US012099005B2

(12) United States Patent
Toyama et al.

(10) Patent No.: US 12,099,005 B2

(45) **Date of Patent: *Sep. 24, 2024**

(54) TERAHERTZ DEVICE

(71) Applicant: ROHM CO., LTD., Kyoto (JP)

(72) Inventors: Tomoichiro Toyama, Kyoto (JP); Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 294 days.

This patent is subject to a terminal disclaimer.

(21) Appl. No.: 17/597,061

(22) PCT Filed: Jun. 30, 2020

(86) PCT No.: PCT/JP2020/025601

§ 371 (c)(1),
(2) Date: Dec. 23, 2021

(87) PCT Pub. No.: WO2021/006105

PCT Pub. Date: Jan. 14, 2021

(65) Prior Publication Data

US 2022/0236178 A1 Jul. 28, 2022

(30) Foreign Application Priority Data

Jul. 5, 2019 (JP) ................................ 2019-126200
Jul. 5, 2019 (JP) ................................ 2019-126201

(51) Int. Cl.

| | |
|---|---|
| ***G01N 21/3581*** | (2014.01) |
| ***H01L 29/861*** | (2006.01) |
| ***H01Q 9/16*** | (2006.01) |
| ***H03B 7/08*** | (2006.01) |

(52) U.S. Cl.

CPC ....... *G01N 21/3581* (2013.01); *H01L 29/861* (2013.01); *H01Q 9/16* (2013.01); *H03B 7/08* (2013.01); *H03B 2200/0084* (2013.01)

(58) Field of Classification Search

CPC . G01N 21/3581; H01L 29/861; H01L 29/205; H01L 29/864; H01L 29/88;

(Continued)

(56) References Cited

U.S. PATENT DOCUMENTS 11,335,653 B2 * 5/2022 Tsuruda .................. H01L 29/20
11,569,184 B2 * 1/2023 Tsuruda ................. H01Q 19/13

(Continued)

FOREIGN PATENT DOCUMENTS

JP H10-335706 12/1998
JP 2002-344025 11/2002

(Continued)

OTHER PUBLICATIONS

International Search Report of PCT/JP2020/025601, Sep. 15, 2020, 3 pages.

(Continued)

*Primary Examiner* — Courtney D Thomas

(74) *Attorney, Agent, or Firm* — HSML P. C.

(57) ABSTRACT

A terahertz device includes a base member, a terahertz element, an antenna base, and a reflection film. The terahertz element is mounted on the base member and configured to generate an electromagnetic wave. The antenna base is located opposing the base member and includes an antenna surface. The reflection film is formed on the antenna surface to reflect at least part of the electromagnetic wave generated by the terahertz element in one direction.

20 Claims, 70 Drawing Sheets

(58) Field of Classification Search
CPC ........ H01Q 9/16; H01Q 15/16; H01Q 1/2283; H01Q 19/13; H01Q 1/36; H03B 7/08; H03B 2200/0084
See application file for complete search history.

(56) References Cited

U.S. PATENT DOCUMENTS

| | | | | |
|---|---|---|---|---|
| 2006/0164836 | A1* | 7/2006 | Suehiro | F21V 29/507 257/E33.072 |
| 2015/0034825 | A1 | 2/2015 | Debray et al. | |
| 2016/0036122 | A1 | 2/2016 | Debray | |
| 2017/0271774 | A1 | 9/2017 | Mukai et al. | |
| 2019/0131704 | A1 | 5/2019 | Urzhumov | |

FOREIGN PATENT DOCUMENTS

| | | |
|---|---|---|
| JP | 2007-129043 | 5/2007 |
| JP | 2009-026840 | 2/2009 |
| JP | 2016-111542 | 6/2016 |
| WO | 2005/043637 | 5/2005 |

OTHER PUBLICATIONS

International Preliminary Report on Patentability issued for International Patent Application No. PCT/JP2020/025601, Date of mailing: Jan. 20, 2022, 13 pages including English translation.
Notice of Reasons for Refusal issued for Japanese Patent Application No. 2021-530618, Dispatch date: Jul. 16, 2024, 16 pages including English machine translation.

* cited by examiner

TERAHERTZ DEVICE

TECHNICAL FIELD

The present disclosure relates to a terahertz device.

BACKGROUND ART

Recent advances in electronic devices such as transistors have reduced the size of electronic devices to nanoscale, so that there have been observations of a phenomenon called a quantum effect. The quantum effect is used to develop an ultra-speed processing device and a device having a new function.

In such environment, in particular, the range of frequencies of 0.1 THz to 10 THz, which is called a terahertz band, is used in attempts to perform high capacity communication, information processing, imaging, and measurements. The range of frequencies has characteristics of both light and radio waves. If a device operating in this frequency band is realized, the device may be used in many applications such as measurements in various fields such as physical field, astronomical filed, and biological field in addition to imaging, high capacity communication, and information processing, which are described above.

A known element that oscillates a high-frequency electromagnetic wave having a frequency in the terahertz band has a structure integrating a resonant tunneling diode and a fine slot antenna (refer to, for example, Patent Document 1).

PRIOR ART DOCUMENT

Patent Document

Patent Document 1: Japanese Laid-Open Patent Publication No. 2016-111542

SUMMARY OF THE INVENTION

Problems that the Invention is to Solve

In a terahertz device including a terahertz element as described above, there may be a need to improve the gain.

It is an objective of the present disclosure to provide a terahertz device that improves gain.

Means for Solving the Problems

To achieve the above objective, a terahertz device includes a base member, a terahertz element mounted on the base member and configured to generate an electromagnetic wave, an antenna base located opposing the base member and including an antenna surface, and a reflection film formed on the antenna surface to reflect at least part of the electromagnetic wave generated by the terahertz element in one direction. With this structure, electromagnetic waves generated by the terahertz element are reflected by the reflection film in one direction. This increases the output of the electromagnetic waves emitted from the terahertz device. Thus, the gain of the terahertz device is improved.

To achieve the above objective, a terahertz device includes a terahertz element configured to generate an electromagnetic wave, a base member including a reflector located opposing the terahertz element to reflect at least part of the electromagnetic wave generated by the terahertz element, an antenna base located opposing the base member and including an antenna surface, and a reflection film formed on the antenna surface to reflect at least part of the electromagnetic wave reflected by the reflector in one direction. With this structure, electromagnetic waves generated by the terahertz element are reflected by the reflector, and the electromagnetic waves are further reflected by the reflection film in one direction. This increases the output of the electromagnetic waves emitted from the terahertz device. Thus, the gain of the terahertz device is improved.

To achieve the above objective, a terahertz device includes a base member, a terahertz element mounted on the base member and configured to receive an electromagnetic wave, an antenna base located opposing the base member and including an antenna surface, and a reflection film formed on the antenna surface to reflect an incident electromagnetic wave toward the terahertz element. With this structure, incident electromagnetic waves of the reflection film are reflected by the reflection film toward the terahertz element. This increases the reception strength of the terahertz device. Thus, the gain of the terahertz device is improved.

To achieve the above objective, a terahertz device includes a terahertz element configured to receive an electromagnetic wave, a base member including a reflector located opposing the terahertz element to reflect at least part of an incident electromagnetic wave toward the terahertz element, an antenna base located opposing the base member and including an antenna surface, and a reflection film formed on the antenna surface to reflect at least part of an incident electromagnetic wave toward the reflector. With this structure, incident electromagnetic waves of the reflection film is reflected toward the reflector, and the electromagnetic waves are further reflected by the reflector toward the terahertz element. This increases the reception strength of the terahertz device. Thus, the gain of the terahertz device is improved.

To achieve the above objective, a terahertz device includes a base member, a terahertz element mounted on the base member and configured to generate an electromagnetic wave, an antenna base opposed to the base member and including an antenna surface, a reflection film formed on the antenna surface to reflect at least part of the electromagnetic wave generated by the terahertz element in one direction, and an electrode used for electrical connection with an external device. The electrode projects sideward relative to the antenna base as viewed in an opposing direction of the base member and the antenna base.

With this structure, electromagnetic waves generated by the terahertz element are reflected by the reflection film in one direction. This increases the output of the electromagnetic waves emitted from the terahertz device. Thus, the gain of the terahertz device is improved.

In addition, since the electrode projects sideward relative to the antenna base, the terahertz device is mountable on a circuit substrate having a hole when the antenna base is inserted into the hole. Thus, when the terahertz device is mounted on the circuit substrate, the terahertz device has a low profile.

To achieve the above objective, a terahertz device includes a base member, a terahertz element mounted on the base member and configured to receive an electromagnetic wave, an antenna base located opposing the base member and including an antenna surface, a reflection film formed on the antenna surface to reflect an incident electromagnetic wave toward the terahertz element, and an electrode used for electrical connection with an external device. The electrode projects sideward relative to the antenna base as viewed in an opposing direction of the base member and the antenna base.

With this structure, incident electromagnetic waves of the reflection film are reflected by the reflection film toward the terahertz element. This increases the reception strength of the terahertz device. Thus, the gain of the terahertz device is improved.

In addition, since the electrode projects sideward relative to the antenna base, the terahertz device is mountable on a circuit substrate having a hole when the antenna base is inserted into the hole. Thus, when the terahertz device is mounted on the circuit substrate, the terahertz device has a low profile.

Effects of the Invention

The terahertz device described above improves gain.

MODES FOR CARRYING OUT THE INVENTION

Figure 1:
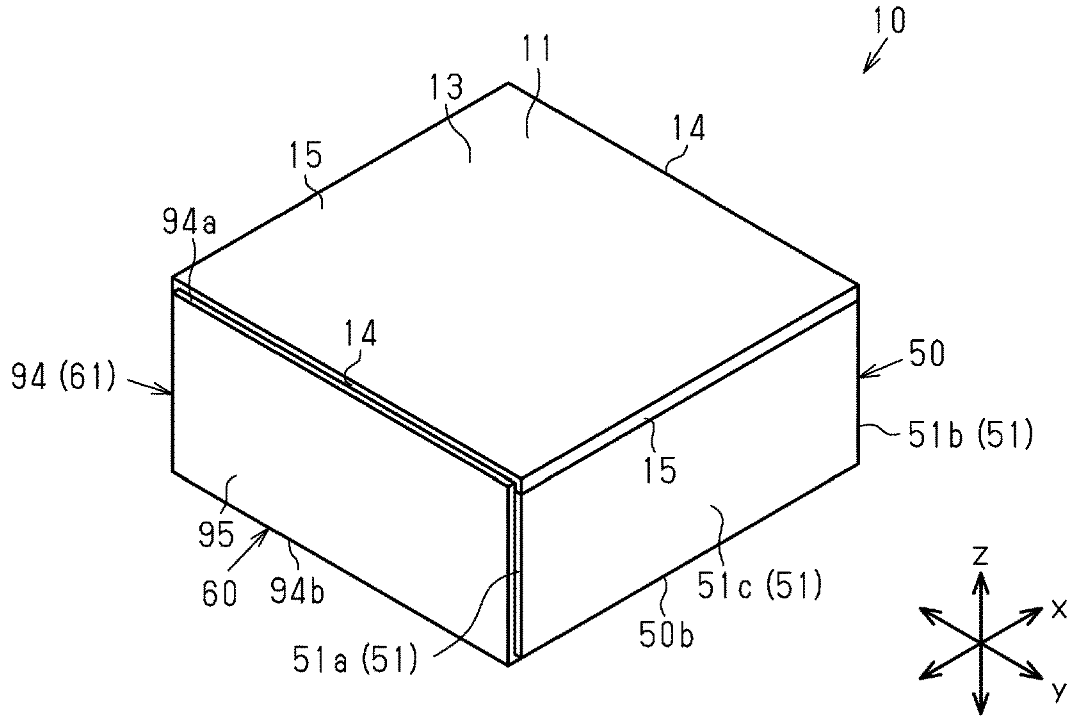
FIG. 1 is a perspective view of a first embodiment of a terahertz device as viewed from above.

Embodiments of a terahertz device will now be described with reference to the drawings. The embodiments described below exemplify configurations and methods for embodying a technical concept and are not intended to limit the material, shape, structure, layout, dimensions, and the like of each component to those described below. The embodiments described below may undergo various modifications. Portions of the drawings are shown schematically.

First Embodiment

FIGS. 1 to 7 show a first embodiment of a terahertz device 10 according to the present disclosure. The terahertz device 10 of the first embodiment includes a mount plate 11, which is used as a base member, a terahertz element 20 configured to generate an electromagnetic wave, an antenna base 50, a reflection film 54, and a lead frame 60, which is used as an electrode and a conductive member.

Figure 2:
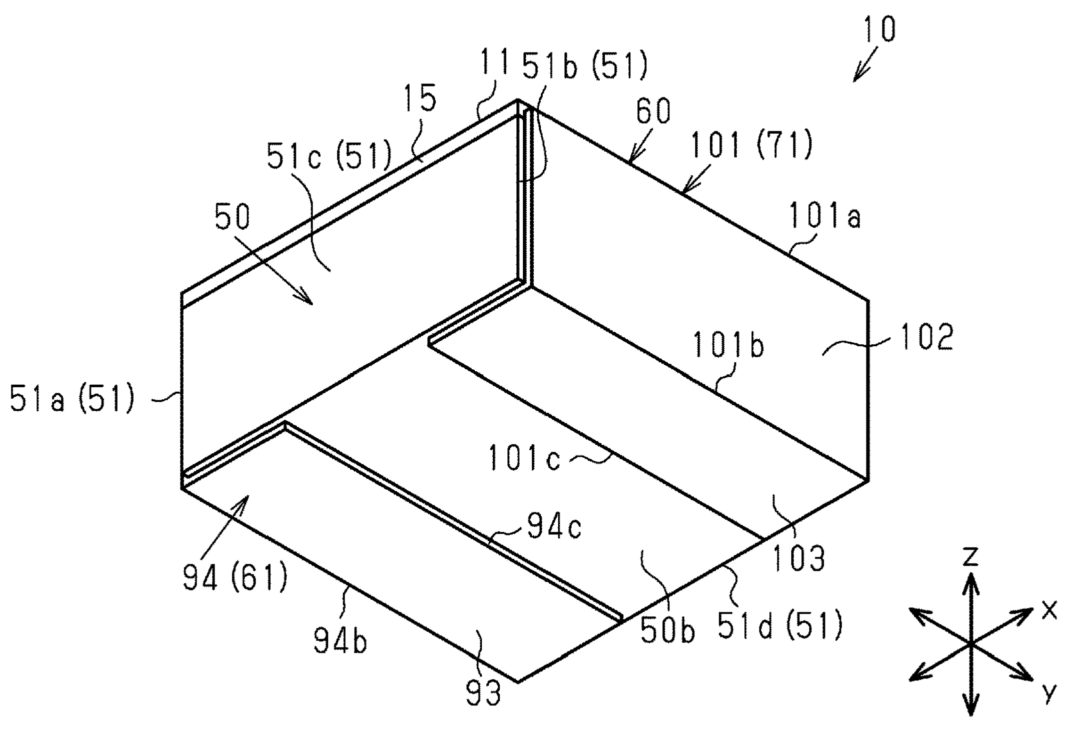
FIG. 2 is a perspective view of the terahertz device as viewed from below.
Figure 3:
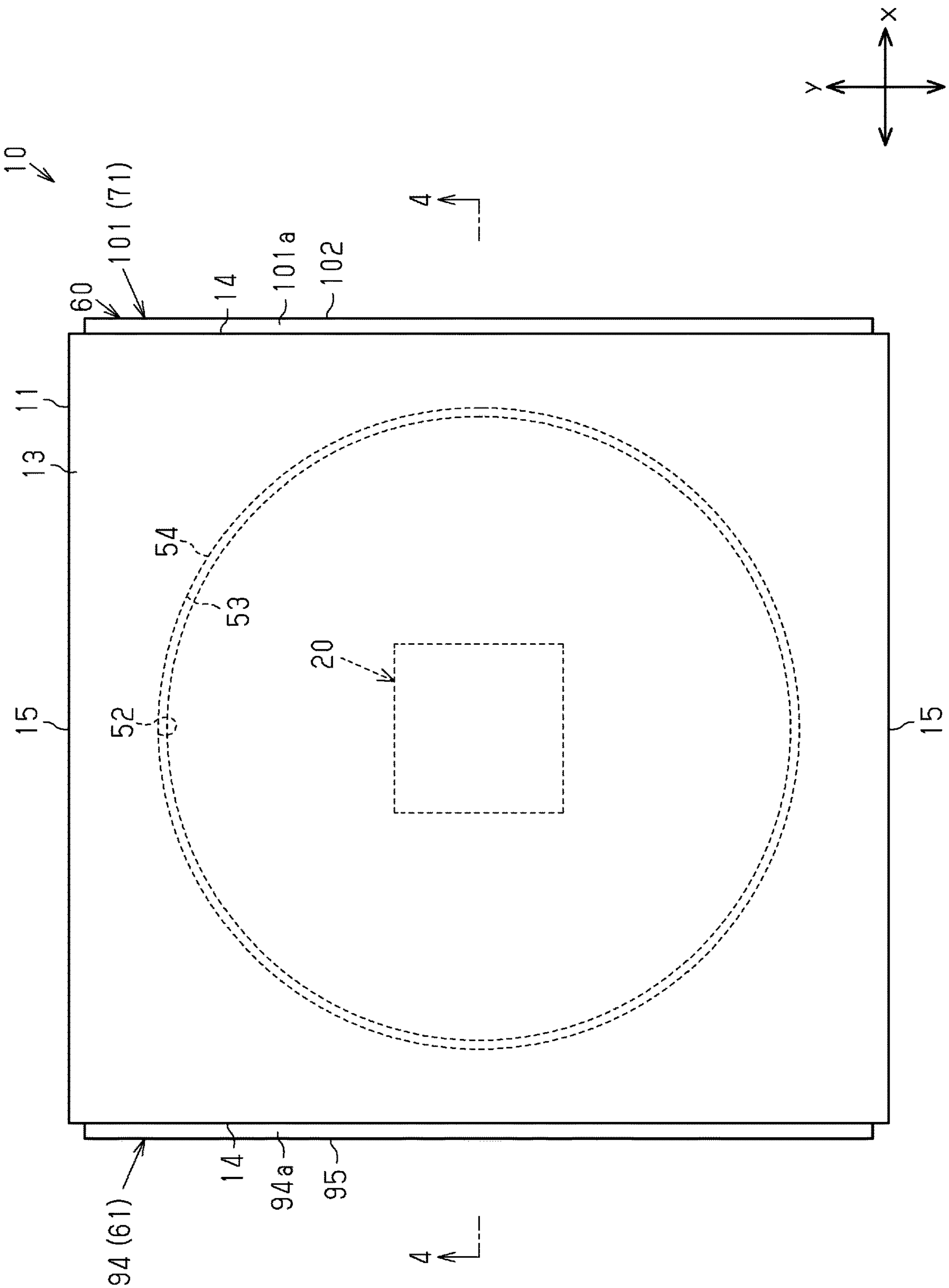
FIG. 3 is a top view of the terahertz device.
Figure 4:
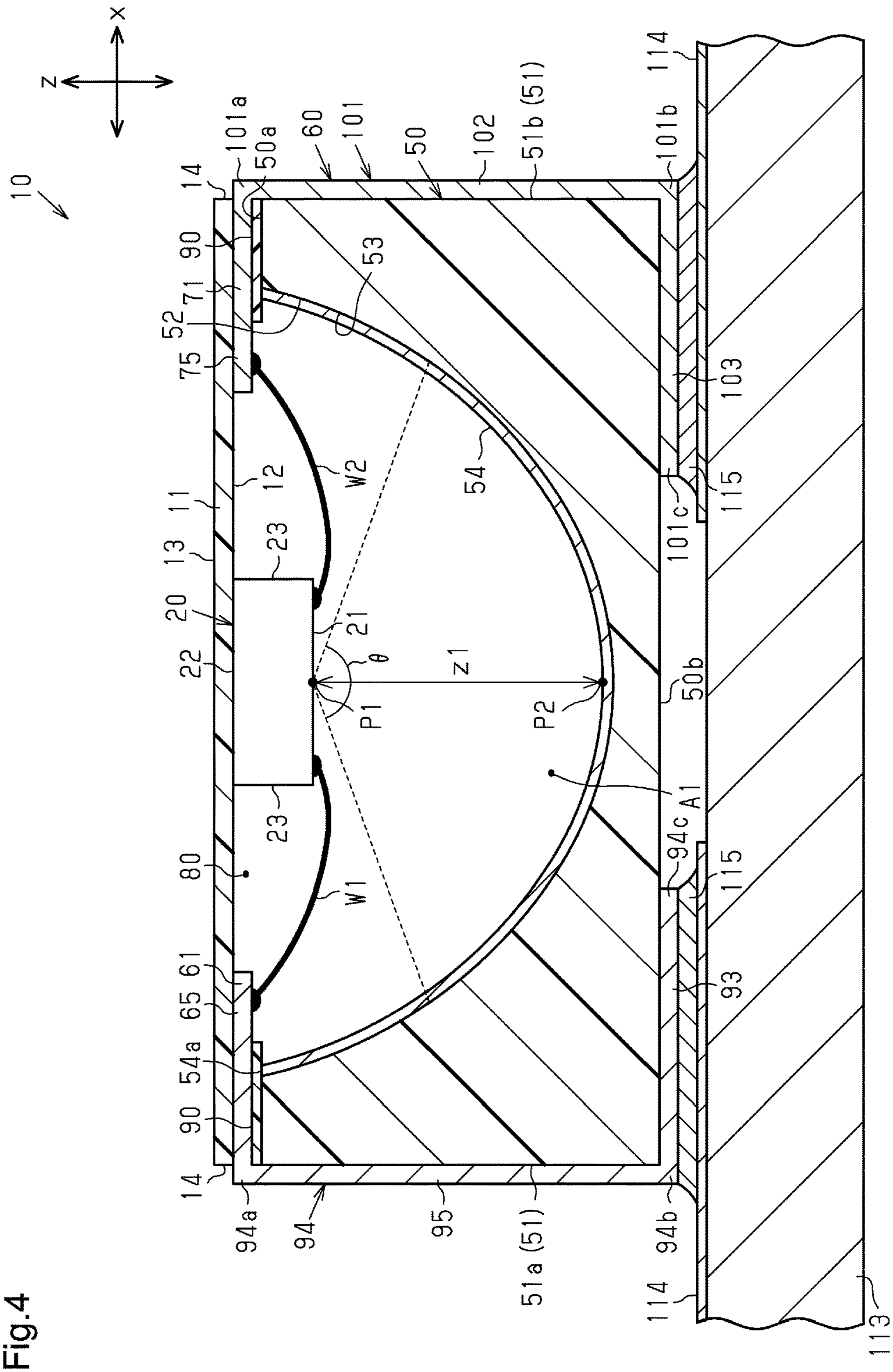
FIG. 4 is an end view taken along line 4-4 in FIG. 3.
Figure 5:
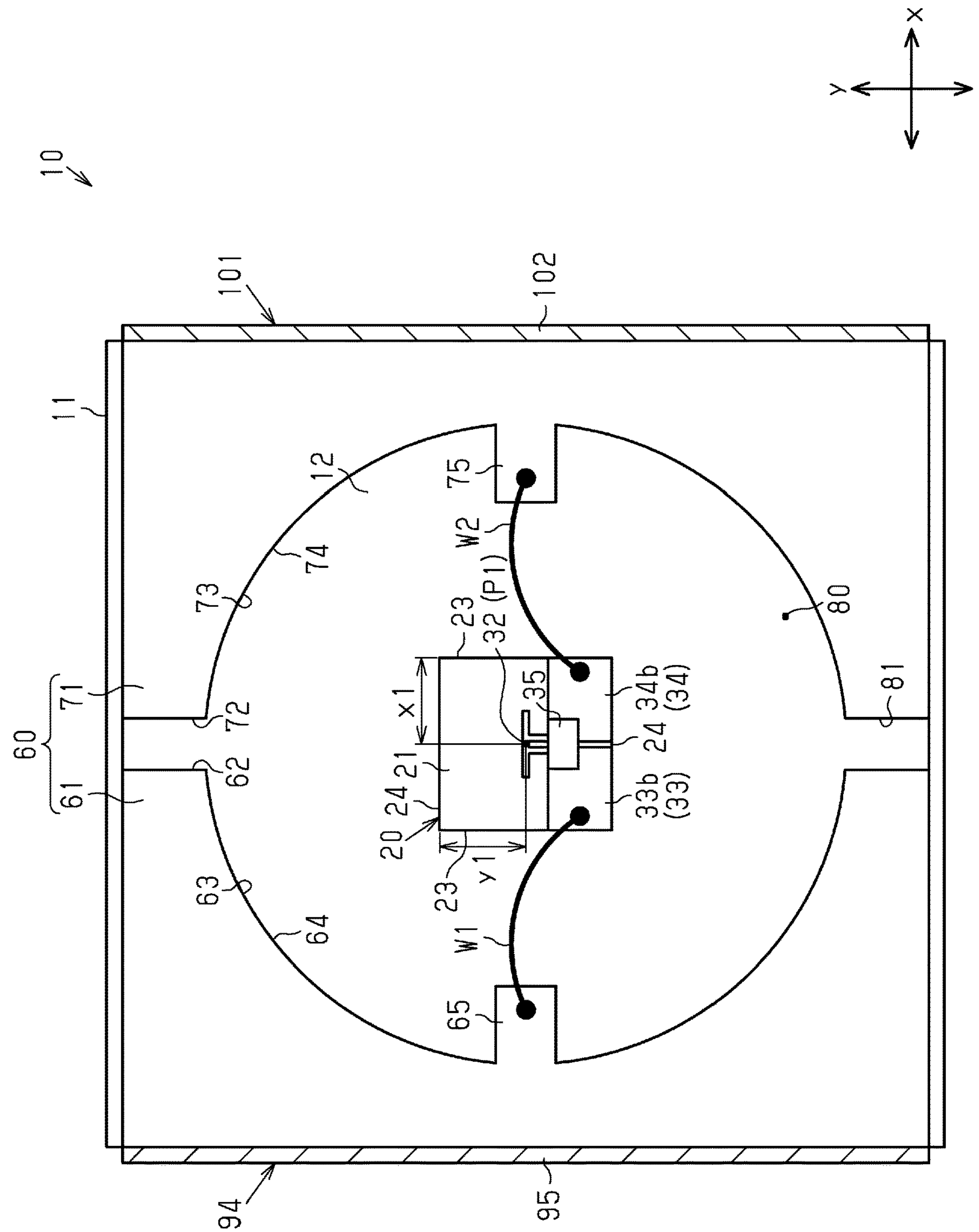
FIG. 5 is a front view of a terahertz element and a lead frame.

FIGS. 1 and 2 are perspective views of the terahertz device 10. FIG. 3 is a top view of the terahertz device 10. FIG. 4 is an end view taken along line 4-4 in FIG. 3. FIG. 5 is a lower view of the terahertz device 10 and a front view of the terahertz element 20 and the lead frame 60 with the antenna base 50 removed. FIG. 5 shows electrodes 94 and 101 in a cut state for the sake of convenience.

The mount plate 11 is formed of a material transmissive to electromagnetic waves generated by the terahertz element 20. In the present embodiment, the mount plate 11 is formed of a dielectric material, for example, a synthetic resin such as an epoxy resin or an intrinsic semiconductor such as a single crystal of silicon (Si). An example of the epoxy resin is a glass epoxy resin. However, the material of the mount plate 11 is not limited to those described above and may be any material, for example, Teflon (registered trademark) or glass. The mount plate 11 is insulative.

The mount plate 11 is, for example, rectangular. For the sake of brevity, the thickness-wise direction of the mount plate 11 is referred to as the z-direction. Two directions that are orthogonal to each other and the z-direction are referred to as the x-direction and the y-direction.

As shown in FIGS. 3 and 4, the mount plate 11 includes a mount main surface 12 and a mount back surface 13, which are plate surfaces intersecting the thickness-wise direction of the mount plate 11. The mount main surface 12 and the mount back surface 13 are flat and rectangular. The mount main surface 12 and the mount back surface 13 extend in the x-direction and the y-direction and are separate from each other in the z-direction. The shapes of the mount main surface 12 and the mount back surface 13 are not limited to a rectangle and may be a circle, an ellipse, or a polygon. For the sake of brevity, in the present embodiment, a direction extending away from the mount back surface 13 in the z-direction is referred to as "upward", and a direction extending away from the mount main surface 12 in the z-direction is referred to as "downward".

As shown in FIG. 5, in the present embodiment, the mount plate 11 includes two first plate side surfaces 14, which are opposite end surfaces in the x-direction, and two second plate side surfaces 15, which are opposite end surfaces in the y-direction. The first plate side surfaces 14 intersect the x-direction. In the present embodiment, the first plate side surfaces 14 are orthogonal to the x-direction. The second plate side surfaces 15 intersect the y-direction. In the present embodiment, the second plate side surfaces 15 are orthogonal to the y-direction. The first plate side surfaces 14 are orthogonal to the second plate side surfaces 15.

The terahertz element 20 converts electromagnetic waves in the terahertz band and electrical energy to and from each other. It is considered that the electromagnetic wave includes concepts of one or both of light and radio waves. The terahertz element 20 converts received electrical energy into electromagnetic waves in the terahertz band. Thus, the terahertz element 20 oscillates the electromagnetic waves (i.e., terahertz waves). The frequency of the electromagnetic waves generated by the terahertz element 20 is, for example, 0.1 Thz to 10 Thz.

As shown in FIG. 5, the terahertz element 20 has the shape of a rectangular plate as viewed the z-direction (hereafter, also referred to as "in plan view"). In the present embodiment, the terahertz element 20 is square in plan view.

The shape of the terahertz element 20 in plan view is not limited to a rectangle and may be a circle, an ellipse, or a polygon.

The terahertz element 20 includes an element main surface 21 and an element back surface 22. The element main surface 21 and the element back surface 22 intersect the z-direction. In the present embodiment, the element main surface 21 and the element back surface 22 are orthogonal to the z-direction. The element main surface 21 and the element back surface 22 are rectangular, for example, square, as viewed in the z-direction. However, the shape of the element main surface 21 and the element back surface 22 is not limited to this and may be any shape.

As shown in FIG. 4, in the present embodiment, when the element back surface 22 is in contact with the mount main surface 12 or is opposed to the mount main surface 12 via an intermediate layer, the terahertz element 20 is attached to the mount plate 11. That is, the mount plate 11 is configured to allow for attachment of the terahertz element 20. The terahertz element 20 is mounted on the mount plate 11.

The terahertz element 20 includes two first element side surfaces 23, which are opposite end surfaces in the x-direction, and two second element side surfaces 24, which are opposite end surfaces in the y-direction. The first element side surfaces 23 intersect the x-direction. In the present embodiment, the first element side surfaces 23 are orthogonal to the x-direction. The second element side surfaces 24 intersect the y-direction. In the present embodiment, the second element side surfaces 24 are orthogonal to the y-direction. The first element side surfaces 23 are orthogonal to the second element side surfaces 24.

Figure 6:
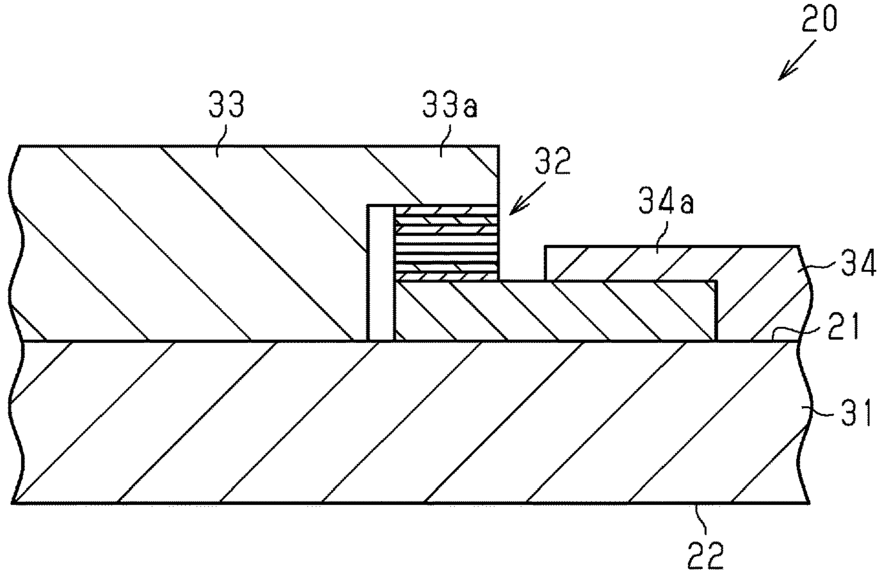
FIG. 6 is a schematic end view of an active element and its surroundings.
Figure 7:
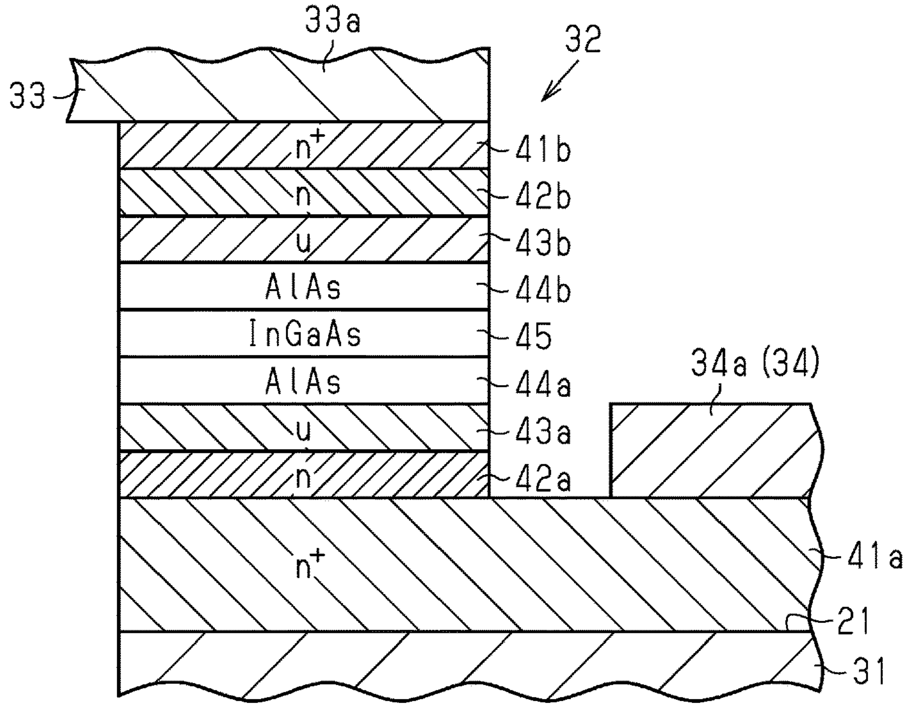
FIG. 7 is an enlarged end view showing a cross-sectional structure of the active element.

FIGS. 6 and 7 show an example of a detailed structure of the terahertz element 20. FIG. 6 is a schematic diagram showing an example of a cross section of the terahertz element 20. FIG. 7 is an enlarged partial view of FIG. 6.

As shown in FIGS. 6 and 7, the terahertz element 20 includes an element substrate 31, an active element 32, a first conductive layer 33, and a second conductive layer 34.

The element substrate 31 is formed of a semiconductor and is semi-insulating. The semiconductor forming the element substrate 31 is, for example, InP (indium phosphide) but may be a semiconductor other than InP. When the element substrate 31 is formed of InP, the refractive index (absolute refractive index) is approximately 3.4. In the present embodiment, the element substrate 31 is rectangular and is, for example, square in plan view. The element main surface 21 and the element back surface 22 are the main surface and the back surface of the element substrate 31. The element side surfaces 23 and 24 are side surfaces of the element substrate 31.

The active element 32 converts electromagnetic waves in the terahertz band and electrical energy to and from each other. The active element 32 is formed on the element substrate 31. The active element 32 is typically a resonant tunneling diode (RTD).

The active element 32 may be, for example, a tunnel injection transit time (TUNNETT) diode, an impact ionization avalanche transit time (IMPATT) diode, a GaAs-base field effect transistor (FET), a GaN-base FET, a high electron mobility transistor (HEMT), or a heterojunction bipolar transistor (HBT).

An example of obtaining the active element 32 will be described.

A semiconductor layer 41*a* is formed on the element substrate 31. The semiconductor layer 41*a* is formed of, for example, GaInAs. The semiconductor layer 41*a* is doped with an n-type impurity at a high concentration.

A GaInAs layer 42*a* is stacked on the semiconductor layer 41*a*. The GaInAs layer 42*a* is doped with an n-type impurity. For example, the impurity concentration of the GaInAs layer 42*a* is lower than the impurity concentration of the semiconductor layer 41*a*.

A GaInAs layer 43*a* is stacked on the GaInAs layer 42*a*. The GaInAs layer 43*a* is not doped with impurities.

An AlAs layer 44*a* is stacked on the GaInAs layer 43*a*. An InGaAs layer 45 is stacked on the AlAs layer 44*a*. An AlAs layer 44*b* is stacked on the InGaAs layer 45. The AlAs layer 44*a*, the InGaAs layer 45, and the AlAs layer 44*b* form an RTD unit.

A GaInAs layer 43*b* is not doped with impurities and is stacked on the AlAs layer 44*b*. A GaInAs layer 42*b* is doped with an n-type impurity and is stacked on the GaInAs layer 43*b*. A GaInAs layer 41*b* is stacked on the GaInAs layer 42*b*. The GaInAs layer 41*b* is doped with an n-type impurity at a high concentration. For example, the impurity concentration of the GaInAs layer 41*b* is higher than the impurity concentration of the GaInAs layer 42*b*.

The active element 32 may have any specific structure configured to generate electromagnetic waves (or receive electromagnetic waves or both generate and receive electromagnetic waves). In other words, the active element 32 may be configured to oscillate in electromagnetic waves of the terahertz band.

As shown in FIG. 5, the terahertz element 20 includes an oscillation point P1 where oscillation of electromagnetic waves is performed. The oscillation point P1 is formed on the element main surface 21. The element main surface 21 that includes the oscillation point P1 may be referred to as an active surface. Also, the oscillation point P1 may refer to a position on which the active element 32 is disposed.

In the present embodiment, the oscillation point P1 (the active element 32) is disposed at the center of the element main surface 21. However, the position of the oscillation point P1, that is, the position of the active element 32 on the element main surface 21, is not limited to the center of the element main surface 21 and may be any position.

In the present embodiment, it is preferred that a first perpendicular distance x1 between the oscillation point P1 and each first element side surface 23 is $(\lambda'InP/2)+((\lambda'InP/2)\times N)$ (N is an integer that is greater than or equal to 0: N=0, 1, 2, 3, . . . ).

λ'InP denotes an effective wavelength of an electromagnetic wave that transmits through the terahertz element 20. When n1 denotes the refractive index of the terahertz element 20 (the element substrate 31), c denotes the speed of light, and fc denotes the center frequency of electromagnetic waves, λ'InP is $(1/n1)\times(c/fc)$. When the first perpendicular distance x1 is set as described above, an electromagnetic wave oscillated by the terahertz element 20 performs a free end reflection on the first element side surface 23. Thus, the terahertz element 20 itself is designed as a resonator (primary resonator/one-dimensional resonator) of the terahertz device 10.

In the same manner, it is preferred that a second perpendicular distance y1 between the oscillation point P1 and each second element side surface 24 is $(\lambda'InP/2)+((\lambda'InP/2)\times N)$ (N is an integer that is greater than or equal to 0: N=0, 1, 2, 3, . . . ).

The perpendicular distances x1 and y1 may have different values for each of the element side surfaces 23 and 24 as long as the values are calculated by the above equation. Further, in FIG. 5, the first perpendicular distance x1 from the oscillation point P1 to the first element side surface 23 located at the right side may differ from the first perpendicular distance x1 from the oscillation point P1 to the first element side surface 23 located at the left side. Also, in FIG. 5, the second perpendicular distance y1 from the oscillation point P1 to the second element side surface 24 located at the upper side may differ from the second perpendicular distance y1 from the oscillation point P1 to the second element side surfaces 24 located at the lower side.

The dimension of the terahertz element 20 in the z-direction may be designed in accordance with, for example, the frequency of an oscillated electromagnetic wave. More specifically, the dimension of the terahertz element 20 in the z-direction is an integer multiple of ½ times a wavelength λ of the electromagnetic wave (i.e., λ/2). The electromagnetic wave performs free end reflection in the interface between the element substrate 31 and air. When the dimension of the terahertz element 20 in the z-direction is set as described above, standing waves having an aligned phase are excited in the terahertz element 20. The dimension of the terahertz element 20 in the z-direction is decreased as the frequency of the electromagnetic wave becomes higher. The dimension in the z-direction is increased as the frequency of the electromagnetic wave becomes lower.

The structure of the terahertz element 20 is not limited to that described above. For example, a back reflector metal layer may be disposed on the element back surface 22, which is located at the opposite side of the element substrate 31 from the element main surface 21 on which the active element 32 is disposed. In this case, the back reflector metal layer reflects an electromagnetic wave (electromagnetic wave) emitted from the active element 32.

When the back reflector metal layer is arranged, the electromagnetic wave performs a fixed end reflection in the interface between the element substrate 31 and the back reflector metal layer. This results in a π phase shift. In this case, the dimension of the terahertz element 20 in the z-direction may be designed to be (λ/4)+(integer multiple of λ/2) using the wavelength λ of the electromagnetic wave.

In the present embodiment, electromagnetic waves generated from the oscillation point P1 have directivity. As shown in FIG. 4, the electromagnetic waves generated from the oscillation point P1 are radiated in the range of an opening angle θ. The opening angle θ is, for example, 120° to 180°. However, the opening angle θ is not limited to that described above and may be any angle.

The first conductive layer 33 and the second conductive layer 34 are formed on the element main surface 21. The first conductive layer 33 and the second conductive layer 34 are insulated from each other. Each of the first conductive layer 33 and the second conductive layer 34 has a stacked structure of metals. The stacked structure of each of the first conductive layer 33 and the second conductive layer 34 is obtained by stacking, for example, gold (Au), palladium (Pd), and titanium (Ti). In another example, the stacked structure of each of the first conductive layer 33 and the second conductive layer 34 is obtained by stacking Au and Ti. The first conductive layer 33 and the second conductive layer 34 are formed through vacuum vapor deposition or sputtering.

As shown in FIG. 6, in the present embodiment, part of the first conductive layer 33 and part of the second conductive layer 34 are disposed at opposite sides of the active element 32 in the x-direction. The first conductive layer 33 includes a first connection region 33*a* overlapping the active element 32 in the z-direction. The first connection region 33*a* is disposed on the GaInAs layer 41*b* in contact with the GaInAs layer 41*b*.

The semiconductor layer 41*a* extends further than other layers such as the GaInAs layer 42*a* toward the second conductive layer 34 in the x-direction. The second conductive layer 34 includes a second connection region 34*a* stacked on part of the semiconductor layer 41*a* where the GaInAs layer 42*a* and other layers are not stacked. Thus, the active element 32 is electrically connected to the first conductive layer 33 and the second conductive layer 34. The second connection region 34*a* is spaced from the GaInAs layer 42*a* and other layers in the x-direction.

Although not shown in FIG. 7, alternatively, a GaInAs layer doped with an n-type impurity at a high concentration may be disposed between the GaInAs layer 41*b* and the first connection region 33*a*. This may result in good contact of the first conductive layer 33 with the GaInAs layer 41*b*.

As shown in FIG. 5, part of the first conductive layer 33 and part of the second conductive layer 34 form a dipole antenna. That is, in the terahertz element 20, the antenna is integrated by part of the first conductive layer 33 and part of the second conductive layer 34 at the side of the element main surface 21. Instead of a dipole antenna, another antenna such as a slot antenna, a biconical antenna, or a loop antenna may be used. Moreover, the antenna may be omitted.

In the present embodiment, the terahertz element 20 includes a metal insulator metal (MIM) reflector 35. The MIM reflector 35 is formed by holding an insulator between part of the first conductive layer 33 and part of the second conductive layer 34 in the z-direction. The MIM reflector 35 is configured to short the part of the first conductive layer 33 and the part of the second conductive layer 34 at a high frequency. The MIM reflector 35 reflects a high-frequency electromagnetic wave. However, the MIM reflector 35 is not necessary and may be omitted.

As shown in FIG. 5, the first conductive layer 33 includes a first pad 33*b*, and the second conductive layer 34 includes a second pad 34*b*. The first pad 33*b* and the second pad 34*b* are spaced apart in the x-direction and insulated from each other.

As shown in FIG. 2, the antenna base 50 is, for example, rectangular-box-shaped as a whole. The antenna base 50 is formed of, for example, an insulative material. More specifically, the antenna base 50 is formed of a dielectric material, for example, a synthetic resin such as an epoxy resin. An example of the epoxy resin is a glass epoxy resin. However, the material of the antenna base 50 is not limited to this and may be any material, for example, Si, Teflon, or glass.

The antenna base 50 is disposed on the mount plate 11 at the mount main surface 12, which is opposite the mount back surface 13. The antenna base 50 is located opposing the mount plate 11. Specifically, the antenna base 50 is opposed to the mount plate 11 via the lead frame 60 in the z-direction. The z-direction may be referred to as the opposing direction of the antenna base 50 and the mount plate 11.

The antenna base 50 includes a base main surface 50*a* opposed to the mount main surface 12, a base back surface 50*b* opposite the base main surface 50*a*, and base side surfaces 51.

The base main surface 50*a* and the base back surface 50*b* intersect the z-direction. In the present embodiment, the element main surface 21 and the element back surface 22 are orthogonal to the z-direction. The base main surface 50*a* and the base back surface 50*b* are, for example, rectangular (e.g., square). The base back surface 50*b* defines the bottom surface of the terahertz device 10.

In the present embodiment, the base side surfaces 51 are surfaces of the terahertz device 10 (the antenna base 50) facing sideward. The base side surfaces 51 may be referred to as the end surfaces of the antenna base 50 facing in directions orthogonal to the opposing direction of the base main surface 50*a* and the base back surface 50*b*. The base side surfaces 51 joins the base main surface 50*a* and the base back surface 50*b*.

The present embodiment includes four base side surfaces 51. Specifically, the base side surfaces 51 include a first base side surface 51*a* and a second base side surface 51*b*, which are opposite end surfaces of the antenna base 50 in the x-direction, and a third base side surface 51*c* and a fourth base side surface 51*d*, which are opposite end surfaces of the antenna base 50 in the y-direction. The first base side surface 51*a* and the second base side surface 51*b* intersect the x-direction. In the present embodiment, the first base side surface 51*a* and the second base side surface 51*b* are orthogonal to the x-direction. The third base side surface 51*c* and the fourth base side surface 51*d* intersect the y-direction. In the present embodiment, the third base side surface 51*c* and the fourth base side surface 51*d* are orthogonal to the y-direction. The first base side surface 51*a* and the second base side surface 51*b* are orthogonal to the third base side surface 51*c* and the fourth base side surface 51*d*.

The antenna base 50 includes a recess 52 recessed with respect to the base main surface 50*a* in a direction away from the mount main surface 12. The recess 52 is recessed from the base main surface 50*a* in a direction away from the mount main surface 12, that is, downward. In the present embodiment, the recess 52 is semispherical as a whole. The recess 52 is filled with air.

The recess 52 is open upward. The opening of the recess 52 is circular as viewed in the z-direction. The opening of the recess 52 is closed by the mount plate 11. In the present embodiment, the terahertz element 20 is accommodated in the recess 52.

The recess 52 includes an antenna surface 53. The antenna surface 53 is, for example, a curved surface projecting downward. The antenna surface 53 is formed in conformance with the shape of an antenna. For example, the antenna surface 53 is curved to be parabolic-antenna-shaped. The antenna surface 53 is circular as viewed from above.

As shown in FIG. 4, the reflection film 54 is formed on the antenna surface 53. The reflection film 54 is formed of a material that reflects electromagnetic waves generated by the terahertz element 20, for example, a metal such as Cu. In the present embodiment, the reflection film 54 is formed on the entire antenna surface 53. The reflection film 54 is not formed on the base main surface 50*a*.

The reflection film 54 is configured to reflect at least part of the electromagnetic waves received from the terahertz element 20 in one direction. In the present embodiment, the reflection film 54 reflects the electromagnetic waves received from the terahertz element 20 in the z-direction (specifically, upward). In other words, when electromagnetic waves are radiated in the range of the opening angle θ, the reflection film 54 is configured to guide the electromagnetic waves in one direction.

Specifically, the reflection film 54 is antenna-shaped. In the present embodiment, the antenna surface 53 is curved in conformance with the shape of an antenna. Accordingly, the reflection film 54 that is formed on the antenna surface 53 is shaped in conformance with the antenna. In the present embodiment, the reflection film 54 is parabolic-antenna-shaped. In other words, the reflection film 54 is a parabolic reflector. The reflection film 54 is circular as viewed in the z-direction.

The reflection film 54 and the mount plate 11 are opposed to each other in the z-direction. In other words, the mount plate 11 is located opposing the reflection film 54. In the present embodiment, the mount plate 11 is located above the reflection film 54. Thus, the electromagnetic waves reflected by the reflection film 54 are emitted upward transmitting through the mount plate 11.

The reflection film 54 is not disposed at the side of the element back surface 22 but at the side of the element main surface 21, where the oscillation point P1 exists, and is opposed to the terahertz element 20 (in the present embodiment, the element main surface 21). The reflection film 54 is disposed, for example, so that the focal point of the reflection film 54 is the oscillation point P1. In the present embodiment, the reflection film 54 has a center point P2 that coincides with the oscillation point P1 as viewed in the z-direction. In the present embodiment, the center point P2 is the center of the circular reflection film 54 as viewed in the z-direction.

It is preferred that the antenna surface 53 is curved so that the condition $Z=(1/(4z1))X^2$ is satisfied when the perpendicular distance from the oscillation point P1 to the reflection film 54 is referred to as a specified distance z1, the coordinate of the reflection film 54 in the z-direction is denoted by Z, and the position of the reflection film 54 in the x-direction is denoted by X. However, the curving aspect of the antenna surface 53 is not limited to this and may be any curving aspect.

The z-direction may be referred to as the opposing direction of the reflection film 54 and the terahertz element 20 (the element main surface 21) or the output direction of the electromagnetic waves of the terahertz device 10. Further, the z-direction may be referred to as the opposing direction of the center point P2 of the reflection film 54 and the oscillation point P1. The specified distance z1 may be refer to as the distance between the oscillation point P1 and the center point P2.

The reflection film 54 is disposed at a position corresponding to the frequency of electromagnetic waves generated from the terahertz element 20 so that the electromagnetic waves resonate. Specifically, the specified distance z1 may be, for example, $(\lambda'_A/4)+((\lambda'_A/2)\times N)$ (N is an integer greater than or equal to 0) so that the resonance condition of the electromagnetic waves generated by the terahertz element 20 is satisfied. $\lambda'_A$ is $(1/n_A)(c/fc)$ (c: speed of light, fc: center frequency of oscillation) where $n_A$ represents the refractive index of an object intervening between the oscillation point P1 and the reflection film 54. For example, when air is present between the oscillation point P1 and the reflection film 54, $n_A$ is 1. fc may be a target frequency of the terahertz element 20 or the frequency having the maximum output among the electromagnetic waves generated from the terahertz element 20.

As viewed in the z-direction, the distance between opposite ends of the reflection film 54 in the x-direction or the y-direction is referred to as the opening width of the reflection film 54. In the present embodiment, since the reflection film 54 is formed on the entire antenna surface 53, the opening width of the reflection film 54 is equal to the opening width of the recess 52. The opening width of the recess 52 may be referred to as the diameter of the opening of the circular recess 52.

The reflection film 54 is formed, for example, over an angle that is greater than or equal to the opening angle θ of the oscillation point P1. More specifically, when the oscillation point P1 is the vertex, the antenna surface 53 is formed over an angle that is greater than or equal to the opening angle θ. As described above, in the present embodiment, the reflection film 54 is formed on the entire antenna surface 53. In the present embodiment, the angle over which the reflection film 54 is formed with the oscillation point P1 is greater than 180°. Therefore, in the present embodiment, the reflection film 54 reflects all of the electromagnetic waves emitted from the oscillation point P1 within the range of the opening angle θ.

In the present embodiment, the dimension of the antenna base 50 in the z-direction is greater than the dimension of the mount plate 11 in the z-direction, that is, the thickness of the mount plate 11. The dimension of the antenna base 50 in the x-direction is set to be equal to the dimension of the mount plate 11 in the x-direction. The dimension of the antenna base 50 in the y-direction is set to be equal to the dimension of the mount plate 11 in the y-direction. However, the antenna base 50 and the mount plate 11 may have any dimensional relationship.

As shown in FIGS. 4 and 5, the lead frame 60 is attached to the mount main surface 12 of the mount plate 11. The lead frame 60 and the mount plate 11 are bonded to each other in tight contact and fixed so as not to be displaced from each other.

The lead frame 60 has the shape of, for example, a rectangular plate, the thickness-wise direction of which conforms to the z-direction. In the present embodiment, the lead frame 60 has a greater thickness than the mount plate 11. In other words, in the present embodiment, the mount plate 11 has a smaller thickness than the lead frame 60.

The lead frame 60 includes a first lead part 61 and a second lead part 71 that are insulated from each other. The first lead part 61 and the second lead part 71 are, for example, separated and opposed to each other in the x-direction and respectively include a first lead opposing surface 62 and a second lead opposing surface 72 that are separated and opposed to each other in the x-direction. In the present embodiment, the lead opposing surfaces 62 and 72 are orthogonal to the x-direction. In the present embodiment, the first lead part 61 and the second lead part 71 correspond to "first conductor" and "second conductor".

As viewed in the z-direction, the first lead part 61 and the second lead part 71 extend sideward, in the present embodiment, in the x-direction, beyond the mount plate 11. The dimension of the two lead parts 61 and 71 in the y-direction is set to be slightly less than the dimension of the mount plate 11 in the y-direction, for example, equal to the dimension of the antenna base 50 in the y-direction. In the present embodiment, the lead frame 60 is less likely to extend beyond the mount plate 11 in the y-direction.

The lead frame 60 is formed so as to avoid overlapping with the reflection film 54 (the recess 52) in the z-direction. More specifically, the lead frame 60 includes an opening 80 that overlaps at least a portion of the reflection film 54 as viewed in the z-direction.

The opening 80 includes, for example, a gap 81 extending between the two lead parts 61 and 71, a first part opening 63 formed in the first lead part 61, and a second part opening 73 formed in the second lead part 71.

The gap 81 is slit-shaped and extends in the y-direction and includes a space between the lead opposing surfaces 62 and 72 and a space between the part openings 63 and 73.

The first part opening 63 is formed in a portion of the first lead part 61 that overlaps the reflection film 54 as viewed in the z-direction. The second part opening 73 is formed in a portion of the second lead part 71 that overlaps the reflection film 54 in the z-direction.

The first part opening 63 and the second part opening 73 extend through in the z-direction to be continuous with the recess 52. The first part opening 63 and the second part opening 73 are separated by the gap 81 and opposed to each other in the x-direction. The two part openings 63 and 73 are open in the x-direction. The first part opening 63 is open toward the second lead part 71. The second part opening 73 is open toward the first lead part 61. Thus, the two part openings 63 and 73 are continuous with the gap 81.

Each of the first part opening 63 and the second part opening 73 is semicircular as viewed in the z-direction. The first part opening 63 and the second part opening 73 form a single circular hole. In other words, the terahertz element 20 is located in the center of the circle formed by the part openings 63 and 73. The diameter of the circle formed by the part openings 63 and 73 may be, for example, greater than or equal to the opening width of the reflection film 54.

The first lead part 61 includes a first inner surface 64, which is the wall surface of the first part opening 63. The first inner surface 64 is recessed from the first lead opposing surface 62 in a direction away from the second lead opposing surface 72.

The second lead part 71 includes a second inner surface 74, which is the wall surface of the second part opening 73. The second inner surface 74 is recessed from the second lead opposing surface 72 in a direction away from the first lead opposing surface 62.

The first inner surface 64 and the second inner surface 74 are curved to project away from each other. The two inner surfaces 64 and 74, for example, extend along the outer side of an end 54*a* of the reflection film 54, that is, the opening edge of the recess 52, to avoid overlapping of the two lead parts 61 and 71 with the reflection film 54.

As shown in FIG. 5, in the present embodiment, the first lead part 61 includes a first connector 65 configured to be electrically connected to the terahertz element 20. In the present embodiment, the first connector 65 is a portion of the first lead part 61 that projects toward the terahertz element 20 from where the first lead part 61 does not overlap the recess 52 (i.e., the reflection film 54) as viewed in the z-direction. More specifically, the first connector 65 is a projection piece projecting from the first inner surface 64 toward the terahertz element 20. The first connector 65 overlaps the reflection film 54 as viewed in the z-direction. The first connector 65 and the first pad 33*b* are connected by a first wire W1. Thus, the first lead part 61 is electrically connected to the terahertz element 20.

In the present embodiment, the projection dimension of the first connector 65 from the first inner surface 64 is less than the length of the first wire W1 as viewed in the z-direction. The projection dimension is, for example, less than ¼ of the opening width of the reflection film 54.

In the same manner, in the present embodiment, the second lead part 71 includes a second connector 75 configured to be electrically connected to the terahertz element 20. In the present embodiment, the second connector 75 is a portion of the second lead part 71 that projects toward the terahertz element 20 from where the second lead part 71 does not overlap the recess 52 (i.e., the reflection film 54) as viewed in the z-direction. More specifically, the second connector 75 is a projection piece projecting from the second inner surface 74 toward the terahertz element 20. The second connector 75 overlaps the recess 52 (i.e., the reflection film 54) as viewed in the z-direction. The second connector 75 and the second pad 34*b* are connected by a second wire W2. Thus, the second lead part 71 is electrically connected to the terahertz element 20.

In the present embodiment, the projection dimension of the second connector 75 from the second inner surface 74 is less than the length of the second wire W2 as viewed in the z-direction. The projection dimension is, for example, less than ¼ of the opening width of the reflection film 54.

In the present embodiment, the first connector 65 and the second connector 75 are opposed to each other at opposite sides of the terahertz element 20. For example, the two connectors 65 and 75 are symmetrically arranged in the x-direction. In other words, the two connectors 65 and 75 are shifted 180° from each other as viewed in the z-direction.

As shown in FIG. 4, the terahertz device 10 includes an adhesive layer 90 that adheres the antenna base 50 to the lead frame 60. The adhesive layer 90 is formed of, for example, an insulative material and includes, for example, a resin adhesive agent. The adhesive layer 90 is disposed between the base main surface 50*a* of the antenna base 50 and the lead frame 60. The antenna base 50 is adhered to the lead frame 60 by the adhesive layer 90. This unitizes the mount plate 11, the lead frame 60, and the antenna base 50. More specifically, the mount plate 11, that is, the base member, and the antenna base 50 are unitized so as not to be displaced from each other. Accordingly, the terahertz element 20, which is mounted on the mount plate 11, and the reflection film 54, which is formed on the antenna base 50, are unitized so as not to be displaced from each other.

The adhesive layer 90 is disposed between the reflection film 54 and the lead frame 60. The adhesive layer 90 hinders electrical connection of the reflection film 54 with the lead frame 60. As described above, the reflection film 54 is not electrically connected to the antenna base 50 and the lead frame 60 and is electrically isolated.

In particular, in the present embodiment, the inner peripheral end of the adhesive layer 90 extends inward (i.e., toward the terahertz element 20) beyond the reflection film 54. Thus, the reflection film 54 is less likely to circumvent the adhesive layer 90 and contact the lead frame 60. The inner peripheral end of the adhesive layer 90 may be referred to as the end of the adhesive layer 90 located close to the terahertz element 20. The inner peripheral end of the adhesive layer 90 is, for example, circular in conformance with the recess 52 as viewed in the z-direction. However, the inner peripheral end of the adhesive layer 90 may have any shape and may be rectangular.

The terahertz element 20 and the reflection film 54 are accommodated in an accommodation space A1 defined by the mount plate 11 and the recess 52. In the present embodiment, the accommodation space A1 is defined by the mount main surface 12 and the antenna surface 53. In the present embodiment, the accommodation space A1 is hermetically sealed by the adhesive layer 90 and other components. Air exists in the accommodation space A1.

As shown in FIGS. 3 to 5, the terahertz device 10 includes a first electrode 94 and a second electrode 101 used for electrical connection with an external device. In the present embodiment, the first electrode 94 and the second electrode 101 are obtained by bending the lead frame 60 along the antenna base 50.

More specifically, the first lead part 61 extends from the first base side surface 51*a* to an outer side of the antenna base 50 and is bent along the antenna base 50 to reach the base back surface 50*b*. The first electrode 94 is formed by the above-described bent portion of the first lead part 61.

The first electrode 94 includes a first proximal portion 94*a*, a first bent portion 94*b* (or curved portion), and a first distal portion 94*c*. The first proximal portion 94*a* is bent toward the first base side surface 51*a* at the corner of the first base side surface 51*a* and the base main surface 50*a*. The first bent portion 94*b* is bent at the corner of the first base side surface 51*a* and the base back surface 50*b*. The first distal portion 94*c* is disposed on the base back surface 50*b*. The first electrode 94 is L-shaped as viewed in the y-direction and extends over the first base side surface 51*a* and the base back surface 50*b*.

The first electrode 94 includes a first side electrode 95 formed on the first base side surface 51*a* and a first back electrode 93 formed on the base back surface 50*b*. The first side electrode 95 is part of the first electrode 94 extending from the first proximal portion 94*a* to the first bent portion 94*b* and is formed on the entire first base side surface 51*a*. The first back electrode 93 is part of the first electrode 94 extending from the first bent portion 94*b* to the first distal portion 94*c*.

In the same manner, the second lead part 71 extends from the second base side surface 51*b* to an outer side of the antenna base 50 and is bent along the antenna base 50 to reach the base back surface 50*b*. The second electrode 101 is formed by the above-described bent portion of the second lead part 71.

The second electrode 101 includes a second proximal portion 101*a*, a second bent portion 101*b* (or curved portion), and a second distal portion 101*c*. The second proximal portion 101*a* is bent toward the second base side surface 51*b* at the corner of the second base side surface 51*b* and the base main surface 50*a*. The second bent portion 101*b* is bent at the corner of the second base side surface 51*b* and the base back surface 50*b*. The second distal portion 101*c* is disposed on the base back surface 50*b*. The second electrode 101 is L-shaped as viewed in the y-direction and extends over the second base side surface 51*b* and the base back surface 50*b*.

The second electrode 101 includes a second side electrode 102 formed on the second base side surface 51*b* and a second back electrode 103 formed on the base back surface 50*b*. The second side electrode 102 is part of the second electrode 101 extending from the second proximal portion 101*a* to the second bent portion 101*b* and is formed on the entire second base side surface 51*b*. The second back electrode 103 is part of the second electrode 101 extending from the second bent portion 101*b* to the second distal portion 101*c*.

In the present embodiment, the two electrodes 94 and 101 are symmetrically at the left side and the right side. The first distal portion 94*c* and the second distal portion 101*c* are separated in the x-direction. This ensures insulation between the electrodes 94 and 101.

Each of the two electrodes 94 and 101 has a width in the y-direction that is set to be equal to the dimension of the antenna base 50 in the y-direction. However, the width of the two electrodes 94 and 101 is not limited to this and may be changed in any manner. For example, the width of the two electrodes 94 and 101 may be less than the dimension of the antenna base 50 in the y-direction.

As described above, the dimension of the antenna base 50 in the z-direction is greater than the thickness of the mount plate 11. In addition, the dimension of the antenna base 50 in the z-direction is greater than the sum of the thickness of the mount plate 11 and the thickness of the lead frame 60. The lead frame 60, which is disposed between the antenna base 50 and the mount plate 11, is disposed at an upper part of the terahertz device 10. Thus, the first proximal portion 94*a* and the second proximal portion 101*a* are disposed at an upper part of the terahertz device 10.

More specifically, when the z-direction is the thickness-wise direction of the terahertz device 10, the first proximal portion 94*a* and the second proximal portion 101*a* are located upward from the center of the terahertz device 10 in the thickness-wise direction (in other words, toward the mount plate 11 or at the side where electromagnetic waves are output).

As shown in FIG. 4, the terahertz device 10 is mounted, for example, on a circuit substrate 113 on which a wiring pattern 114 is formed. More specifically, the terahertz device 10 is configured to be installed so that the base back surface 50*b* is opposed to the circuit substrate 113. When the back electrodes 93 and 103 are bonded to the wiring pattern 114 by a conductive bonding member 115 such as solder, the terahertz device 10 is mounted on the circuit substrate 113.

A method for manufacturing the terahertz device 10 of the present embodiment will now be described. To simplify the description, a method for manufacturing one terahertz device 10 will first be described.

Figure 8:
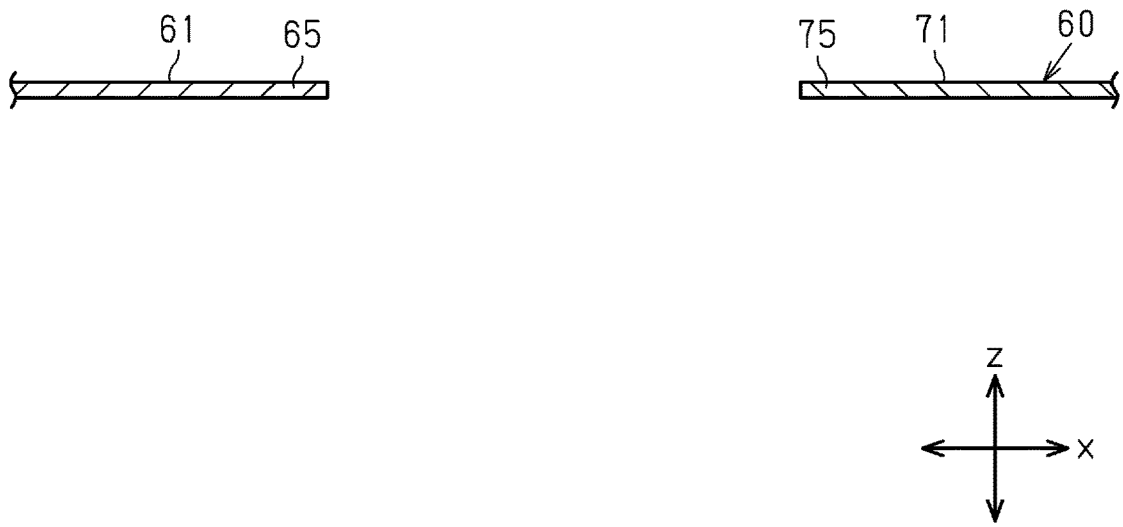
FIG. 8 is an end view showing a step in a method for manufacturing the terahertz device in the first embodiment.

As shown in FIG. 8, the method for manufacturing the terahertz device 10 includes a step of forming the lead frame 60. In this step, the first lead part 61 including the first part opening 63 and the first connector 65 is formed, and the second lead part 71 including the second part opening 73 and the second connector 75 is formed.

Figure 9:
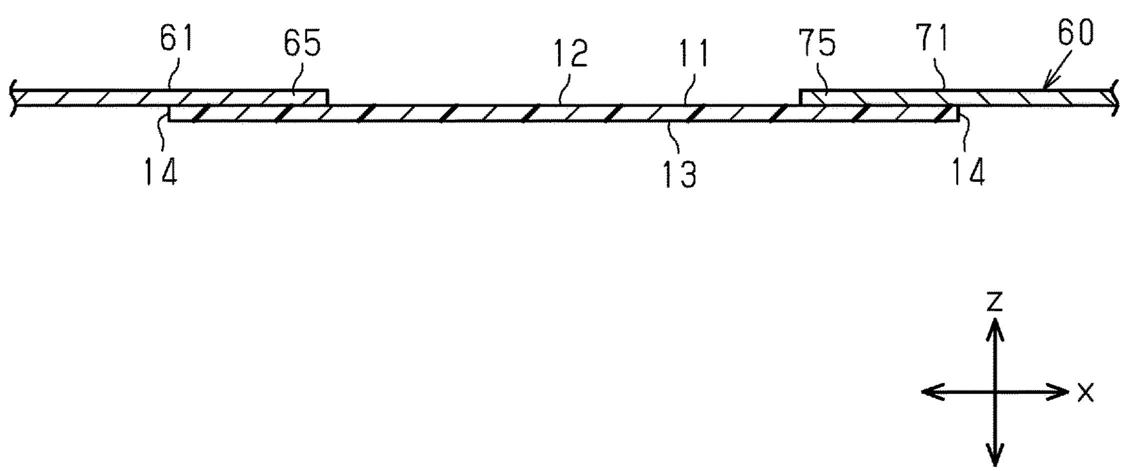
FIG. 9 is an end view showing a step in the method for manufacturing the terahertz device.

As shown in FIG. 9, the method for manufacturing the terahertz device 10 includes a step of forming the mount plate 11. In this step, the mount plate 11 is formed so as to extend over the two lead parts 61 and 71. Any specific process for forming the mount plate 11 may be used.

Figure 10:
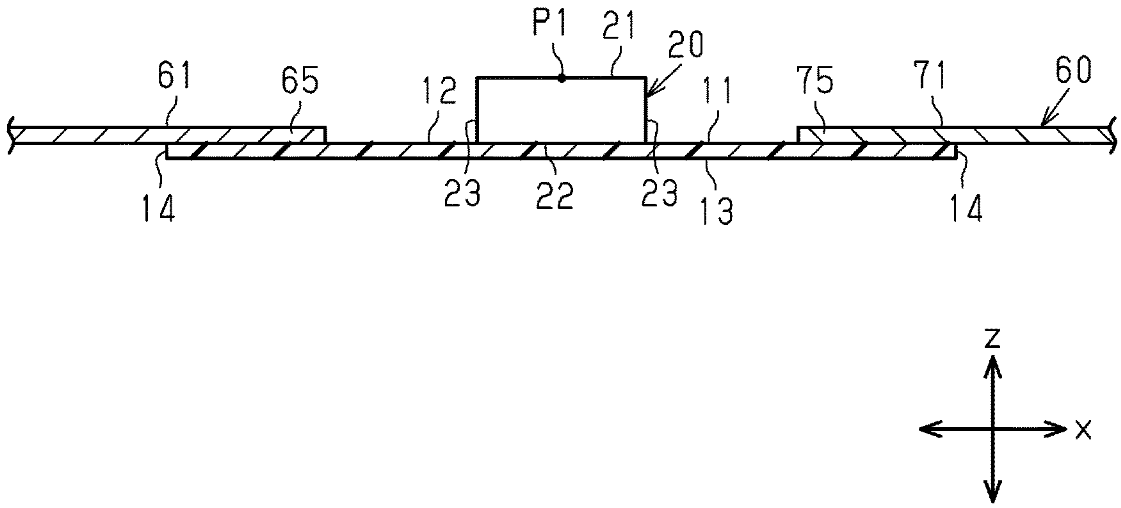
FIG. 10 is an end view showing a step in the method for manufacturing the terahertz device.

As shown in FIG. 10, the method for manufacturing the terahertz device 10 subsequently includes a step of mounting the terahertz element 20 on the mount plate 11. In this step, the terahertz element 20 is mounted on a surface of the mount plate 11 on which the lead frame 60 is formed. This unitizes the lead frame 60, the mount plate 11, and the terahertz element 20.

Figure 11:
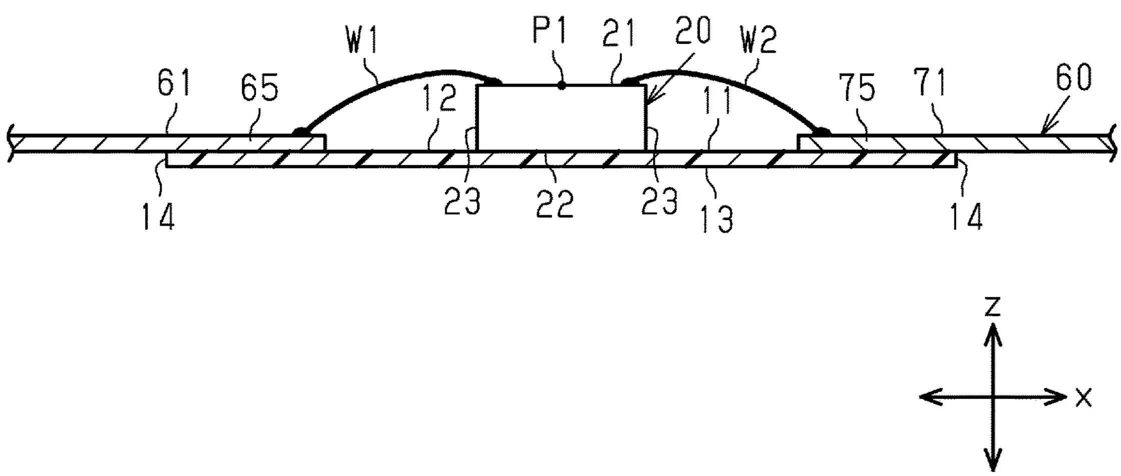
FIG. 11 is an end view showing a step in the method for manufacturing the terahertz device.

As shown in FIG. 11, the method for manufacturing the terahertz device 10 includes a step of electrically connecting the terahertz element 20 and the two lead parts 61 and 71 using the two wires W1 and W2. In this step, the first wire W1 is bonded to the first pad 33*b* and the first lead part 61, and the second wire W2 is bonded to the second pad 34*b* and the second lead part 71. The bonding order may be determined in any manner.

Figure 12:
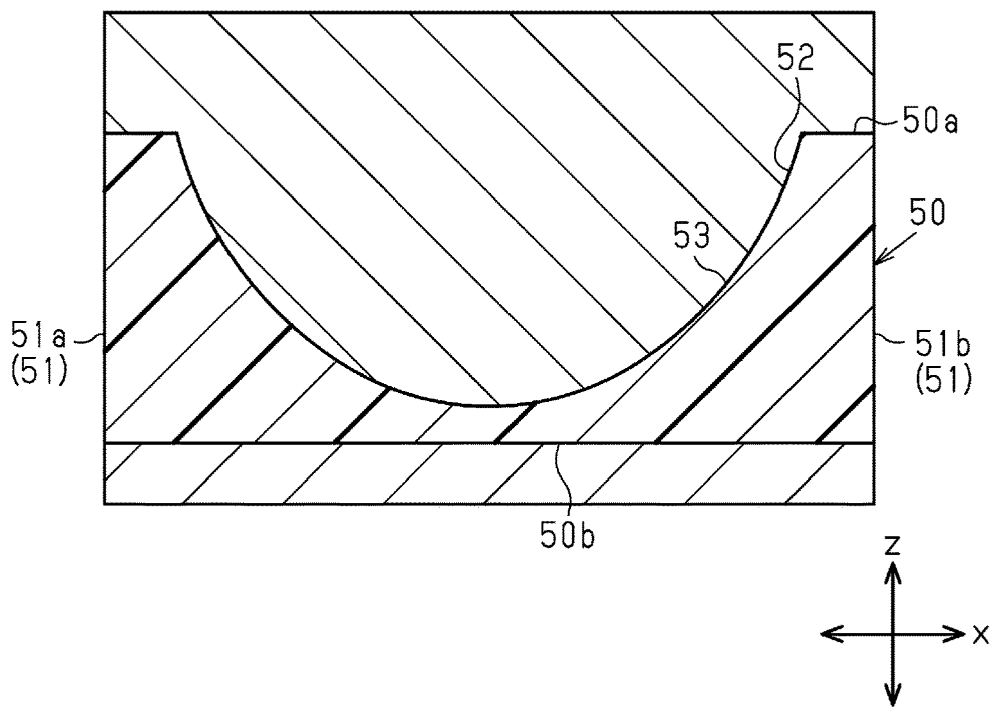
FIG. 12 is an end view showing a step in the method for manufacturing the terahertz device.

As shown in FIG. 12, the method for manufacturing the terahertz device 10 includes a step of forming the recess 52 in the antenna base 50. In this step, molds that are formed in conformance with the antenna surface 53 are used to form the recess 52 having the antenna surface 53.

Figure 13:
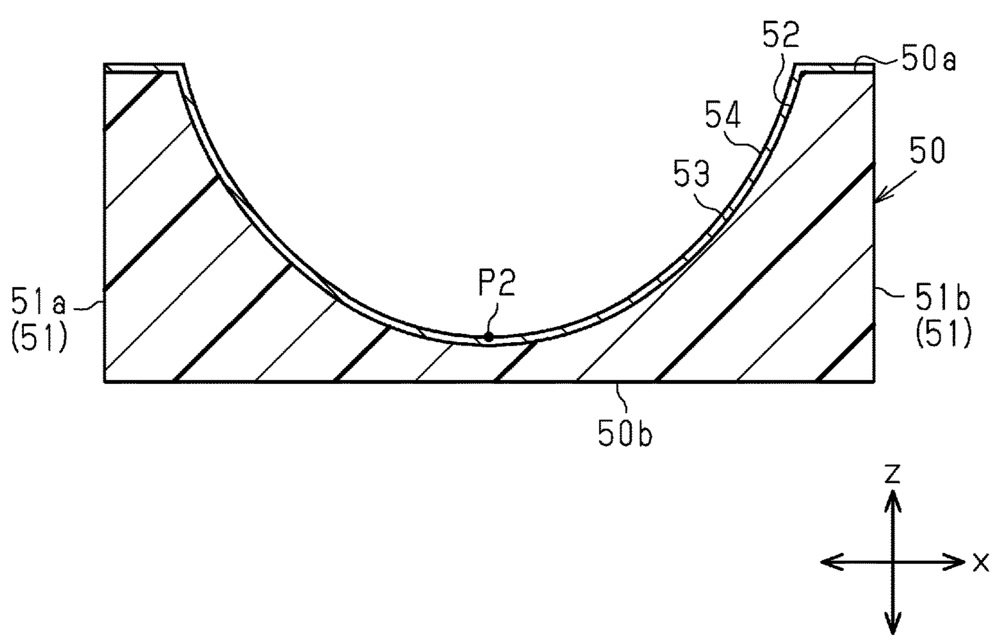
FIG. 13 is an end view showing a step in the method for manufacturing the terahertz device.

As shown in FIG. 13, the method for manufacturing the terahertz device 10 includes a step of forming a metal film forming the reflection film 54, which is performed after the recess 52 is formed. In this step, the metal layer is formed on both the base main surface 50*a* and the antenna surface 53.

Figure 14:
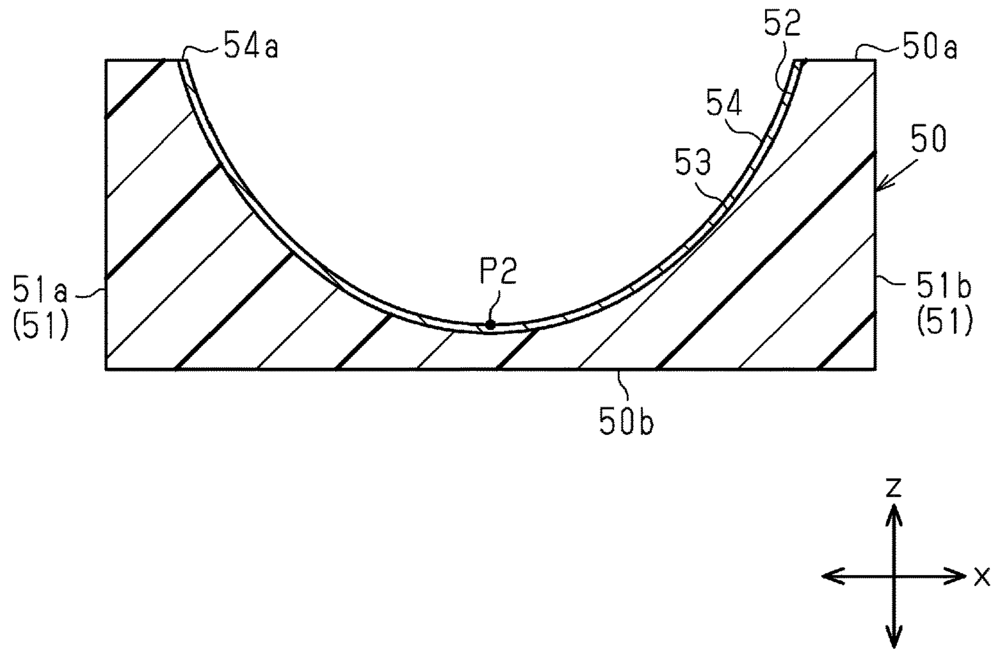
FIG. 14 is an end view showing a step in the method for manufacturing the terahertz device.

As shown in FIG. 14, the method for manufacturing the terahertz device 10 includes a step of removing the metal film from the base main surface 50*a*. Any specific process for removing the metal film from the base main surface 50*a* may be used. For example, the metal film may be removed by patterning or an abrasive process. As a result, the metal film is formed on only the antenna surface 53 as the reflection film 54.

The step of forming the metal film is not limited to the above-described steps. For example, the method for manufacturing the terahertz device 10 may include a step of masking the base main surface 50*a* and a step of forming a metal film on the antenna surface 53 by vapor deposition using electron beams. This case eliminates the need for the step of removing the metal film from the base main surface 50*a*.

Figure 15:
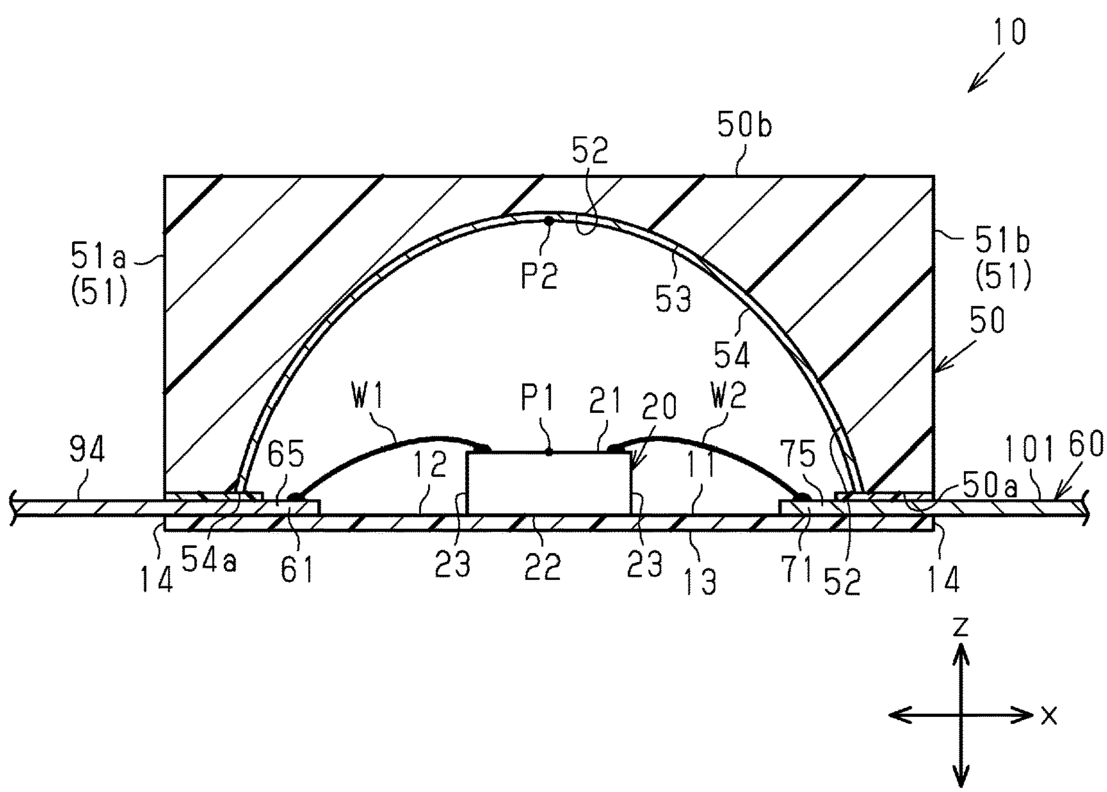
FIG. 15 is an end view showing a step in the method for manufacturing the terahertz device.

As shown in FIG. 15, the method for manufacturing the terahertz device 10 includes a step of coupling the unitized body of the lead frame 60, the mount plate 11, and the terahertz element 20 to the antenna base 50 on which the reflection film 54 is formed. In this step, the adhesive layer 90 is used to adhere the antenna base 50 and the lead frame 60.

Figure 16:
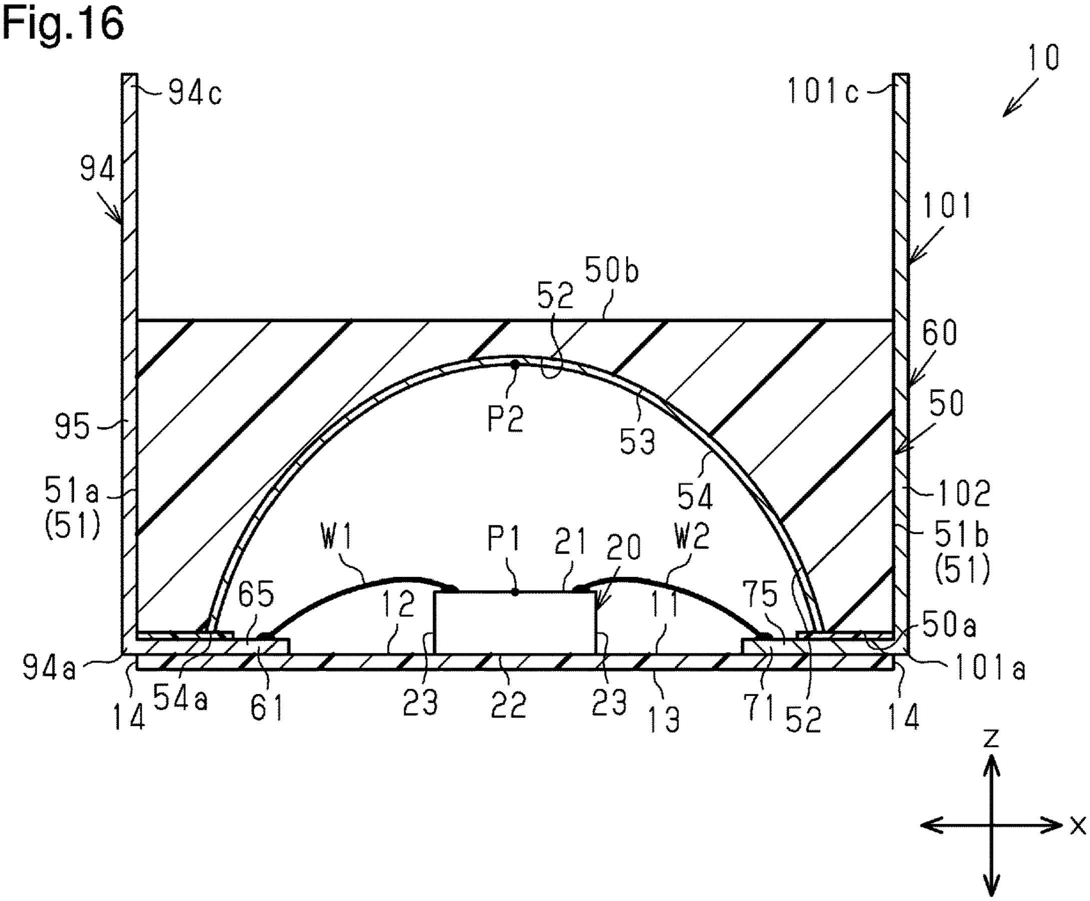
FIG. 16 is an end view showing a step in the method for manufacturing the terahertz device.

As shown in FIG. 16, the method for manufacturing the terahertz device 10 subsequently includes a first bending step of bending the lead frame 60. In the first bending step, the lead frame 60 (the two lead parts 61 and 71), which projects sideward from the antenna base 50, is bent at the corners of the antenna base 50 so as to extend along the base side surfaces 51*a* and 51*b* of the antenna base 50. This forms the side electrodes 95 and 102.

Figure 17:
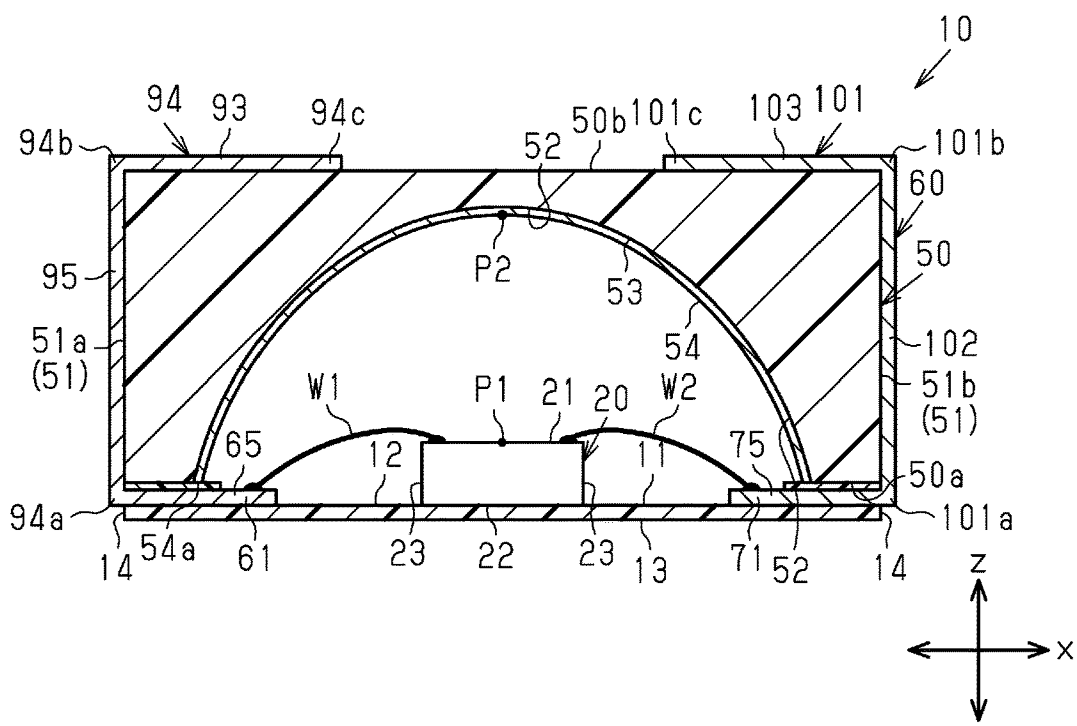
FIG. 17 is an end view showing a step in the method for manufacturing the terahertz device.

As shown in FIG. 17, the method for manufacturing the terahertz device 10 subsequently includes a second bending step of further bending the lead frame 60. In the second bending step, the lead frame 60, which projects upward from the antenna base 50, is bent at the corners of the antenna base 50 so as to extend along the base back surface 50*b* of the antenna base 50. This forms the bent portions 94*b* and 101*b* and the back electrodes 93 and 103. As a result, the terahertz device 10 is formed.

To simplify the description, the method for manufacturing one terahertz device 10 has been described above. However, practically, a plurality of terahertz devices 10 may be simultaneously manufactured.

Figure 18:
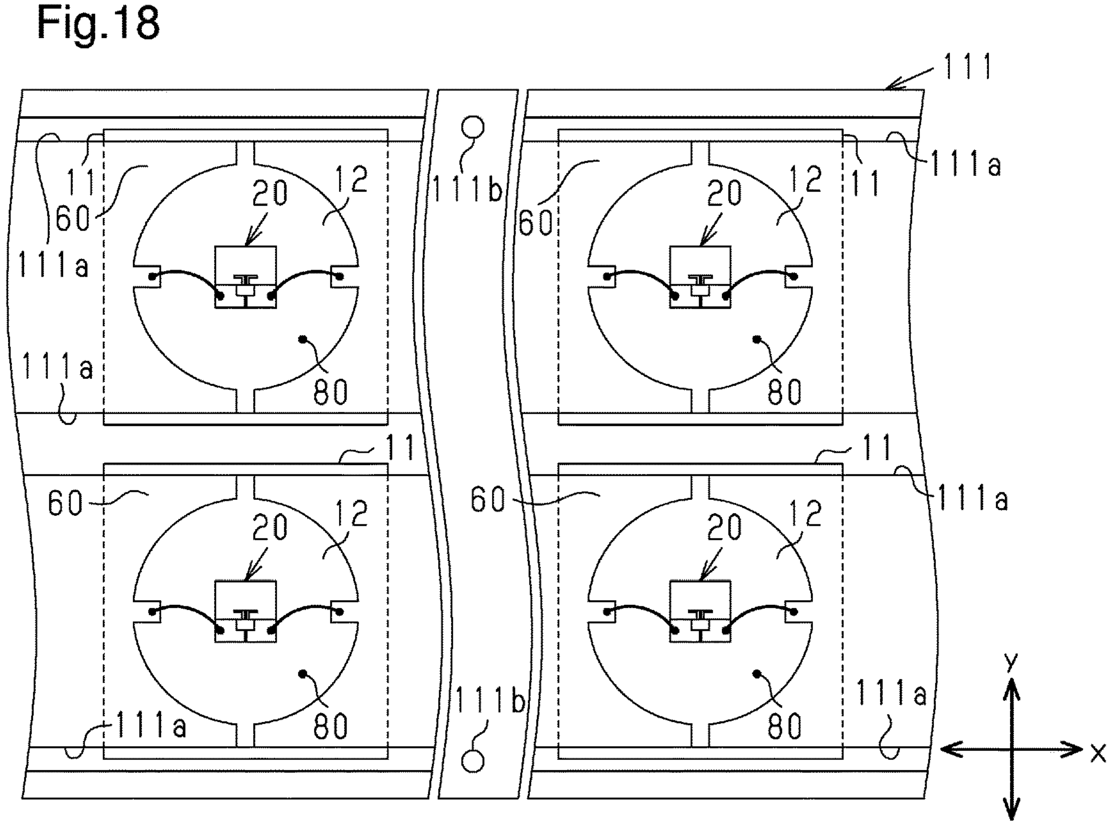
FIG. 18 is a plan view showing a step in the method for manufacturing the terahertz device.

For example, as shown in FIG. 18, a metal plate 111, including a plurality of lead frames 60 and including punched-out portions corresponding to the openings 80, is prepared. A plurality of mount plates 11 and a plurality of terahertz elements 20 are mounted on the metal plate 111. The metal plate 111 is punched out along the ends of the lead frames 60 in the y-direction to form first through holes 111*a*. The first through holes 111*a* are, for example, slit-shaped and extend from opposite sides of the mount plate 11 in the x-direction by an amount corresponding to the two electrodes 94 and 101.

Figure 19:
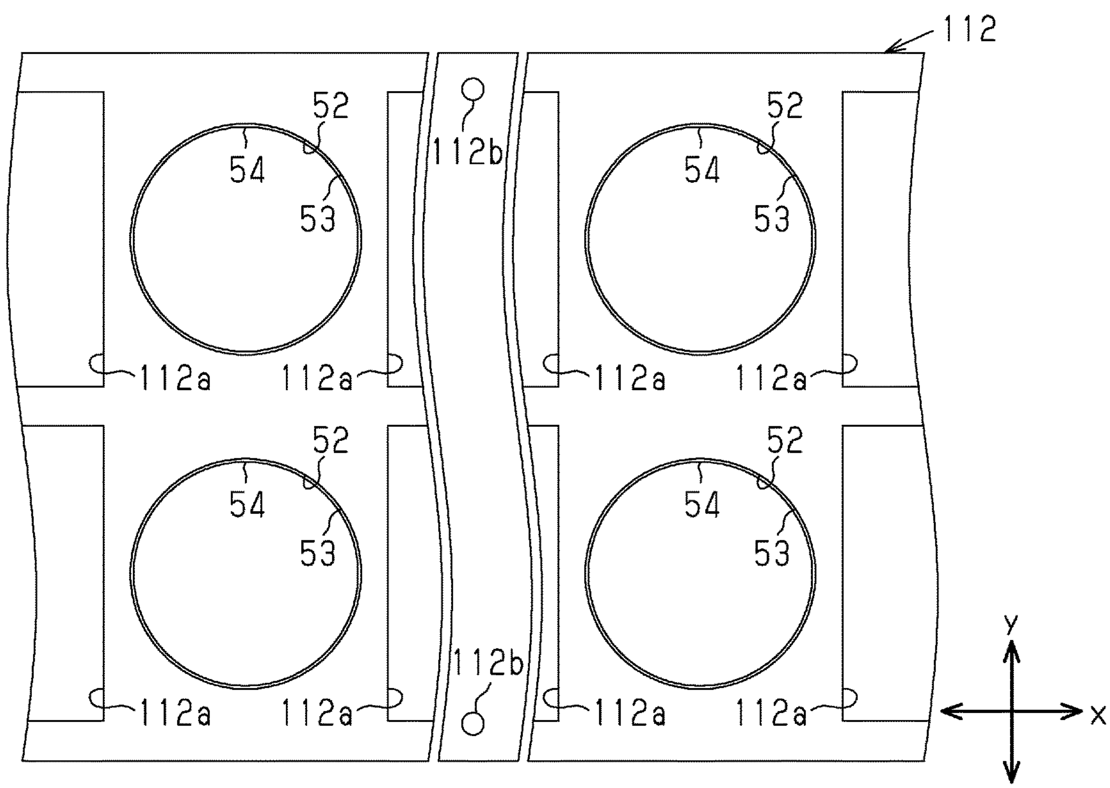
FIG. 19 is a plan view showing a step in the method for manufacturing the terahertz device.

Meanwhile, as shown in FIG. 19, a base body 112, in which the recesses 52 and the reflection films 54 are formed, is prepared. Second through holes 112*a* are formed in portions of the base body 112 corresponding to where the lead frames 60 are exposed. The second through holes 112*a* are formed in portions opposed to the electrodes 94 and 101 when the metal plate 111 is adhered to the base body 112. The metal plate 111, which includes the mount plates 11 and the terahertz elements 20, and the base body 112 are positioned and adhered to each other by an adhesive. Subsequently, the metal plate 111 and the base body 112 are cut by dicing. Then, the lead frames 60 are bent. This manufactures a plurality of terahertz devices 10.

The metal plate 111 may include first positioning portions 111*b*, and the base body 112 may include second positioning portions 112*b*. When adhering the metal plate 111 to the base body 112, the metal plate 111 and the base body 112 may be positioned so that the first positioning portions 111*b* overlap the second positioning portions 112*b*.

Operation of the present embodiment will now be described.

When electromagnetic waves are generated from the oscillation point P1 of the terahertz element 20, the reflection film 54 reflects and emits the electromagnetic waves in one direction.

In addition, in the present embodiment, the two electrodes 94 and 101 are formed on the base back surface 50*b*, which defines the bottom surface of the terahertz device 10. This allows the terahertz device 10 to be mounted on the circuit substrate 113 with an orientation so that the base back surface 50*b* faces the circuit substrate 113. Thus, the terahertz device 10 is readily mounted on the circuit substrate 113.

The present embodiment, which has been described above, has the following advantages.

(1-1) The terahertz device 10 includes the mount plate 11 used as the base member, the terahertz element 20 mounted on the mount plate 11, the antenna base 50 located opposing the mount plate 11 and including the antenna surface 53, and the reflection film 54 formed on the antenna surface 53. The reflection film 54 reflects at least part of electromagnetic waves generated by the terahertz element 20 in one direction (for example, upward). With this structure, electromagnetic waves generated by the terahertz element are emitted in one direction. This increases the output of the electromagnetic waves emitted from the terahertz device 10. Thus, the gain of the terahertz device 10 is improved.

(1-2) The terahertz device 10 includes the electrodes 94 and 101 used for electrical connection with an external device. The electrodes 94 and 101 include the side electrodes 95 and 102, which are formed on the base side surfaces 51*a* and 51*b*, and the back electrodes 93 and 103, which are formed on the base back surface 50*b*. With this structure, the side electrodes 95 and 102 or the back electrodes 93 and 103 are electrically connected to the wiring pattern 114 of the circuit substrate 113 in a relatively easy manner. Thus, the terahertz device 10 is readily mounted on the circuit substrate 113.

(1-3) The electrodes 94 and 101 are obtained by bending the lead frame 60 along the antenna base 50. In this structure, the lead frame 60, which is relatively easy to bend, is used as the electrodes 94 and 101. Thus, the side electrodes 95 and 102 and the back electrodes 93 and 103 are readily formed. In addition, the bending of the lead frame 60 along the antenna base 50 limits sideward projection of the lead frame 60. As a result, the terahertz device 10 is reduced in size in the x-direction.

(1-4) The first electrode 94 includes the first proximal portion 94*a*, the first bent portion 94*b*, and the first distal portion 94*c*. The first proximal portion 94*a* is bent toward the first base side surface 51*a* at the corner of the first base side surface 51*a* and the base main surface 50*a*. The first bent portion 94*b* is bent at the corner of the first base side surface 51*a* and the base back surface 50*b*. The first distal portion 94*c* is disposed on the base back surface 50*b*. The first side electrode 95 extends from the first proximal portion 94*a* to the first bent portion 94*b*. The first back electrode 93 extends from the first bent portion 94*b* to the first distal portion 94*c*.

In the same manner, the second electrode 101 includes the second proximal portion 101*a*, the second bent portion 101*b*, and the second distal portion 101*c*. The second proximal portion 101*a* is bent toward the second base side surface 51*b* at the corner of the second base side surface 51*b* and the base main surface 50*a*. The second bent portion 101*b* is bent at the corner of the second base side surface 51*b* and the base back surface 50*b*. The second distal portion 101*c* is disposed on the base back surface 50*b*. The second side electrode 102 extends from the second proximal portion 101*a* to the second bent portion 101*b*. The second back electrode 103 extends from the second bent portion 101*b* to the second distal portion 101*c*.

With this structure, the side electrodes 95 and 102 and the back electrodes 93 and 103 are obtained by bending the lead frame 60 at each corner of the antenna base 50 used as a support point. Thus, the side electrodes 95 and 102 and the back electrodes 93 and 103 are relatively easily formed.

(1-5) The two distal portions 94*c* and 101*c* are separate from each other in the x-direction. This structure ensures insulation of the two electrodes 94 and 101.

(1-6) The terahertz element 20 includes the element main surface 21, which includes the oscillation point P1 configured to generate electromagnetic waves, and the element back surface 22, which is opposite the element main surface 21. The reflection film 54 is disposed at the side of the element main surface 21, not at the side of the element back surface 22. In this structure, electromagnetic waves readily reach the reflection film 54. Thus, the reflection film 54 is appropriately used to reflect electromagnetic waves generated from the oscillation point P1.

(1-7) The terahertz element 20 radiates electromagnetic waves from the oscillation point P1 in the range of the opening angle θ. The reflection film 54 is formed over an angle that is greater than or equal to the opening angle θ of the oscillation point P1. With this structure, the electromagnetic waves radiated from the oscillation point P1 in the range of the opening angle θ are reflected by the reflection film 54. This reduces electromagnetic waves that are not reflected by the reflection film 54, thereby improving the gain.

(1-8) The reflection film 54 is parabolic-antenna-shaped. With this structure, electromagnetic waves are appropriately reflected in one direction.

(1-9) The reflection film 54 is disposed so that the focal point of the reflection film 54 is located at the oscillation point P1. With this structure, electromagnetic waves generated from the oscillation point P1 are guided in one direction by the reflection film 54. This reduces electromagnetic waves that are not reflected in one direction by the reflection film 54, thereby improving the gain.

(1-10) The reflection film 54 is disposed at a position corresponding to the frequency of electromagnetic waves generated by the terahertz element 20 so that the electromagnetic waves resonate. In an example, the specified distance z1, which is the perpendicular distance from the oscillation point P1 toward the reflection film 54, is set to satisfy the resonance condition of the electromagnetic waves, for example, $(\lambda'_A/4)+((\lambda'_A/2)\times N)$. This structure improves the gain of the terahertz device 10.

(1-11) The reflection film 54 is electrically isolated. This structure obviates disadvantages such as absorption of electromagnetic waves by the reflection film 54.

(1-12) The antenna base 50 is formed of an insulative material. This structure limits electrical connection of the reflection film 54 with another member via the antenna base 50.

(1-13) The mount plate 11, which is used as the base member, includes the mount main surface 12 on which the terahertz element 20 is mounted. The antenna base 50 includes the base main surface 50*a*, which is opposed to the mount main surface 12, and the recess 52, which is recessed from the base main surface 50*a* and includes the antenna surface 53. The terahertz element 20 and the reflection film 54 are disposed in the accommodation space A1 defined by the mount main surface 12 and the antenna surface 53. This structure reduces external effects on the terahertz element 20 and the reflection film 54.

(1-14) The reflection film 54 is formed on the antenna surface 53 but is not formed on the base main surface 50*a*. This structure obviates reflection of electromagnetic waves by the reflection film 54 formed on the base main surface 50*a*. Thus, disadvantages caused by unwanted reflection waves, for example, the occurrence of standing waves, are limited.

(1-15) The lead frame 60, which is used as a conductive member, is disposed on the mount main surface 12. The antenna base 50 is adhered to the lead frame 60 by the adhesive layer 90. The adhesive layer 90 is formed from an insulative material and is disposed between the reflection film 54 and the lead frame 60. In this structure, the adhesive layer 90 restricts contact of the reflection film 54 with the lead frame 60. Thus, electrical connection of the reflection film 54 with the lead frame 60 is hindered.

(1-16) The lead frame 60 includes the opening 80 overlapping at least a portion of the reflection film 54 as viewed in the z-direction. In this structure, electromagnetic waves reflected by the reflection film 54 are output through the opening 80. This limits interruption of electromagnetic waves by the lead frame 60.

(1-17) The lead frame 60 includes the first lead part 61 and the second lead part 71, which are separated and opposed to each other. The opening 80 includes the gap 81 between the two lead parts 61 and 71. This structure limits interruption (blocking) of electromagnetic waves by the lead frame 60 while ensuring the insulation properties of the two lead parts 61 and 71.

(1-18) The opening 80 includes the first part opening 63 formed in a portion of the first lead part 61 that overlaps the reflection film 54 as viewed in the z-direction and is continuous with the gap 81. The opening 80 includes the second part opening 73 formed in a portion of the second lead part 71 that overlaps the reflection film 54 as viewed in the z-direction and is continuous with the gap 81. In this structure, the interruption of electromagnetic waves by the lead frame 60 is further limited.

(1-19) The first lead part 61 includes the first connector 65 configured to be electrically connected to the terahertz element 20. The first connector 65 projects from the first inner surface 64, which is the wall surface of the first part opening 63, toward the terahertz element 20 and overlaps the reflection film 54 as viewed in the z-direction. The second lead part 71 includes the second connector 75 configured to be electrically connected to the terahertz element 20. The second connector 75 projects from the second inner surface 74, which is the wall surface of the second part opening 73, toward the terahertz element 20 and overlaps the reflection film 54 as viewed in the z-direction. In this structure, while limiting interruption of electromagnetic waves by the lead frame 60, the two lead parts 61 and 71 are electrically connected to the terahertz element 20.

(1-20) The terahertz device 10 includes the first wire W1 and the second wire W2. The first wire W1 connects the first connector 65 to the first pad 33*b* formed on the terahertz element 20, The second wire W2 connects the second connector 75 to the second pad 34*b* formed on the terahertz element 20. As viewed in the z-direction, the projection dimension of the first connector 65 from the first inner surface 64 is less than the length of the first wire W1. With this structure, interruption of electromagnetic waves by the first connector 65 is limited as the projection dimension of the first connector 65 is decreased. In the same manner, as viewed in the z-direction, the projection dimension of the second connector 75 from the second inner surface 74 may be less than the length of the second wire W2.

(1-21) The two connectors 65 and 75 are opposed to each other at opposite sides of the terahertz element 20. In this structure, the two wires W1 and W2 are less likely to interfere with each other. Thus, contact of the two wires W1 and W2 is avoided.

Modified Example of First Embodiment

Figure 20:
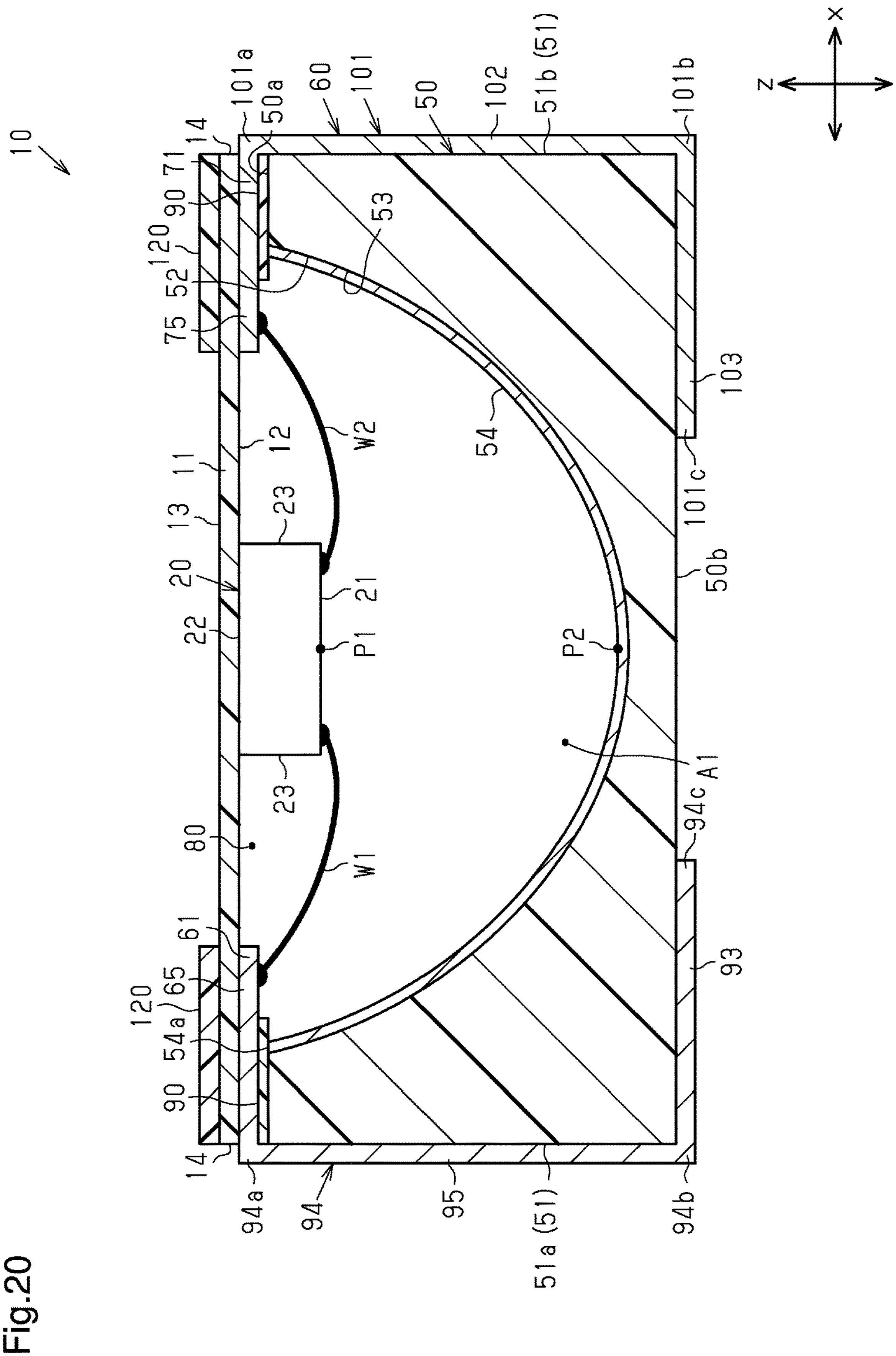
FIG. 20 is an end view of a modified example of the terahertz device of the first embodiment.

As shown in FIG. 20, the terahertz device 10 may include a reflection reduction film 120 formed on the mount back surface 13. The reflection reduction film 120 may refer to a reflection prevention film or an anti-reflection (AR) coating film.

For example, the reflection reduction film 120 may be formed on at least a portion of the part of the mount back surface 13 overlapping the lead frame 60 as viewed in the z-direction. In an example, the reflection reduction film 120 is formed on the entirety of the part of the mount back surface 13 overlapping the lead frame 60 as viewed in the z-direction. This limits the occurrence of standing waves caused by reflection of electromagnetic waves at the lead frame 60. Any specific structure of the reflection reduction film 120 may be used as long as reflection of electromagnetic waves in at least the terahertz band is reduced.

Second Embodiment

Figure 21:
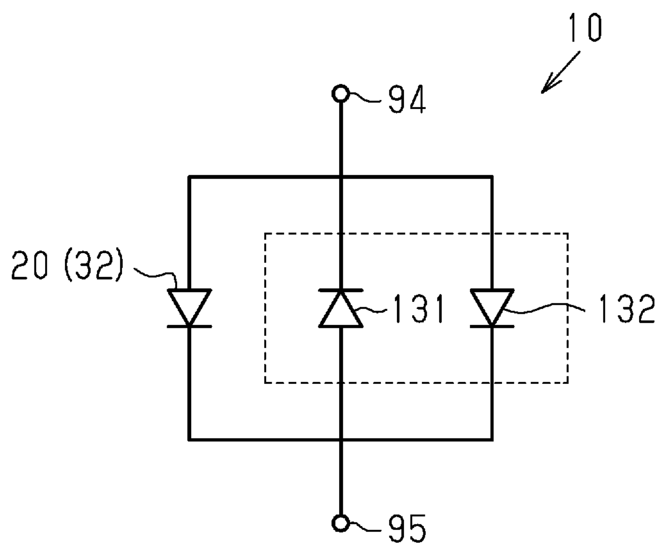
FIG. 21 is a circuit diagram showing the overview of a second embodiment of a terahertz device.

As shown in FIG. 21, the present embodiment of a terahertz device 10 includes protection diodes 131 and 132, which are an example of a specific element that is electrically connected to the terahertz element 20. The protection diodes 131 and 132 are electrically connected to the terahertz element 20. In the present embodiment, the protection diodes 131 and 132 are connected to the terahertz element 20 in parallel. The two protection diodes 131 and 132 are connected to the terahertz element 20 in opposite directions. The protection diodes 131 and 132 may be general diodes or Zener diodes, Schottky diodes, or light emitting diodes.

The specific element is not limited to the protection diodes 131 and 132 and may be a control integrated circuit (IC) (e.g., application-specific integrated circuit (ASIC)). The control IC may be configured to, for example, detect current flowing to the terahertz element 20, serve as an amplifier, supply power to the terahertz element 20, or process signals. The specific element may be connected to the terahertz element 20 in any mode and may be, for example, connected in series.

Figure 22:
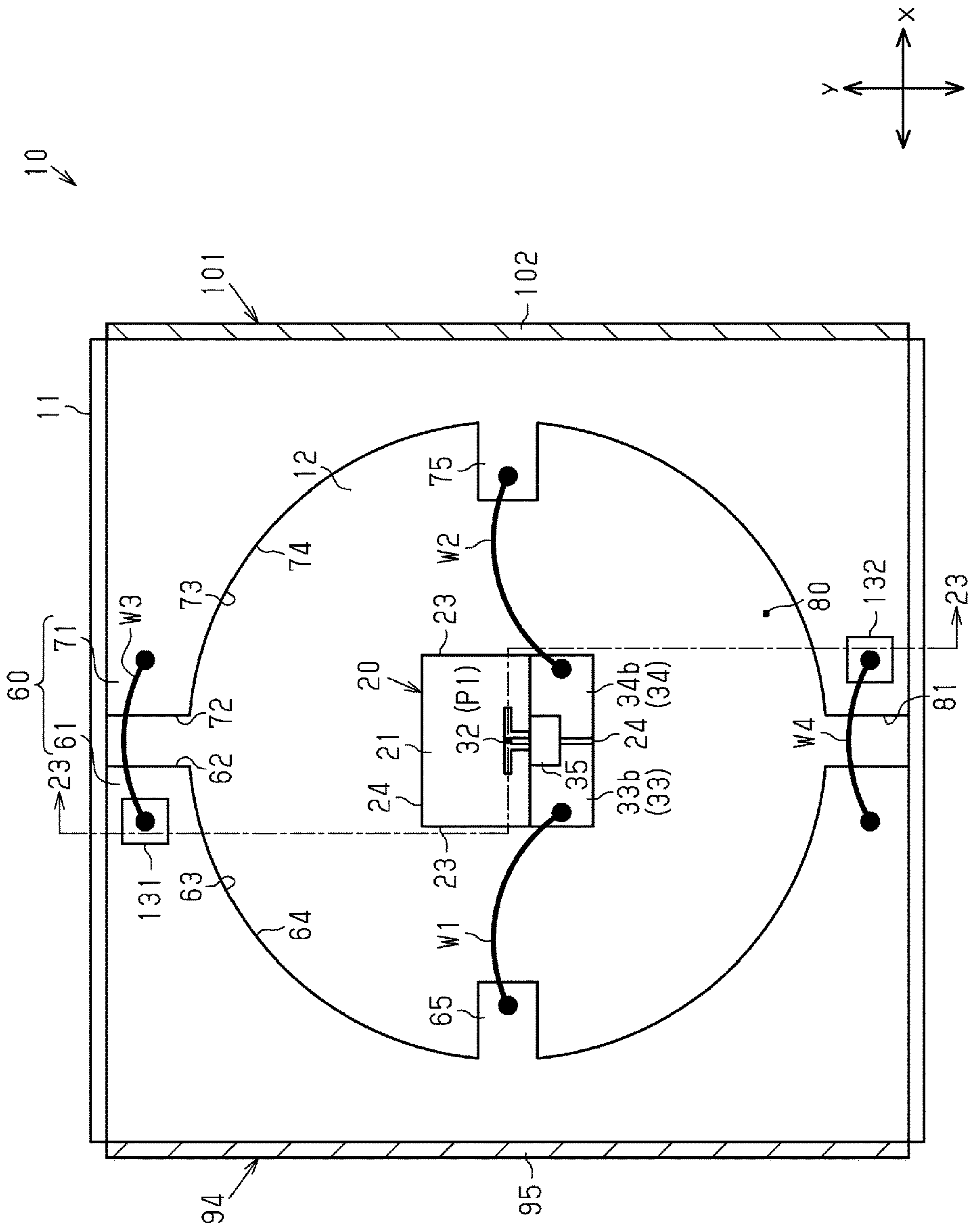
FIG. 22 is a front view of a terahertz element and a lead frame in the second embodiment.
Figure 23:
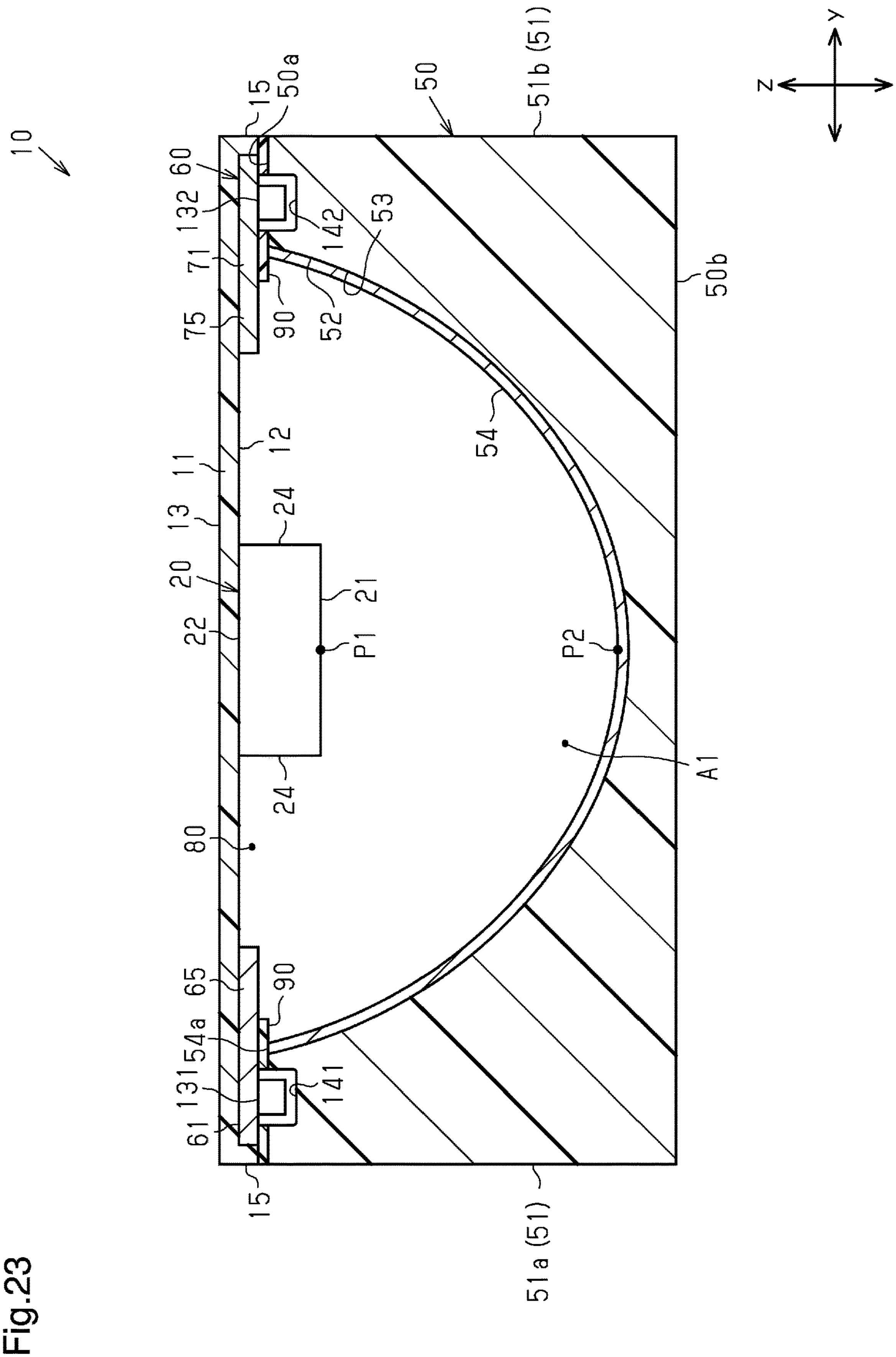
FIG. 23 is an end view taken along line 23-23 in FIG. 22.

As shown in FIGS. 22 and 23, the two protection diodes 131 and 132 are opposed to each other at opposite sides of the terahertz element 20. The two protection diodes 131 and 132 are mounted on the lead frame 60.

More specifically, the first protection diode 131 is disposed on the first lead part 61 and electrically connected to the first lead part 61. The first protection diode 131 is disposed, for example, near the first part opening 63 on the first lead part 61. In the present embodiment, the first protection diode 131 is disposed in a region surrounded by the first inner surface 64, the first lead opposing surface 62, and the end surface of the first lead part 61 in the y-direction.

The first protection diode 131 and the second lead part 71 are electrically connected by a first diode wire W3. Thus, the first protection diode 131 is electrically connected to the two electrodes 94 and 101.

The first diode wire W3 is bonded to the second lead part 71 at a position close to the first protection diode 131, that is, a region defined by the second inner surface 74, the second lead opposing surface 72, and the end surface of the second lead part 71 in the y-direction. This reduces the length of the first diode wire W3.

In the same manner, the second protection diode 132 is disposed on the second lead part 71 and electrically connected to the second lead part 71. The second protection diode 132 is disposed, for example, near the second part opening 73 on the second lead part 71. In the present embodiment, the second protection diode 132 is disposed in a region surrounded by the second inner surface 74, the second lead opposing surface 72, and the end surface of the second lead part 71 in the y-direction.

The second protection diode 132 and the first lead part 61 are electrically connected by a second diode wire W4. Thus, the second protection diode 132 is electrically connected to the two electrodes 94 and 101.

The second diode wire W4 is bonded to the first lead part 61 at a position closet to the second protection diode 132, that is, a region surrounded by the first inner surface 64, the first lead opposing surface 62, and the end surface of the first lead part 61 in the y-direction. This reduces the length of the second diode wire W4.

As shown in FIG. 23, in the present embodiment, the antenna base 50 includes receptacles 141 and 142 that are recessed from the base main surface 50*a*. The protection diodes 131 and 132 are accommodated in the receptacles 141 and 142. The receptacles 141 and 142 are formed around the recess 52 so as not to be continuous with the recess 52. That is, the receptacles 141 and 142 are arranged separately from the recess 52 to accommodate the specific elements. As shown in FIG. 23, the adhesive layer 90 is not formed on locations corresponding to the receptacles 141 and 142.

The present embodiment, which has been described above, has the following operational advantages.

(2-1) The terahertz device 10 includes the protection diodes 131 and 132 connected to the terahertz element 20 in parallel. With this structure, for example, when static electricity causes to a high voltage to be applied to opposite ends of the terahertz element 20, current flows through the protection diodes 131 and 132. Thus, an excessive current flowing to the terahertz element 20 is limited, so that the terahertz element 20 is protected.

(2-2) The two protection diodes 131 and 132 are connected to the terahertz element 20 in opposite directions. With this structure, the terahertz element 20 is protected from a high voltage produced in each direction.

(2-3) The antenna base 50 includes the receptacles 141 and 142 recessed from the base main surface 50*a*. The protection diodes 131 and 132 are accommodated in the receptacles 141 and 142. This structure limits increases in the size of the terahertz device 10 caused by arrangement of the protection diodes 131 and 132.

Modified Examples

In each embodiment, the terahertz device 10 may be modified, for example, as follows. The modified examples described below may be combined with one another as long as there is no technical inconsistency. For the sake of convenience, the following modified examples will be basically described using the first embodiment. However, other embodiments may be used as long as there is no technical inconsistency.

Figure 24:
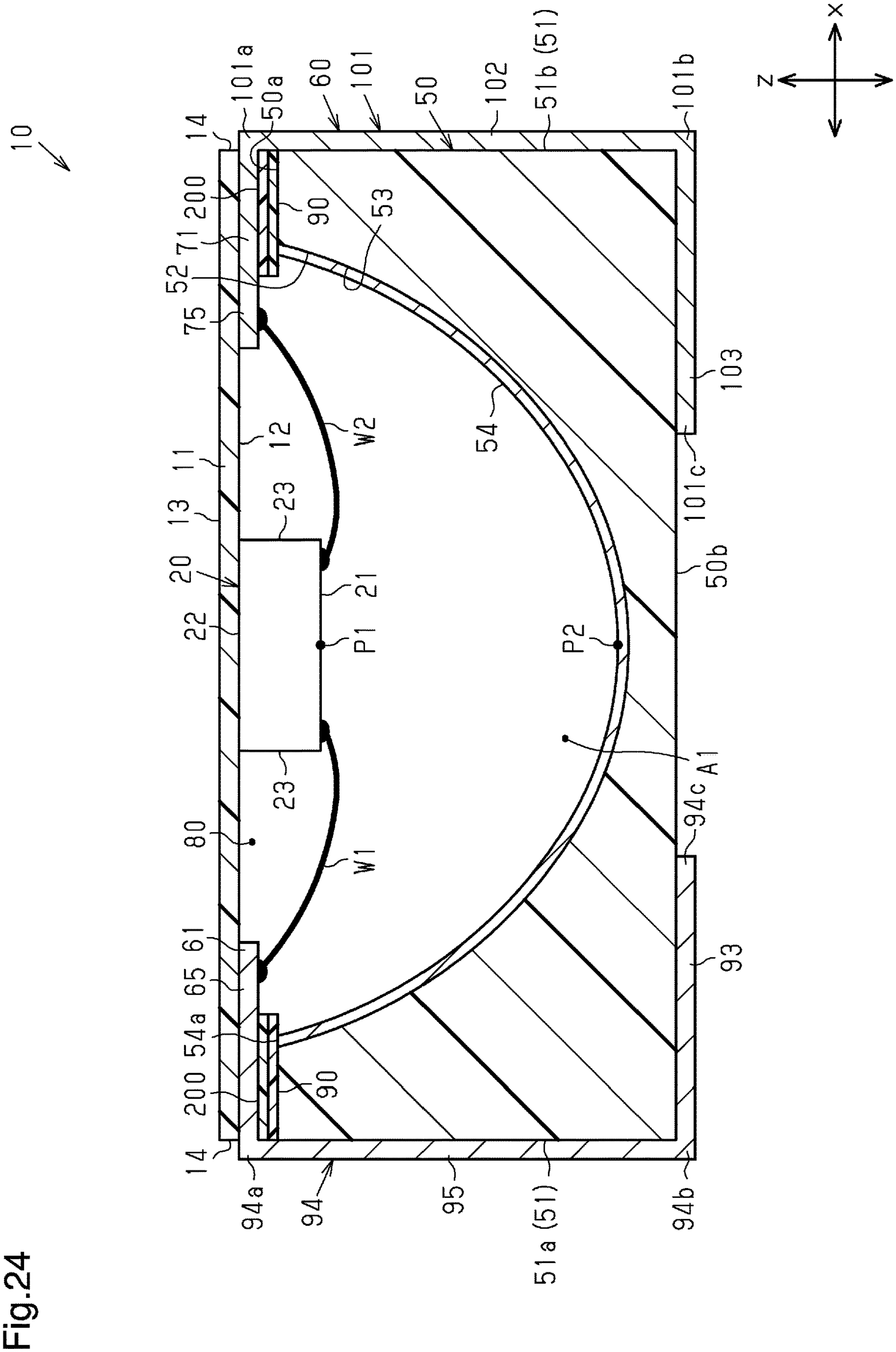
FIG. 24 is a schematic end view showing a modified example of a terahertz device.

As shown in FIG. 24, the terahertz device 10 may include a spacer 200 that is different from the adhesive layer 90 to insulate the reflection film 54 from the lead frame 60. The spacer 200 is insulative. The spacer 200 is also disposed between the reflection film 54 and the lead frame 60. In FIG. 24, the spacer 200 is disposed between the lead frame 60 and the adhesive layer 90. However, alternatively, the spacer 200 may be disposed between the antenna base 50 and the adhesive layer 90.

In this configuration, contact of the reflection film 54 with the lead frame 60 is restricted by the spacer 200 and the adhesive layer 90. Thus, the contact of the reflection film 54 with the lead frame 60 is further restricted.

Figure 25:
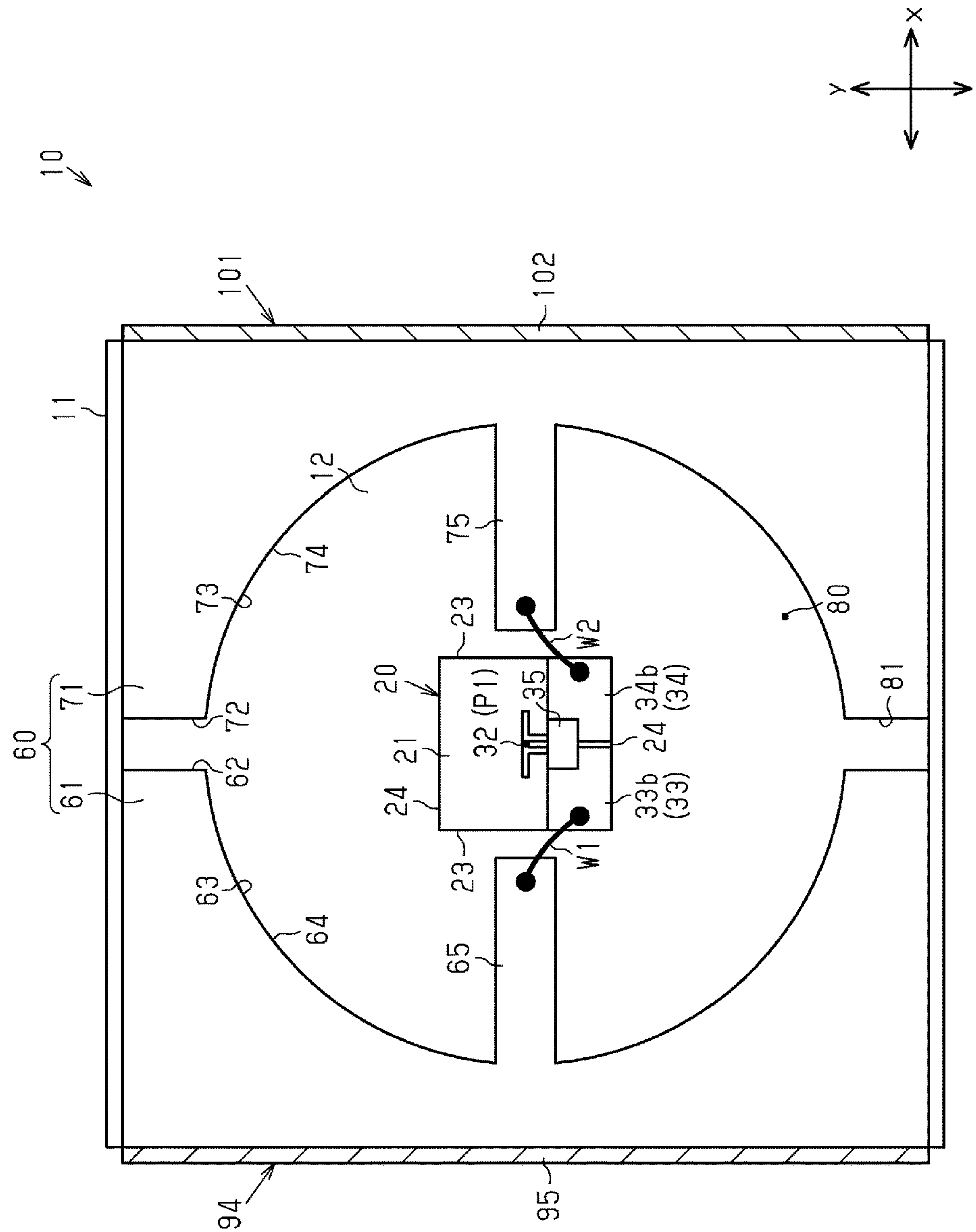
FIG. 25 is a front view showing a modified example of connectors.

As shown in FIG. 25, the first connector 65 and the second connector 75 may extend to the vicinity of the terahertz element 20. For example, the distal portion of the first connector 65 may be located closer to the terahertz element 20 than to the first inner surface 64, and the distal portion of the second connector 75 may be located closer to the terahertz element 20 than to the second inner surface 74. In other words, the projection dimension of each of the two connectors 65 and 75 may be greater than ¼ of the opening width of the reflection film 54.

In addition, as viewed in the z-direction, the length of the first wire W1 may be less than the projection dimension of the first connector 65 from the first inner surface 64. In the same manner, the length of the second wire W2 may be less than the projection dimension of the second connector 75 from the second inner surface 74. In this structure, the length of the wires W1 and W2 is decreased, thereby limiting adverse effects on the responsiveness caused by the wires W1 and W2.

Figure 26:
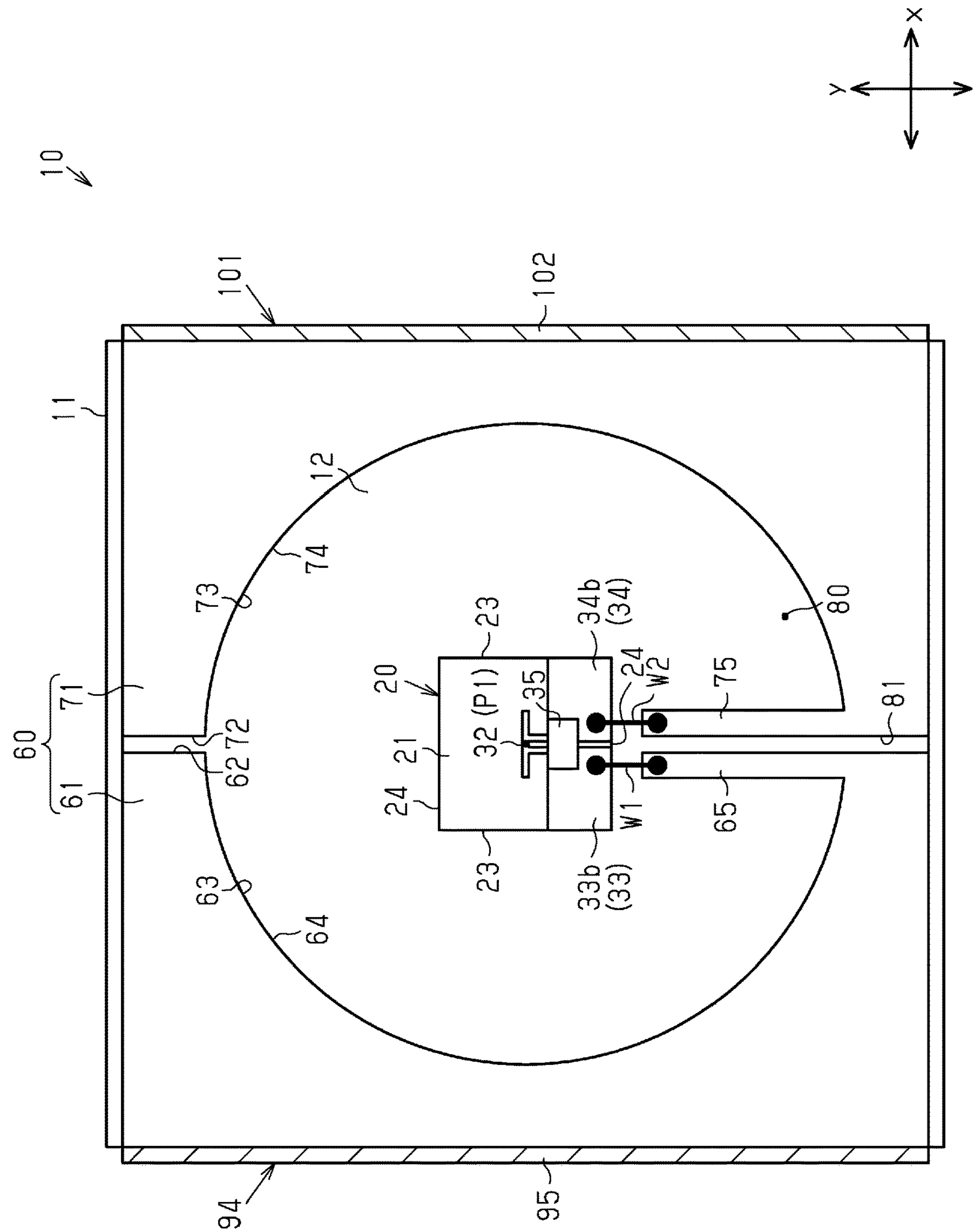
FIG. 26 is a front view showing a modified example of connectors.

As shown in FIG. 26, the first connector 65 and the second connector 75 may be arranged parallel to each other. This structure improves the responsiveness of the terahertz device 10.

The first connector 65 and the second connector 75 may be omitted.

Figure 27:
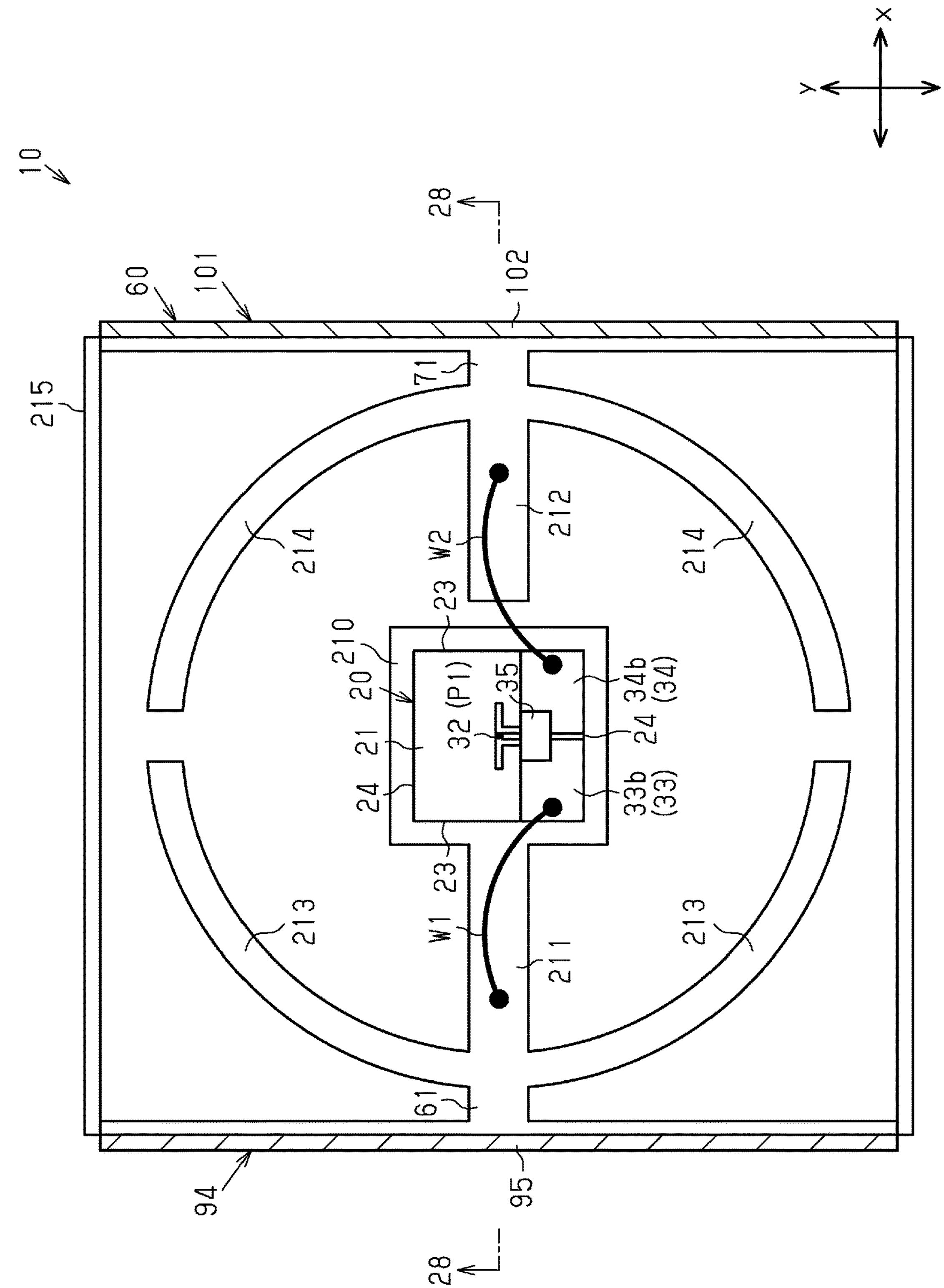
FIG. 27 is a front view showing a modified example of a lead frame.
Figure 28:
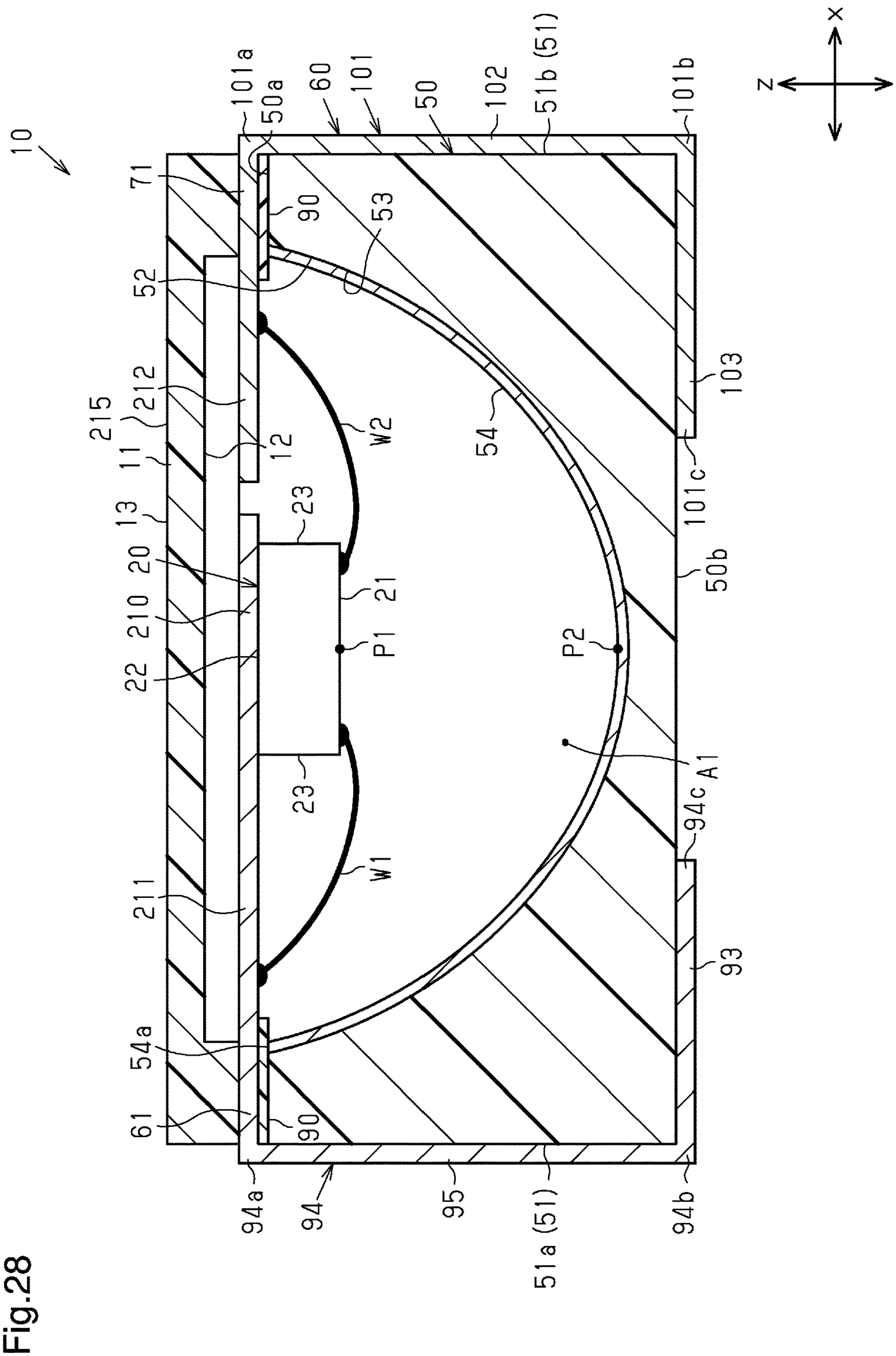
FIG. 28 is an end view taken along line 28-28 in FIG. 27.

As shown in FIGS. 27 and 28, the lead frame 60 may be used as the base member on which the terahertz element 20 is mounted. Specifically, the lead frame 60 may include a mount base 210 on which the terahertz element 20 is mounted, a first connector 211 joined to the mount base 210, and a second connector 212 insulated from the first connector 211. The first connector 211 is electrically connected to the first pad 33*b* by the first wire W1. The second connector 212 is electrically connected to the second pad 34*b* by the second wire W2.

In addition, the lead frame 60 may include a first curved portion 213 extending from the first connector 211 along the outer side of the opening edge of the recess 52 and a second curved portion 214 extending from the second connector 212 along the outer side of the opening edge of the recess 52.

In this modified example, as shown in FIG. 28, the terahertz device 10 may include a cover member 215 covering the mount base 210 and the two connectors 211 and 212 from above. The cover member 215 may be formed of a material transmissive to electromagnetic waves, for example, a dielectric.

Figure 29:
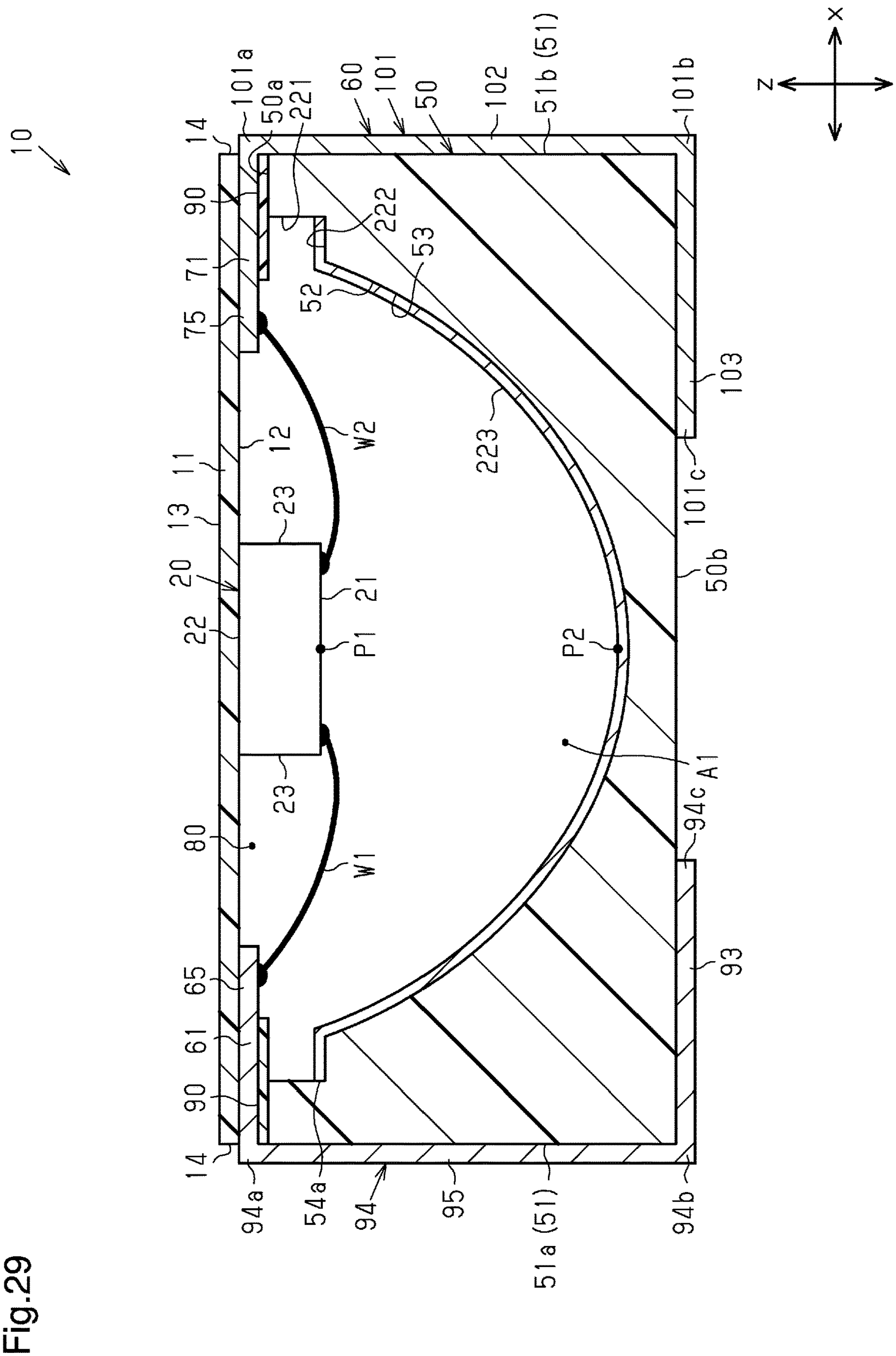
FIG. 29 is a schematic end view showing a modified example of a terahertz device.

As shown in FIG. 29, the recess 52 may include a large diameter surface 221 having a larger diameter than the antenna surface 53 and a stepped surface 222 formed between the antenna surface 53 and the large diameter surface 221. The stepped surface 222 intersects the z-direction. In this structure, a reflection film 223 may be formed over the antenna surface 53 and the stepped surface 222. In this case, the reflection film 223 and the lead frame 60 are separate in the z-direction and thus are not likely to contact each other.

Figure 30:
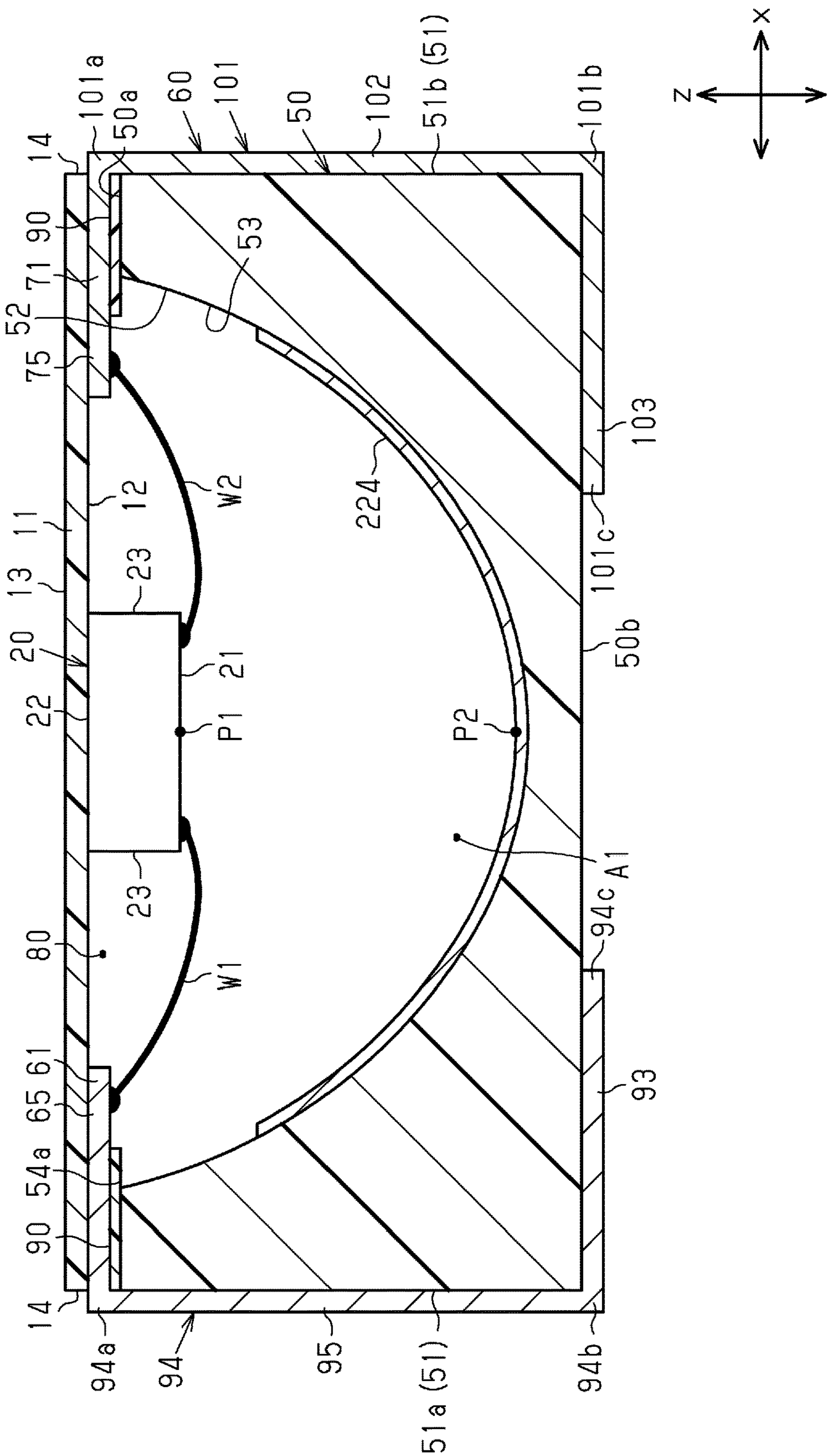
FIG. 30 is a schematic end view showing a modified example of a terahertz device.

As shown in FIG. 30, a reflection film 224 may be formed on a portion of the antenna surface 53. For example, the reflection film 224 may be formed on a portion located below the oscillation point P1. The reflection film 224 may be formed over an angle that is less than the opening angle θ of the oscillation point P1. Any reflection film that reflects at least part of electromagnetic waves generated by the terahertz element 20 in one direction may be used.

The shape of the reflection film may be changed. For example, the reflection film is not limited to a single film and may include a plurality of separate parts. For example, a slit and/or a hole may be formed in the reflection film.

Figure 31:
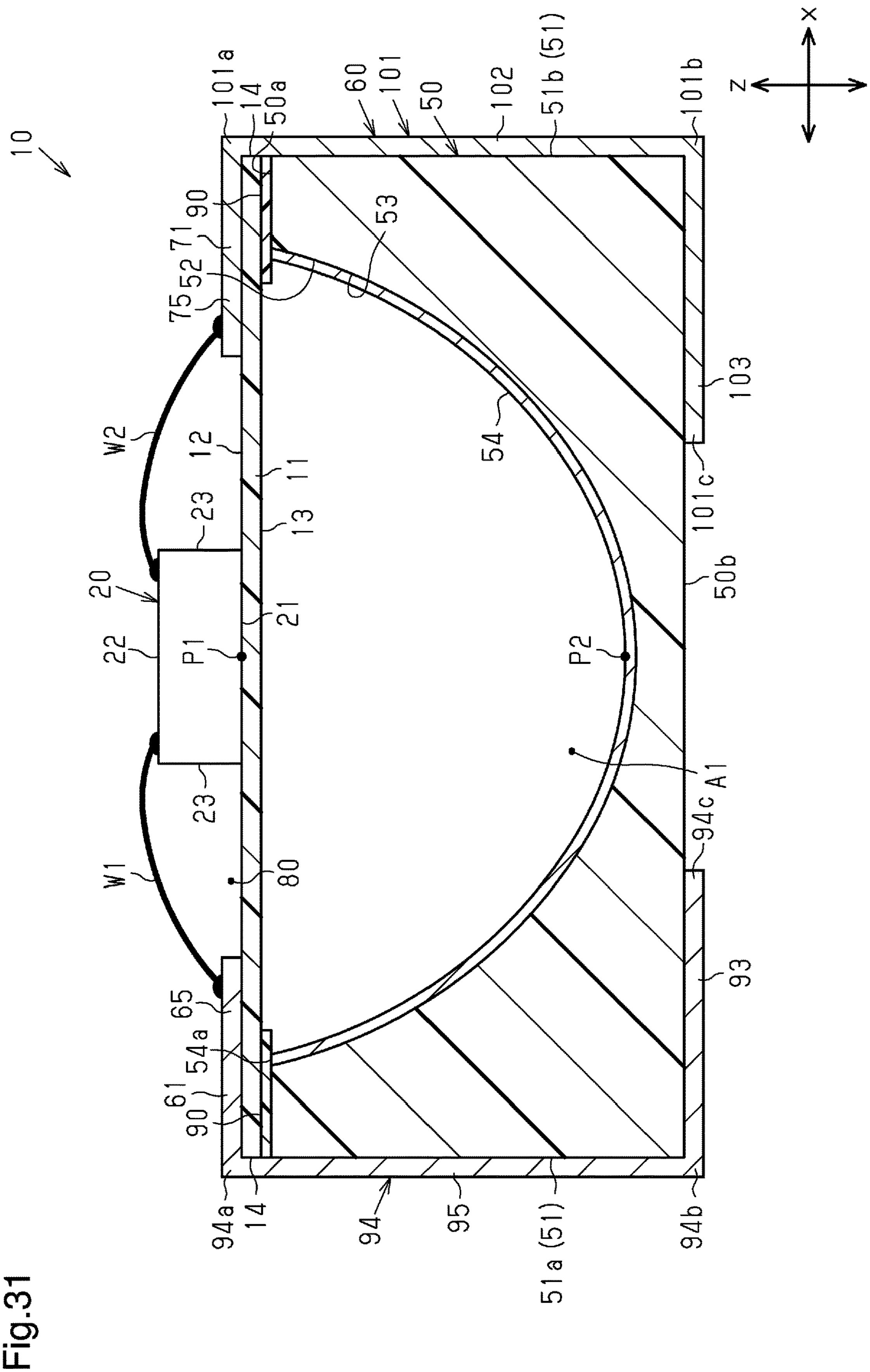
FIG. 31 is a schematic end view showing a modified example of a terahertz device.

As shown in FIG. 31, the antenna base 50 may be configured to be disposed at the side of the mount back surface 13. In this case, the mount plate 11 is disposed between the lead frame 60 and the reflection film 54, so that contact of the reflection film 54 with the lead frame 60 is avoided. However, considering the point that the terahertz element 20 is accommodated in the accommodation space A1, it is more preferred that the antenna base 50 is disposed at the side of the mount main surface 12.

Figure 32:
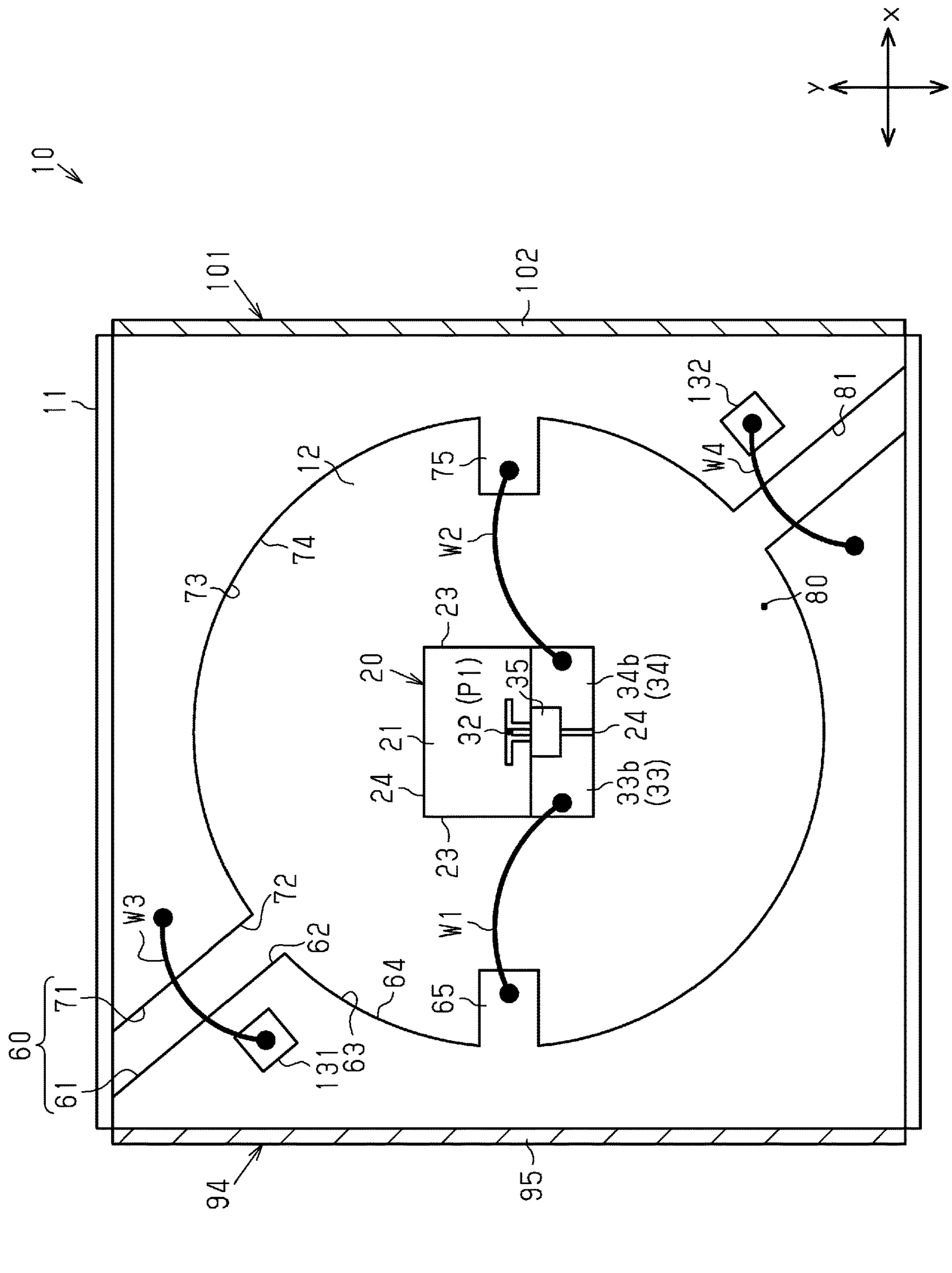
FIG. 32 is a front view showing a modified example of a lead frame.

As shown in FIG. 32, the lead opposing surfaces 62 and 72 may be inclined from the y-direction. In this case, the gap 81 diagonally extend with respect to the y-direction.

In this structure, when the protection diodes 131 and 132 are arranged as in the second embodiment, at least a portion of the first protection diode 131 may be disposed between the first inner surface 64 and the first lead opposing surface 62. Also, at least a portion of the second protection diode 132 may be disposed between the second inner surface 74 and the second lead opposing surface 72.

Figure 33:
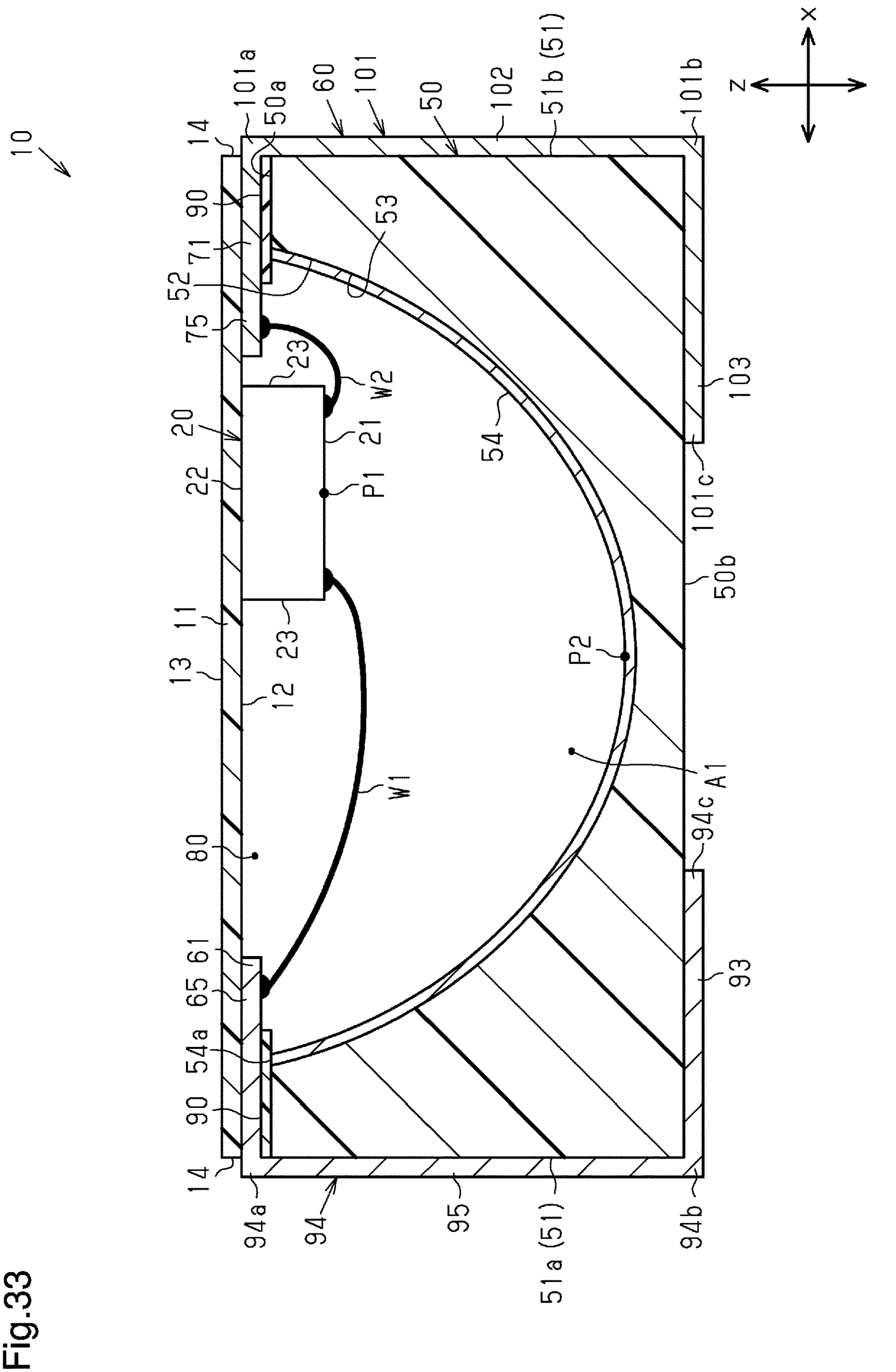
FIG. 33 is a schematic end view showing a modified example of a terahertz device.

As shown in FIG. 33, the terahertz element 20 may be disposed so that the oscillation point P1 is located at a position separate from the center point P2 of the reflection film 54 as viewed from above. That is, the focal point of the reflection film 54 does not have to coincide with oscillation point P1.

Figure 34:
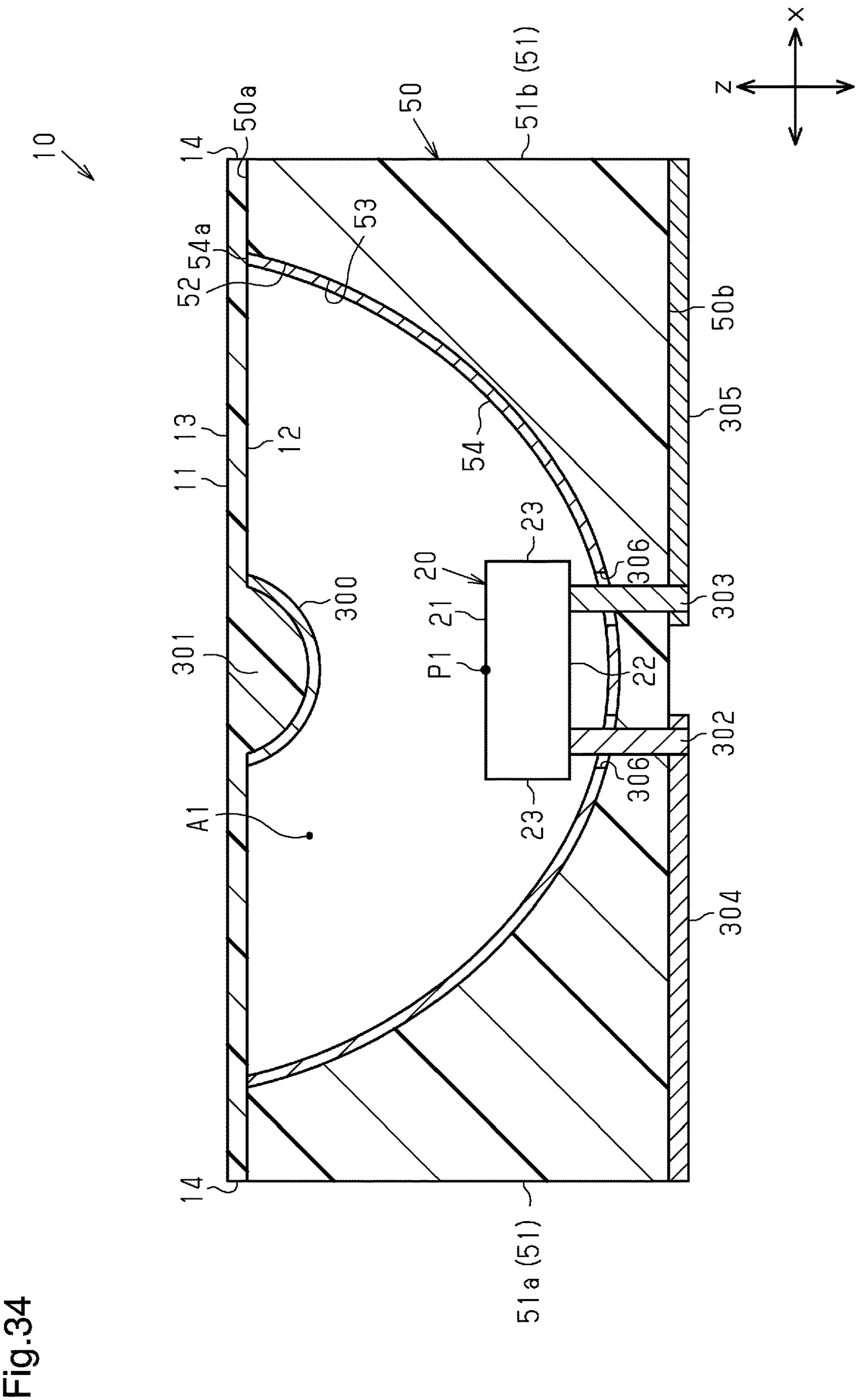
FIG. 34 is a schematic plan view showing a modified example of a terahertz device.

As shown in FIG. 34, the terahertz device 10 may be of a multi-reflector type including a reflector 300 disposed separately from the reflection film 54.

Specifically, the terahertz device 10 includes the reflector 300 in addition to the reflection film 54. More specifically, the mount main surface 12 includes a reflection protrusion 301, and a metal film is formed on the surface of the reflection protrusion 301 to form the reflector 300. In accordance with the curve of the reflection protrusion 301 protruding toward the reflection film 54, the reflector 300 is curved to protrude toward the reflection film 54. The reflector 300 and the reflection film 54 are radially opposed to each other. Electromagnetic waves reflected by the reflector 300 are emitted toward the reflection film 54.

In the present modified example, the terahertz element 20 is located opposing the reflector 300. In other words, the mount plate 11, which is used as the base member including the reflector 300, is located opposing the terahertz element 20.

The terahertz device 10 includes, for example, mount poles 302 and 303. The mount poles 302 and 303 are formed of, for example, a conductive material. The mount poles 302 and 303 extend through the antenna base 50 and the reflection film 54 from below and enter the accommodation space A1. The terahertz element 20 is mounted on the mount poles 302 and 303. The terahertz element 20 is electrically connected to the mount poles 302 and 303.

The terahertz element 20 may be bonded to the mount poles 302 and 303 directly or by a conductive bonding member. In addition, to avoid contact of the mount poles 302 and 303 with the reflection film 54, an insulator (e.g., insulation coating) may be disposed on side surfaces of the mount poles 302 and 303. In this modified example, the mount poles 302 and 303 are two. However, the number of mount poles 302 and 303 may be any number.

In this modified example, the terahertz device 10 includes electrodes 304 and 305 electrically connected to the mount poles 302 and 303. The electrodes 304 and 305 are formed on the base back surface 50*b*, which is a side of the antenna base 50 opposite from the base main surface 50*a*, and are joined to the mount poles 302 and 303.

In this modified example, when a voltage is applied from the both electrodes 304 and 305, electromagnetic waves are generated by the terahertz element 20. The electromagnetic waves are reflected by the reflector 300 and then further reflected by the reflection film 54 and are emitted upward, which corresponds to one direction. That is, the electromagnetic waves generated by the terahertz element 20 are emitted to the reflection film 54 via the reflector 300 and further reflected by the reflection film 54.

More specifically, the reflector 300 is configured to receive electromagnetic waves generated by the terahertz element 20 and reflect at least part of the electromagnetic waves. The reflection film 54 is configured to receive the electromagnetic waves reflected by the reflector 300 and reflect at least part of the electromagnetic waves in one direction (upward).

In this modified example, the lead frame 60 and the two wires W1 and W2 are not formed on the mount plate 11. The reflector 300 may be disposed, for example, within a projection range of the terahertz element 20 as viewed from above. This limits interruption (blocking) of the electromagnetic waves.

As shown in FIG. 34, the reflection film 54 includes through holes 306, through which the mount poles 302 and 303 are inserted. The through holes 306 may be greater in size than the mount poles 302 and 303 to avoid contact of the reflection film 54 with the mount poles 302 and 303. The portion of the reflection film 54 located between the mount poles 302 and 303 may be omitted. That is, as viewed from above, the reflection film 54 may be annular with the central portion removed. The reflector 300 may be recessed with respect to the terahertz element 20. Specifically, the reflector 300 may be shaped as an antenna that is recessed in the opposite direction of the reflection film 54 (i.e., upward). More specifically, the reflector 300 may be a Cassegrain type or a Gregorian type.

Figure 35:
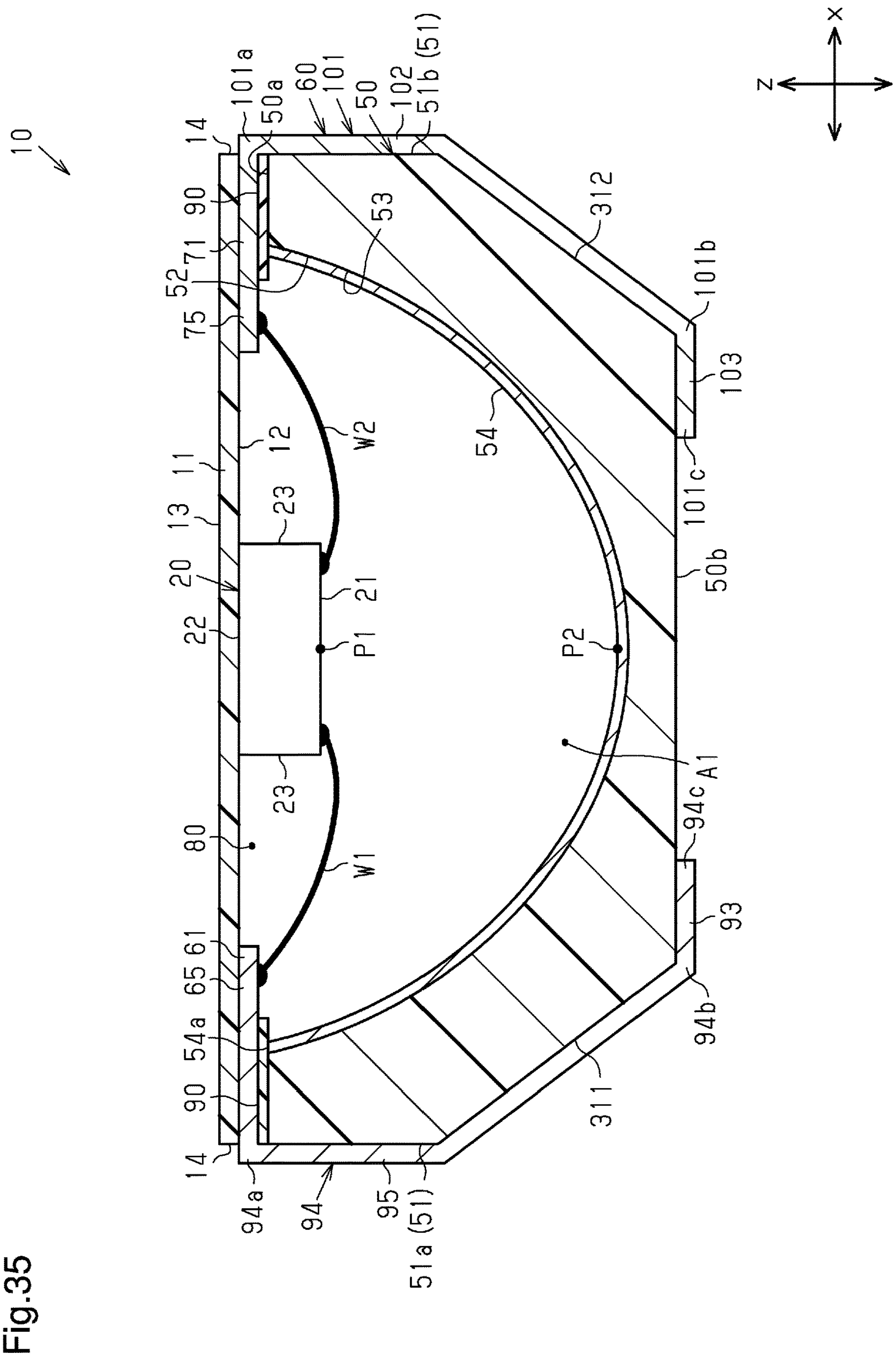
FIG. 35 is a schematic end view showing a modified example of a terahertz device.

The shape of the antenna base 50 may be changed. For example, as shown in FIG. 35, the antenna base 50 may be chamfered and dome-shaped. Specifically, in this modified example, the antenna base 50 may include inclined surfaces 311 and 312 formed between the base back surface 50*b* and the base side surfaces 51*a* and 51*b*. The first inclined surface 311 intersects both the first base side surface 51*a* and the base back surface 50*b*. The second inclined surface 312 intersects both the second base side surface 51*b* and the base back surface 50*b*.

In this case, the first electrode 94 may be formed along the first base side surface 51*a*, the first inclined surface 311, and the base back surface 50*b*. The second electrode 101 may be formed along the second base side surface 51*b*, the second inclined surface 312, and the base back surface 50*b*.

Figure 36:
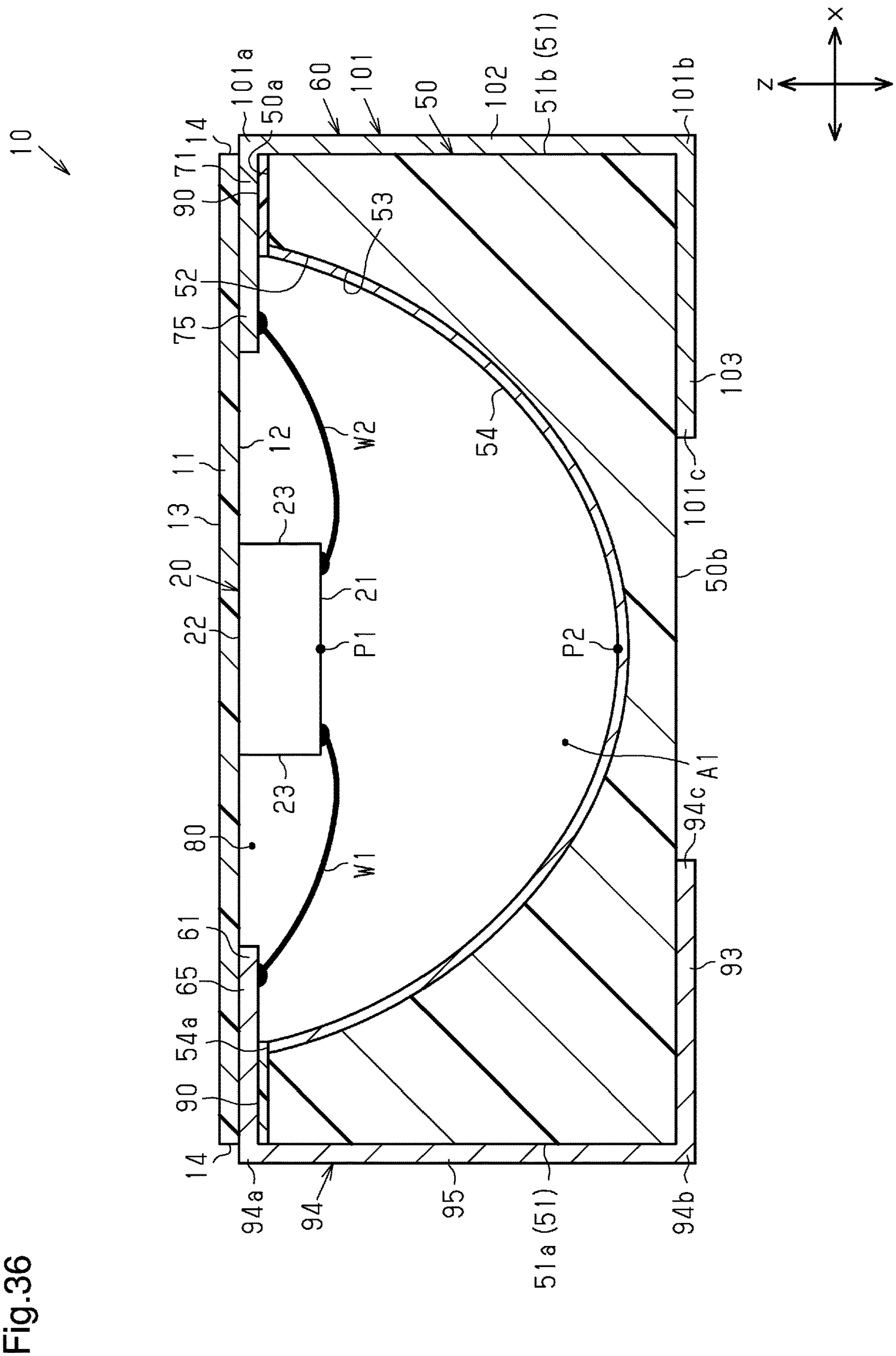
FIG. 36 is a schematic end view showing a modified example of a terahertz device.

As shown in FIG. 36, the inner peripheral end of the adhesive layer 90 may be flush with the surface of the reflection film 54. That is, the adhesive layer 90 may be configured not to extend inward (in other words, toward the terahertz element 20) beyond the reflection film 54.

Figure 37:
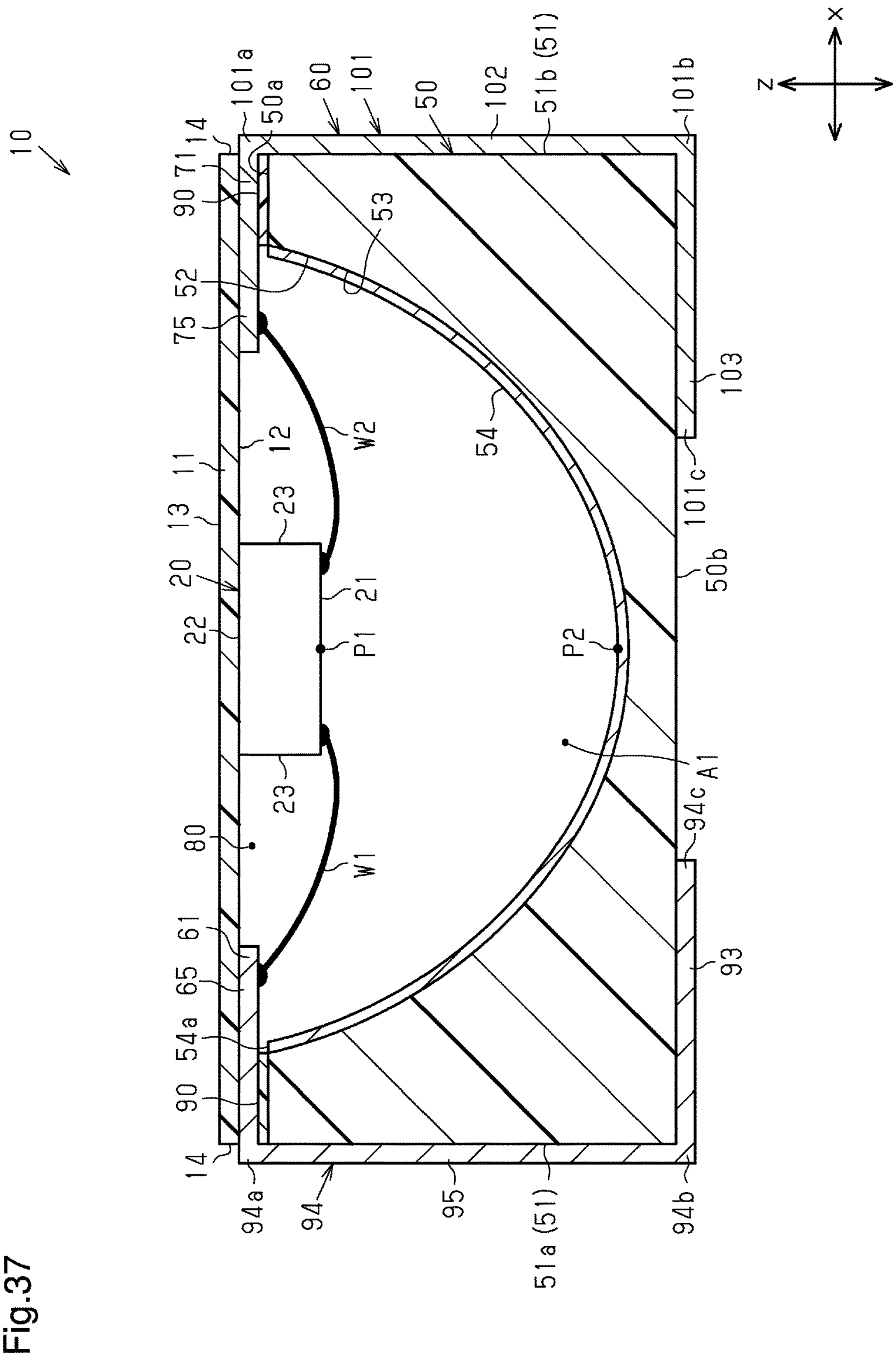
FIG. 37 is a schematic end view showing a modified example of a terahertz device.
Figure 38:
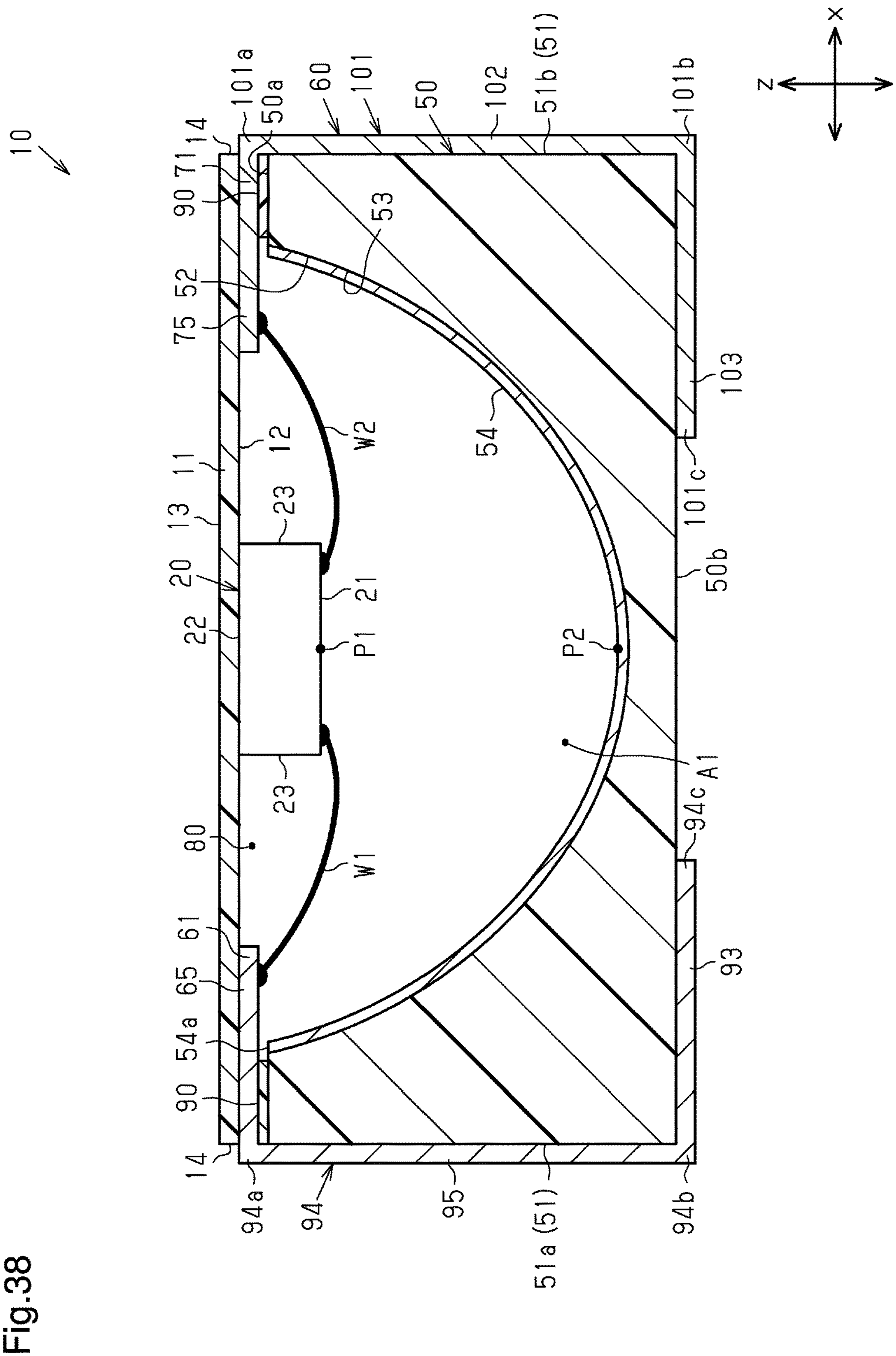
FIG. 38 is a schematic end view showing a modified example of a terahertz device.

As shown in FIGS. 37 and 38, the inner peripheral end of the adhesive layer 90 may be located outward from the surface of the reflection film 54 (in other words, toward the base side surfaces 51) in the x-direction and the y-direction. For example, as shown in FIG. 37, the inner peripheral end of the adhesive layer 90 may be flush with the antenna surface 53. Alternatively, as shown in FIG. 38, the inner peripheral end of the adhesive layer 90 may be located outward from the antenna surface 53 in the x-direction and the y-direction. In this case, the adhesive layer 90 is not disposed between the end 54*a* of the reflection film 54 and the lead frame 60. In other words, the adhesive layer 90 does not necessarily have to be disposed between the reflection film 54 and the lead frame 60. Even in this case, the reflection film 54 is separated from the lead frame 60 by the height of the adhesive layer 90, so that contact of the reflection film 54 with the lead frame 60 is limited.

When the terahertz device 10 is electrically connected to the wiring pattern 114 using the side electrodes 95 and 102, the terahertz device 10 may be mounted on the circuit substrate 113. Specifically, the conductive bonding member 115 may be arranged to connect the side electrodes 95 and 102 to the wiring pattern 114.

The electrodes 94 and 101 may be formed using a conductive member other than the lead frame 60.

Inclined surfaces may be arranged between the base main surface 50*a* and the base side surfaces 51*a* and 51*b*. In this case, the inclined surfaces correspond to the corners between the base main surface 50*a* and the base side surfaces 51*a* and 51*b*.

The terahertz element 20 may be disposed so that the element back surface 22 faces the reflection film 54. That is, the reflection film 54 may be disposed at the side of the element back surface 22 of the terahertz element 20, not at the side of the element main surface 21.

The reflection film 54 does not have to be electrically isolated.

The reflection film 54 may be formed on the base main surface 50*a*. In this case, for example, a reflection reduction film may be located opposing the base main surface 50*a*.

The gas existing in the accommodation space A1 is not limited to air and may be changed in any manner. Moreover, the accommodation space A1 may be vacuum.

The antenna base 50 and the lead frame 60 may be unitized by a process other than adhesion.

The shape of the opening 80 may be changed in any manner. For example, one of the part openings 63 and 73 may be omitted. The part openings 63 and 73 may be smaller than the reflection film 54.

The mount plate 11, which is used as the base member, may have any shape. For example, the mount plate 11 may have a greater thickness than the lead frame 60.

The electrodes 94 and 101 may extend from the proximity of the center of the terahertz device 10 in the z-direction or may extend from below the center of the terahertz device 10. The side electrodes 95 and 102 are not limited to the disposition on the first base side surface 51*a* and the second base side surface 51*b* and may be disposed on the third base side surface 51*c* and the fourth base side surface 51*d*.

In other words, the two electrodes 94 and 101 may be disposed on opposite sides of the antenna base 50 in the x-direction or the y-direction. The first electrode 94 may be formed over the first base side surface 51*a* and the third base side surface 51*c*. The second electrode 101 may be formed in the same manner.

The specific structure of the terahertz element 20 may be changed. For example, the position and size of the two pads 33*b* and 34*b* may be changed. The oscillation point P1 may be located at a position other than the center.

The terahertz element 20 may be configured to receive electromagnetic waves and convert the received electromagnetic waves into electrical energy. Specifically, the terahertz element 20 receives electromagnetic waves, for example, in the range of the opening angle θ of the oscillation point P1. In this case, the oscillation point P1 may be referred to as a reception point that receives electromagnetic waves.

In this structure, the reflection film may reflect the incident electromagnetic waves toward the terahertz element 20 (preferably, the reception point). This increases the reception strength of the terahertz device 10, thereby improving the gain related to reception.

Moreover, the terahertz element 20 may be configured to oscillate and receive electromagnetic waves. That is, the oscillation point P1 may perform at least one of oscillation and reception of electromagnetic waves.

When the terahertz element 20 is configured to receive electromagnetic waves, the reflector 300 of the modified example reflects electromagnetic waves reflected by the reflection film 54 toward the terahertz element 20. In this structure, the electromagnetic waves reflected by the reflection film 54 are emitted via the reflector 300 to the terahertz element 20. More specifically, the reflection film 54 is configured to reflect at least part of the incident electromagnetic waves toward the reflector 300. The reflector 300 is configured to receive the electromagnetic waves reflected by the reflection film 54 and emit at least part of the electromagnetic waves toward the terahertz element 20.

Third Embodiment

FIGS. 39 to 45 show a third embodiment of a terahertz device 10 according to the present disclosure. The terahertz device 10 of the third embodiment includes a mount plate 11 used as a base member, a terahertz element 20 configured to generate an electromagnetic wave, an antenna base 50, a reflection film 54, and a lead frame 60 used as an electrode and a conductive member.

Figure 39:
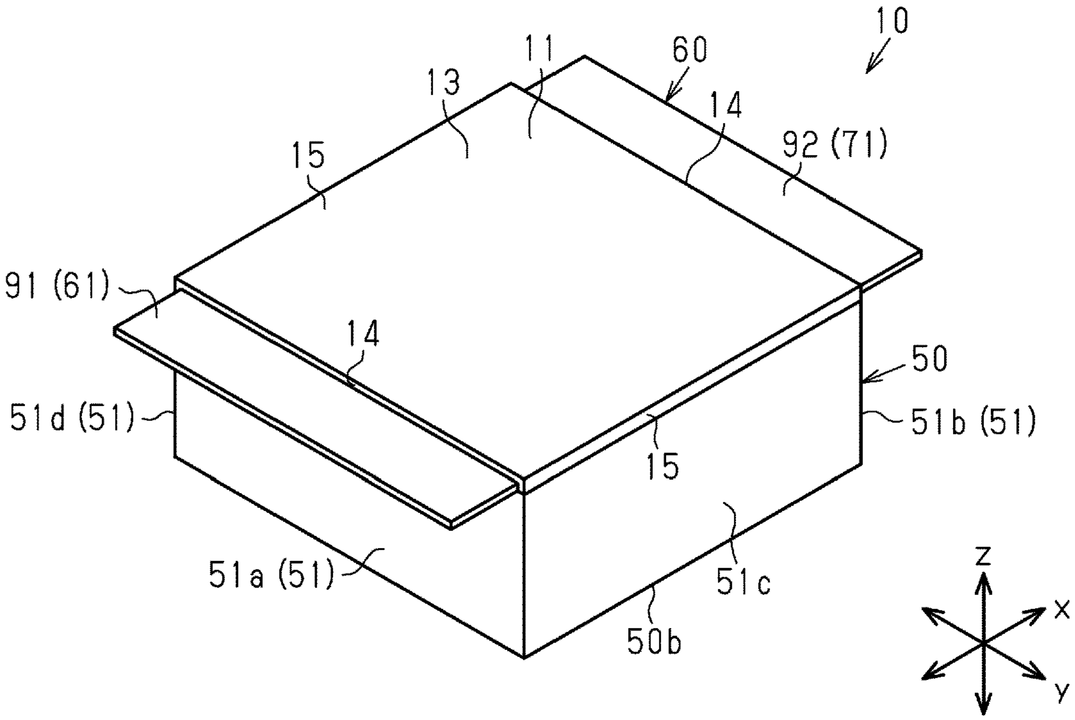
FIG. 39 is a perspective view of a third embodiment of a terahertz device as viewed from above.
Figure 40:
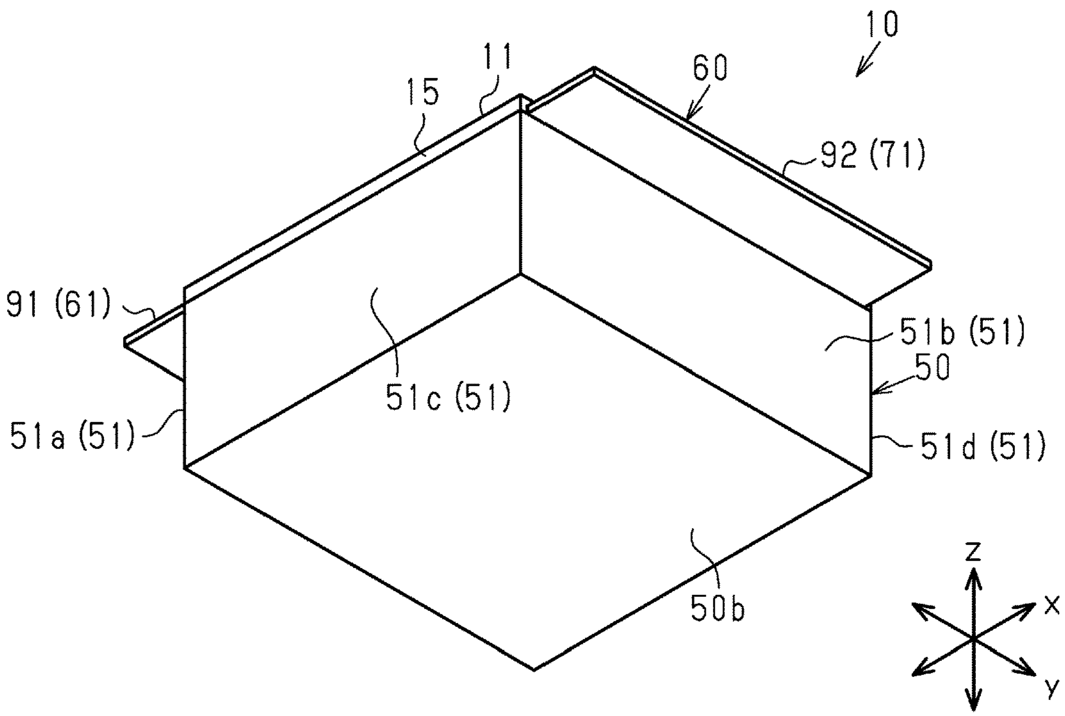
FIG. 40 is a perspective view of the terahertz device as viewed from below.
Figure 41:
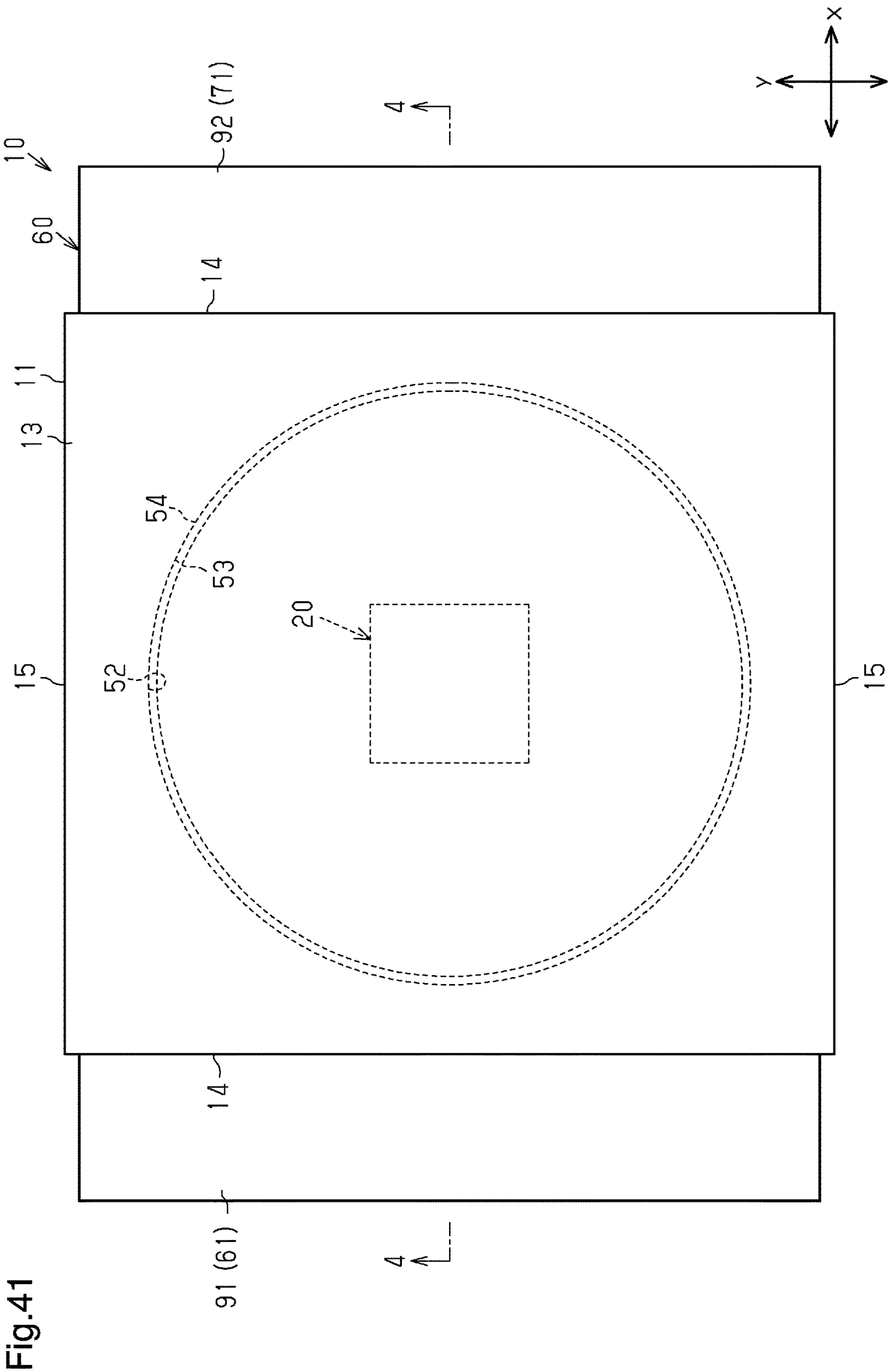
FIG. 41 is a top view of the terahertz device.
Figure 42:
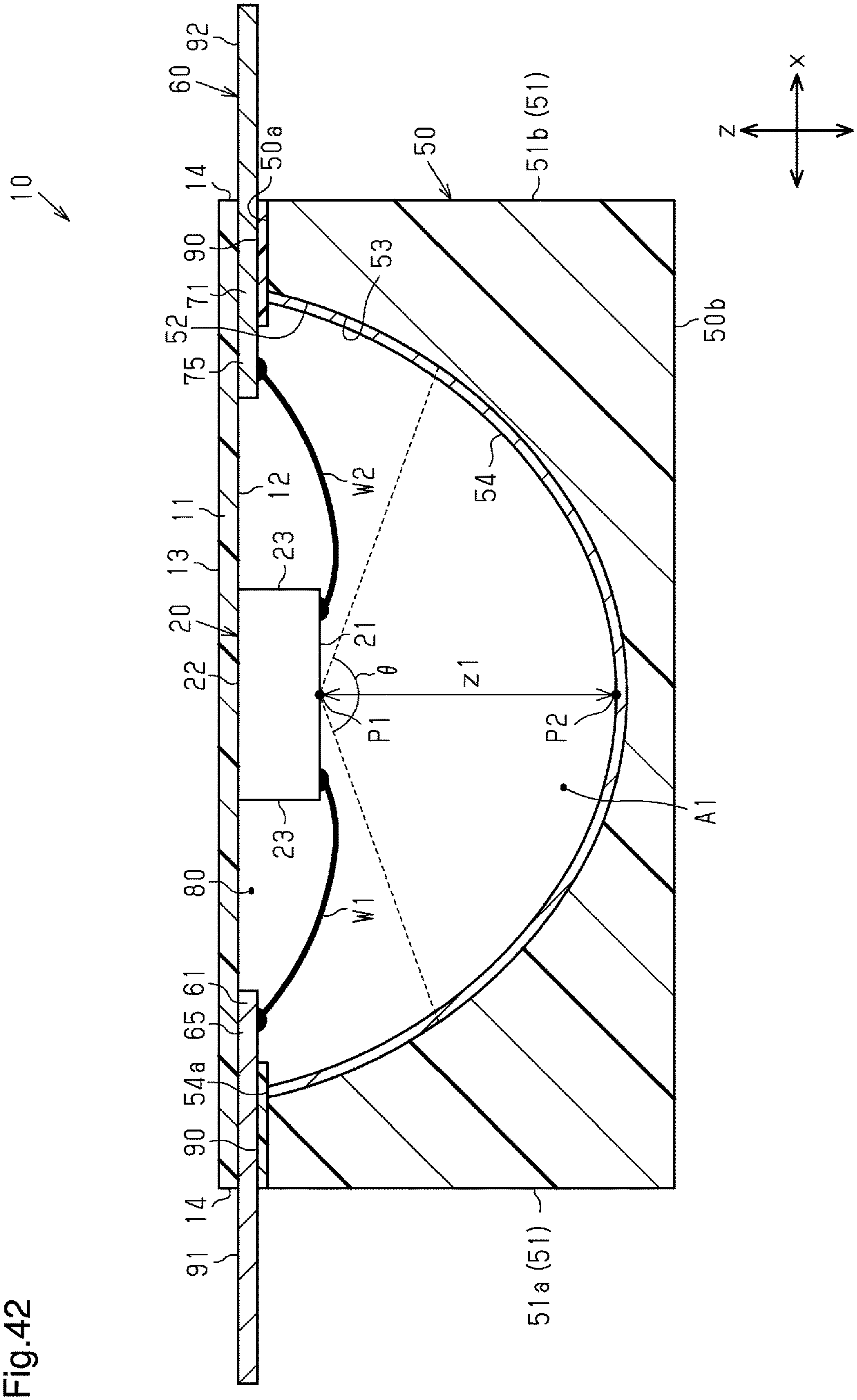
FIG. 42 is an end view taken along line 4-4 in FIG. 41.
Figure 43:
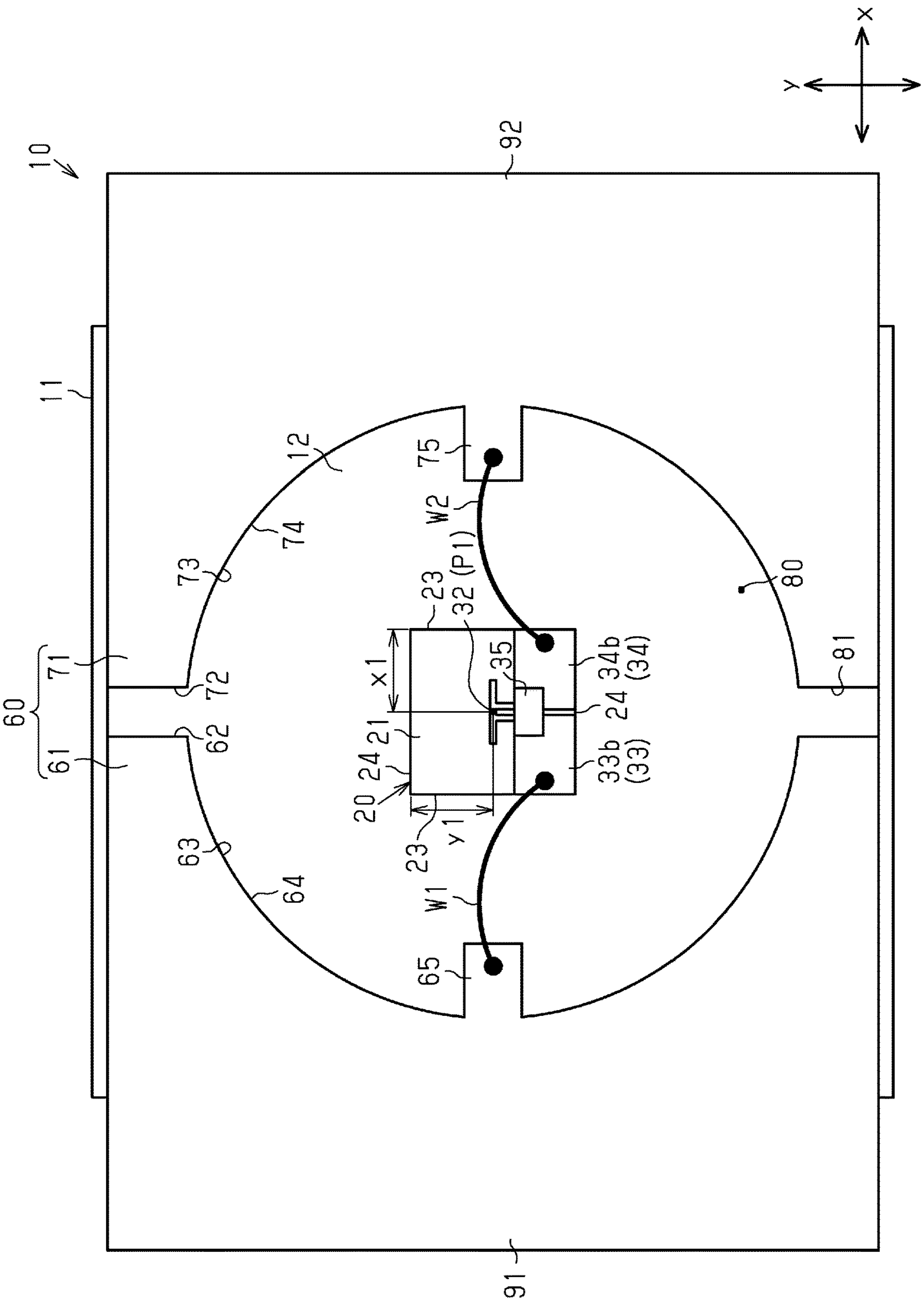
FIG. 43 is a front view of a terahertz element and a lead frame.

FIGS. 39 and 40 are perspective views of the terahertz device 10. FIG. 41 is a top view of the terahertz device 10. FIG. 42 is an end view taken along line 4-4 in FIG. 41. FIG. 43 is a lower view of the terahertz device 10 and a front view of the terahertz element 20 and the lead frame 60 with the antenna base 50 removed.

The mount plate 11 is formed of a material transmissive to electromagnetic waves generated by the terahertz element 20. In the present embodiment, the mount plate 11 is formed of a dielectric material, for example, a synthetic resin such as an epoxy resin or an intrinsic semiconductor such as a single crystal of silicon (Si). An example of the epoxy resin is a glass epoxy resin. However, the material of the mount plate 11 is not limited to those described above and may be any material, for example, Teflon (registered trademark) or glass. The mount plate 11 is insulative.

The mount plate 11 is, for example, rectangular. For the sake of brevity, the thickness-wise direction of the mount plate 11 is referred to as the z-direction. Two directions that are orthogonal to each other and the z-direction are referred to as the x-direction and the y-direction.

As shown in FIGS. 41 and 42, the mount plate 11 includes a mount main surface 12 and a mount back surface 13, which are plate surfaces intersecting the thickness-wise direction of the mount plate 11. The mount main surface 12 and the mount back surface 13 are flat and rectangular. The mount main surface 12 and the mount back surface 13 extend in the x-direction and the y-direction and are separate from each other in the z-direction. The shapes of the mount main surface 12 and the mount back surface 13 are not limited to a rectangle and may be a circle, an ellipse, or a polygon. For the sake of brevity, in the present embodiment, a direction extending away from the mount back surface 13 in the z-direction is referred to as "upward", and a direction extending away from the mount main surface 12 in the z-direction is referred to as "downward".

As shown in FIG. 43, in the present embodiment, the mount plate 11 includes two first plate side surfaces 14, which are opposite end surfaces in the x-direction, and two second plate side surfaces 15, which are opposite end surfaces in the y-direction. The first plate side surfaces 14 intersect the x-direction. In the present embodiment, the first plate side surfaces 14 are orthogonal to the x-direction. The second plate side surfaces 15 intersect the y-direction. In the present embodiment, the second plate side surfaces 15 are orthogonal to the y-direction. The first plate side surfaces 14 are orthogonal to the second plate side surfaces 15.

The terahertz element 20 converts electromagnetic waves in the terahertz band and electrical energy to and from each other. It is considered that the electromagnetic wave includes concepts of one or both of light and radio waves. The terahertz element 20 converts received electrical energy into electromagnetic waves in the terahertz band. Thus, the terahertz element 20 oscillates the electromagnetic waves (i.e., terahertz waves). The frequency of the electromagnetic waves generated by the terahertz element 20 is, for example, 0.1 Thz to 10 Thz.

As shown in FIG. 43, the terahertz element 20 has the shape of a rectangular plate as viewed the z-direction (hereafter, also referred to as "in plan view"). In the present embodiment, the terahertz element 20 is square in plan view. The shape of the terahertz element 20 in plan view is not limited to a rectangle and may be a circle, an ellipse, or a polygon.

The terahertz element 20 includes an element main surface 21 and an element back surface 22. The element main surface 21 and the element back surface 22 intersect the z-direction. In the present embodiment, the element main surface 21 and the element back surface 22 are orthogonal to the z-direction. The element main surface 21 and the element back surface 22 are rectangular, for example, square, as viewed in the z-direction. However, the shape of the element main surface 21 and the element back surface 22 is not limited to this and may be any shape.

As shown in FIG. 42, in the present embodiment, when the element back surface 22 is in contact with the mount main surface 12 or is opposed to the mount main surface 12 via an intermediate layer, the terahertz element 20 is attached to the mount plate 11. That is, the mount plate 11 is configured to allow for attachment of the terahertz element 20. The terahertz element 20 is mounted on the mount plate 11.

The terahertz element 20 includes two first element side surfaces 23, which are opposite end surfaces in the x-direction, and two second element side surfaces 24, which are opposite end surfaces in the y-direction. The first element side surfaces 23 intersect the x-direction. In the present embodiment, the first element side surfaces 23 are orthogonal to the x-direction. The second element side surfaces 24 intersect the y-direction. In the present embodiment, the second element side surfaces 24 are orthogonal to the y-direction. The first element side surfaces 23 are orthogonal to the second element side surfaces 24.

Figure 44:
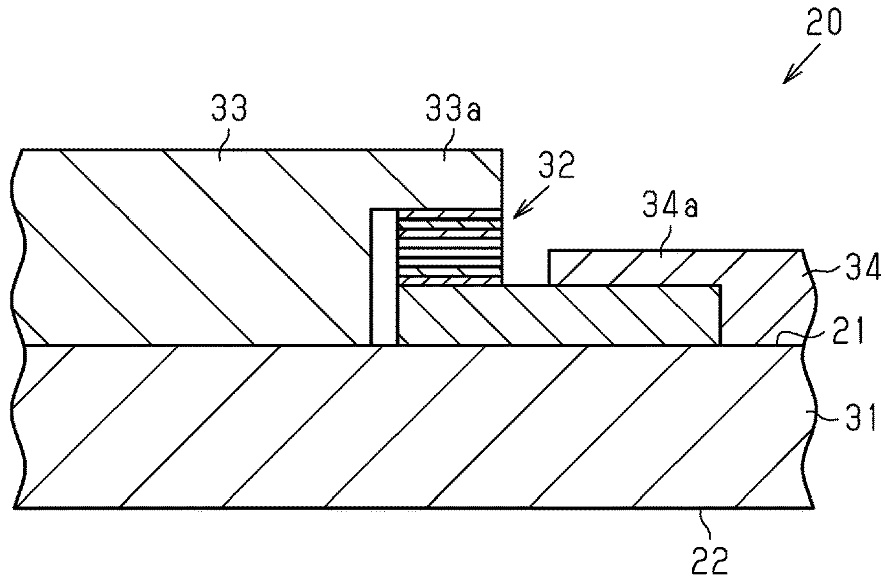
FIG. 44 is a schematic end view of an active element and its surroundings.
Figure 45:
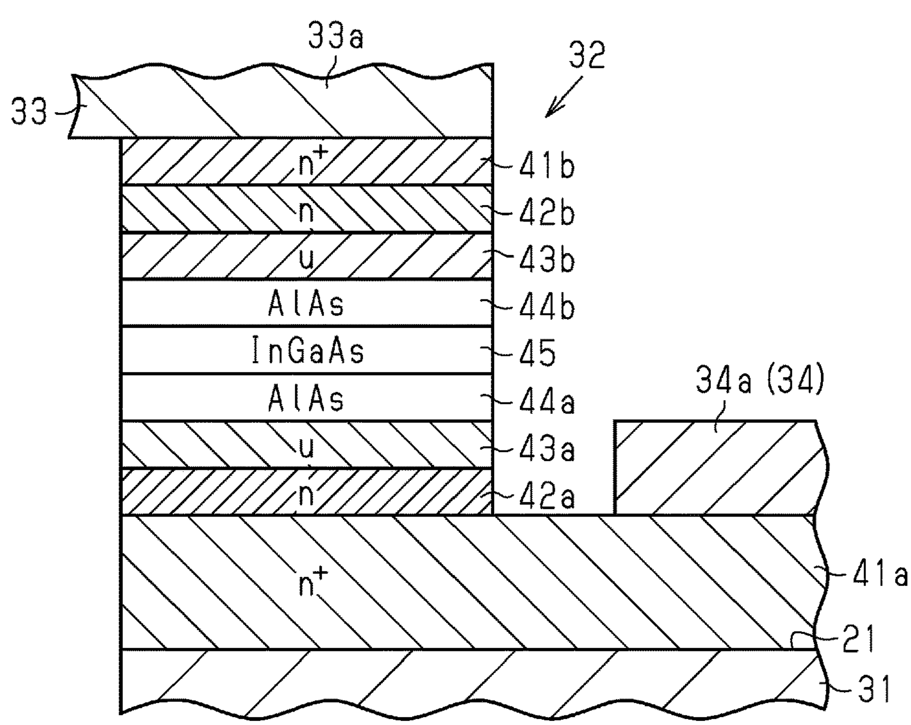
FIG. 45 is an enlarged end view showing a cross-sectional structure of the active element.

FIGS. 44 and 45 show an example of a detailed structure of the terahertz element 20. FIG. 44 is a schematic diagram showing an example of a cross section of the terahertz element 20. FIG. 45 is an enlarged partial view of FIG. 44.

As shown in FIGS. 44 and 45, the terahertz element 20 includes an element substrate 31, an active element 32, a first conductive layer 33, and a second conductive layer 34.

The element substrate 31 is formed of a semiconductor and is semi-insulating. The semiconductor forming the element substrate 31 is, for example, InP (indium phosphide) but may be a semiconductor other than InP. When the element substrate 31 is formed of InP, the refractive index (absolute refractive index) is approximately 3.4. In the present embodiment, the element substrate 31 is rectangular and is, for example, square in plan view. The element main surface 21 and the element back surface 22 are the main surface and the back surface of the element substrate 31. The element side surfaces 23 and 24 are side surfaces of the element substrate 31.

The active element 32 converts electromagnetic waves in the terahertz band and electrical energy to and from each other. The active element 32 is formed on the element substrate 31. The active element 32 is typically a resonant tunneling diode (RTD).

The active element 32 may be, for example, a tunnel injection transit time (TUNNETT) diode, an impact ionization avalanche transit time (IMPATT) diode, a GaAs-base field effect transistor (FET), a GaN-base FET, a high electron mobility transistor (HEMT), or a heterojunction bipolar transistor (HBT).

An example of obtaining the active element 32 will be described. A semiconductor layer 41*a* is formed on the element substrate 31. The semiconductor layer 41*a* is formed of, for example, GaInAs. The semiconductor layer 41*a* is doped with an n-type impurity at a high concentration.

A GaInAs layer 42*a* is stacked on the semiconductor layer 41*a*. The GaInAs layer 42*a* is doped with an n-type impurity. For example, the impurity concentration of the GaInAs layer 42*a* is lower than the impurity concentration of the semiconductor layer 41*a*.

A GaInAs layer 43*a* is stacked on the GaInAs layer 42*a*. The GaInAs layer 43*a* is not doped with impurities.

An AlAs layer 44*a* is stacked on the GaInAs layer 43*a*. An InGaAs layer 45 is stacked on the AlAs layer 44*a*. An AlAs layer 44*b* is stacked on the InGaAs layer 45. The AlAs layer 44*a*, the InGaAs layer 45, and the AlAs layer 44*b* form an RTD unit.

A GaInAs layer 43*b* is not doped with impurities and is stacked on the AlAs layer 44*b*. A GaInAs layer 42*b* is doped with an n-type impurity and is stacked on the GaInAs layer 43*b*. A GaInAs layer 41*b* is stacked on the GaInAs layer 42*b*. The GaInAs layer 41*b* is doped with an n-type impurity at a high concentration. For example, the impurity concentration of the GaInAs layer 41*b* is higher than the impurity concentration of the GaInAs layer 42*b*.

The active element 32 may have any specific structure configured to generate electromagnetic waves (or receive electromagnetic waves or both generate and receive electromagnetic waves). In other words, the active element 32 may be configured to oscillate in electromagnetic waves of the terahertz band.

As shown in FIG. 43, the terahertz element 20 includes an oscillation point P1 where oscillation of electromagnetic waves is performed. The oscillation point P1 is formed on the element main surface 21. The element main surface 21 that includes the oscillation point P1 may be referred to as an active surface. Also, the oscillation point P1 may refer to a position on which the active element 32 is disposed.

In the present embodiment, the oscillation point P1 (the active element 32) is disposed at the center of the element main surface 21. However, the position of the oscillation point P1, that is, the position of the active element 32 on the element main surface 21, is not limited to the center of the element main surface 21 and may be any position.

In the present embodiment, it is preferred that a first perpendicular distance x1 between the oscillation point P1 and each first element side surface 23 is (λ'InP/2)+((λ'InP/2)×N) (N is an integer that is greater than or equal to 0: N=0, 1, 2, 3, . . . ).

λ'InP denotes an effective wavelength of an electromagnetic wave that transmits through the terahertz element 20. When n1 denotes the refractive index of the terahertz element 20 (the element substrate 31), c denotes the speed of light, and fc denotes the center frequency of electromagnetic waves, λ'InP is (1/n1)×(c/fc). When the first perpendicular distance x1 is set as described above, an electromagnetic wave oscillated by the terahertz element 20 performs a free end reflection on the first element side surface 23. Thus, the terahertz element 20 itself is designed as a resonator (primary resonator/one-dimensional resonator) of the terahertz device 10.

In the same manner, it is preferred that a second perpendicular distance y1 between the oscillation point P1 and each second element side surface 24 is (λ'InP/2)+((λ'InP/2)×N) (N is an integer that is greater than or equal to 0: N=0, 1, 2, 3, . . . ).

The perpendicular distances x1 and y1 may have different values for each of the element side surfaces 23 and 24 as long as the values are calculated by the above equation. Further, in FIG. 43, the first perpendicular distance x1 from the oscillation point P1 to the first element side surface 23 located at the right side may differ from the first perpendicular distance x1 from the oscillation point P1 to the first element side surface 23 located at the left side. Also, in FIG. 43, the second perpendicular distance y1 from the oscillation point P1 to the second element side surface 24 located at the upper side may differ from the second perpendicular distance y1 from the oscillation point P1 to the second element side surfaces 24 located at the lower side.

The dimension of the terahertz element 20 in the z-direction may be designed in accordance with, for example, the frequency of an oscillated electromagnetic wave. More specifically, the dimension of the terahertz element 20 in the z-direction is an integer multiple of ½ times a wavelength λ of the electromagnetic wave (i.e., λ/2). The electromagnetic wave performs free end reflection in the interface between the element substrate 31 and air. When the dimension of the terahertz element 20 in the z-direction is set as described above, standing waves having an aligned phase are excited in the terahertz element 20. The dimension of the terahertz element 20 in the z-direction is decreased as the frequency of the electromagnetic wave becomes higher. The dimension in the z-direction is increased as the frequency of the electromagnetic wave becomes lower.

The structure of the terahertz element 20 is not limited to that described above. For example, a back reflector metal layer may be disposed on the element back surface 22, which is located at the opposite side of the element substrate 31 from the element main surface 21 on which the active element 32 is disposed. In this case, the back reflector metal layer reflects an electromagnetic wave (electromagnetic wave) emitted from the active element 32.

When the back reflector metal layer is arranged, the electromagnetic wave performs a fixed end reflection in the interface between the element substrate 31 and the back reflector metal layer. This results in a π phase shift. In this case, the dimension of the terahertz element 20 in the z-direction may be designed to be (λ/4)+(integer multiple of λ/2) using the wavelength λ of the electromagnetic wave.

In the present embodiment, electromagnetic waves generated from the oscillation point P1 have directivity. As shown in FIG. 42, the electromagnetic waves generated from the oscillation point P1 are radiated in the range of an opening angle θ. The opening angle θ is, for example, 120° to 180°. However, the opening angle θ is not limited to that described above and may be any angle.

The first conductive layer 33 and the second conductive layer 34 are formed on the element main surface 21. The first conductive layer 33 and the second conductive layer 34 are insulated from each other. Each of the first conductive layer 33 and the second conductive layer 34 has a stacked structure of metals. The stacked structure of each of the first conductive layer 33 and the second conductive layer 34 is obtained by stacking, for example, gold (Au), palladium (Pd), and titanium (Ti). In another example, the stacked structure of each of the first conductive layer 33 and the second conductive layer 34 is obtained by stacking Au and Ti. The first conductive layer 33 and the second conductive layer 34 are formed through vacuum vapor deposition or sputtering.

As shown in FIG. 44, in the present embodiment, part of the first conductive layer 33 and part of the second conductive layer 34 are disposed at opposite sides of the active element 32 in the x-direction. The first conductive layer 33 includes a first connection region 33*a* overlapping the active element 32 in the z-direction. The first connection region 33*a* is disposed on the GaInAs layer 41*b* in contact with the GaInAs layer 41*b*.

The semiconductor layer 41*a* extends further than other layers such as the GaInAs layer 42*a* toward the second conductive layer 34 in the x-direction. The second conductive layer 34 includes a second connection region 34*a* stacked on part of the semiconductor layer 41*a* where the GaInAs layer 42*a* and other layers are not stacked. Thus, the active element 32 is electrically connected to the first conductive layer 33 and the second conductive layer 34. The second connection region 34*a* is spaced from the GaInAs layer 42*a* and other layers in the x-direction.

Although not shown in FIG. 45, alternatively, a GaInAs layer doped with an n-type impurity at a high concentration may be disposed between the GaInAs layer 41*b* and the first connection region 33*a*. This may result in good contact of the first conductive layer 33 with the GaInAs layer 41*b*.

As shown in FIG. 43, part of the first conductive layer 33 and part of the second conductive layer 34 form a dipole antenna. That is, in the terahertz element 20, the antenna is integrated by part of the first conductive layer 33 and part of the second conductive layer 34 at the side of the element main surface 21. Instead of a dipole antenna, another antenna such as a slot antenna, a biconical antenna, or a loop antenna may be used. Moreover, the antenna may be omitted.

In the present embodiment, the terahertz element 20 includes a metal insulator metal (MIM) reflector 35. The MIM reflector 35 is formed by holding an insulator between part of the first conductive layer 33 and part of the second conductive layer 34 in the z-direction. The MIM reflector 35 is configured to short the part of the first conductive layer 33 and the part of the second conductive layer 34 at a high frequency. The MIM reflector 35 reflects a high-frequency electromagnetic wave. However, the MIM reflector 35 is not necessary and may be omitted.

As shown in FIG. 43, the first conductive layer 33 includes a first pad 33*b*, and the second conductive layer 34 includes a second pad 34*b*. The first pad 33*b* and the second pad 34*b* are spaced apart in the x-direction and insulated from each other.

As shown in FIG. 40, the antenna base 50 is, for example, rectangular-box-shaped as a whole. The antenna base 50 is formed of, for example, an insulative material. More specifically, the antenna base 50 is formed of a dielectric material, for example, a synthetic resin such as an epoxy resin. An example of the epoxy resin is a glass epoxy resin. However, the material of the antenna base 50 is not limited to this and may be any material, for example, Si, Teflon, or glass.

The antenna base 50 is disposed on the mount plate 11 at the mount main surface 12, which is opposite the mount back surface 13. The antenna base 50 is located opposing the mount plate 11. Specifically, the antenna base 50 is opposed to the mount plate 11 via the lead frame 60 in the z-direction. The z-direction may be referred to as the opposing direction of the antenna base 50 and the mount plate 11.

The antenna base 50 includes a base main surface 50*a* opposed to the mount main surface 12, a base back surface 50*b* opposite the base main surface 50*a*, and base side surfaces 51.

The base main surface 50*a* and the base back surface 50*b* intersect the z-direction. In the present embodiment, the element main surface 21 and the element back surface 22 are orthogonal to the z-direction. The base main surface 50*a* and the base back surface 50*b* are, for example, rectangular (e.g., square). The base back surface 50*b* defines the bottom surface of the terahertz device 10.

In the present embodiment, the base side surfaces 51 are surfaces of the terahertz device 10 (the antenna base 50) facing sideward. The base side surfaces 51 may be referred to as the end surfaces of the antenna base 50 facing in directions orthogonal to the opposing direction of the base main surface 50*a* and the base back surface 50*b*. The base side surfaces 51 joins the base main surface 50*a* and the base back surface 50*b*.

The present embodiment includes four base side surfaces 51. Specifically, the base side surfaces 51 include a first base side surface 51*a* and a second base side surface 51*b*, which are opposite end surfaces of the antenna base 50 in the x-direction, and a third base side surface 51*c* and a fourth base side surface 51*d*, which are opposite end surfaces of the antenna base 50 in the y-direction. The first base side surface 51*a* and the second base side surface 51*b* intersect the x-direction. In the present embodiment, the first base side surface 51*a* and the second base side surface 51*b* are orthogonal to the x-direction. The third base side surface 51*c* and the fourth base side surface 51*d* intersect the y-direction. In the present embodiment, the third base side surface 51*c* and the fourth base side surface 51*d* are orthogonal to the y-direction. The first base side surface 51*a* and the second base side surface 51*b* are orthogonal to the third base side surface 51*c* and the fourth base side surface 51*d*.

The antenna base 50 includes a recess 52 recessed with respect to the base main surface 50*a* in a direction away from the mount main surface 12. The recess 52 is recessed from the base main surface 50*a* in a direction away from the mount main surface 12, that is, downward. In the present embodiment, the recess 52 is semispherical as a whole. The recess 52 is filled with air.

The recess 52 is open upward. The opening of the recess 52 is circular as viewed in the z-direction. The opening of the recess 52 is closed by the mount plate 11. In the present embodiment, the terahertz element 20 is accommodated in the recess 52.

The recess 52 includes an antenna surface 53. The antenna surface 53 is, for example, a curved surface projecting downward. The antenna surface 53 is formed in conformance with the shape of an antenna. For example, the antenna surface 53 is curved to be parabolic-antenna-shaped. The antenna surface 53 is circular as viewed from above.

As shown in FIG. 42, the reflection film 54 is formed on the antenna surface 53. The reflection film 54 is formed of a material that reflects electromagnetic waves generated by the terahertz element 20, for example, a metal such as Cu. In the present embodiment, the reflection film 54 is formed on the entire antenna surface 53. The reflection film 54 is not formed on the base main surface 50*a*.

The reflection film 54 is configured to reflect at least part of the electromagnetic waves received from the terahertz element 20 in one direction. In the present embodiment, the reflection film 54 reflects the electromagnetic waves received from the terahertz element 20 in the z-direction (specifically, upward). In other words, when electromagnetic waves are radiated in the range of the opening angle θ, the reflection film 54 is configured to guide the electromagnetic waves in one direction.

Specifically, the reflection film 54 is antenna-shaped. In the present embodiment, the antenna surface 53 is curved in conformance with the shape of an antenna. Accordingly, the reflection film 54 that is formed on the antenna surface 53 is shaped in conformance with the antenna. In the present embodiment, the reflection film 54 is parabolic-antenna-shaped. In other words, the reflection film 54 is a parabolic reflector. The reflection film 54 is circular as viewed in the z-direction.

The reflection film 54 and the mount plate 11 are opposed to each other in the z-direction. In other words, the mount plate 11 is located opposing the reflection film 54. In the present embodiment, the mount plate 11 is located above the reflection film 54. Thus, the electromagnetic waves reflected by the reflection film 54 are emitted upward transmitting through the mount plate 11.

The reflection film 54 is not disposed at the side of the element back surface 22 but at the side of the element main surface 21, where the oscillation point P1 exists, and is opposed to the terahertz element 20 (in the present embodiment, the element main surface 21). The reflection film 54 is disposed, for example, so that the focal point of the reflection film 54 is the oscillation point P1. In the present embodiment, the reflection film 54 has a center point P2 that coincides with the oscillation point P1 as viewed in the z-direction. In the present embodiment, the center point P2 is the center of the circular reflection film 54 as viewed in the z-direction.

It is preferred that the antenna surface 53 is curved so that the condition $Z=(1/(4z\mathbf{1}))X^2$ is satisfied when the perpendicular distance from the oscillation point P1 to the reflection film 54 is referred to as a specified distance z1, the coordinate of the reflection film 54 in the z-direction is denoted by Z, and the position of the reflection film 54 in the x-direction is denoted by X. However, the curving aspect of the antenna surface 53 is not limited to this and may be any curving aspect.

The z-direction may be referred to as the opposing direction of the reflection film 54 and the terahertz element 20 (the element main surface 21) or the output direction of the electromagnetic waves of the terahertz device 10. Further, the z-direction may be referred to as the opposing direction of the center point P2 of the reflection film 54 and the oscillation point P1. The specified distance z1 may be refer to as the distance between the oscillation point P1 and the center point P2.

The reflection film 54 is disposed at a position corresponding to the frequency of electromagnetic waves generated from the terahertz element 20 so that the electromagnetic waves resonate. Specifically, the specified distance z1 may be, for example, $(\lambda'_A/4)+((\lambda'_A/2)\times N)$ (N is an integer greater than or equal to 0) so that the resonance condition of the electromagnetic waves generated by the terahertz element 20 is satisfied. $\lambda'_A$ is $(1/n_A)(c/fc)$ (c: speed of light, fc: center frequency of oscillation) where $n_A$ represents the refractive index of an object intervening between the oscillation point P1 and the reflection film 54. For example, when air is present between the oscillation point P1 and the reflection film 54, $n_A$ is 1. fc may be a target frequency of the terahertz element 20 or the frequency having the maximum output among the electromagnetic waves generated from the terahertz element 20.

As viewed in the z-direction, the distance between opposite ends of the reflection film 54 in the x-direction or the y-direction is referred to as the opening width of the reflection film 54. In the present embodiment, since the reflection film 54 is formed on the entire antenna surface 53, the opening width of the reflection film 54 is equal to the opening width of the recess 52. The opening width of the recess 52 may be referred to as the diameter of the opening of the circular recess 52.

The reflection film 54 is formed, for example, over an angle that is greater than or equal to the opening angle θ of the oscillation point P1. More specifically, when the oscillation point P1 is the vertex, the antenna surface 53 is formed over an angle that is greater than or equal to the opening angle θ. As described above, in the present embodiment, the reflection film 54 is formed on the entire antenna surface 53. In the present embodiment, the angle over which the reflection film 54 is formed with the oscillation point P1 is greater than 180°. Therefore, in the present embodiment, the reflection film 54 reflects all of the electromagnetic waves emitted from the oscillation point P1 within the range of the opening angle θ.

In the present embodiment, the dimension of the antenna base 50 in the z-direction is greater than the dimension of the mount plate 11 in the z-direction, that is, the thickness of the mount plate 11. The dimension of the antenna base 50 in the x-direction is set to be equal to the dimension of the mount plate 11 in the x-direction. The dimension of the antenna base 50 in the y-direction is set to be equal to the dimension of the mount plate 11 in the y-direction. However, the antenna base 50 and the mount plate 11 may have any dimensional relationship.

As shown in FIGS. 42 and 43, the lead frame 60 is attached to the mount main surface 12 of the mount plate 11. The lead frame 60 and the mount plate 11 are bonded to each other in tight contact and fixed so as not to be displaced from each other.

The lead frame 60 has the shape of, for example, a rectangular plate, the thickness-wise direction of which conforms to the z-direction. In the present embodiment, the lead frame 60 has a greater thickness than the mount plate 11. In other words, in the present embodiment, the mount plate 11 has a smaller thickness than the lead frame 60.

The lead frame 60 includes a first lead part 61 and a second lead part 71 that are insulated from each other. The first lead part 61 and the second lead part 71 are, for example, separated and opposed to each other in the x-direction and respectively include a first lead opposing surface 62 and a second lead opposing surface 72 that are separated and opposed to each other in the x-direction. In the present embodiment, the lead opposing surfaces 62 and 72 are orthogonal to the x-direction. In the present embodiment, the first lead part 61 and the second lead part 71 correspond to "first conductor" and "second conductor".

As viewed in the z-direction, the first lead part 61 and the second lead part 71 extend sideward, in the present embodiment, in the x-direction, beyond the mount plate 11. The dimension of the two lead parts 61 and 71 in the y-direction is set to be slightly less than the dimension of the mount plate 11 in the y-direction, for example, equal to the dimension of the antenna base 50 in the y-direction. In the present embodiment, the lead frame 60 is less likely to extend beyond the mount plate 11 in the y-direction.

The lead frame 60 is formed so as to avoid overlapping with the reflection film 54 (the recess 52) in the z-direction. More specifically, the lead frame 60 includes an opening 80 that overlaps at least a portion of the reflection film 54 as viewed in the z-direction.

The opening 80 includes, for example, a gap 81 extending between the two lead parts 61 and 71, a first part opening 63 formed in the first lead part 61, and a second part opening 73 formed in the second lead part 71.

The gap 81 is slit-shaped and extends in the y-direction and includes a space between the lead opposing surfaces 62 and 72 and a space between the part openings 63 and 73.

The first part opening 63 is formed in a portion of the first lead part 61 that overlaps the reflection film 54 as viewed in the z-direction. The second part opening 73 is formed in a portion of the second lead part 71 that overlaps the reflection film 54 in the z-direction.

The first part opening 63 and the second part opening 73 extend through in the z-direction to be continuous with the recess 52. The first part opening 63 and the second part opening 73 are separated by the gap 81 and opposed to each other in the x-direction. The two part openings 63 and 73 are open in the x-direction. The first part opening 63 is open toward the second lead part 71. The second part opening 73 is open toward the first lead part 61. Thus, the two part openings 63 and 73 are continuous with the gap 81.

Each of the first part opening 63 and the second part opening 73 is semicircular as viewed in the z-direction. The first part opening 63 and the second part opening 73 form a single circular hole. In other words, the terahertz element 20 is located in the center of the circle formed by the part openings 63 and 73. The diameter of the circle formed by the part openings 63 and 73 may be, for example, greater than or equal to the opening width of the reflection film 54.

The first lead part 61 includes a first inner surface 64, which is the wall surface of the first part opening 63. The first inner surface 64 is recessed from the first lead opposing surface 62 in a direction away from the second lead opposing surface 72.

The second lead part 71 includes a second inner surface 74, which is the wall surface of the second part opening 73.

The second inner surface 74 is recessed from the second lead opposing surface 72 in a direction away from the first lead opposing surface 62.

The first inner surface 64 and the second inner surface 74 are curved to project away from each other. The two inner surfaces 64 and 74, for example, extend along the outer side of an end 54*a* of the reflection film 54, that is, the opening edge of the recess 52, to avoid overlapping of the two lead parts 61 and 71 with the reflection film 54.

As shown in FIG. 43, in the present embodiment, the first lead part 61 includes a first connector 65 configured to be electrically connected to the terahertz element 20. In the present embodiment, the first connector 65 is a portion of the first lead part 61 that projects toward the terahertz element 20 from where the first lead part 61 does not overlap the recess 52 (i.e., the reflection film 54) as viewed in the z-direction. More specifically, the first connector 65 is a projection piece projecting from the first inner surface 64 toward the terahertz element 20. The first connector 65 overlaps the reflection film 54 as viewed in the z-direction. The first connector 65 and the first pad 33*b* are connected by a first wire W1. Thus, the first lead part 61 is electrically connected to the terahertz element 20.

In the present embodiment, the projection dimension of the first connector 65 from the first inner surface 64 is less than the length of the first wire W1 as viewed in the z-direction. The projection dimension is, for example, less than ¼ of the opening width of the reflection film 54.

In the same manner, in the present embodiment, the second lead part 71 includes a second connector 75 configured to be electrically connected to the terahertz element 20. In the present embodiment, the second connector 75 is a portion of the second lead part 71 that projects toward the terahertz element 20 from where the second lead part 71 does not overlap the recess 52 (i.e., the reflection film 54) as viewed in the z-direction. More specifically, the second connector 75 is a projection piece projecting from the second inner surface 74 toward the terahertz element 20. The second connector 75 overlaps the recess 52 (i.e., the reflection film 54) as viewed in the z-direction. The second connector 75 and the second pad 34*b* are connected by a second wire W2. Thus, the second lead part 71 is electrically connected to the terahertz element 20.

In the present embodiment, the projection dimension of the second connector 75 from the second inner surface 74 is less than the length of the second wire W2 as viewed in the z-direction. The projection dimension is, for example, less than ¼ of the opening width of the reflection film 54.

In the present embodiment, the first connector 65 and the second connector 75 are opposed to each other at opposite sides of the terahertz element 20. For example, the two connectors 65 and 75 are symmetrically arranged in the x-direction. In other words, the two connectors 65 and 75 are shifted 180° from each other as viewed in the z-direction.

As shown in FIG. 42, the terahertz device 10 includes an adhesive layer 90 that adheres the antenna base 50 to the lead frame 60. The adhesive layer 90 is formed of, for example, an insulative material and includes, for example, a resin adhesive agent. The adhesive layer 90 is disposed between the base main surface 50*a* of the antenna base 50 and the lead frame 60. The antenna base 50 is adhered to the lead frame 60 by the adhesive layer 90. This unitizes the mount plate 11, the lead frame 60, and the antenna base 50. More specifically, the mount plate 11, that is, the base member, and the antenna base 50 are unitized so as not to be displaced from each other. Accordingly, the terahertz element 20, which is mounted on the mount plate 11, and the reflection film 54, which is formed on the antenna base 50, are unitized so as not to be displaced from each other.

The adhesive layer 90 is disposed between the reflection film 54 and the lead frame 60. The adhesive layer 90 hinders electrical connection of the reflection film 54 with the lead frame 60. As described above, the reflection film 54 is not electrically connected to the antenna base 50 and the lead frame 60 and is electrically isolated.

In particular, in the present embodiment, the inner peripheral end of the adhesive layer 90 extends inward (i.e., toward the terahertz element 20) beyond the reflection film 54. Thus, the reflection film 54 is less likely to avoid/circumvent/evade the adhesive layer 90 and contact the lead frame 60. The inner peripheral end of the adhesive layer 90 may be referred to as the end of the adhesive layer 90 located close to the terahertz element 20. The inner peripheral end of the adhesive layer 90 is, for example, circular in conformance with the recess 52 as viewed in the z-direction. However, the inner peripheral end of the adhesive layer 90 may have any shape and may be rectangular.

The terahertz element 20 and the reflection film 54 are accommodated in an accommodation space A1 defined by the mount plate 11 and the recess 52. In the present embodiment, the accommodation space A1 is defined by the mount main surface 12 and the antenna surface 53. In the present embodiment, the accommodation space A1 is hermetically sealed by the adhesive layer 90 and other components. Air exists in the accommodation space A1.

As shown in FIGS. 41 to 43, the terahertz device 10 includes a first electrode 91 and a second electrode 92 used for electrical connection with an external device. In the present embodiment, the lead frame 60 includes the first electrode 91 and the second electrode 92.

More specifically, in the present embodiment, part of the first lead part 61 and part of the second lead part 71 project sideward relative to the antenna base 50. The first electrode 91 is formed by a portion of the first lead part 61 projecting sideward relative to the antenna base 50. The first electrode 91 projects from the first base side surface 51*a*.

In the same manner, the second electrode 92 is formed by a portion of the second lead part 71 projecting sideward relative to the antenna base 50. The second electrode 92 projects from the second base side surface 51*b*.

In the present embodiment, the first electrode 91 and the second electrode 92 are separate from each other in the x-direction. The first electrode 91 and the second electrode 92 extend in opposite directions from the antenna base 50. In the present embodiment, the first electrode 91 and the second electrode 92 extend in the x-direction. The first electrode 91 and the second electrode 92 are orthogonal to the z-direction. In other words, the first electrode 91 and the second electrode 92 are flat plates extending horizontally.

As described above, the dimension of the antenna base 50 in the z-direction is greater than the thickness of the mount plate 11. In addition, the dimension of the antenna base 50 in the z-direction is greater than the sum of the thickness of the mount plate 11 and the thickness of the lead frame 60. The lead frame 60, which is disposed between the antenna base 50 and the mount plate 11, is disposed at an upper part of the terahertz device 10. Thus, the first electrode 91 and the second electrode 92, which are formed of part of the lead frame 60, are disposed at an upper side of the terahertz device 10.

More specifically, when the z-direction is the thickness-wise direction of the terahertz device 10, the first electrode 91 and the second electrode 92 are located upward from the center of the terahertz device 10 in the thickness-wise direction (in other words, toward the mount plate 11 or at the side where electromagnetic waves are output). In other words, the electrodes 91 and 92 project sideward from portions of the base side surfaces 51*a* and 51*b* located toward the base main surface 50*a* from the center. The projection direction is not limited to the direction orthogonal to the base side surfaces 51*a* and 51*b* and may be inclined from the direction orthogonal to the base side surfaces 51*a* and 51*b*.

A method for manufacturing the terahertz device 10 of the present embodiment will now be described. To simplify the description, a method for manufacturing one terahertz device 10 will first be described.

Figure 46:
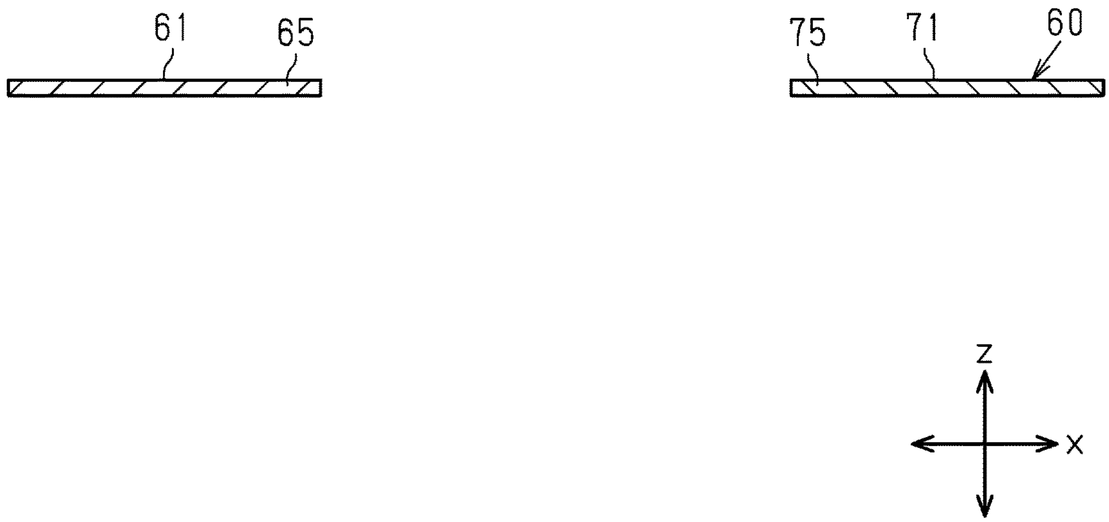
FIG. 46 is an end view showing a step in a method for manufacturing the terahertz device in the third embodiment.

As shown in FIG. 46, the method for manufacturing the terahertz device 10 includes a step of forming the lead frame 60. In this step, the first lead part 61 including the first part opening 63 and the first connector 65 is formed, and the second lead part 71 including the second part opening 73 and the second connector 75 is formed.

Figure 47:
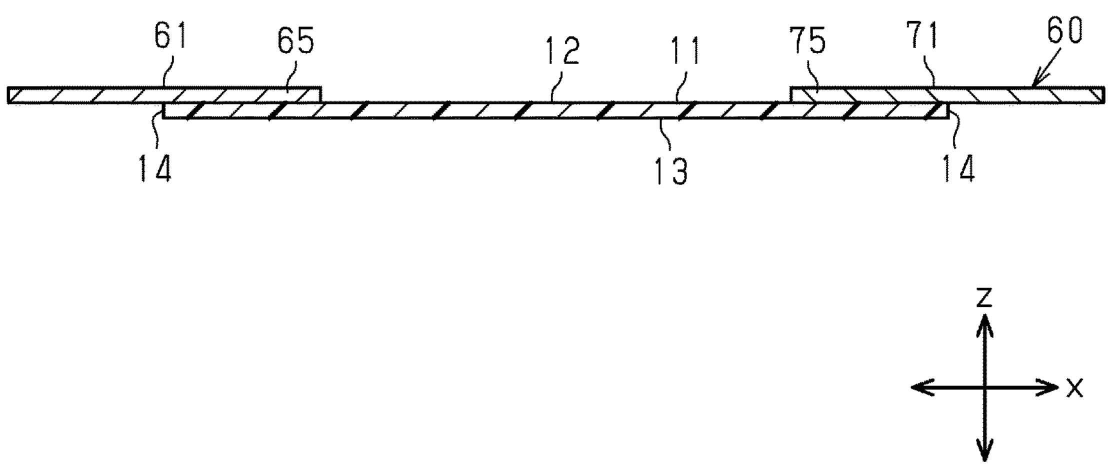
FIG. 47 is an end view showing a step in the method for manufacturing the terahertz device.

As shown in FIG. 47, the method for manufacturing the terahertz device 10 includes a step of forming the mount plate 11. In this step, the mount plate 11 is formed so as to extend over the two lead parts 61 and 71. Any specific process for forming the mount plate 11 may be used.

Figure 48:
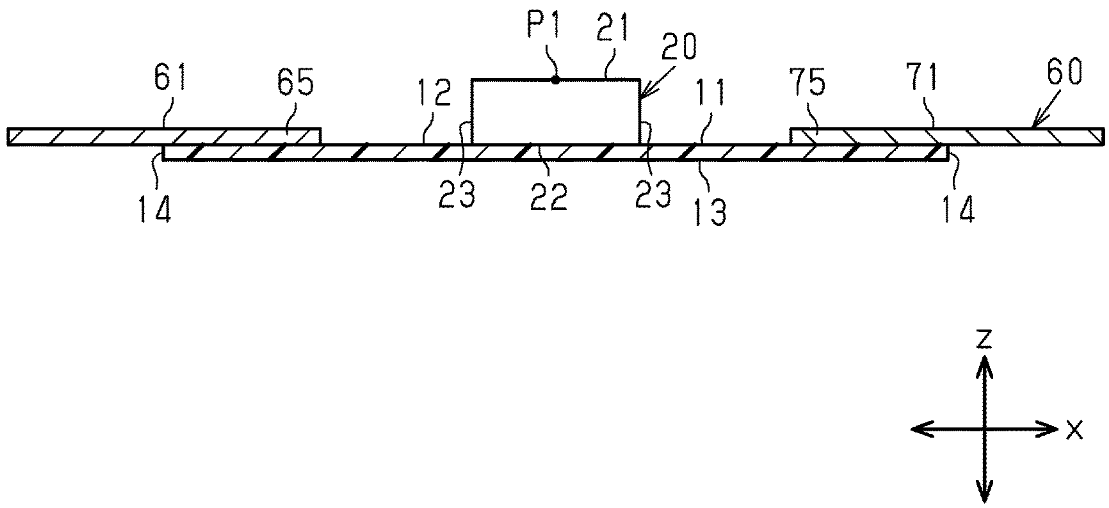
FIG. 48 is an end view showing a step in the method for manufacturing the terahertz device.

As shown in FIG. 48, the method for manufacturing the terahertz device 10 subsequently includes a step of mounting the terahertz element 20 on the mount plate 11. In this step, the terahertz element 20 is mounted on a surface of the mount plate 11 on which the lead frame 60 is formed. This unitizes the lead frame 60, the mount plate 11, and the terahertz element 20.

Figure 49:
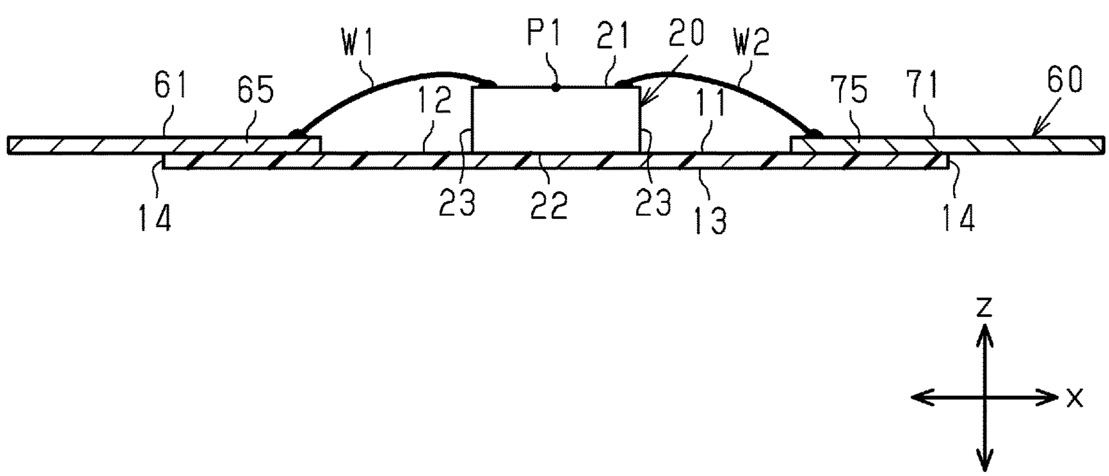
FIG. 49 is an end view showing a step in the method for manufacturing the terahertz device.

As shown in FIG. 49, the method for manufacturing the terahertz device 10 includes a step of electrically connecting the terahertz element 20 and the two lead parts 61 and 71 using the two wires W1 and W2. In this step, the first wire W1 is bonded to the first pad 33*b* and the first lead part 61, and the second wire W2 is bonded to the second pad 34*b* and the second lead part 71. The bonding order may be determined in any manner.

Figure 50:
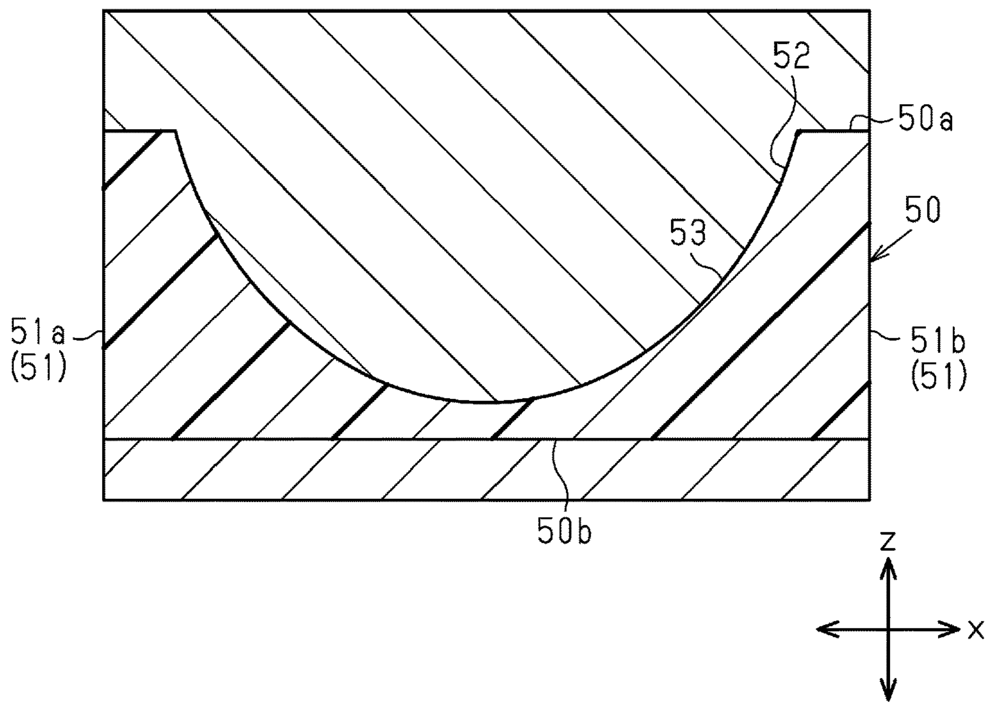
FIG. 50 is an end view showing a step in the method for manufacturing the terahertz device.

As shown in FIG. 50, the method for manufacturing the terahertz device 10 includes a step of forming the recess 52 in the antenna base 50. In this step, molds that are formed in conformance with the antenna surface 53 are used to form the recess 52 having the antenna surface 53.

Figure 51:
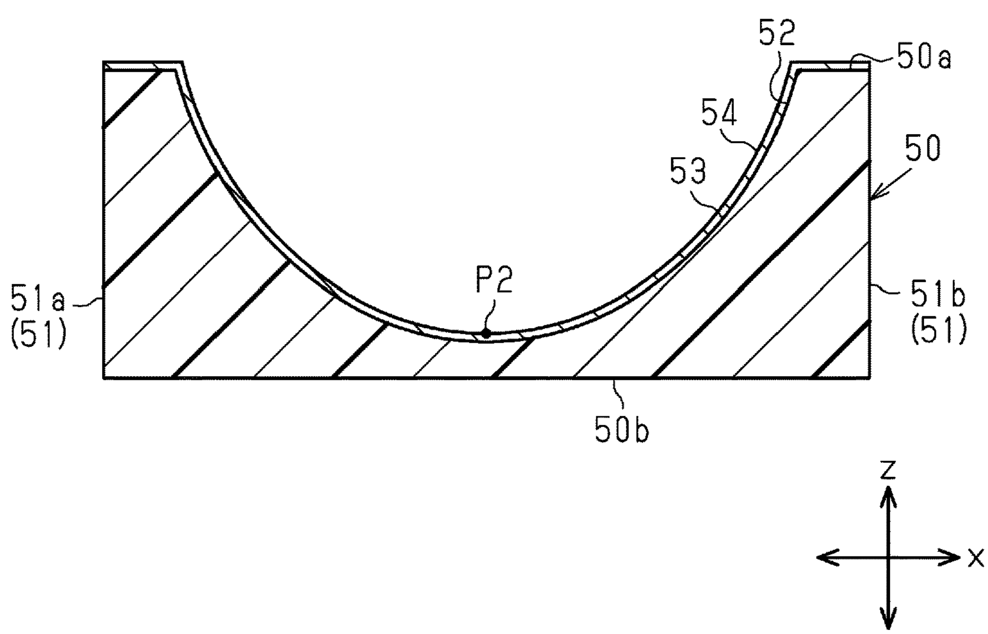
FIG. 51 is an end view showing a step in the method for manufacturing the terahertz device.

As shown in FIG. 51, the method for manufacturing the terahertz device 10 includes a step of forming a metal film forming the reflection film 54, which is performed after the recess 52 is formed. In this step, the metal layer is formed on both the base main surface 50*a* and the antenna surface 53.

Figure 52:
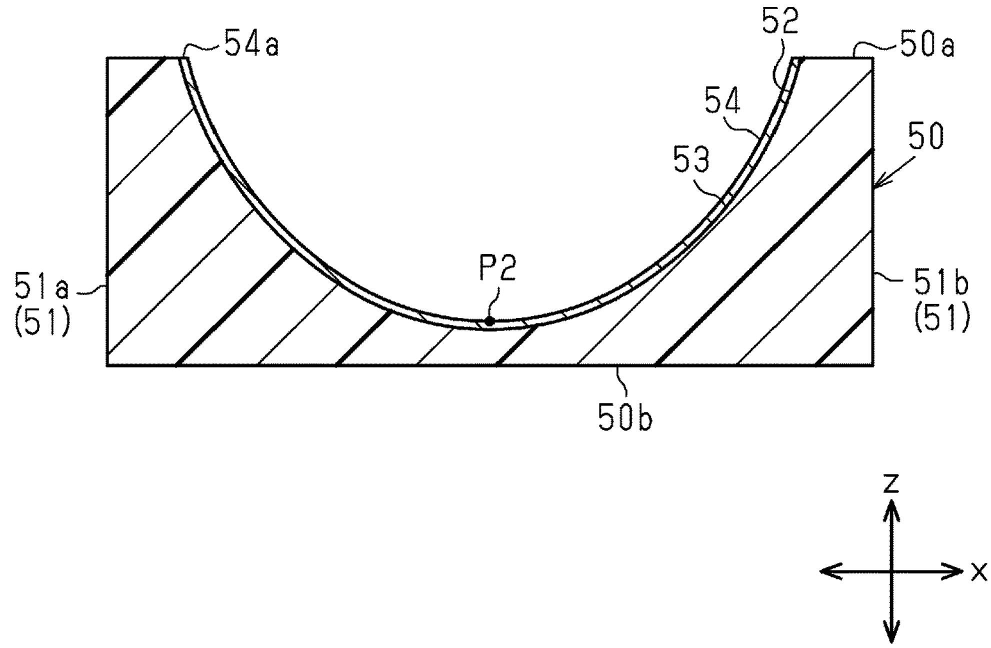
FIG. 52 is an end view showing a step in the method for manufacturing the terahertz device.

As shown in FIG. 52, the method for manufacturing the terahertz device 10 includes a step of removing the metal film from the base main surface 50*a*. Any specific process for removing the metal film from the base main surface 50*a* may be used. For example, the metal film may be removed by patterning or an abrasive process. As a result, the metal film is formed on only the antenna surface 53 as the reflection film 54.

The step of forming the metal film is not limited to the above-described steps. For example, the method for manufacturing the terahertz device 10 may include a step of masking the base main surface 50*a* and a step of forming a metal film on the antenna surface 53 by vapor deposition using electron beams. This case eliminates the need for the step of removing the metal film from the base main surface 50*a*.

Figure 53:
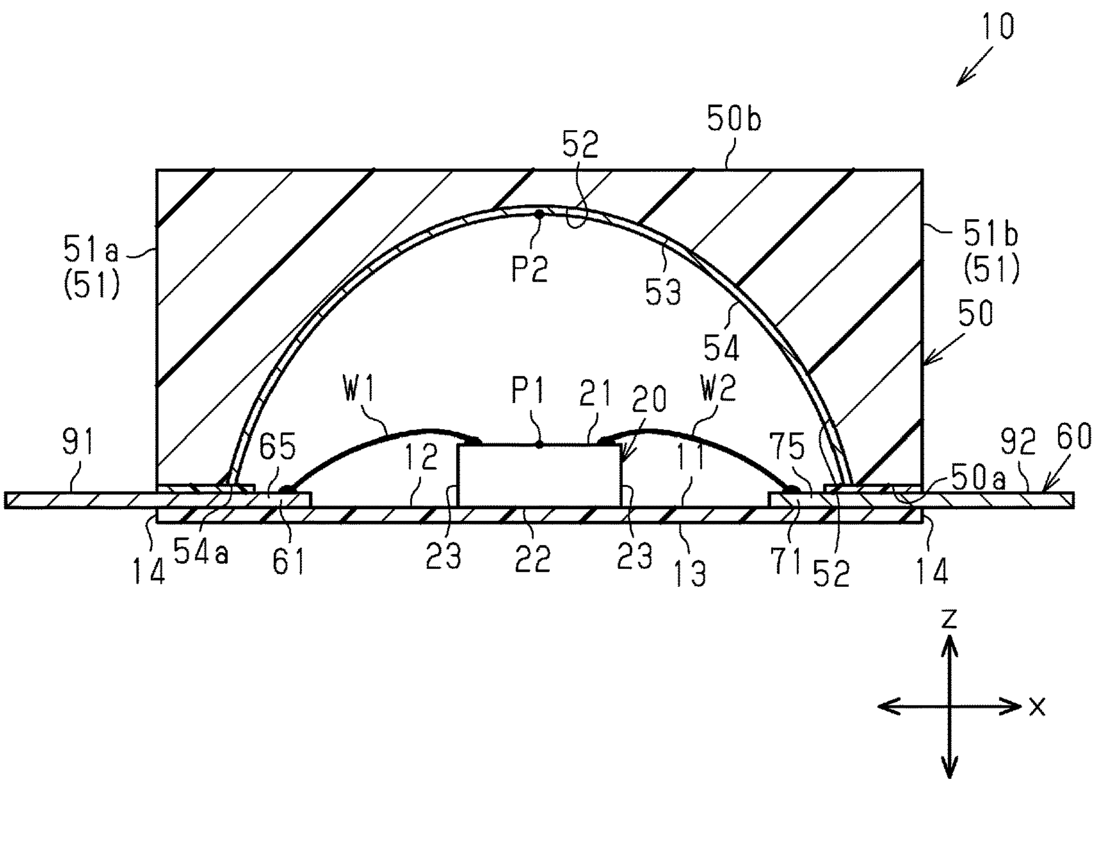
FIG. 53 is an end view showing a step in the method for manufacturing the terahertz device.

As shown in FIG. 53, the method for manufacturing the terahertz device 10 includes a step of coupling the unitized body of the lead frame 60, the mount plate 11, and the terahertz element 20 to the antenna base 50 on which the reflection film 54 is formed. In this step, the adhesive layer 90 is used to adhere the antenna base 50 and the lead frame 60. As a result, the terahertz device 10 is formed.

To simplify the description, the method for manufacturing one terahertz device 10 has been described above. However, practically, a plurality of terahertz devices 10 may be simultaneously manufactured.

Figure 54:
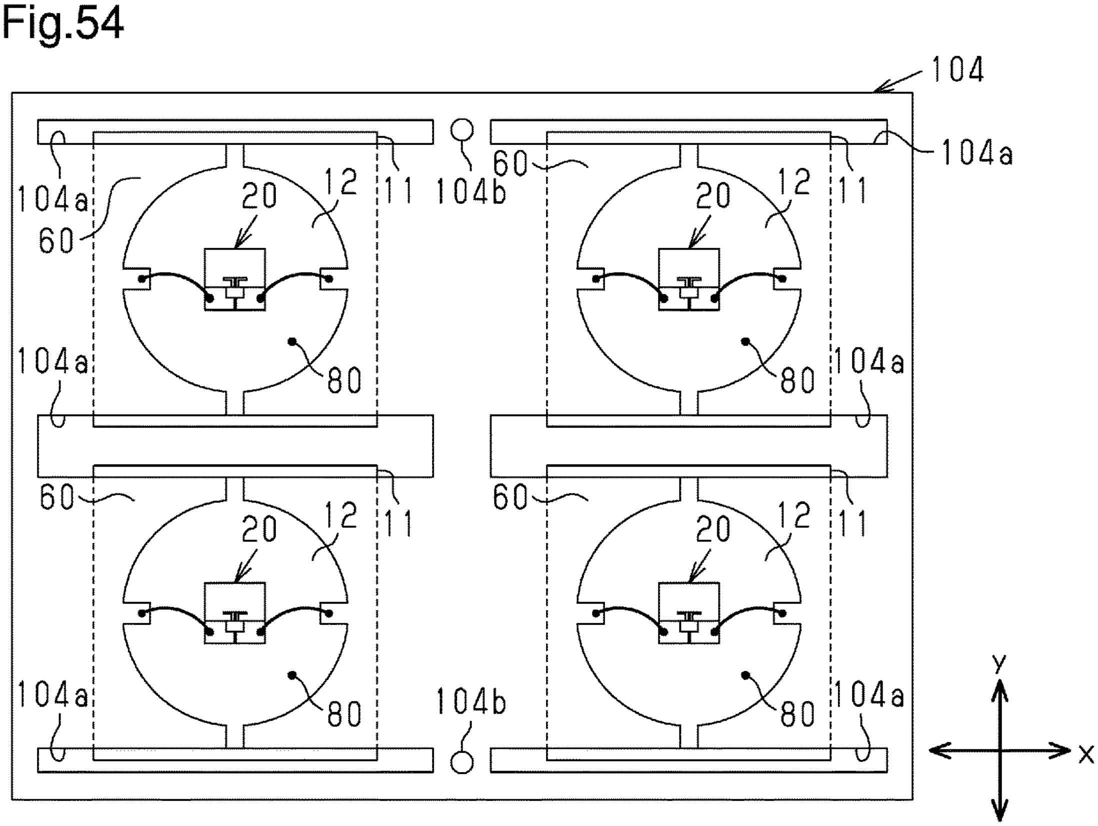
FIG. 54 is a plan view showing a step in the method for manufacturing the terahertz device.

For example, as shown in FIG. 54, a metal plate 104 including a plurality of lead frames 60 and including punched-out portions corresponding to the openings 80 is prepared. A plurality of mount plates 11 and a plurality of terahertz elements 20 are mounted on the metal plate 104. The metal plate 104 is punched out along the ends of the lead frames 60 in the y-direction to form first through holes 104*a*. The first through holes 104*a* are, for example, slit-shaped and extend from opposite sides of the mount plate 11 in the x-direction by an amount corresponding to the two electrodes 91 and 92.

Figure 55:
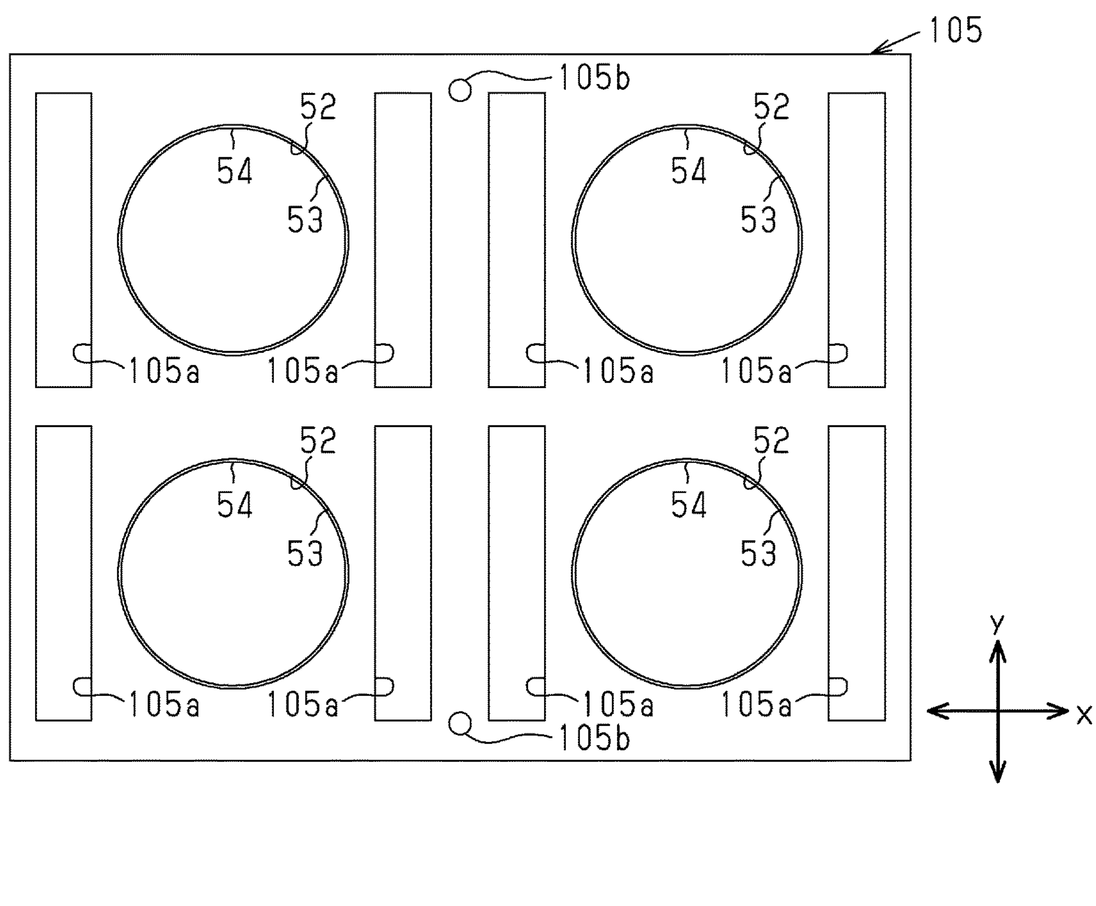
FIG. 55 is a plan view showing a step in the method for manufacturing the terahertz device.

Meanwhile, as shown in FIG. 55, a base body 105 in which the recesses 52 and the reflection films 54 are formed is prepared. Second through holes 105*a* are formed in portions of the base body 105 corresponding to where the lead frames 60 are exposed. The second through holes 105*a* are formed in portions faced toward the electrodes 91 and 92 when the metal plate 104 is adhered to the base body 105. The metal plate 104, which includes the mount plates 11 and the terahertz elements 20, and the base body 105 are positioned and adhered to each other by an adhesive. Subsequently, the metal plate 104 and the base body 105 are cut by dicing. This manufactures a plurality of terahertz devices 10.

The metal plate 104 may include first positioning portions 104*b*, and the base body 105 may include second positioning portions 105*b*. When adhering the metal plate 104 to the base body 105, the metal plate 104 and the base body 105 may be positioned so that the first positioning portions 104*b* overlap the second positioning portions 105*b*.

Operation of the present embodiment will now be described.

When electromagnetic waves are generated from the oscillation point P1 of the terahertz element 20, the reflection film 54 reflects and emits the electromagnetic waves in one direction.

Figure 56:
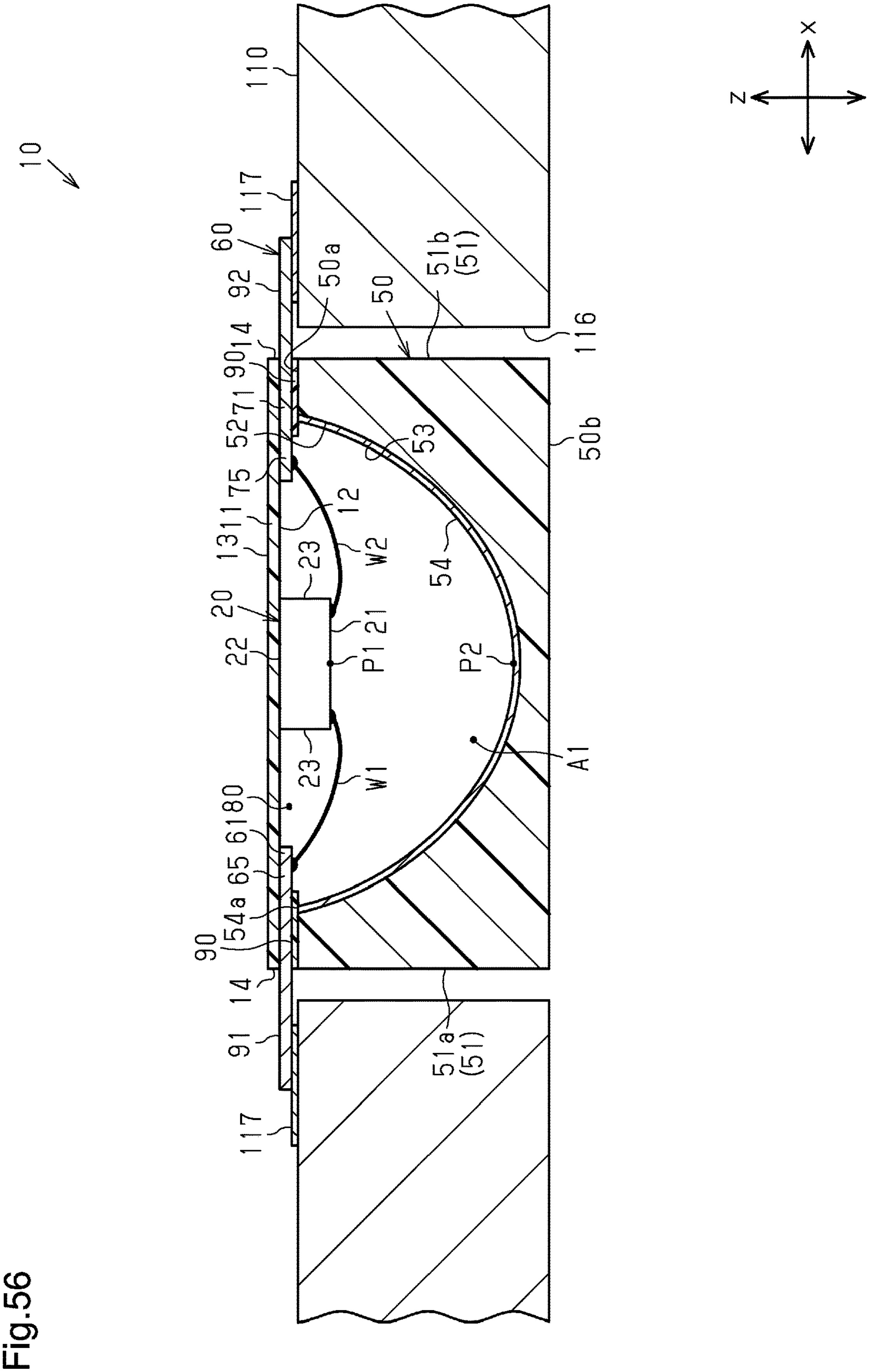
FIG. 56 is an end view showing an example of a mount mode of the terahertz device on a circuit substrate.

The two electrodes 91 and 92 of the terahertz device 10 project sideward relative to the antenna base 50 as viewed in the z-direction. As shown in FIG. 56, the terahertz device 10 may be mounted on a circuit substrate 110 having a hole 116 when the antenna base 50 is inserted into the hole 116 of the circuit substrate 110. In this case, for example, a conductive bonding member 117 such as solder may be used to bond the electrodes 91 and 92 to the circuit substrate 110.

The present embodiment, which has been described above, has the following advantages.

(3-1) The terahertz device 10 includes the mount plate 11 used as the base member, the terahertz element 20 mounted on the mount plate 11, the antenna base 50 located opposing the mount plate 11 and including the antenna surface 53, and the reflection film 54 formed on the antenna surface 53. The reflection film 54 reflects at least part of electromagnetic waves generated by the terahertz element 20 in one direction (for example, upward). With this structure, electromagnetic waves generated by the terahertz element are emitted in one direction. This increases the output of the electromagnetic waves emitted from the terahertz device 10. Thus, the gain of the terahertz device 10 is improved.

(3-2) The terahertz device 10 includes the first electrode 91 and the second electrode 92 as electrodes used for electrical connection with an external device. The electrodes 91 and 92 project sideward relative to the antenna base 50 as viewed in the z-direction, that is, the opposing direction of the mount plate 11 and the antenna base 50. This structure allows for the mounting on the circuit substrate 110 when the antenna base 50 is inserted into the hole 116 of the circuit substrate 110. Thus, when the terahertz device 10 is mounted on the circuit substrate 110, the projection of the terahertz device 10 from the circuit substrate 110 in the z-direction is limited, thereby achieving a low profile structure.

More specifically, when the terahertz device 10 includes the antenna base 50 including the reflection film 54, the terahertz device 10 is increased in size in the z-direction corresponding to the antenna base 50, while improving the gain. This may be a disadvantage such that the terahertz device 10 interferes with the mounting on the circuit substrate 110.

In this regard, when the electrodes 91 and 92 project sideward, the terahertz device 10 may be mounted on the circuit substrate 110 with the antenna base 50 inserted into the hole 116 as described above. More specifically, the antenna base 50 may be inserted into the hole 116 to a position where the electrodes 91 and 92 contact the circuit substrate 110. This reduces the amount of projection of the terahertz device 10 from the circuit substrate 110, thereby reducing the disadvantage of including the antenna base 50.

(3-3) The electrodes 91 and 92 are located toward the mount plate 11 from the center of the terahertz device 10 in the z-direction. This structure allows for an increase in the size of the antenna base 50, which is inserted into the hole 116, thereby achieving a further low profile structure.

(3-4) The electrodes 91 and 92 extend in a direction (the x-direction) orthogonal to the thickness-wise direction of the terahertz device 10 (the z-direction). In this structure, the length of the electrodes 91 and 92 are decreased as compared to in a structure in which the electrodes 91 and 92 are bent. Accordingly, inductance of the electrodes 91 and 92 is decreased. In addition, adverse effects produced by the bending of the electrodes 91 and 92 on high frequency response are limited.

(3-5) The electrodes 91 and 92 are separated and face each other. In this structure, contact of the electrodes 91 and 92 is avoided. The two electrodes 91 and 92 support the terahertz device 10 on the circuit substrate 110.

(3-6) The terahertz element 20 includes the element main surface 21, which includes the oscillation point P1 configured to generate electromagnetic waves, and the element back surface 22, which is opposite the element main surface 21. The reflection film 54 is disposed at the side of the element main surface 21, not at the side of the element back surface 22. In this structure, electromagnetic waves readily reach the reflection film 54. Thus, the reflection film 54 is appropriately used to reflect electromagnetic waves generated from the oscillation point P1.

(3-7) The terahertz element 20 radiates electromagnetic waves from the oscillation point P1 in the range of the opening angle θ. The reflection film 54 is formed over an angle that is greater than or equal to the opening angle θ of the oscillation point P1. With this structure, the electromagnetic waves radiated from the oscillation point P1 in the range of the opening angle θ are reflected by the reflection film 54. This reduces electromagnetic waves that are not reflected by the reflection film 54, thereby improving the gain.

(3-8) The reflection film 54 is parabolic-antenna-shaped. With this structure, electromagnetic waves are appropriately reflected in one direction.

(3-9) The reflection film 54 is disposed so that the focal point of the reflection film 54 is located at the oscillation point P1. With this structure, electromagnetic waves generated from the oscillation point P1 are guided in one direction by the reflection film 54. This reduces electromagnetic waves that are not reflected in one direction by the reflection film 54, thereby improving the gain.

(3-10) The reflection film 54 is disposed at a position corresponding to the frequency of electromagnetic waves generated from the terahertz element 20 so that the electromagnetic waves resonate. In an example, the specified distance z1, which is the perpendicular distance from the oscillation point P1 toward the reflection film 54, is set to satisfy the resonance condition of the electromagnetic waves, for example, $(\lambda'_A/4)+((\lambda'_A/2)\times N)$. This structure improves the gain of the terahertz device 10.

(3-11) The reflection film 54 is electrically isolated. This structure obviates disadvantages such as absorption of electromagnetic waves by the reflection film 54.

(3-12) The antenna base 50 is formed of an insulative material. This structure limits electrical connection of the reflection film 54 with another member via the antenna base 50.

(3-13) The mount plate 11, which is used as the base member, includes the mount main surface 12 on which the terahertz element 20 is mounted. The antenna base 50 includes the base main surface 50*a*, which is opposed to the mount main surface 12, and the recess 52, which is recessed from the base main surface 50*a* and includes the antenna surface 53. The terahertz element 20 and the reflection film 54 are disposed in the accommodation space A1 defined by the mount main surface 12 and the antenna surface 53. This structure reduces external effects on the terahertz element 20 and the reflection film 54.

(3-14) The reflection film 54 is formed on the antenna surface 53 but is not formed on the base main surface 50*a*. This structure obviates reflection of electromagnetic waves by the reflection film 54 formed on the base main surface 50*a*. Thus, disadvantages caused by unwanted reflection waves, for example, occurrence of standing waves, are limited.

(3-15) The lead frame 60, which is used as a conductive member, is disposed on the mount main surface 12. The antenna base 50 is adhered to the lead frame 60 by the adhesive layer 90. The adhesive layer 90 is formed from an insulative material and is disposed between the reflection film 54 and the lead frame 60. In this structure, the adhesive layer 90 restricts contact of the reflection film 54 with the lead frame 60. Thus, electrical connection of the reflection film 54 with the lead frame 60 is hindered.

(3-16) The lead frame 60 includes the opening 80 overlapping at least a portion of the reflection film 54 as viewed in the z-direction. In this structure, electromagnetic waves reflected by the reflection film 54 are output through the opening 80. This limits interruption of electromagnetic waves by the lead frame 60.

(3-17) The lead frame 60 includes the first lead part 61 and the second lead part 71, which are separated and opposed to each other. The opening 80 includes the gap 81 between the two lead parts 61 and 71. This structure limits interruption (blocking) of electromagnetic waves by the lead frame 60 while ensuring the insulation properties of the two lead parts 61 and 71.

(3-18) The opening 80 includes the first part opening 63 formed in a portion of the first lead part 61 that overlaps the reflection film 54 as viewed in the z-direction and is continuous with the gap 81. The opening 80 includes the second part opening 73 formed in a portion of the second lead part 71 that overlaps the reflection film 54 as viewed in the z-direction and is continuous with the gap 81 In this structure, the interruption of electromagnetic waves by the lead frame 60 is further limited.

(3-19) The first lead part 61 includes the first connector 65 configured to be electrically connected to the terahertz element 20. The first connector 65 projects from the first inner surface 64, which is the wall surface of the first part opening 63, toward the terahertz element 20 and overlaps the reflection film 54 as viewed in the z-direction. The second lead part 71 includes the second connector 75 configured to be electrically connected to the terahertz element 20. The second connector 75 projects from the second inner surface 74, which is the wall surface of the second part opening 73, toward the terahertz element 20 and overlaps the reflection film 54 as viewed in the z-direction. In this structure, while limiting interruption of electromagnetic waves by the lead frame 60, the two lead parts 61 and 71 are electrically connected to the terahertz element 20.

(3-20) The terahertz device 10 includes the first wire W1 and the second wire W2. The first wire W1 connects the first connector 65 to the first pad 33*b* formed on the terahertz element 20, The second wire W2 connects the second connector 75 to the second pad 34*b* formed on the terahertz element 20. As viewed in the z-direction, the projection dimension of the first connector 65 from the first inner surface 64 is less than the length of the first wire W1. With this structure, interruption of electromagnetic waves by the first connector 65 is limited as the projection dimension of the first connector 65 is decreased. In the same manner, as viewed in the z-direction, the projection dimension of the second connector 75 from the second inner surface 74 may be less than the length of the second wire W2.

(3-21) The two connectors 65 and 75 are opposed to each other at opposite sides of the terahertz element 20. In this structure, the two wires W1 and W2 are less likely to interfere with each other. Thus, contact of the two wires W1 and W2 is avoided.

Modified Example of Third Embodiment

Figure 57:
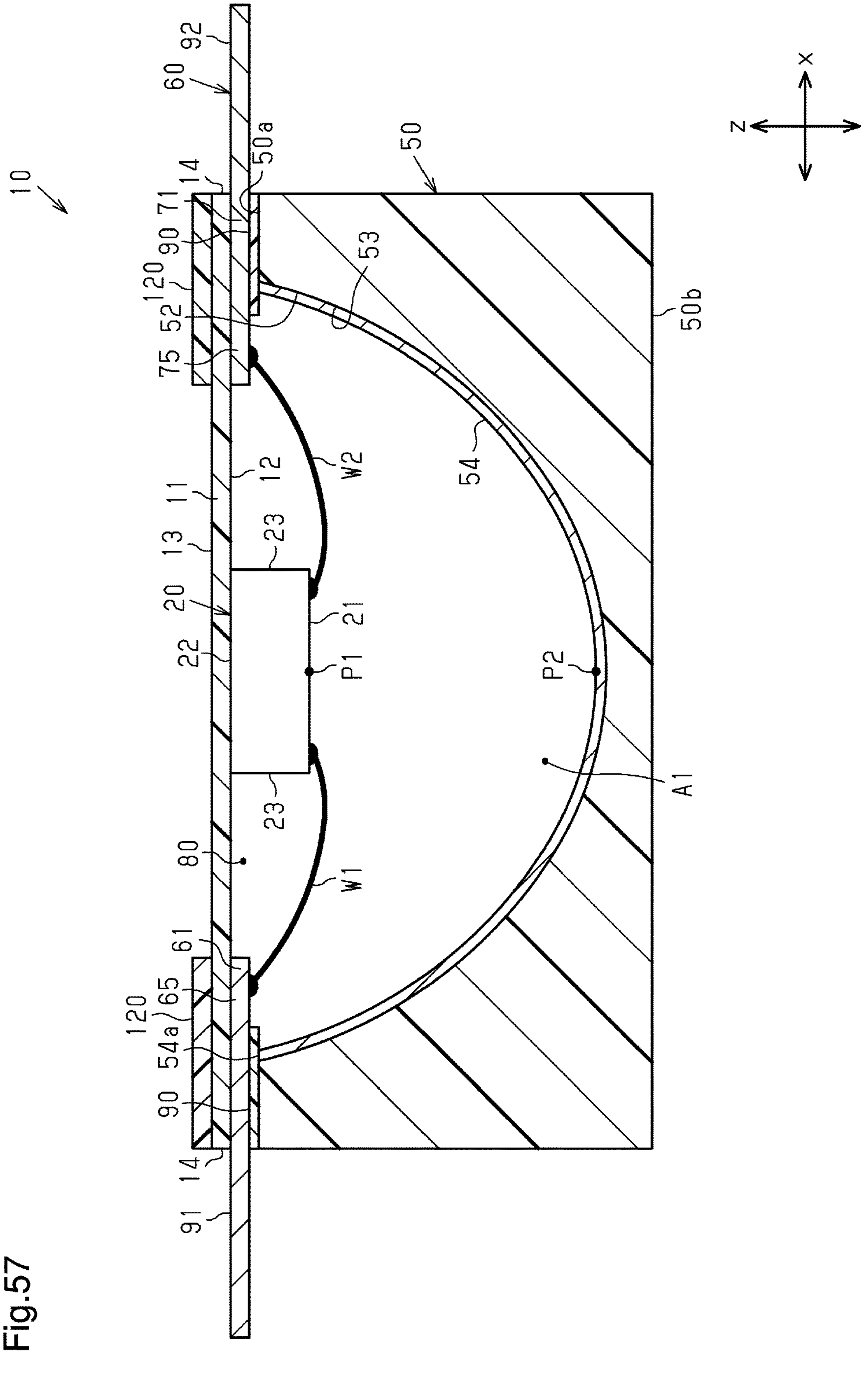
FIG. 57 is an end view of a modified example of the terahertz device of the third embodiment.

As shown in FIG. 57, the terahertz device 10 may include a reflection reduction film 120 formed on the mount back surface 13. The reflection reduction film 120 may refer to a reflection prevention film or an anti-reflection (AR) coating film.

For example, the reflection reduction film 120 may be formed on at least a portion of the part of the mount back surface 13 overlapping the lead frame 60 as viewed in the z-direction. In an example, the reflection reduction film 120 is formed on the entirety of the part of the mount back surface 13 overlapping the lead frame 60 as viewed in the z-direction. This limits occurrence of standing waves caused by reflection of electromagnetic waves at the lead frame 60. Any specific structure of the reflection reduction film 120 may be used as long as reflection of electromagnetic waves in at least the terahertz band is reduced.

Fourth Embodiment

Figure 58:
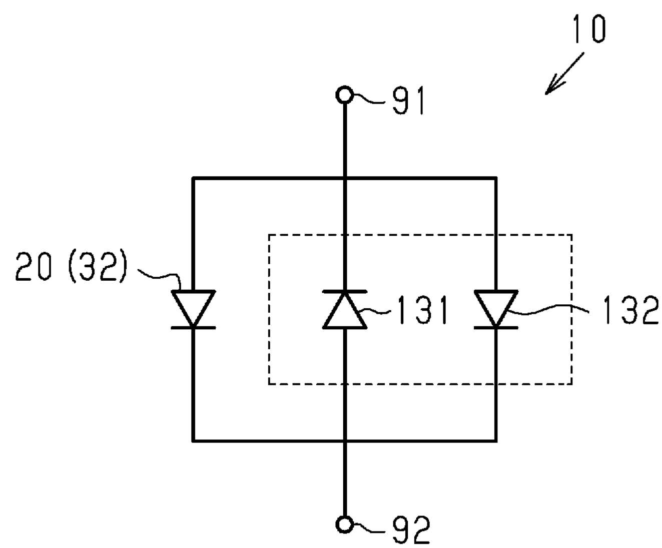
FIG. 58 is a circuit diagram showing the overview of a fourth embodiment of a terahertz device.

As shown in FIG. 58, the present embodiment of a terahertz device 10 includes protection diodes 131 and 132, which are an example of a specific element that is electrically connected to the terahertz element 20. The protection diodes 131 and 132 are electrically connected to the terahertz element 20. In the present embodiment, the protection diodes 131 and 132 are connected to the terahertz element 20 in parallel. The two protection diodes 131 and 132 are connected to the terahertz element 20 in opposite directions. The protection diodes 131 and 132 may be general diodes or Zener diodes, Schottky diodes, or light emitting diodes.

The specific element is not limited to the protection diodes 131 and 132 and may be a control integrated circuit (IC) (e.g., application-specific integrated circuit (ASIC)). The control IC may be configured to, for example, detect current flowing to the terahertz element 20, serve as an amplifier, supply power to the terahertz element 20, or process signals. The specific element may be connected to the terahertz element 20 in any mode and may be, for example, connected in series.

Figure 59:
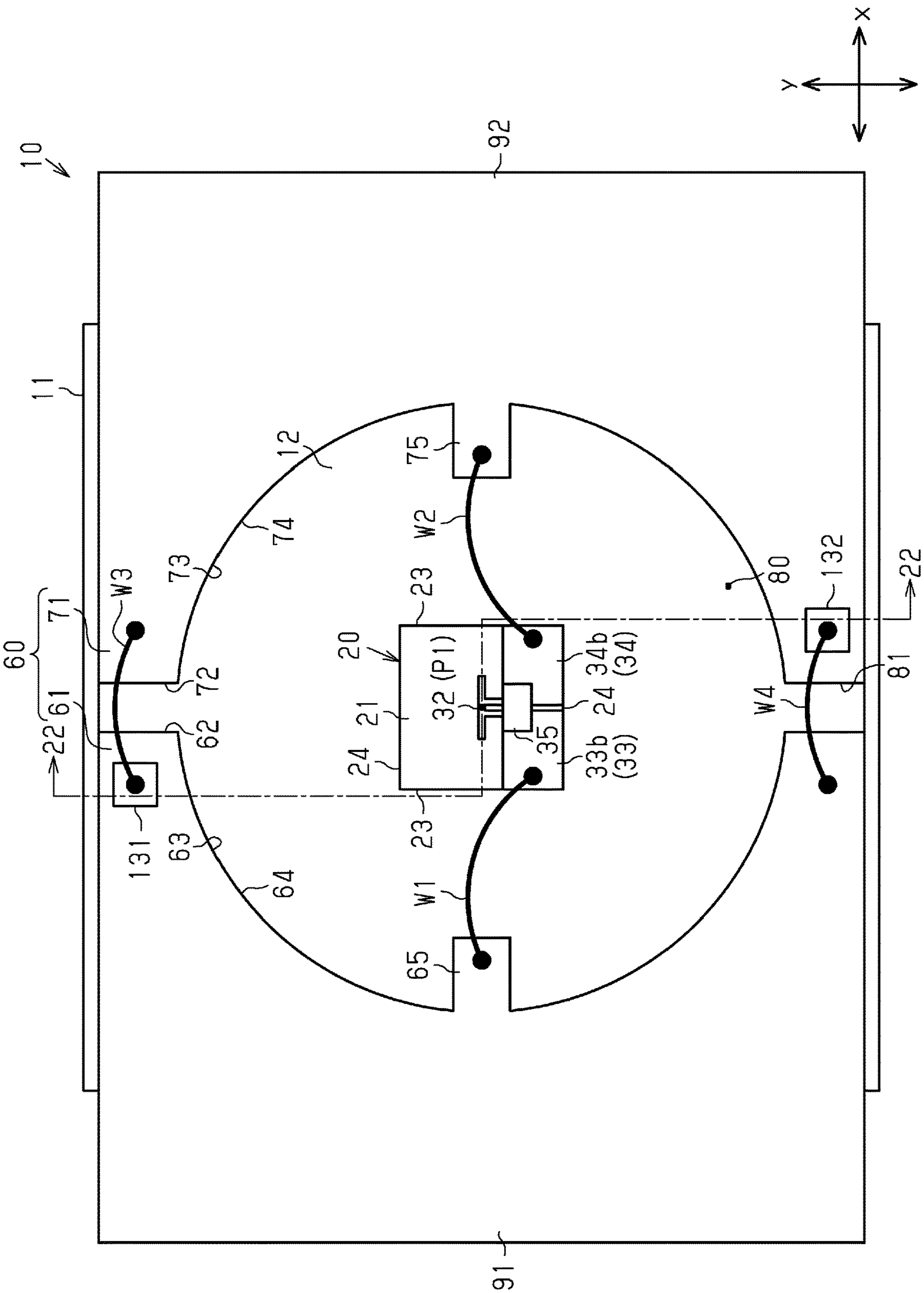
FIG. 59 is a front view of a terahertz element and a lead frame in the fourth embodiment.
Figure 60:
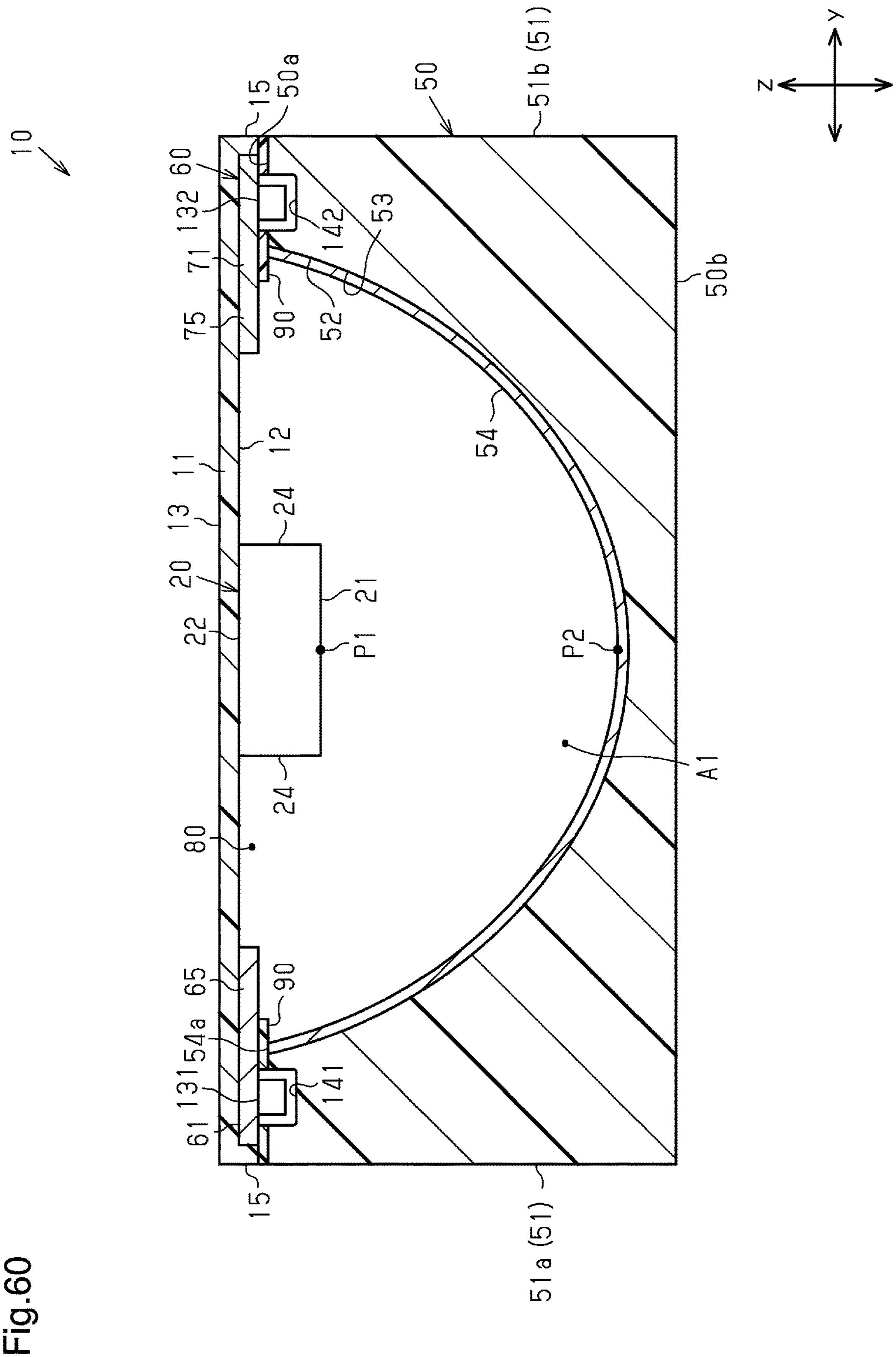
FIG. 60 is an end view taken along line 22-22 in FIG. 59.

As shown in FIGS. 59 and 60, the two protection diodes 131 and 132 are opposed to each other at opposite sides of the terahertz element 20. The two protection diodes 131 and 132 are mounted on the lead frame 60.

More specifically, the first protection diode 131 is disposed on the first lead part 61 and electrically connected to the first lead part 61. The first protection diode 131 is disposed, for example, near the first part opening 63 on the first lead part 61. In the present embodiment, the first protection diode 131 is disposed in a region surrounded by the first inner surface 64, the first lead opposing surface 62, and the end surface of the first lead part 61 in the y-direction.

The first protection diode 131 and the second lead part 71 are electrically connected by a first diode wire W3. Thus, the first protection diode 131 is electrically connected to the two electrodes 91 and 92.

The first diode wire W3 is bonded to the second lead part 71 at a position close to the first protection diode 131, that is, a region defined by the second inner surface 74, the second lead opposing surface 72, and the end surface of the second lead part 71 in the y-direction. This reduces the length of the first diode wire W3.

In the same manner, the second protection diode 132 is disposed on the second lead part 71 and electrically connected to the second lead part 71. The second protection diode 132 is disposed, for example, near the second part opening 73 on the second lead part 71. In the present embodiment, the second protection diode 132 is disposed in a region surrounded by the second inner surface 74, the second lead opposing surface 72, and the end surface of the second lead part 71 in the y-direction.

The second protection diode 132 and the first lead part 61 are electrically connected by a second diode wire W4. Thus, the second protection diode 132 is electrically connected to the two electrodes 91 and 92.

The second diode wire W4 is bonded to the first lead part 61 at a position closet to the second protection diode 132, that is, a region surrounded by the first inner surface 64, the first lead opposing surface 62, and the end surface of the first lead part 61 in the y-direction. This reduces the length of the second diode wire W4.

As shown in FIG. 60, in the present embodiment, the antenna base 50 includes receptacles 141 and 142 that are recessed from the base main surface 50*a*. The protection diodes 131 and 132 are accommodated in the receptacles 141 and 142. The receptacles 141 and 142 are formed around the recess 52 so as not to be continuous with the recess 52. That is, the receptacles 141 and 142 are arranged separately from the recess 52 to accommodate the specific elements. As shown in FIG. 60, the adhesive layer 90 is not formed on locations corresponding to the receptacles 141 and 142.

The present embodiment, which has been described above, has the following operational advantages.

(4-1) The terahertz device 10 includes the protection diodes 131 and 132 connected to the terahertz element 20 in parallel. With this structure, for example, when static electricity causes to a high voltage to be applied to opposite ends of the terahertz element 20, current flows through the protection diodes 131 and 132. Thus, an excessive current flowing to the terahertz element 20 is limited, so that the terahertz element 20 is protected.

(4-2) The two protection diodes 131 and 132 are connected to the terahertz element 20 in opposite directions. With this structure, the terahertz element 20 is protected from a high voltage produced in each direction.

(4-3) The antenna base 50 includes the receptacles 141 and 142 recessed from the base main surface 50*a*. The protection diodes 131 and 132 are accommodated in the receptacles 141 and 142. This structure limits increases in the size of the terahertz device 10 caused by arrangement of the protection diodes 131 and 132.

Fifth Embodiment

Figure 61:
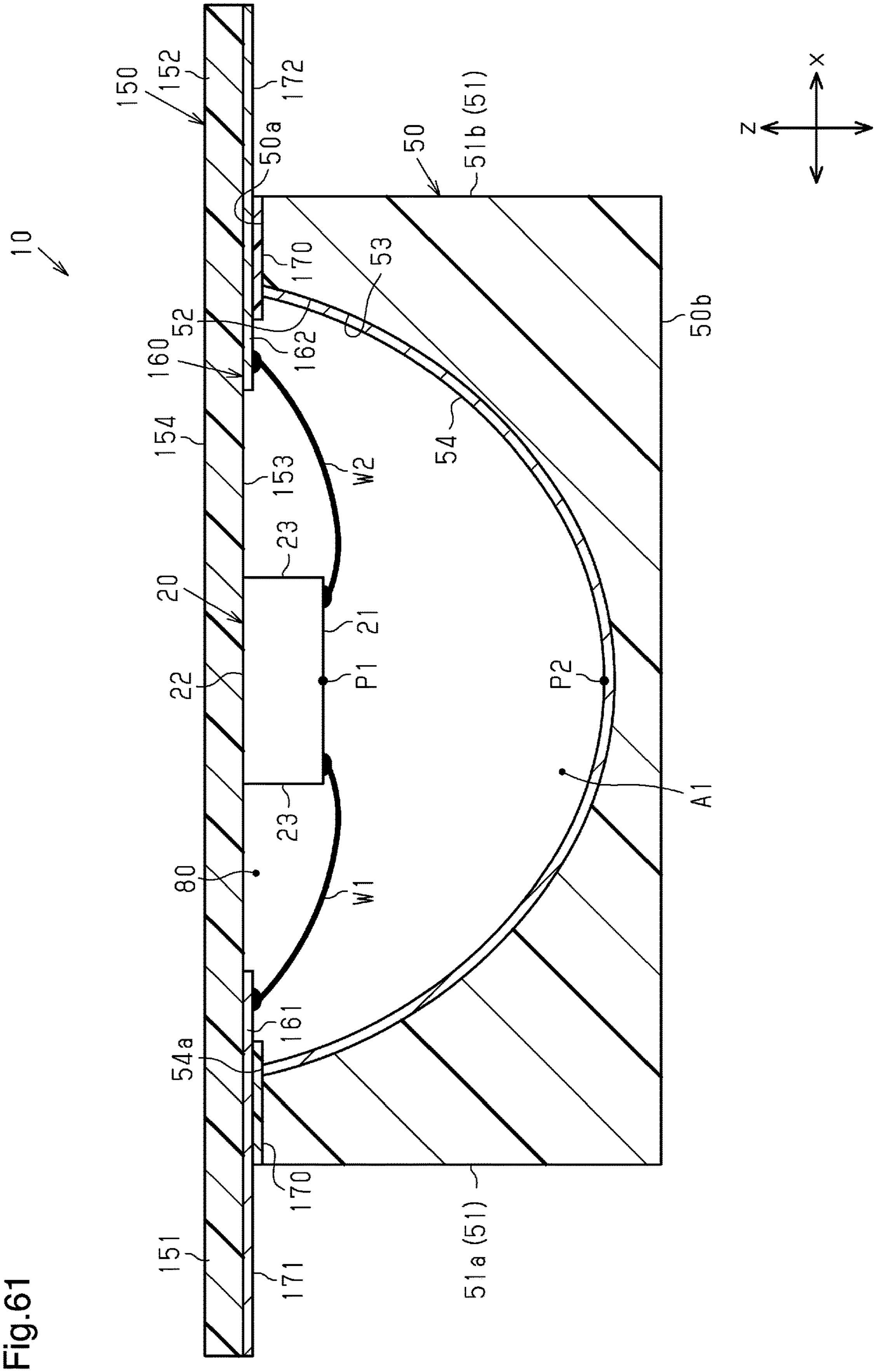
FIG. 61 is a schematic end view showing a fifth embodiment of a terahertz device.

As shown in FIG. 61, the terahertz device 10 includes a support substrate 150 as a base member. The support substrate 150 is formed of, for example, a material transmissive to electromagnetic waves. In an example, the support substrate 150 is formed of a dielectric.

The support substrate 150 is plate-shaped and, in the present embodiment, is rectangular-plate-shaped. The support substrate 150 includes a first extension 151 and a second extension 152 that are longer than the antenna base 50 in a predetermined direction as viewed in the z-direction and extend sideward (e.g., the x-direction) beyond the antenna base 50 as viewed in the z-direction. The two extensions 151 and 152 are separated and opposed to each other in the x-direction.

The support substrate 150 includes plate surfaces defining a mount main surface 153 and a mount back surface 154. The mount main surface 153 and the mount back surface 154 intersect the z-direction and, in an example, are orthogonal to the z-direction. The terahertz element 20 is mounted on the mount main surface 153. The mount main surface 153 and the reflection film 54 are opposed to each other.

The terahertz device 10 includes a wiring pattern 160 and an adhesive layer 170. The wiring pattern 160 is formed on the mount main surface 153 and used as a conductive member and an electrode. The adhesive layer 170 adheres the wiring pattern 160 to the antenna base 50.

The wiring pattern 160 is a conductive layer formed on the mount main surface 153 and is formed of, for example, Cu. The thickness of the support substrate 150, that is, the dimension of the support substrate 150 in the z-direction, is greater than the thickness of the wiring pattern 160. The wiring pattern 160 includes a first pattern 161 and a second pattern 162. The specific layout of the first pattern 161 and the second pattern 162 is basically the same as that of the first lead part 61 and the second lead part 71. In the present embodiment, the first pattern 161 and the second pattern 162 correspond to "first conductor" and "second conductor".

The adhesive layer 170 is formed of an insulative material. The adhesive layer 170 is disposed between the base main surface 50*a* and the wiring pattern 160 and between the reflection film 54 and the wiring pattern 160.

In the present embodiment, the wiring pattern 160 includes electrodes 171 and 172. For example, the electrodes 171 and 172 are formed of the wiring pattern 160 that is formed on the extensions 151 and 152 of the support substrate 150. The first electrode 171 is formed of a portion of the first pattern 161 extending from the antenna base 50 (the first base side surface 51*a*) in the x-direction. The second electrode 172 is formed of a portion of the second pattern 162 extending from the antenna base 50 (the second base side surface 51*b*) in the x-direction. Thus, in the same manner as the third embodiment, the electrodes 171 and 172 project sideward relative to the antenna base 50. In other words, the support substrate 150 supports the electrodes 171 and 172.

An example of a method for manufacturing the method for manufacturing the terahertz device 10 of the present embodiment will now be described.

Figure 62:
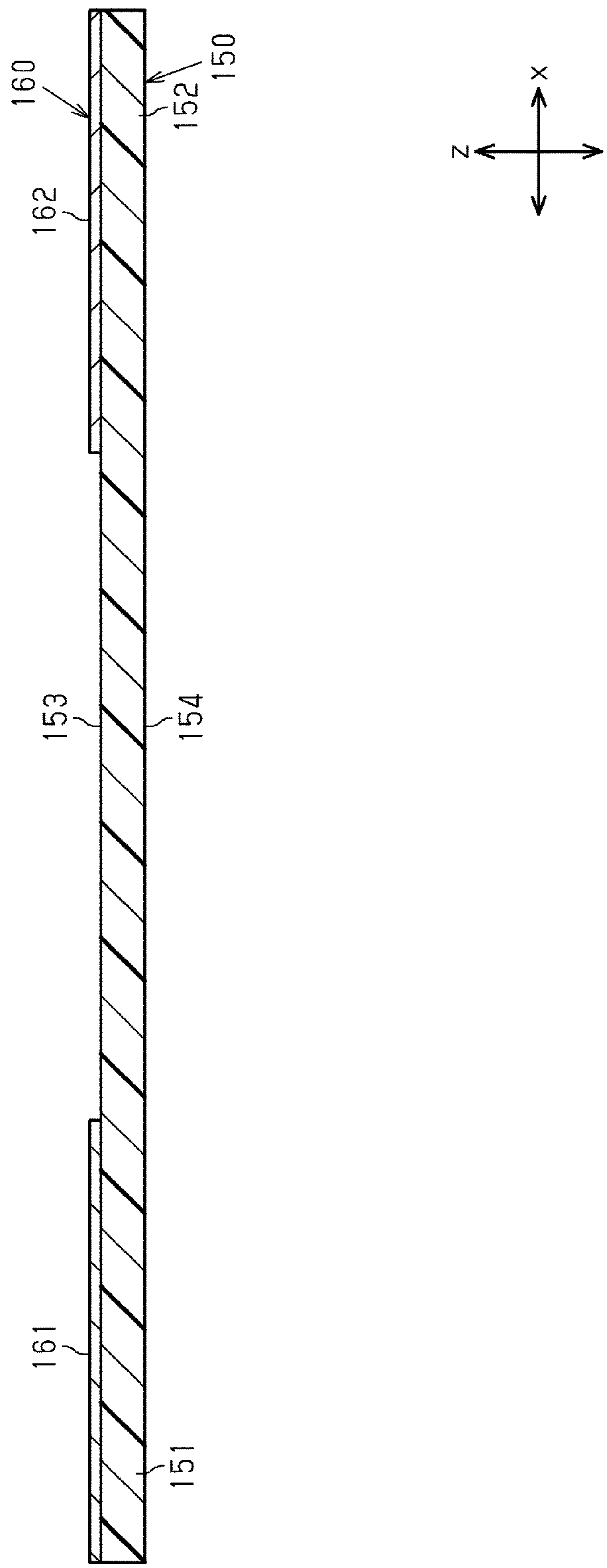
FIG. 62 is an end view showing a step of the terahertz device in the fifth embodiment.

As shown in FIG. 62, the method for manufacturing the terahertz device 10 includes a step of forming the wiring pattern 160 on the support substrate 150. In this step, the wiring pattern 160 is patterned on the mount main surface 153 of the support substrate 150. This forms the two patterns 161 and 162. The subsequent steps such as the step of mounting the terahertz element 20 are the same as those of the third embodiment and will not be described in detail.

The present embodiment, which has been described above, has the following operational advantages.

(5-1) The terahertz device 10 includes the support substrate 150, which is used as the base member, and the wiring pattern 160, which is used the conductive members. In this structure, instead of the lead frame 60, the wiring pattern 160 is used as the conductive members. Thus, micromachining may be performed and readily form a signal path corresponding to high-speed signal transmission.

(5-2) The support substrate 150 includes the first extension 151 and the second extension 152 extending sideward relative to the antenna base 50 as viewed in the z-direction. The two electrodes 171 and 172 are formed of the wiring pattern 160 that is formed on the two extensions 151 and 152. In this structure, the electrodes 171 and 172 project sideward relative to the antenna base 50, and the advantage (3-2) is obtained.

Modified Example of Fifth Embodiment

Figure 63:
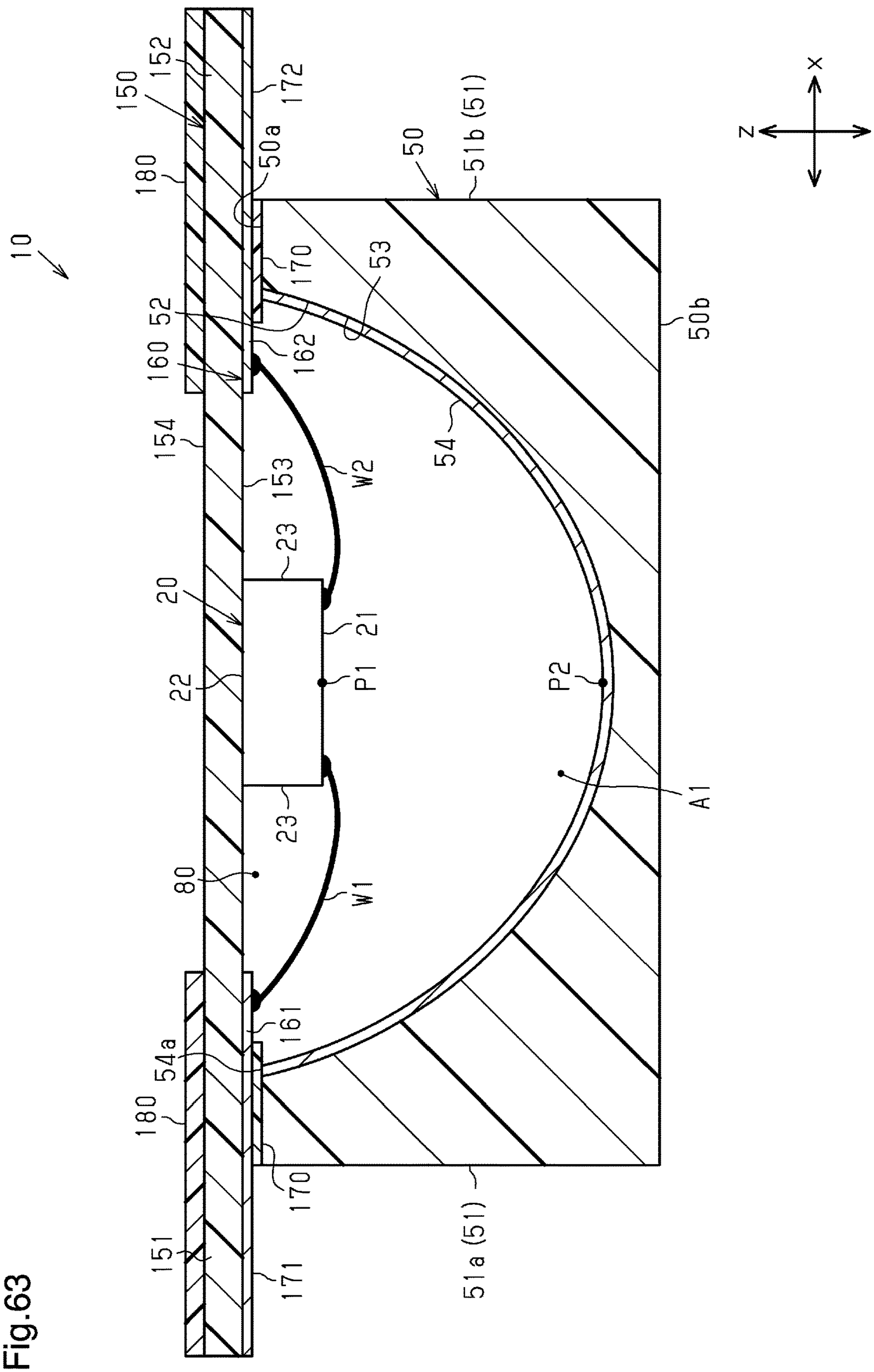
FIG. 63 is an end view of a modified example of the terahertz device of the fifth embodiment.

As shown in FIG. 63, a reflection reduction film 180 is formed on at least a portion of the part of the mount back surface 154 overlapping the wiring pattern 160 as viewed in the z-direction. The reflection reduction film 180 may be formed on, for example, portions overlapping the electrodes 171 and 172, that is, the extensions 151 and 152.

Sixth Embodiment

Figure 64:
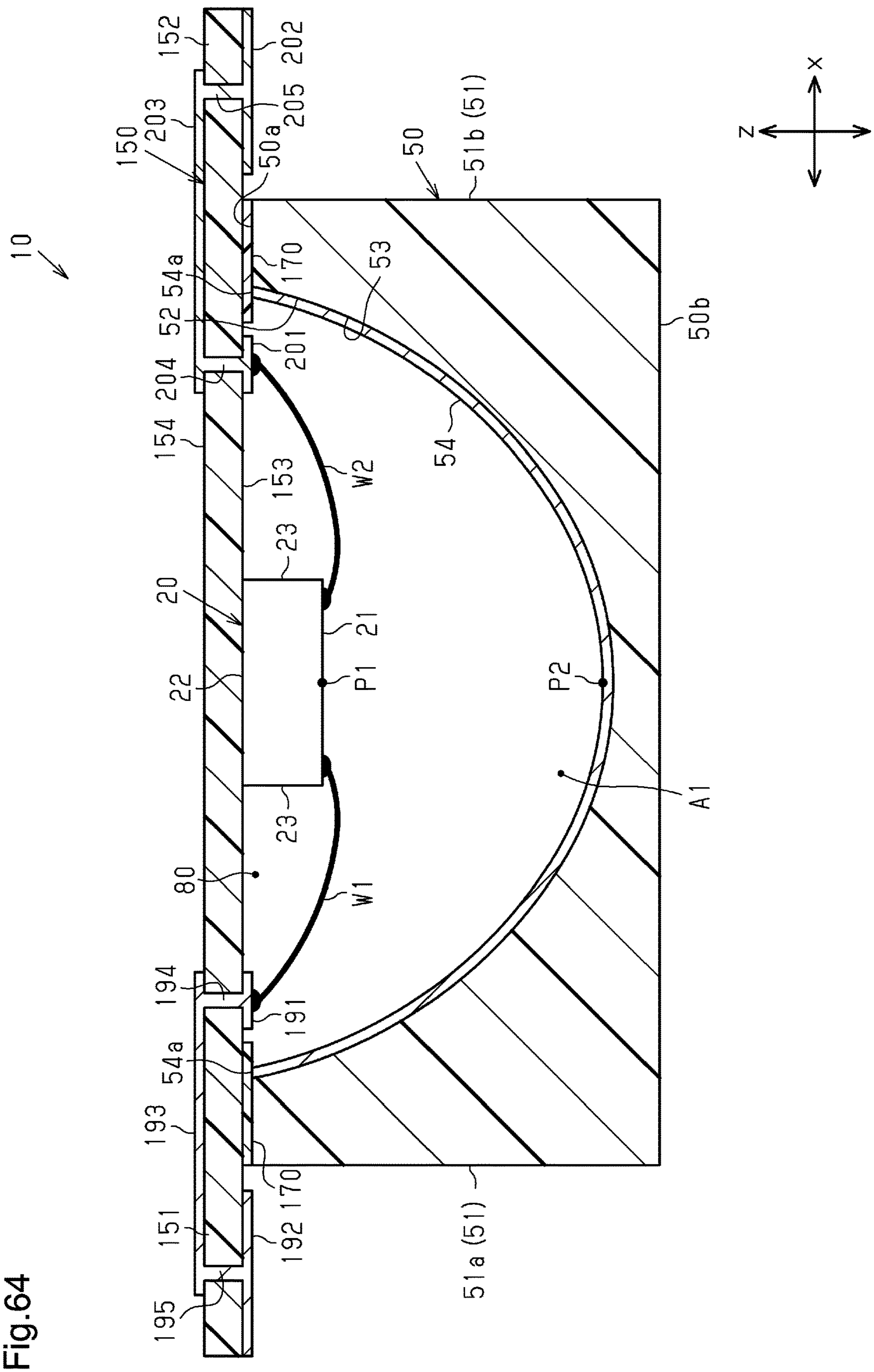
FIG. 64 is a schematic end view showing a sixth embodiment of a terahertz device.

In the present embodiment, as shown in FIG. 64, the terahertz device 10 includes a first connection pattern 191 and a first electrode 192 that are formed on the mount main surface 153, a first back pattern 193 formed on the mount back surface 154, and first through vias 194 and 195 that electrically connect the first connection pattern 191 and the first electrode 192 to the first back pattern 193.

The first connection pattern 191 is obtained by forming a wiring pattern on the mount main surface 153. The first connection pattern 191 is formed on a portion of the mount main surface 153 faced toward the recess 52. The first connection pattern 191 is disposed in the accommodation space A1. The first connection pattern 191 is separate from the end 54*a* of the reflection film 54, so that the first connection pattern 191 does not contact the reflection film 54. The first wire W1 is bonded to the first connection pattern 191.

The first electrode 192 is obtained by forming a wiring pattern on the mount main surface 153. The first electrode 192 is disposed outside the accommodation space A1. The first electrode 192 is formed on a portion of the mount main surface 153 corresponding to the first extension 151 and projects sideward relative to the antenna base 50.

The first back pattern 193 is obtained by forming a wiring pattern on the mount back surface 154. The first back pattern 193 extends over the first connection pattern 191 and the first electrode 192 and overlaps the first connection pattern 191 and the first electrode 192 as viewed in the z-direction.

The first through vias 194 and 195 extend through the support substrate 150 in the thickness-wise direction. One of the first through vias denoted by 194 connects the first connection pattern 191 to the first back pattern 193. The other one of the first through vias denoted by 195 connects the first electrode 192 to the first back pattern 193. Thus, the first electrode 192 is electrically connected to the terahertz element 20.

The terahertz device 10 includes, for example, a second connection pattern 201 and a second electrode 202 that are formed on the mount main surface 153, a second back pattern 203 formed on the mount back surface 154, and second through vias 204 and 205 that electrically connect the second connection pattern 201 and the second electrode 202 to the second back pattern 203. The second connection pattern 201, the second electrode 202, the second back pattern 203, and the second through vias 204 and 205 are the same as the first connection pattern 191, the first electrode 192, the first back pattern 193, and the first through vias 194 and 195 except being symmetrical with respect to the x-direction and thus will not be described in detail. In the present embodiment, the first connection pattern 191 corresponds to "first connector". The second connection pattern 201 corresponds to "second connector".

In the present embodiment, the antenna base 50 is attached to the mount main surface 153 by the adhesive layer 170. In this case, the connection patterns 191 and 201 are disposed toward the terahertz element 20 from the end 54*a* of the reflection film 54. In contrast, the electrodes 192 and 202 are disposed sideward relative to the end 54*a* of the reflection film 54. That is, as viewed in the z-direction, the end 54*a* of the reflection film 54 (and the base main surface 50*a*) is disposed between the connection patterns 191 and 201 and the electrodes 192 and 202 and separated from the connection patterns 191 and 201 and the electrodes 192 and 202. This ensures the insulation of the reflection film 54 from the electrodes 192 and 202 and the insulation of the reflection film 54 from the connection patterns 191 and 201.

The present embodiment, which has been described above, has the following operational advantages.

(6-1) The terahertz device 10 includes the support substrate 150 as a base member including the mount main surface 153 and the mount back surface 154, the connection patterns 191 and 201 and the electrodes 192 and 202 formed on the mount main surface 153 of the support substrate 150, the back patterns 193 and 203 formed on the mount back surface 154, and the through vias 194, 195, 204, and 205. The connection patterns 191 and 201 are connected to the terahertz element 20 by the wires W1 and W2. The through vias 194, 195, 204, and 205 extend through the circuit substrate 110 to connect the connection patterns 191 and 201 and the electrodes 192 and 202 to the back patterns 193 and 203. The end 54*a* of the reflection film 54 is disposed between the connection patterns 191 and 201 and the electrodes 192 and 202 and separated from the connection patterns 191 and 201 and the electrodes 192 and 202. In this structure, while avoiding contact of the connection patterns 191 and 201 and the electrodes 192 and 202 with the reflection film 54, the electrodes 192 and 202 are electrically connected to the terahertz element 20.

Modified Example of Sixth Embodiment

Figure 65:
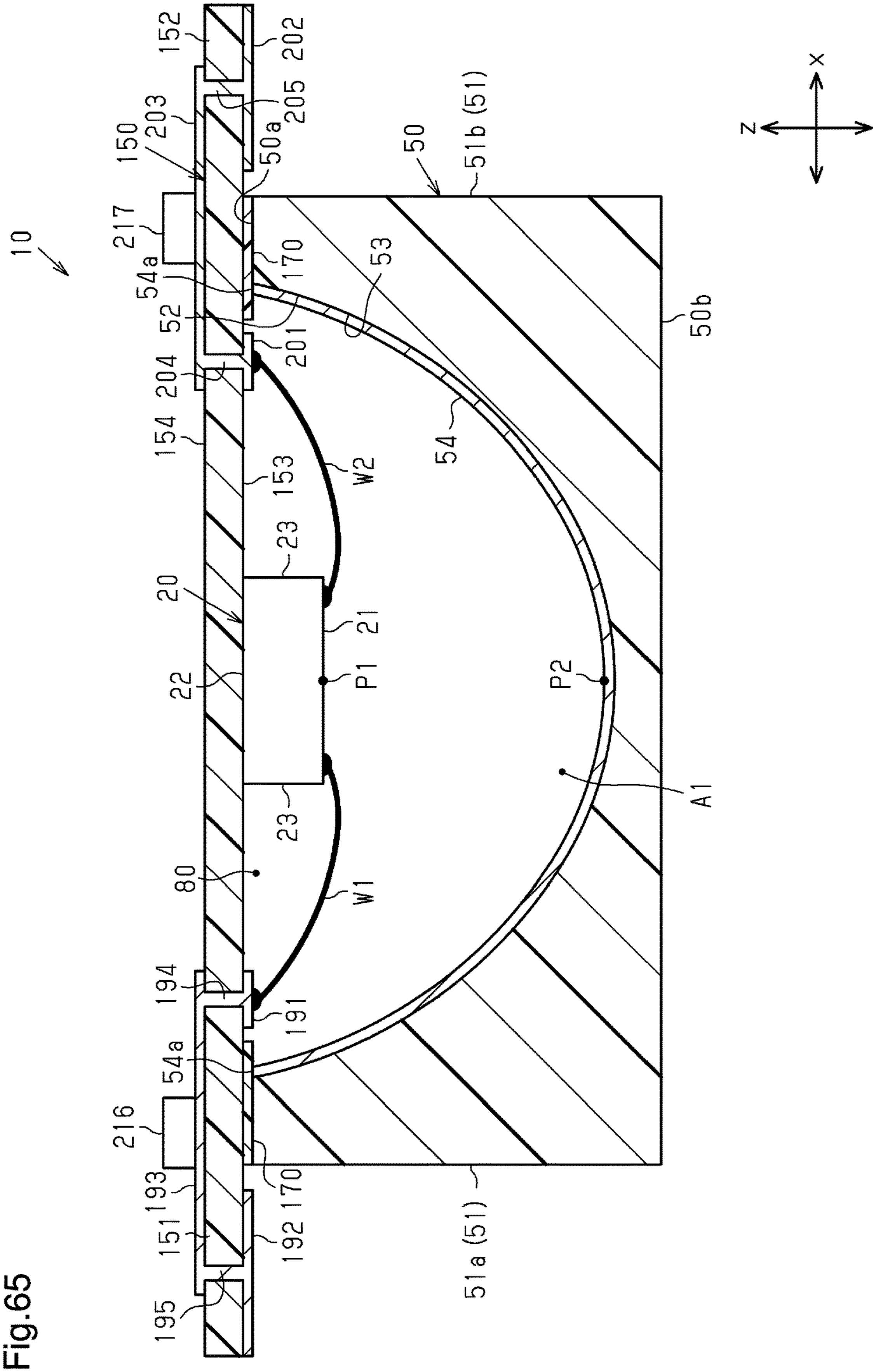
FIG. 65 is an end view of a modified example of the terahertz device of the sixth embodiment.

As shown in FIG. 65, the terahertz device 10 may include specific elements 216 and 217 mounted on the mount back surface 154 (in the present embodiment, the back patterns 193 and 203). Thus, the specific elements 216 and 217 are electrically connected to the terahertz element 20 in a relatively easy manner. The specific elements 216 and 217 may be, for example, protection diodes. Thus, an excessive current flowing to the terahertz element 20 is limited.

However, the specific elements 216 and 217 are not limited to those described above and may be changed in any manner. For example, each of the specific elements 216 and 217 may be a control IC (e.g., ASIC). The control IC may be configured to, for example, detect current flowing to the terahertz element 20, serve as an amplifier, supply power to the terahertz element 20, or process signals.

For example, when the specific elements 216 and 217 are electrically connected to the terahertz element 20, the specific elements 216 and 217 may be mounted on the mount back surface 154. For example, the specific elements 216 and 217 are not limited to being mounted on the back patterns 193 and 203 as described above and may be mounted on a portion of the mount back surface 154 where the back patterns 193 and 203 are not formed. In this case, the specific elements 216 and 217 may be electrically connected to the back patterns 193 and 203 by conductors.

Figure 66:
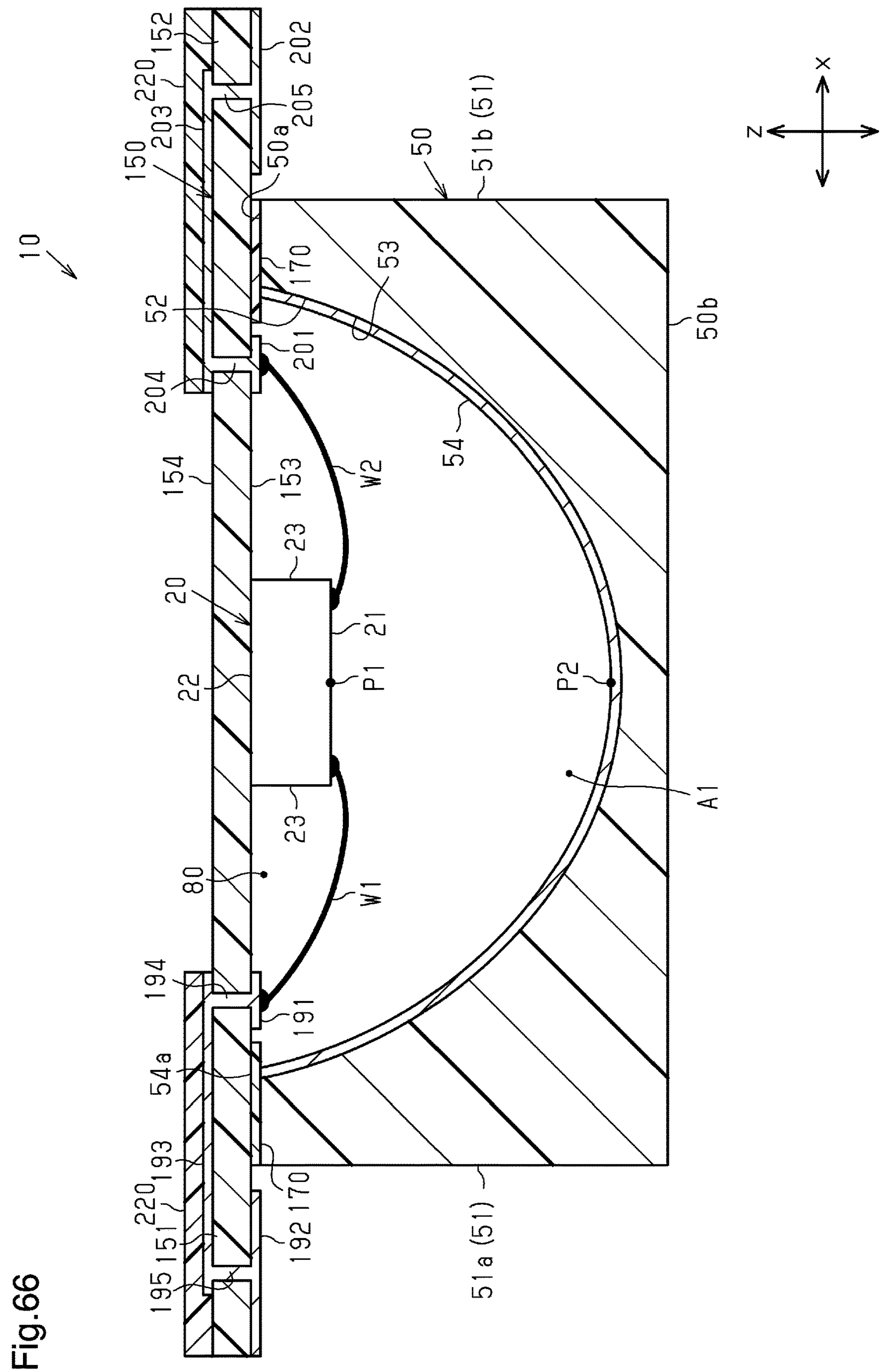
FIG. 66 is an end view of a modified example of the terahertz device of the sixth embodiment.

As shown in FIG. 66, the terahertz device 10 may include a reflection reduction film 220 formed on the support substrate 150 to overlap wiring patterns as viewed in the z-direction. The reflection reduction film 220 is formed, for example, on the back patterns 193 and 203. In an example, the reflection reduction film 220 may overlap the back patterns 193 and 203 and the electrodes 192 and 202.

Seventh Embodiment

Figure 67:
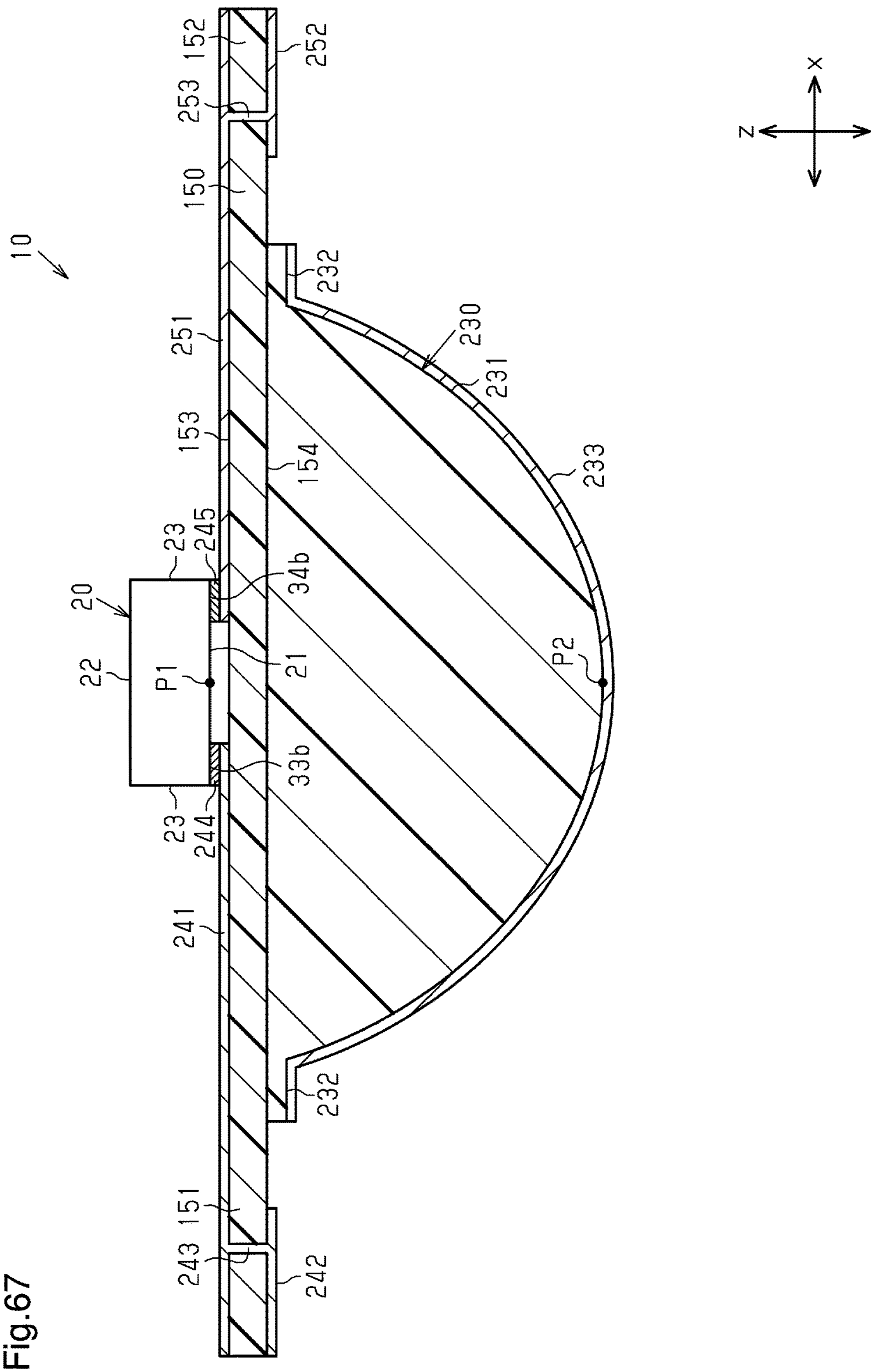
FIG. 67 is a schematic end view showing a seventh embodiment of a terahertz device.

As shown in FIG. 67, an antenna base 230 may be convex-lens-shaped. For example, the antenna base 230 is disposed on the support substrate 150 at the side of the mount back surface 154. The antenna base 230 includes an antenna surface 231 and a flange surface 232. The antenna surface 231 is curved to project in a direction away from the terahertz element 20 disposed on the mount main surface 153. The flange surface 232 projects sideward beyond the proximal end of the antenna surface 231. The antenna surface 231 is curved in conformance with the lens surface of the antenna base 230. The antenna surface 231 and the terahertz element 20 are opposed to each other in the z-direction.

In the present embodiment, a reflection film 233 is formed on at least the antenna surface 231. In an example, the reflection film 233 is formed over the antenna surface 231 and the flange surface 232. In the present embodiment, the support substrate 150 and the antenna base 230 are disposed between the terahertz element 20 and the reflection film 233.

In the present embodiment, it is preferred that the support substrate 150 and the antenna base 230 are formed of a material transmissive to electromagnetic waves generated by the terahertz element 20 and may be formed of, for example, a dielectric. The dielectric may be, for example, Si, resin, Teflon, or glass. The support substrate 150 and the antenna base 230 may be formed of the same material or different materials. For example, when the support substrate 150 and the antenna base 230 are formed of the same material, the refractive index is less likely change, so that reflection in the interface between the support substrate 150 and the antenna base 230 is reduced.

The support substrate 150 and the antenna base 230 may be adhered to each other or may be formed integrally.

In the present embodiment, the terahertz device 10 includes a first connection pattern 241 formed on the mount main surface 153, a first electrode 242 formed on the mount back surface 154, and a first through via 243 connecting the first connection pattern 241 to the first electrode 242. The first electrode 242 is disposed at a position projecting sideward (e.g., the x-direction) relative to the antenna base 230 as viewed in the z-direction. The first electrode 242 and the reflection film 233 are separate in the x-direction.

The terahertz device 10 includes a second connection pattern 251 formed on the mount main surface 153, a second electrode 252 formed on the mount back surface 154, and a second through via 253 connecting the second connection pattern 251 to the second electrode 252. The second electrode 252 is disposed at a position projecting sideward (e.g., the x-direction) relative to the antenna base 230 as viewed in the z-direction. The second electrode 252 and the reflection film 233 are separate in the x-direction.

In the present embodiment, the terahertz element 20 is disposed so that the element main surface 21 faces the reflection film 233. More specifically, when the element main surface 21 is faced toward the mount main surface 153, the terahertz element 20 is mounted on the support substrate 150. In this case, conductive bonding members 244 and 245 such as solder may be used to electrically connect the two pads 33*b* and 34*b* to the connection patterns 241 and 251. The shape and positional relationship of the antenna surface 231 with respect to the oscillation point P1 is the same as those of the third embodiment.

In the present embodiment, the terahertz device 10 is mounted on the circuit substrate 110 from the mount back surface 154. As a result, at least a portion of the antenna base 230 is inserted into the hole 116. The electrodes 242 and 252 are faced toward the circuit substrate 110 and thus are electrically connected by the conductive bonding member 117.

The present embodiment, which has been described above, has the following operational advantages.

(7-1) The terahertz device 10 includes the antenna base 230, which is convex-lens-shaped and curved to project in a direction away from the terahertz element 20. The antenna surface 231 corresponds to the lens surface of the antenna base 230. With this structure, for example, the advantage (3-1) is obtained.

(7-2) The antenna base 230 is disposed at the side of the mount back surface 154. The terahertz element 20 and the reflection film 233 are opposed to each other at opposite sides of the support substrate 150 and the antenna base 230. This structure eliminates the need for forming a recess accommodating the terahertz element 20 in the antenna base 230, thereby simplifying the structure of the antenna base 230.

Modified Examples

In each embodiment, the terahertz device 10 may be modified, for example, as follows. The modified examples described below may be combined with one another as long as there is no technical inconsistency. For the sake of convenience, the following modified examples will be basically described using the third embodiment. However, other embodiments may be used as long as there is no technical inconsistency.

Figure 68:
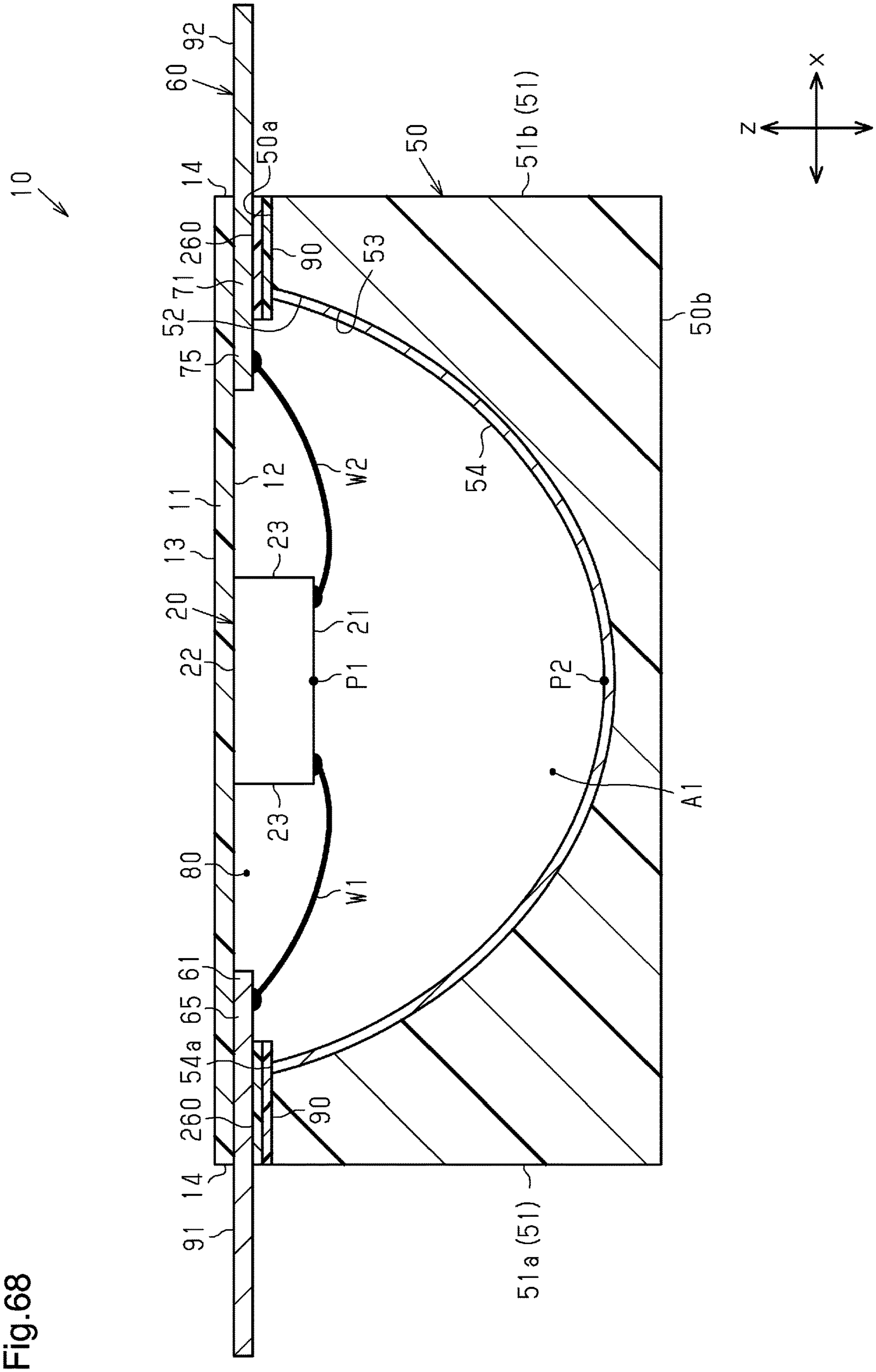
FIG. 68 is a schematic end view showing a modified example of a terahertz device.

As shown in FIG. 68, the terahertz device 10 may include a spacer 260 that is different from the adhesive layer 90 to insulate the reflection film 54 from the lead frame 60. The spacer 260 is insulative. The spacer 260 is also disposed between the reflection film 54 and the lead frame 60. In FIG. 68, the spacer 260 is disposed between the lead frame 60 and the adhesive layer 90. However, alternatively, the spacer 260 may be disposed between the antenna base 50 and the adhesive layer 90.

In this configuration, contact of the reflection film 54 with the lead frame 60 is restricted by the spacer 260 and the adhesive layer 90. Thus, the contact of the reflection film 54 with the lead frame 60 is further restricted.

Figure 69:
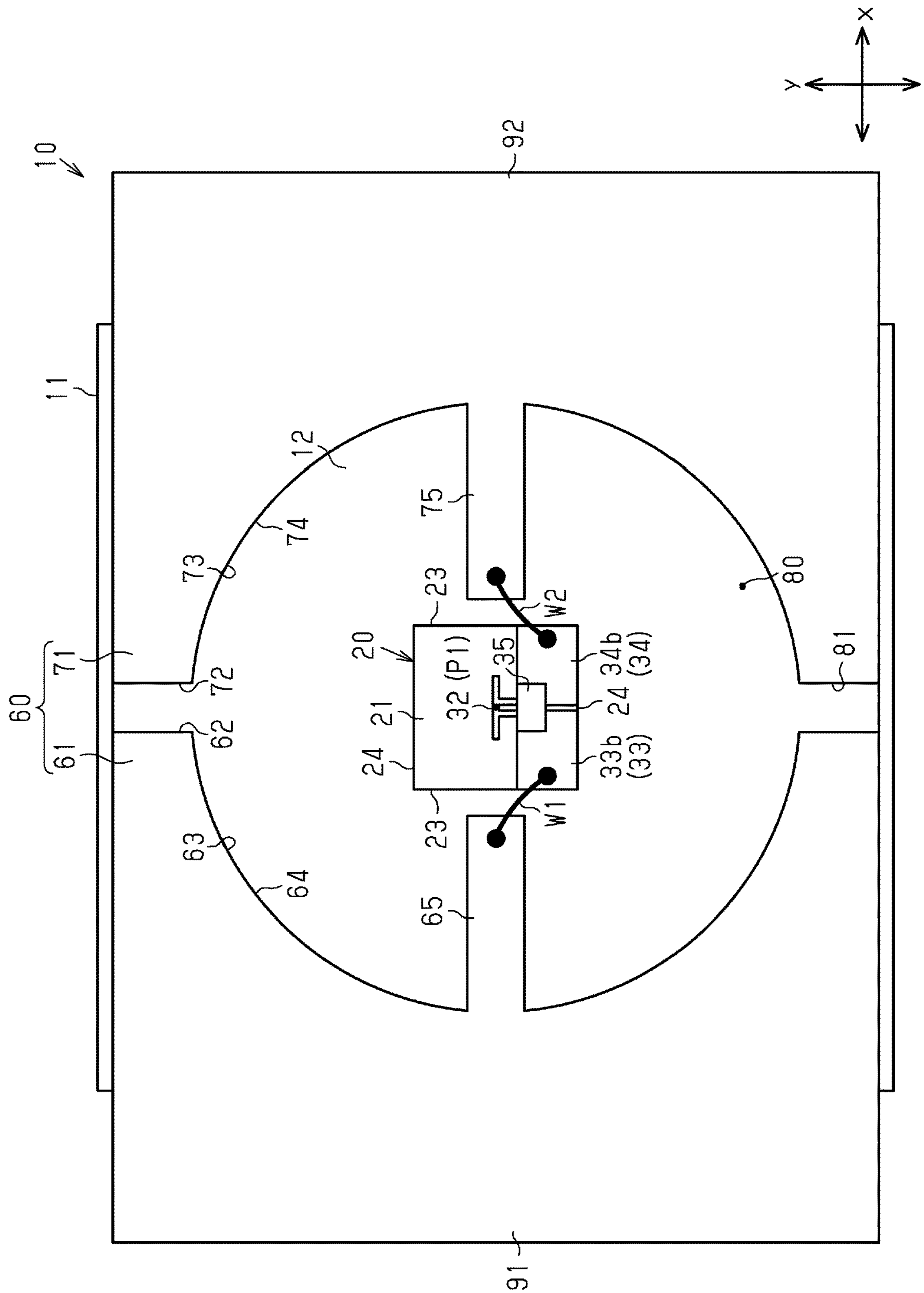
FIG. 69 is a front view showing a modified example of connectors.

As shown in FIG. 69, the first connector 65 and the second connector 75 may extend to the vicinity of the terahertz element 20. For example, the distal portion of the first connector 65 may be located closer to the terahertz element 20 than to the first inner surface 64, and the distal portion of the second connector 75 may be located closer to the terahertz element 20 than to the second inner surface 74. In other words, the projection dimension of each of the two connectors 65 and 75 may be greater than ¼ of the opening width of the reflection film 54.

In addition, as viewed in the z-direction, the length of the first wire W1 may be less than the projection dimension of the first connector 65 from the first inner surface 64. In the same manner, the length of the second wire W2 may be less than the projection dimension of the second connector 75 from the second inner surface 74. In this structure, the length of the wires W1 and W2 is decreased, thereby limiting adverse effects on the responsiveness caused by the wires W1 and W2.

Figure 70:
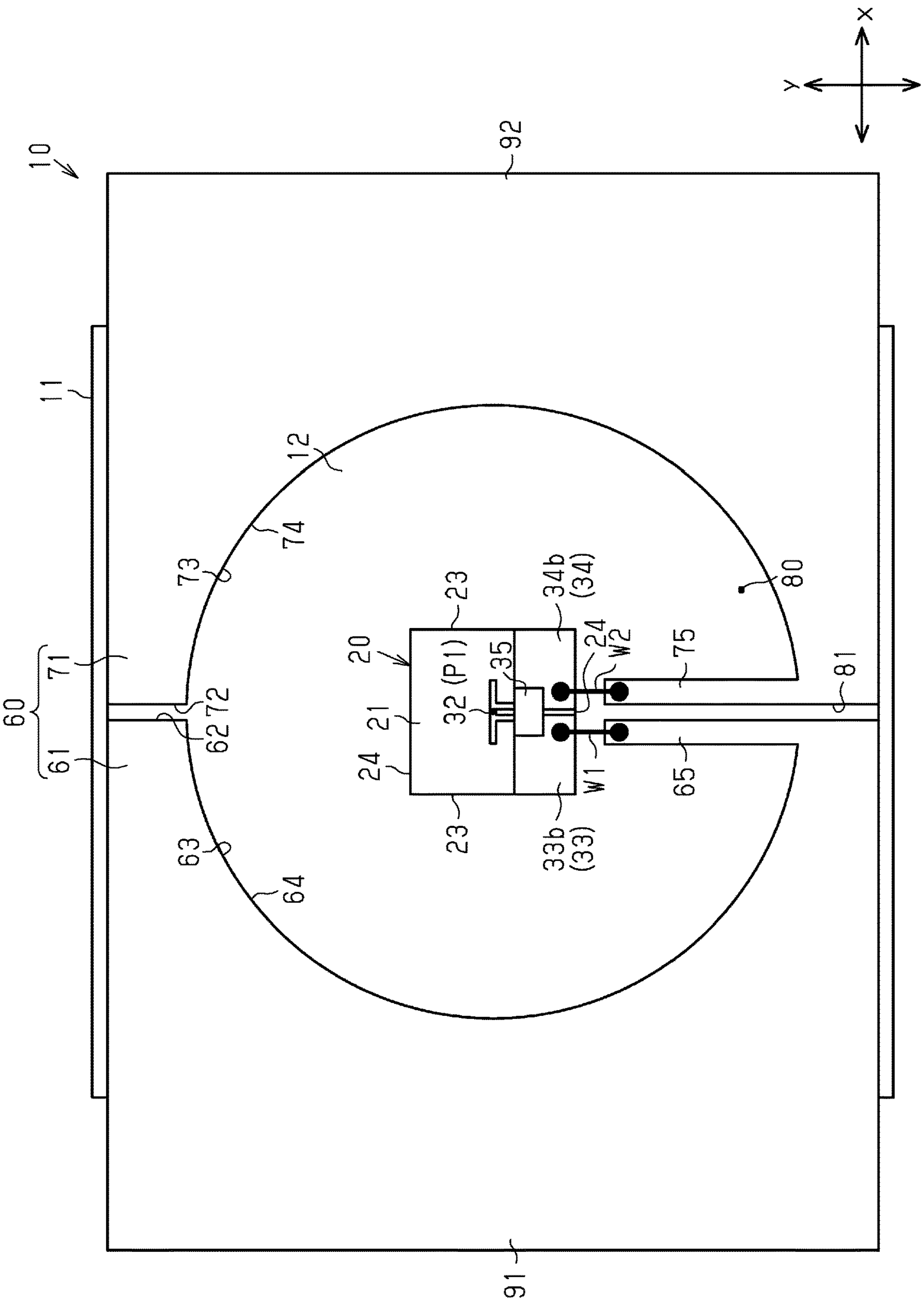
FIG. 70 is a front view showing a modified example of connectors.

As shown in FIG. 70, the first connector 65 and the second connector 75 may be arranged parallel to each other. This structure improves the responsiveness of the terahertz device 10.

The first connector 65 and the second connector 75 may be omitted.

Figure 71:
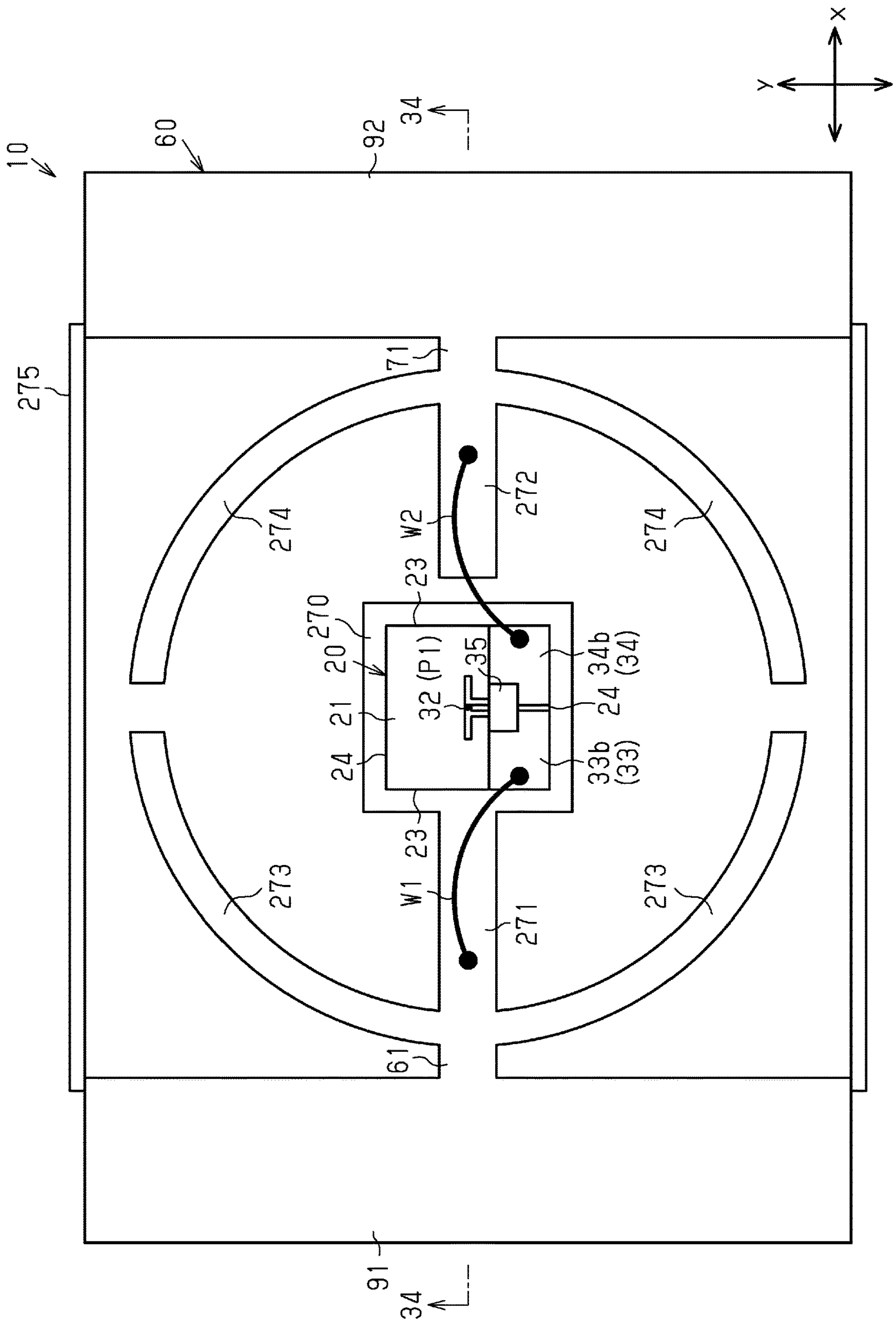
FIG. 71 is a front view showing a modified example of a lead frame.
Figure 72:
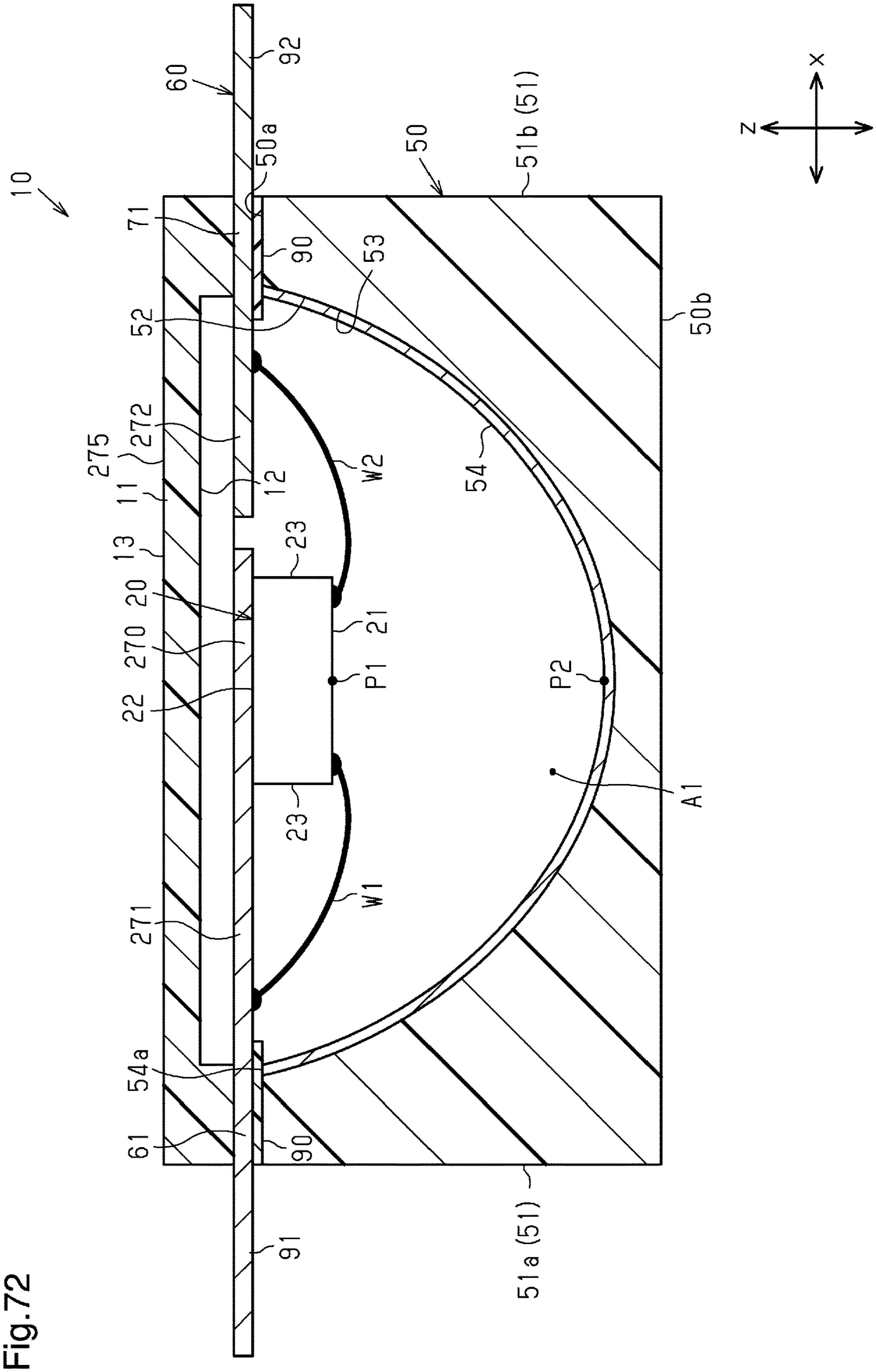
FIG. 72 is an end view taken along line 34-34 in FIG. 71.

As shown in FIGS. 71 and 72, the lead frame 60 may be used as the base member on which the terahertz element 20 is mounted. Specifically, the lead frame 60 may include a mount base 270 on which the terahertz element 20 is mounted, a first connector 271 joined to the mount base 270, and a second connector 272 insulated from the first connector 271. The first connector 271 is electrically connected to the first pad 33*b* by the first wire W1. The second connector 272 is electrically connected to the second pad 34*b* by the second wire W2.

In addition, the lead frame 60 may include a first curved portion 273 extending from the first connector 271 along the outer side of the opening edge of the recess 52 and a second curved portion 274 extending from the second connector 272 along the outer side of the opening edge of the recess 52.

In this modified example, as shown in FIG. 72, the terahertz device 10 may include a cover member 275 covering the mount base 270 and the two connectors 271 and 272 from above. The cover member 275 may be formed of a material transmissive to electromagnetic waves, for example, a dielectric.

Figure 73:
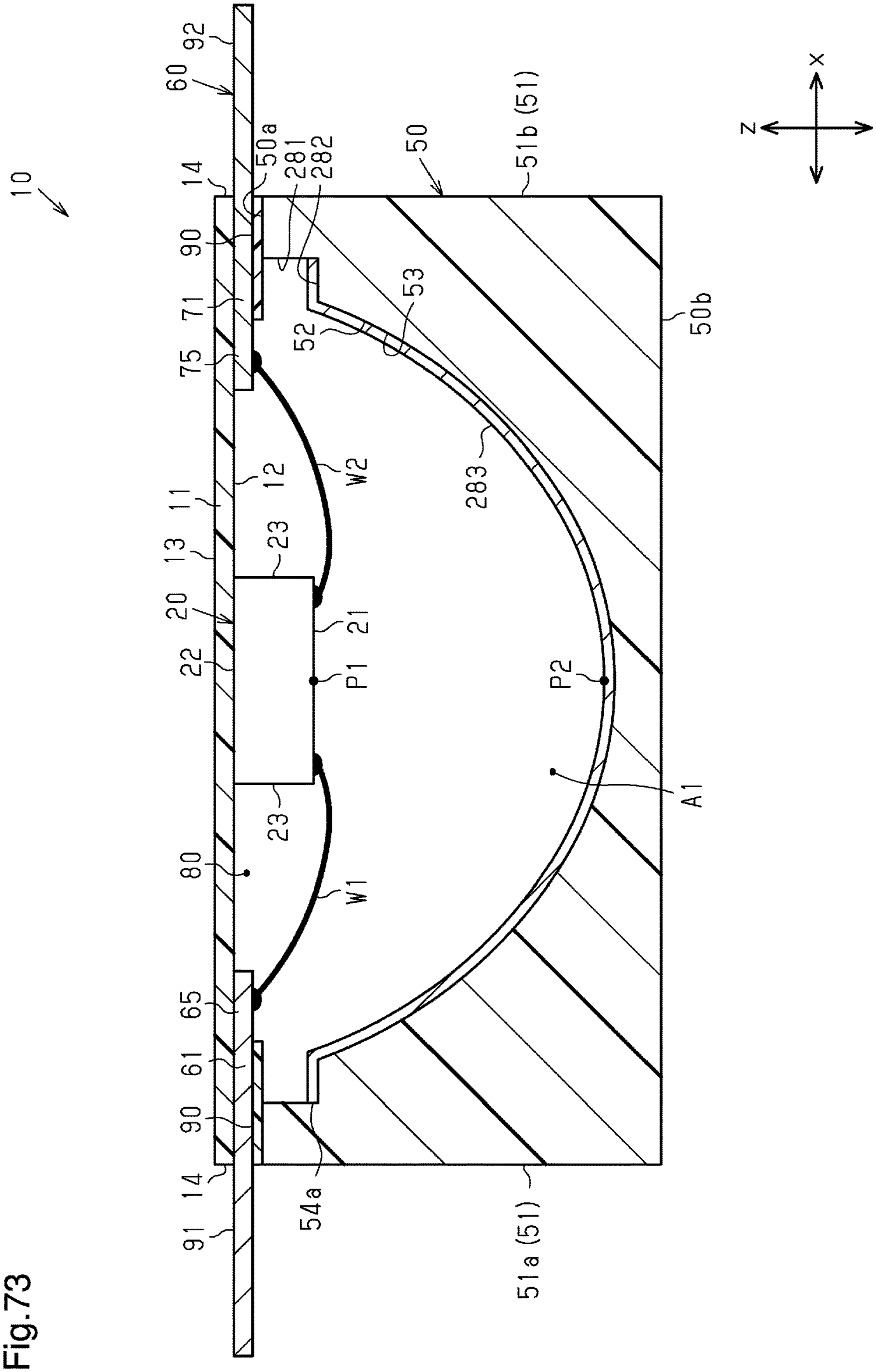
FIG. 73 is a schematic end view showing a modified example of a terahertz device.

As shown in FIG. 73, the recess 52 may include a large diameter surface 281 having a larger diameter than the antenna surface 53 and a stepped surface 282 formed between the antenna surface 53 and the large diameter surface 281. The stepped surface 282 intersects the z-direction. In this structure, a reflection film 283 may be formed over the antenna surface 53 and the stepped surface 282. In this case, the reflection film 283 and the lead frame 60 are separate in the z-direction and thus are not likely to contact each other.

Figure 74:
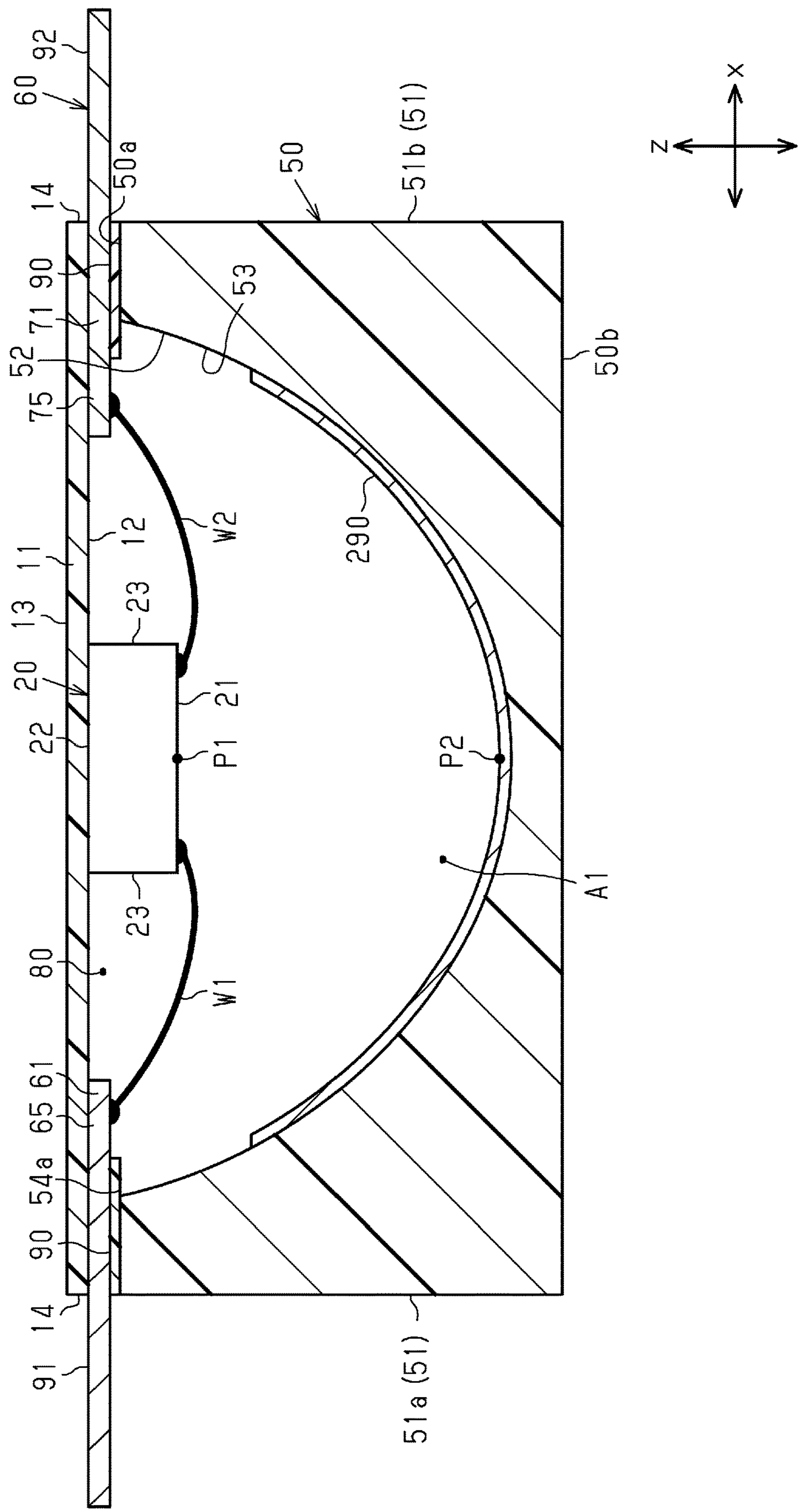
FIG. 74 is a schematic end view showing a modified example of a terahertz device.

As shown in FIG. 74, a reflection film 290 may be formed on a portion of the antenna surface 53. For example, the reflection film 290 may be formed on a portion located below the oscillation point P1. The reflection film 290 may be formed over an angle that is less than the opening angle θ of the oscillation point P1. Any reflection film that reflects at least part of electromagnetic waves generated by the terahertz element 20 in one direction may be used.

The shape of the reflection film may be changed. For example, the reflection film is not limited to a single film and may include a plurality of separate parts. For example, a slit and/or a hole may be formed in the reflection film.

Figure 75:
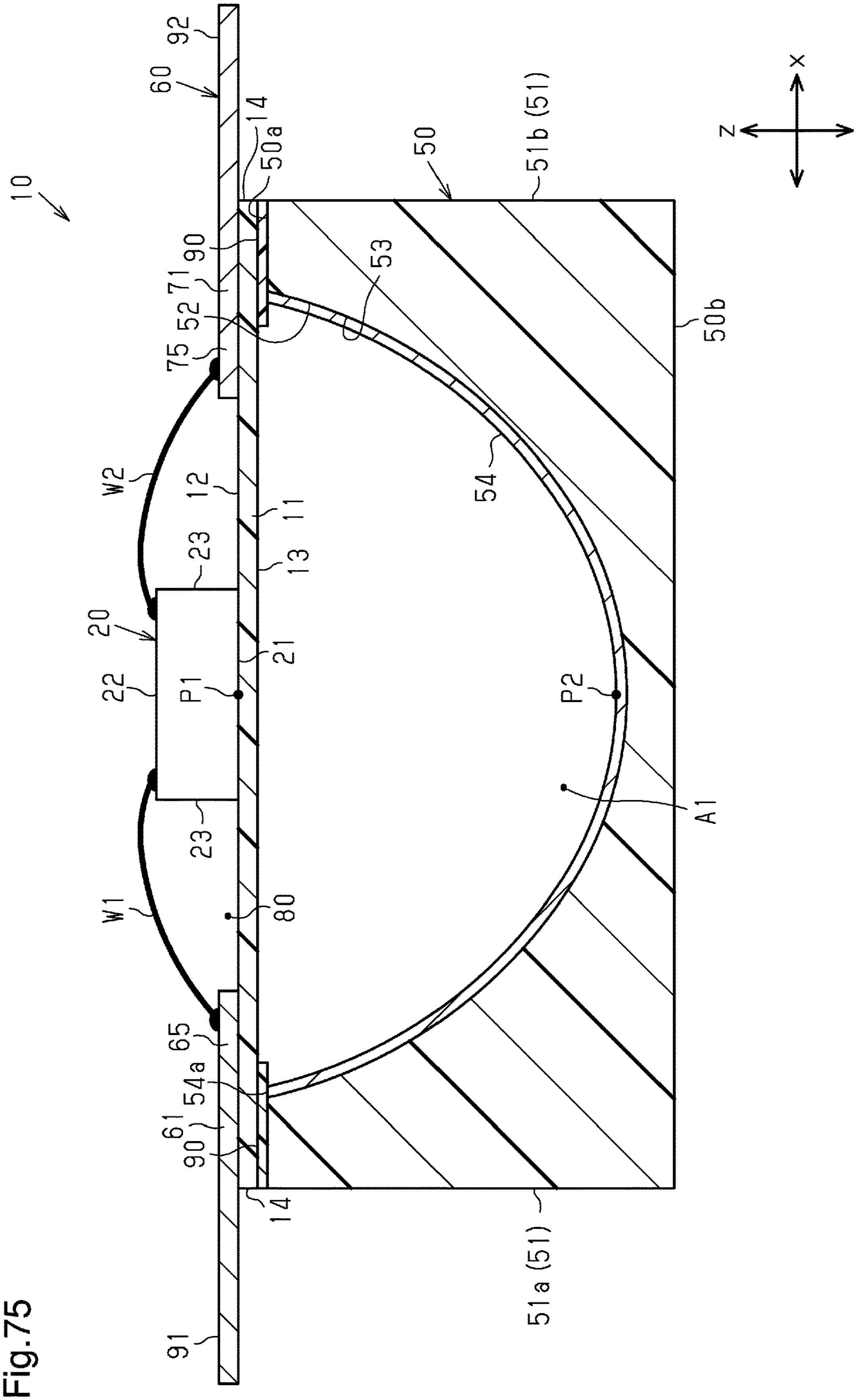
FIG. 75 is a schematic end view showing a modified example of a terahertz device.

As shown in FIG. 75, the antenna base 50 may be configured to be disposed at the side of the mount back surface 13. In this case, the mount plate 11 is disposed between the lead frame 60 and the reflection film 54, so that contact of the reflection film 54 with the lead frame 60 is avoided. However, considering the point that the terahertz element 20 is accommodated in the accommodation space A1, it is more preferred that the antenna base 50 is disposed at the side of the mount main surface 12.

Figure 76:
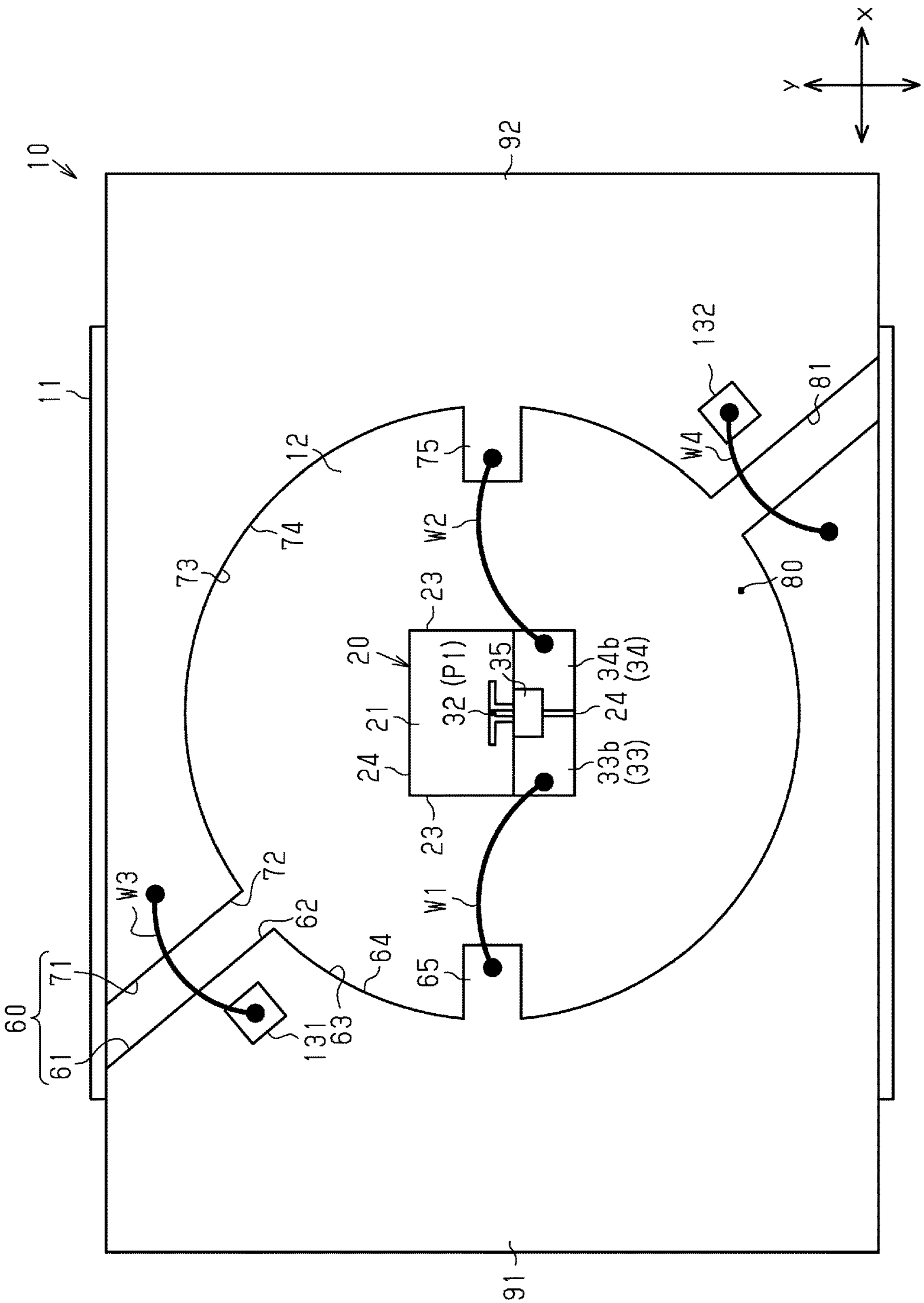
FIG. 76 is a front view showing a modified example of a lead frame.

As shown in FIG. 76, the lead opposing surfaces 62 and 72 may be inclined from the y-direction. In this case, the gap 81 diagonally extend with respect to the y-direction.

In this structure, when the protection diodes 131 and 132 are arranged as in the fourth embodiment, at least a portion of the first protection diode 131 may be disposed between the first inner surface 64 and the first lead opposing surface 62. Also, at least a portion of the second protection diode 132 may be disposed between the second inner surface 74 and the second lead opposing surface 72.

Figure 77:
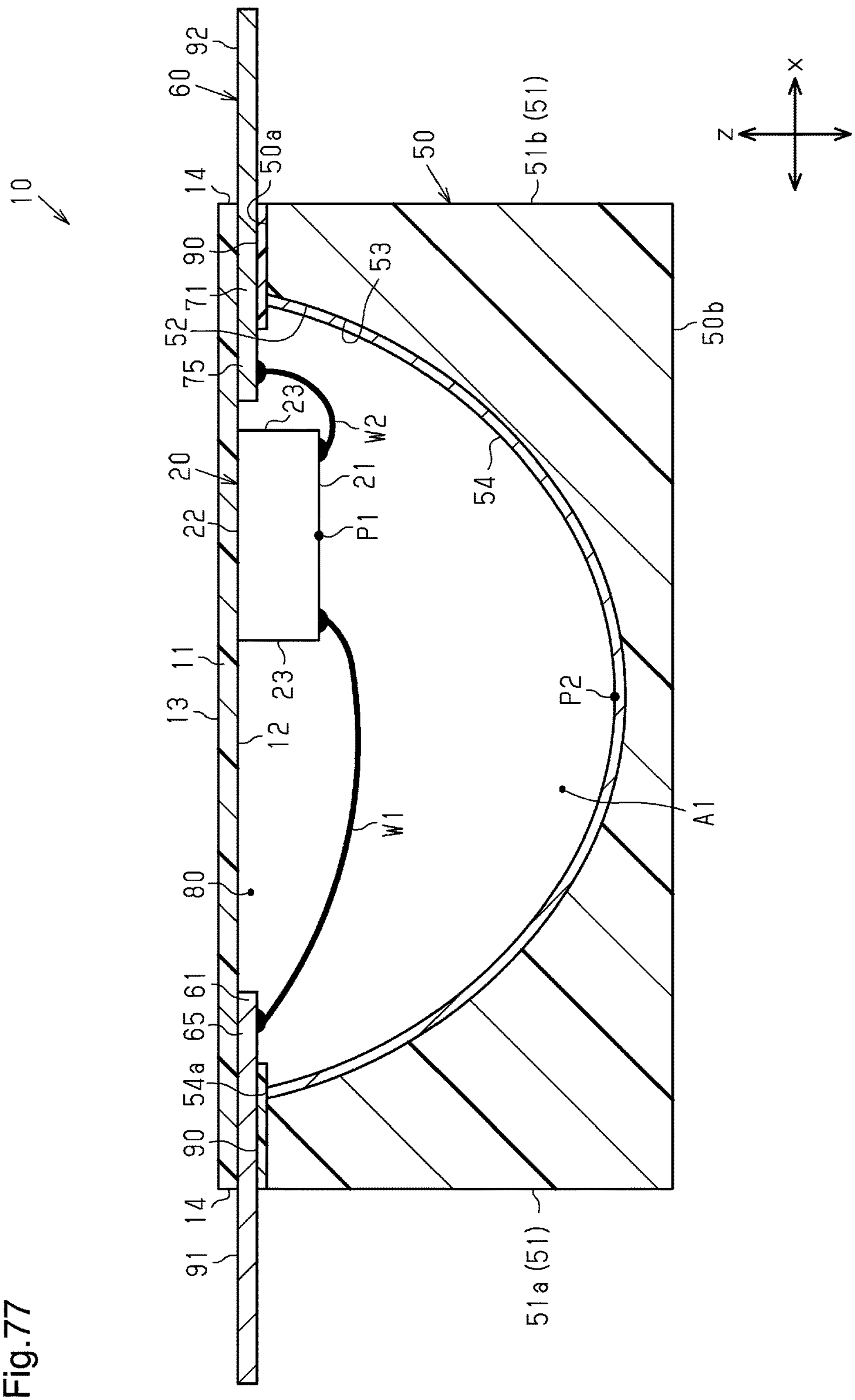
FIG. 77 is a schematic end view showing a modified example of a terahertz device.

As shown in FIG. 77, the terahertz element 20 may be disposed so that the oscillation point P1 is located at a position separate from the center point P2 of the reflection film 54 as viewed from above. That is, the focal point of the reflection film 54 does not have to coincide with oscillation point P1.

Figure 78:
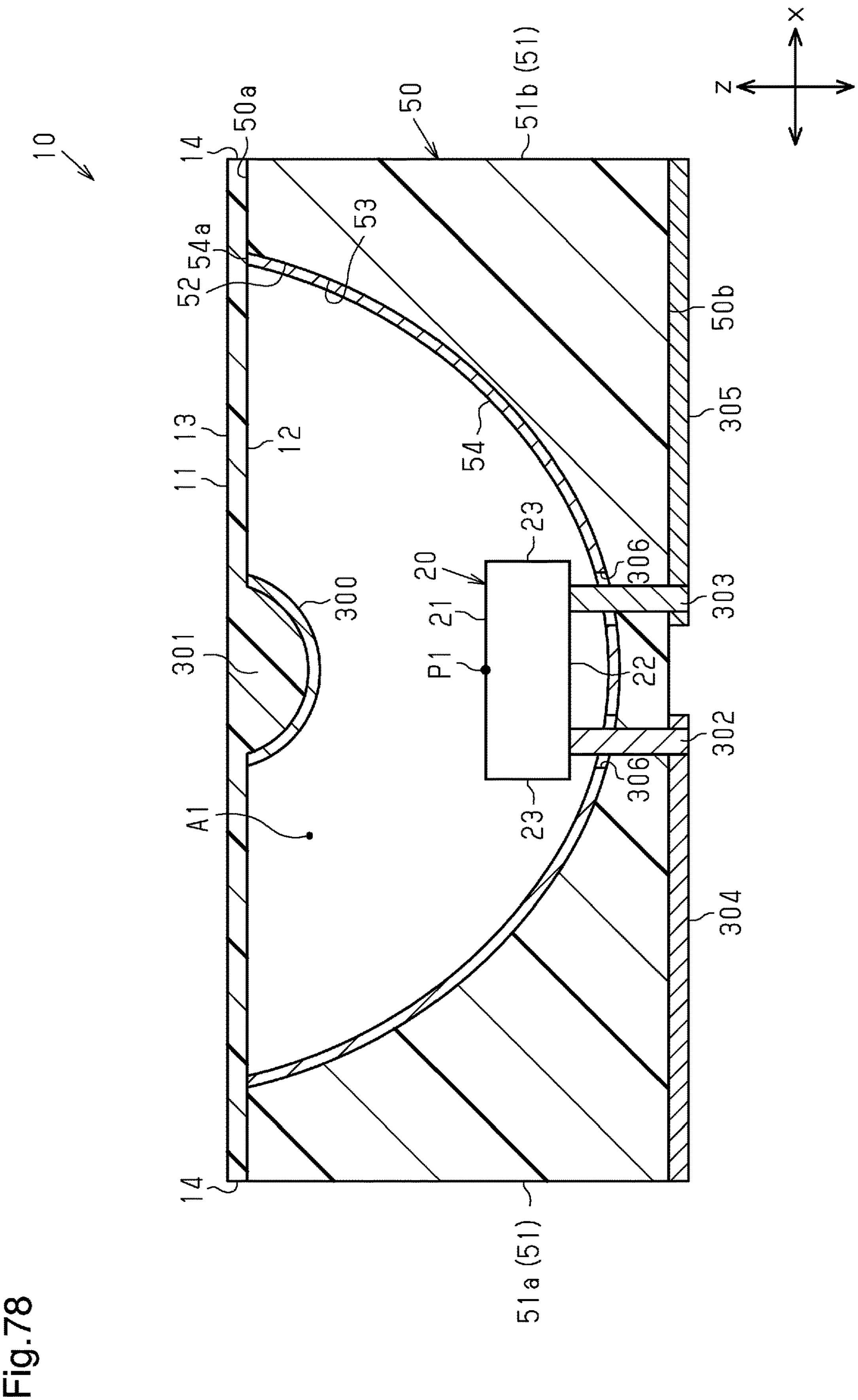
FIG. 78 is a schematic end view showing a modified example of a terahertz device.

As shown in FIG. 78, the terahertz device 10 may be of a multi-reflector type including a reflector 300 disposed separately from the reflection film 54.

Specifically, the terahertz device 10 includes the reflector 300 in addition to the reflection film 54. More specifically, the mount main surface 12 includes a reflection protrusion 301, and a metal film is formed on the surface of the reflection protrusion 301 to form the reflector 300. In accordance with the curve of the reflection protrusion 301 protruding toward the reflection film 54, the reflector 300 is curved to protrude toward the reflection film 54. The reflector 300 and the reflection film 54 are radially faced to each other. Electromagnetic waves reflected by the reflector 300 are emitted toward the reflection film 54.

In the present modified example, the terahertz element 20 is located opposing the reflector 300. In other words, the mount plate 11, which is used as the base member including the reflector 300, is located opposing the terahertz element 20.

The terahertz device 10 includes, for example, mount poles 302 and 303. The mount poles 302 and 303 are formed of, for example, a conductive material. The mount poles 302 and 303 extend through the antenna base 50 and the reflection film 54 from below and enter the accommodation space A1. The terahertz element 20 is mounted on the mount poles 302 and 303. The terahertz element 20 is electrically connected to the mount poles 302 and 303.

The terahertz element 20 may be bonded to the mount poles 302 and 303 directly or by a conductive bonding member. In addition, to avoid contact of the mount poles 302 and 303 with the reflection film 54, an insulator (e.g., insulation coating) may be disposed on side surfaces of the mount poles 302 and 303. In this modified example, the mount poles 302 and 303 are two. However, the number of mount poles 302 and 303 may be any number.

In this modified example, the terahertz device 10 includes electrodes 304 and 305 electrically connected to the mount poles 302 and 303. The electrodes 304 and 305 are formed on the base back surface 50*b*, which is a side of the antenna base 50 opposite from the base main surface 50*a*, and are joined to the mount poles 302 and 303.

In this modified example, when a voltage is applied from the both electrodes 304 and 305, electromagnetic waves are generated by the terahertz element 20. The electromagnetic waves are reflected by the reflector 300 and then further reflected by the reflection film 54 and are emitted upward, which corresponds to one direction. That is, the electromagnetic waves generated by the terahertz element 20 are emitted to the reflection film 54 via the reflector 300 and further reflected by the reflection film 54.

More specifically, the reflector 300 is configured to receive electromagnetic waves generated by the terahertz element 20 and reflect at least part of the electromagnetic waves. The reflection film 54 is configured to receive the electromagnetic waves reflected by the reflector 300 and reflect at least part of the electromagnetic waves in one direction (upward).

In this modified example, the lead frame 60 and the two wires W1 and W2 are not formed on the mount plate 11. The reflector 300 may be disposed, for example, within a projection range of the terahertz element 20 as viewed from above. This limits interruption (blocking) of the electromagnetic waves.

As shown in FIG. 78, the reflection film 54 includes through holes 306, through which the mount poles 302 and 303 are inserted. The through holes 306 may be greater in size than the mount poles 302 and 303 to avoid contact of the reflection film 54 with the mount poles 302 and 303. The portion of the reflection film 54 located between the mount poles 302 and 303 may be omitted. That is, as viewed from above, the reflection film 54 may be annular with the central portion removed. The reflector 300 may be recessed with respect to the terahertz element 20. Specifically, the reflector 300 may be shaped as an antenna that is recessed in the opposite direction of the reflection film 54 (i.e., upward). More specifically, the reflector 300 may be a Cassegrain type or a Gregorian type.

Figure 79:
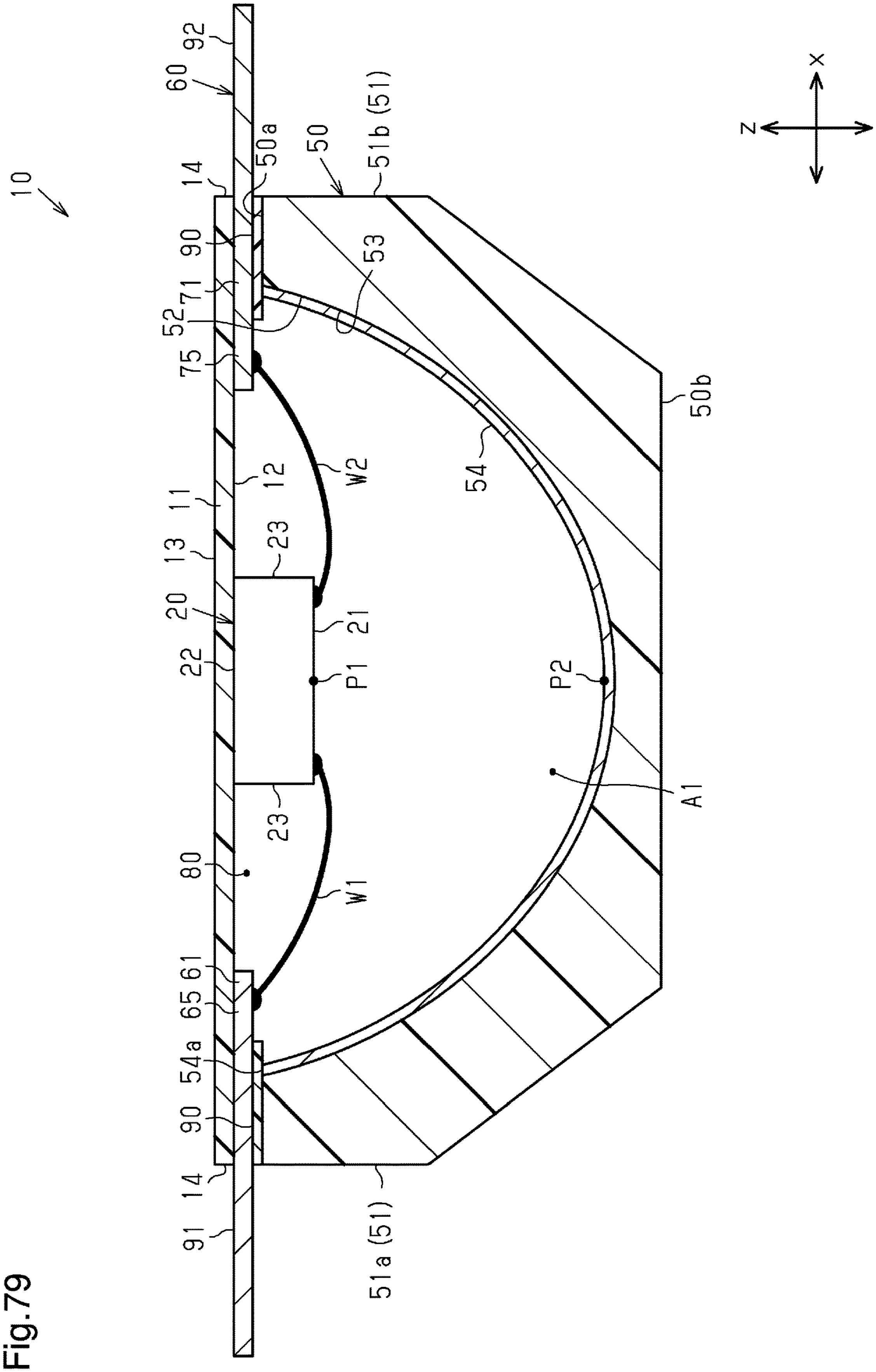
FIG. 79 is a schematic end view showing a modified example of a terahertz device.
Figure 80:
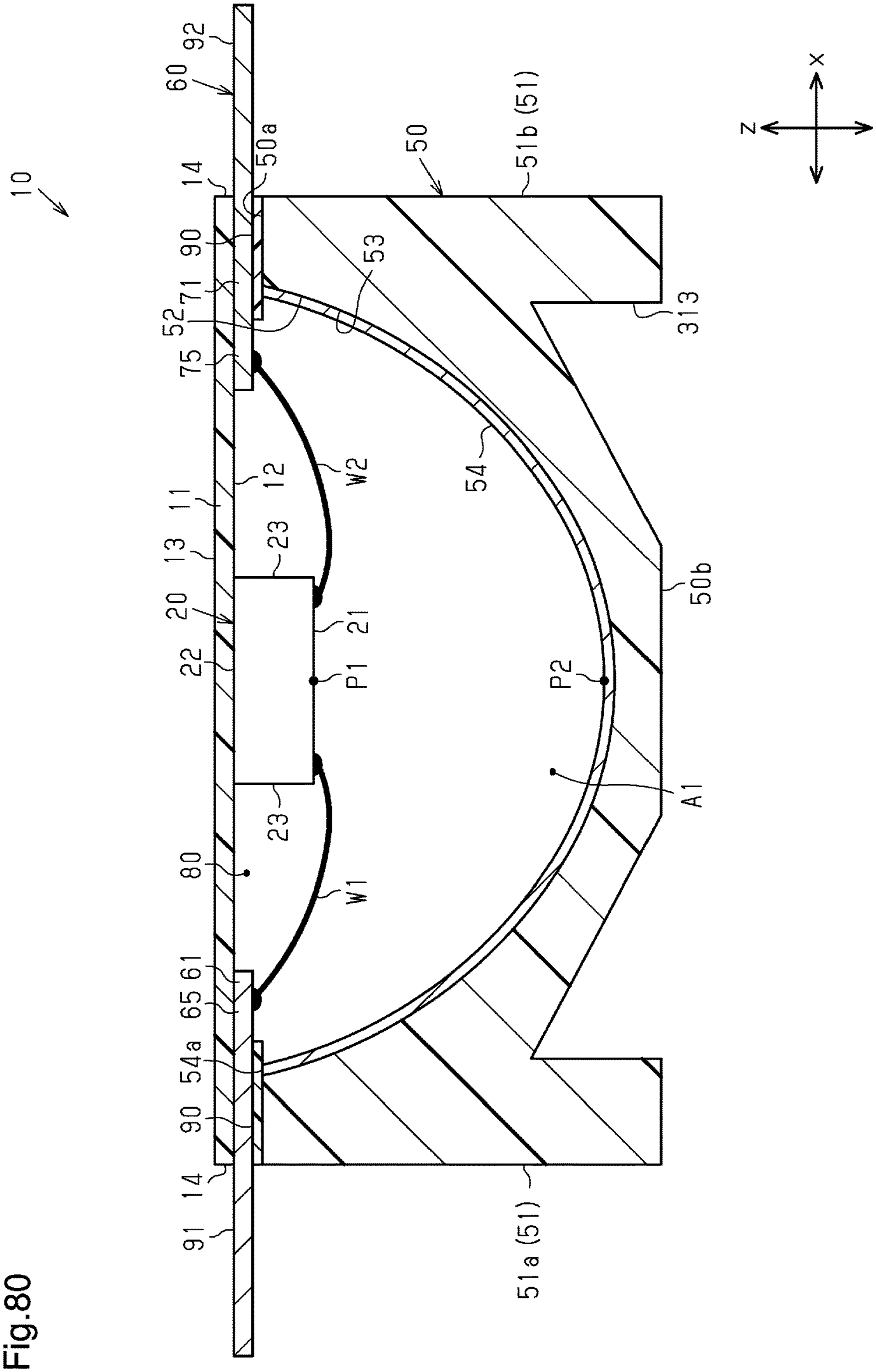
FIG. 80 is a schematic end view showing a modified example of a terahertz device.

The shape of the antenna base 50 may be changed. For example, as shown in FIG. 79, the antenna base 50 may be chamfered and dome-shaped. As shown in FIG. 80, the antenna base 50 may include a cutaway portion 313.

Figure 81:
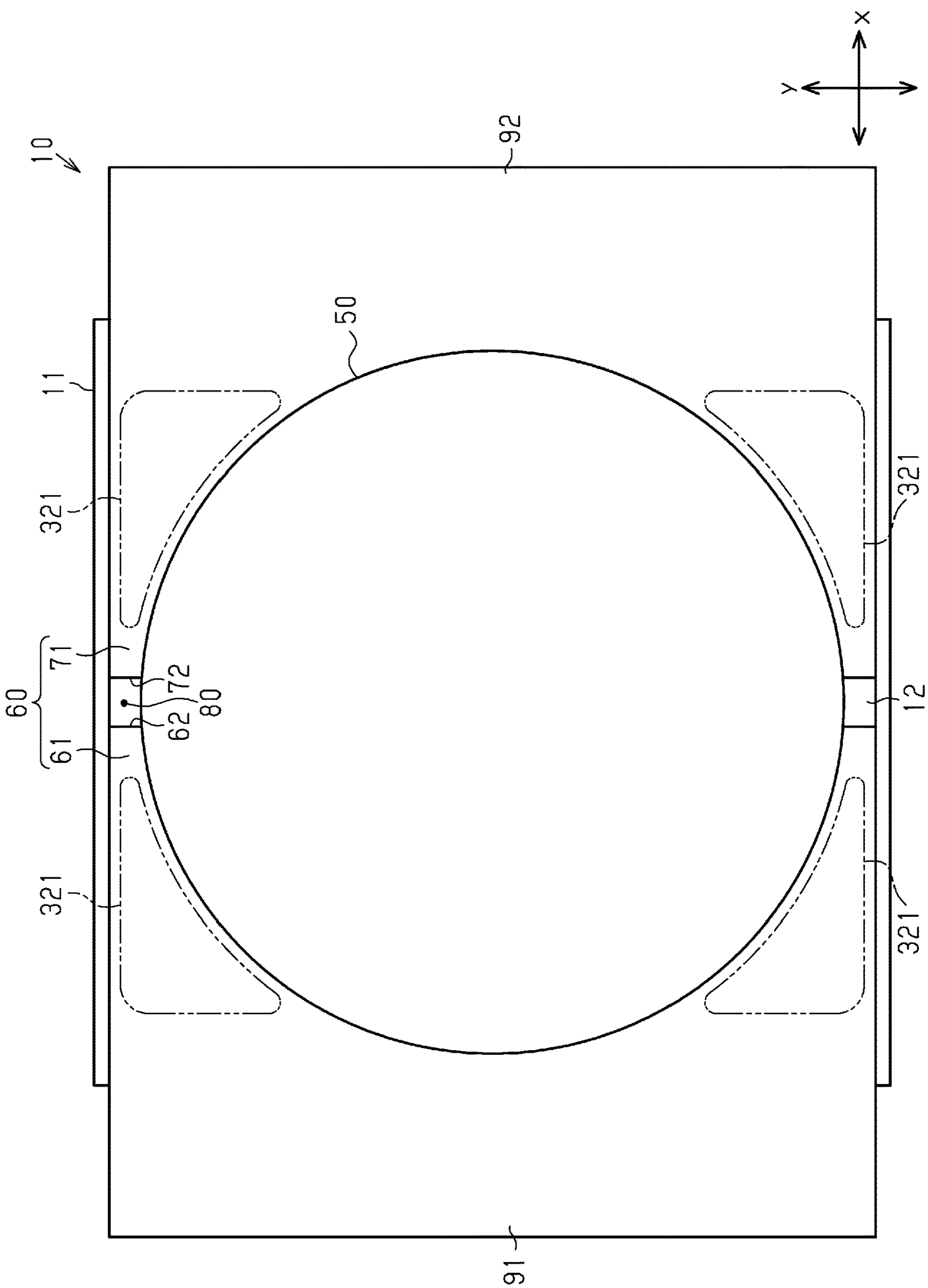
FIG. 81 is a schematic end view showing a modified example of a terahertz device.

As shown in FIG. 81, the antenna base 50 may be circular as viewed in the z-direction. More specifically, the antenna base 50 may have the shape of a cylinder, the axis of which extends in the z-direction. In this case, exposure regions 321 are formed around the antenna base 50 to expose the lead frame 60. In this modified example, for example, the exposure regions 321 may be used to mount the terahertz device 10 on the circuit substrate 110. More specifically, the diameter of the hole 116 formed in the circuit substrate 110 is equal to or slightly greater than the diameter of the contour of the antenna base 50 In this case, when the antenna base 50 is inserted into the hole 116, the exposure regions 321 contact the circuit substrate 110. Therefore, the conductive bonding members 117 are disposed on the exposure regions 321, so that the terahertz device 10 is electrically connected and mounted on the circuit substrate 110. As a result, the terahertz device 10 is further reduced in size.

Figure 82:
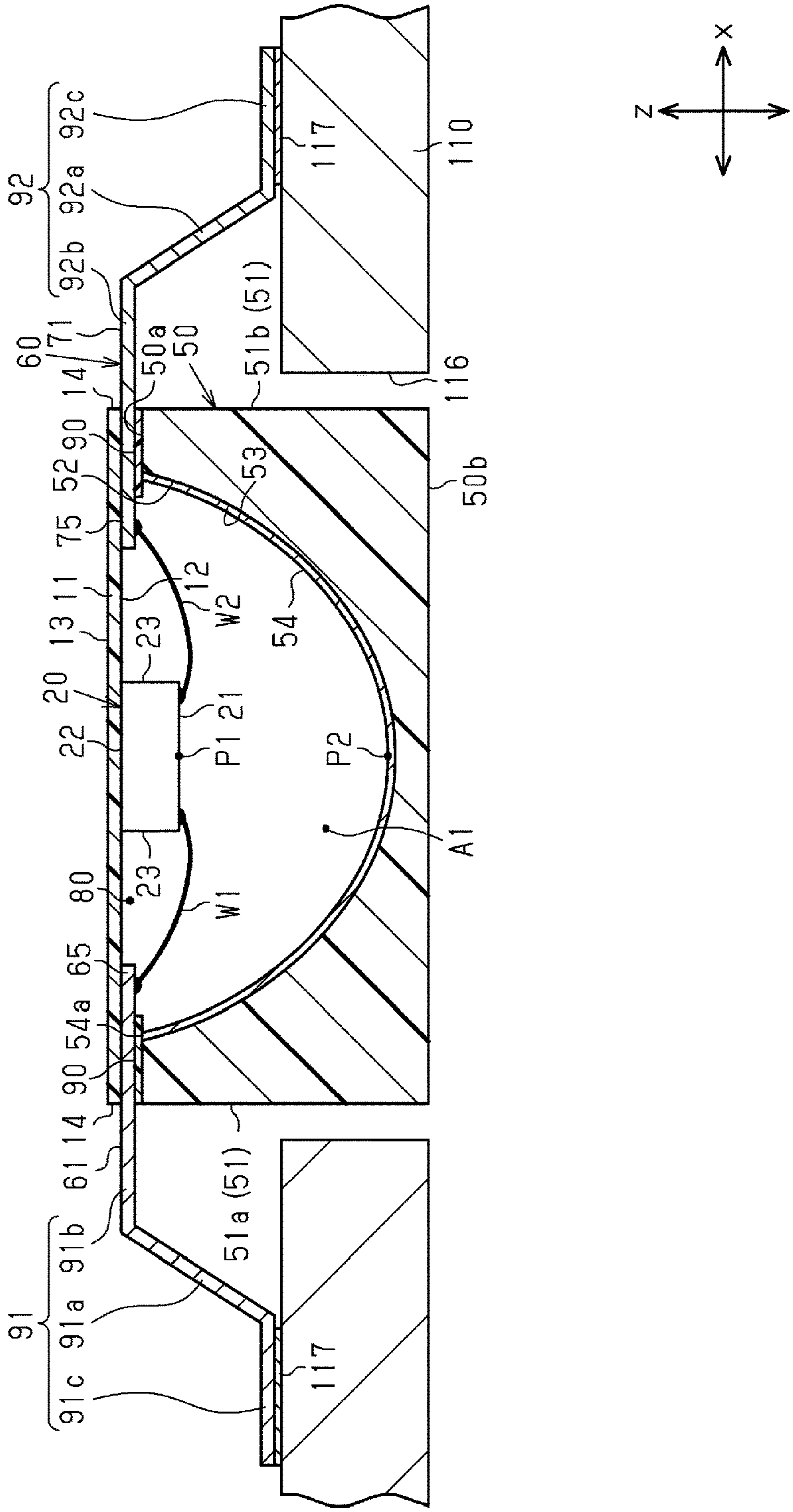
FIG. 82 is a schematic end view showing a modified example of a terahertz device.

As shown in FIG. 82, the electrodes 91 and 92 may include inclined portions 91*a* and 92*a* inclined in a direction away from the mount plate 11, more specifically, downward, as the inclined portions 91*a* and 92*a* extend away from the antenna base 50. For example, the first electrode 91 may be crank-shaped and include a first proximal portion 91*b* extending from the antenna base 50 (the first base side surface 51*a*) in the x-direction, a first distal portion 91*c* disposed sideward and downward relative to the first proximal portion 91*b*, and a first inclined portion 91*a* joined to the first proximal portion 91*b* and the first distal portion 91*c*.

In the same manner, the second electrode 92 may be crank-shaped and include a second proximal portion 92*b* extending from the antenna base 50 (the second base side surface 51*b*) in the x-direction, a second distal portion 92*c* located sideward and downward relative to the second proximal portion 92*b*, and a second inclined portion 92*a* joined to the second proximal portion 92*b* and the second distal portion 92*c*.

In this structure, when part of the antenna base 50 is inserted in the hole 116, the two distal portions 91*c* and 92*c* may be bonded to the circuit substrate 110 by the conductive bonding member 117 so that the terahertz device 10 is mounted on the circuit substrate 110. This limits downward projection of the terahertz device 10 from the circuit substrate 110 even when the circuit substrate 110 has a smaller thickness than the terahertz device 10. The first proximal portion 91*b* and the second proximal portion 92*b* may be omitted.

Figure 83:
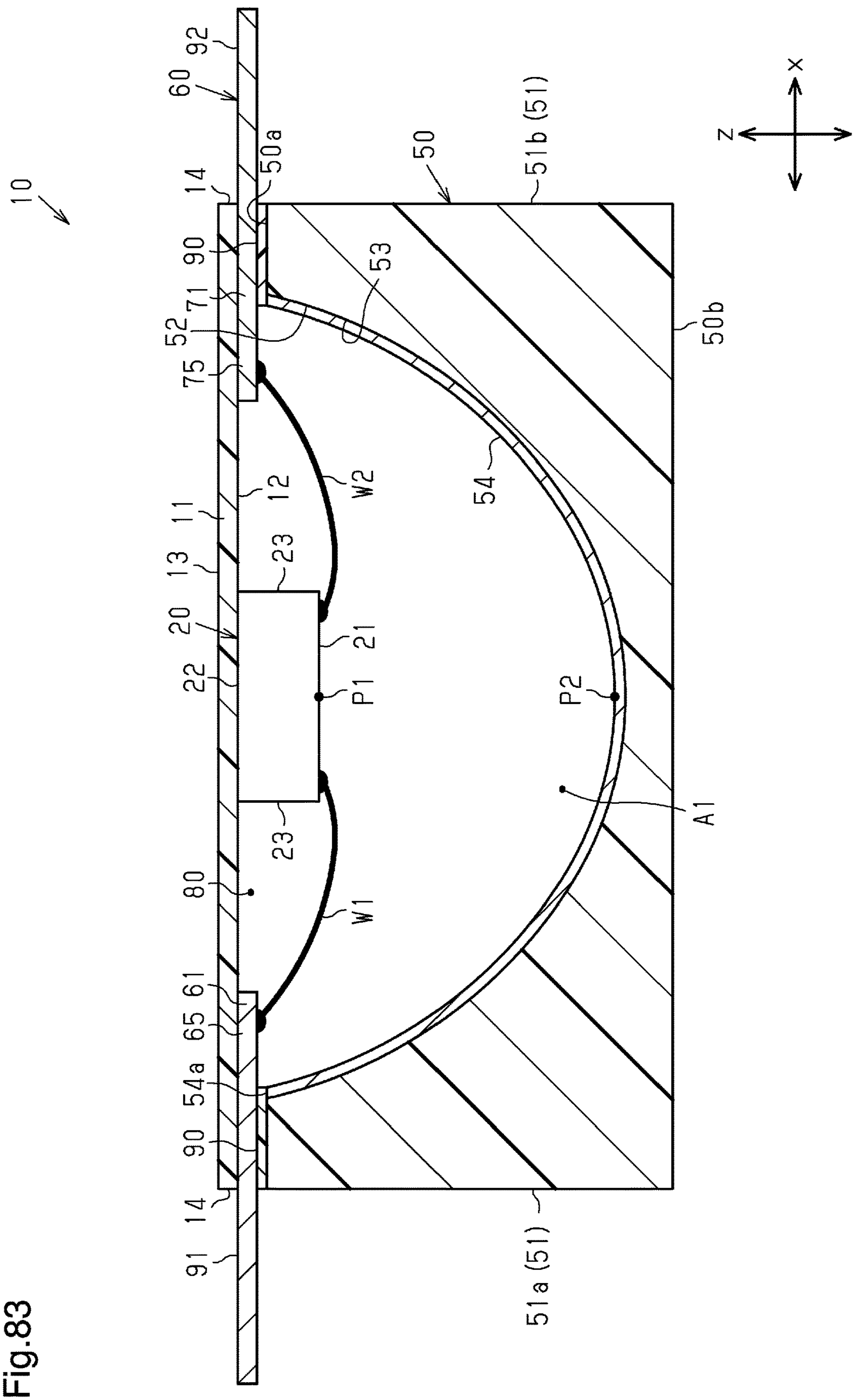
FIG. 83 is a schematic end view showing a modified example of a terahertz device.

As shown in FIG. 83, the inner peripheral end of the adhesive layer 90 may be flush with the surface of the reflection film 54. That is, the adhesive layer 90 may be configured not to extend inward (in other words, toward the terahertz element 20) beyond the reflection film 54.

Figure 84:
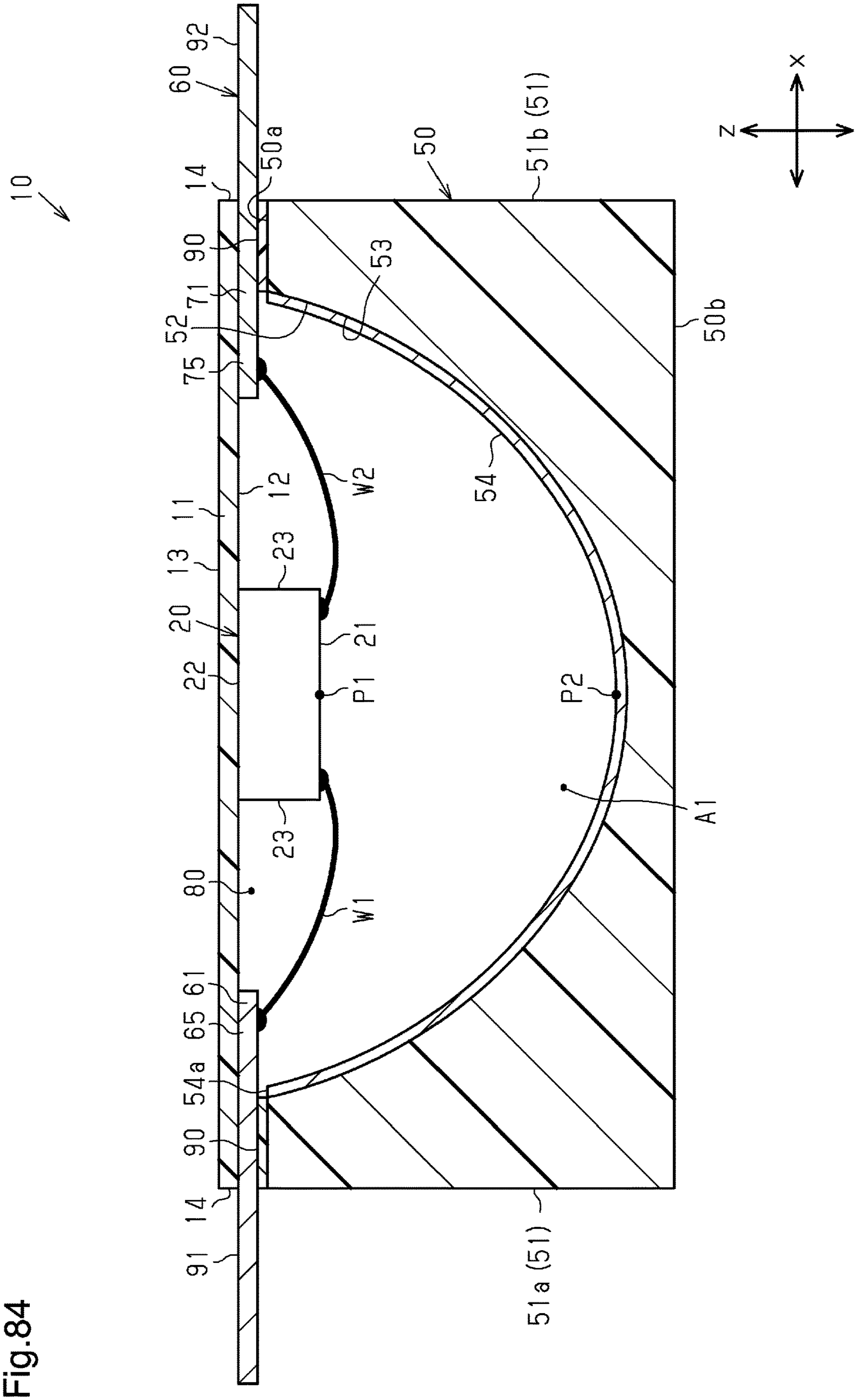
FIG. 84 is a schematic end view showing a modified example of a terahertz device.
Figure 85:
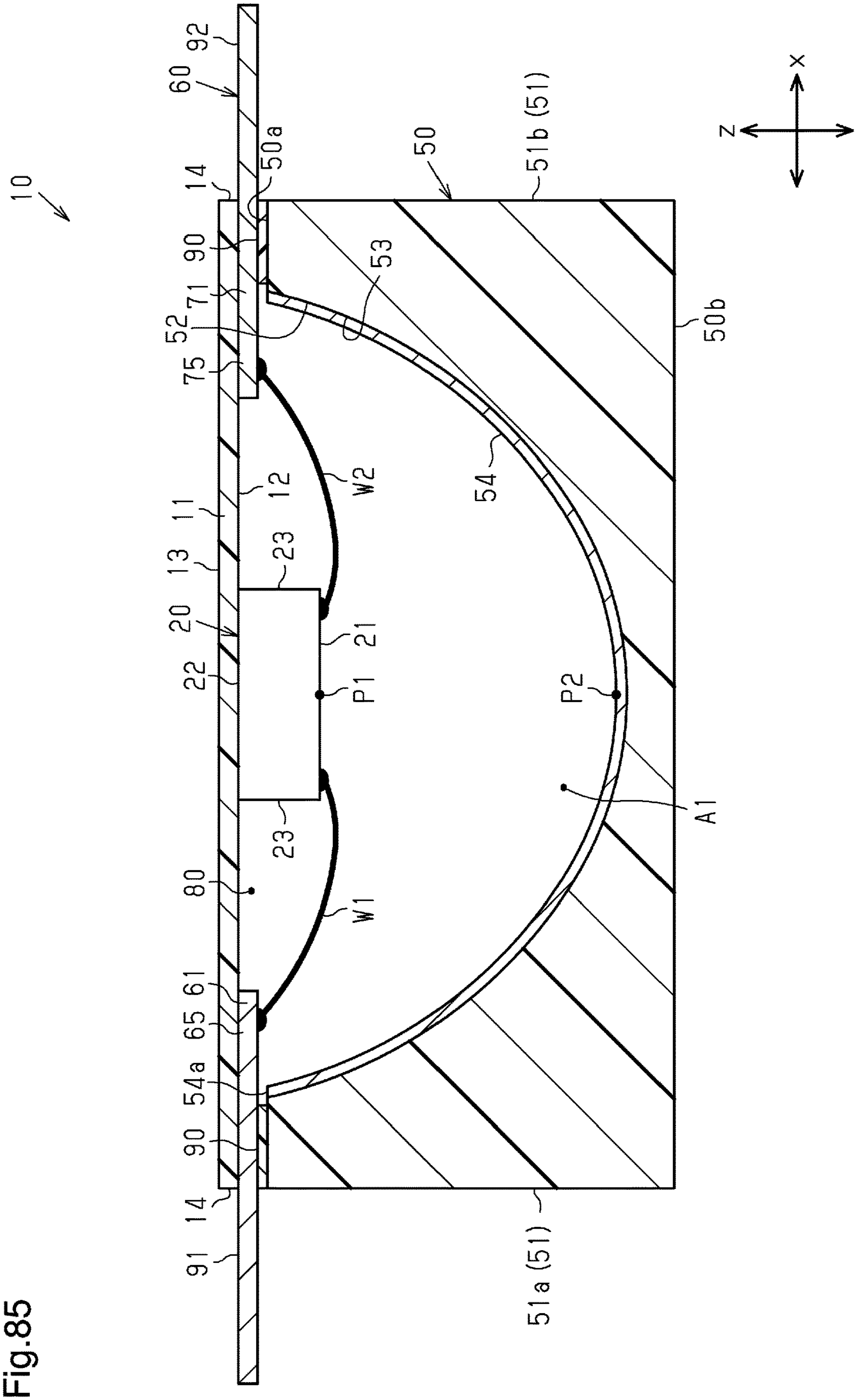
FIG. 85 is a schematic end view showing a modified example of a terahertz device.

As shown in FIGS. 84 and 85, the inner peripheral end of the adhesive layer 90 may be located outward from the surface of the reflection film 54 (in other words, toward the base side surfaces 51) in the x-direction and the y-direction. For example, as shown in FIG. 84, the inner peripheral end of the adhesive layer 90 may be flush with the antenna surface 53. Alternatively, as shown in FIG. 85, the inner peripheral end of the adhesive layer 90 may be located outward from the antenna surface 53 in the x-direction and the y-direction. In this case, the adhesive layer 90 is not disposed between the end 54*a* of the reflection film 54 and the lead frame 60. In other words, the adhesive layer 90 does not necessarily have to be disposed between the reflection film 54 and the lead frame 60. Even in this case, the reflection film 54 is separated from the lead frame 60 by the height of the adhesive layer 90, so that contact of the reflection film 54 with the lead frame 60 is limited.

The electrodes 91 and 92 may project in the y-direction instead of the x-direction. The electrodes 91 and 92 may project in both the x-direction and the y-direction.

The terahertz element 20 may be disposed so that the element back surface 22 faces the reflection film 54. That is, the reflection film 54 may be disposed at the side of the element back surface 22 of the terahertz element 20, not at the side of the element main surface 21.

The reflection film 54 does not have to be electrically isolated.

The reflection film 54 may be formed on the base main surface 50*a*. In this case, for example, a reflection reduction film may be located opposing the base main surface 50*a*.

The gas existing in the accommodation space A1 is not limited to air and may be changed in any manner. Moreover, the accommodation space A1 may be vacuum.

The antenna base 50 and the lead frame 60 may be unitized by a process other than adhesion.

The shape of the opening 80 may be changed in any manner. For example, one of the part openings 63 and 73 may be omitted. The part openings 63 and 73 may be smaller than the reflection film 54.

The mount plate 11 and the support substrate 150, which are used as the base member, may have any shape. For example, the mount plate 11 may have a greater thickness than the lead frame 60.

The electrodes 91 and 92 may be disposed in the proximity of the center of the terahertz device 10 in the z-direction or disposed downward from the center.

The specific structure of the terahertz element 20 may be changed. For example, the position and size of the two pads 33*b* and 34*b* may be changed. The oscillation point P1 may be located at a position other than the center.

The terahertz element 20 may be configured to receive electromagnetic waves and convert the received electromagnetic waves into electrical energy. Specifically, the terahertz element 20 receives electromagnetic waves, for example, in the range of the opening angle θ of the oscillation point P1. In this case, the oscillation point P1 may be referred to as a reception point that receives electromagnetic waves.

In this structure, the reflection film may reflect the incident electromagnetic waves toward the terahertz element 20 (preferably, the reception point). This increases the reception strength of the terahertz device 10, thereby improving the gain related to reception.

Moreover, the terahertz element 20 may be configured to oscillate and receive electromagnetic waves. That is, the oscillation point P1 may perform at least one of oscillation and reception of electromagnetic waves.

When the terahertz element 20 is configured to receive electromagnetic waves, the reflector 300 of the modified example reflects electromagnetic waves reflected by the reflection film 54 toward the terahertz element 20. In this structure, the electromagnetic waves reflected by the reflection film 54 are emitted via the reflector 300 to the terahertz element 20. More specifically, the reflection film 54 is configured to reflect at least part of the incident electromagnetic waves toward the reflector 300. The reflector 300 is configured to receive the electromagnetic waves reflected by the reflection film 54 and emit at least part of the electromagnetic waves toward the terahertz element 20.

CLAUSES

The technical aspects will be described below based on the embodiments and the modified examples described above.

1. A terahertz device, including:

a base member;

a terahertz element mounted on the base member and configured to generate an electromagnetic wave;

an antenna base located opposing the base member and including an antenna surface; and a reflection film formed on the antenna surface to reflect at least part of the electromagnetic wave generated by the terahertz element in one direction.

2. The terahertz device according to clause 1, in which the antenna base includes a base main surface faced to the base member, a base back surface opposite the base main surface, and a base side surface facing sideward, the terahertz device further comprises an electrode used for electrical connection with an external device, and the electrode includes a side electrode formed on the base side surface, and a back electrode formed on the base back surface.

3. The terahertz device according to clause 2, in which the electrode includes a lead frame bent along the antenna base.

4. The terahertz device according to clause 3, in which the electrode includes a proximal portion that is bent at a corner between the base side surface and the base main surface toward the base side surface, a bent portion that is bent at a corner between the base side surface and the base back surface, and a distal portion disposed on the base back surface, the side electrode is a portion of the electrode from the proximal portion to the bent portion, and the back electrode is a portion of the electrode from the bent portion to the distal portion.

5. The terahertz device according to any one of clauses 1 to 4, in which the terahertz element includes an element main surface including an oscillation point on which an electromagnetic wave is generated, and an element back surface opposite the element main surface, and the reflection film is disposed closer to the element main surface than to the element back surface.

6. The terahertz device according to clause 5, in which the terahertz element is configured to radiate an electromagnetic wave from the oscillation point in a range of an opening angle, and the reflection film is formed over an angle that is greater than or equal to the opening angle of the oscillation point.

7. The terahertz device according to clause 5 or 6, in which the reflection film is parabolic-antenna-shaped.

8. The terahertz device according to clause 7, in which the reflection film is disposed so that a focal point of the reflection film is located on the oscillation point.

9. The terahertz device according to clause 7, in which a center point of the reflection film coincides with the oscillation point as viewed in an opposing direction of the base member and the antenna base.

10. The terahertz device according to any one of clauses 7 to 9, in which the reflection film is disposed at a position corresponding to a frequency of an electromagnetic wave generated by the terahertz element so that the electromagnetic wave resonates.

11. The terahertz device according to clause 7, in which the terahertz element is disposed at a position so that a center point of the reflection film and the oscillation point are located at different positions as viewed in an opposing direction of the base member and the antenna base.

12. The terahertz device according to any one of clauses 1 to 11, in which the reflection film is electrically isolated.

13. The terahertz device according to any one of clauses 1 to 12, in which the antenna base is formed of an insulative material.

14. The terahertz device according to any one of clauses 1 to 13, in which the base member is located opposing the reflection film and is formed of a material transmissive to an electromagnetic wave.

15. The terahertz device according to clause 14, in which the base member is formed of a dielectric.

16. The terahertz device according to any one of clauses 1 to 15, in which the base member includes a mount main surface on which the terahertz element is mounted, the antenna base includes a base main surface opposed to the mount main surface, and a recess recessed from the base main surface and including the antenna surface, and the terahertz element and the reflection film are disposed in an accommodation space defined by the mount main surface and the antenna surface.

17. The terahertz device according to clause 16, in which the reflection film is formed on the antenna surface and is not formed on the base main surface.

18. The terahertz device according to clause 16 or 17, in which the antenna base includes a receptacle, disposed separately from the recess, to accommodate a protection diode, and the protection diode is connected in parallel to the terahertz element.

19. The terahertz device according to any one of clauses 16 to 18, further including:

a conductive member disposed on the mount main surface and connected to the terahertz element; and an adhesive layer disposed between the antenna base and the conductive member to adhere the antenna base to the conductive member, in which the adhesive layer is formed of an insulative material and is disposed between the reflection film and the conductive member.

20. The terahertz device according to clause 19, further including an insulative spacer disposed between the reflection film and the conductive member, in which the spacer is different from the adhesive layer.

21. The terahertz device according to clause 19 or 20, in which the recess includes a large diameter surface having a diameter larger than that of the antenna surface and a stepped surface formed between the antenna surface and the large diameter surface, and the reflection film is formed over the antenna surface and the stepped surface.

22. The terahertz device according to any one of clauses 19 to 21, in which the base member includes a mount back surface opposite the mount main surface, the terahertz device further includes a reflection reduction film formed on at least a portion of a part of the mount back surface, the part of the mount back surface overlapping the conductive member as viewed in an opposing direction of the base member and the antenna base, and the reflection reduction film reduces reflection of an electromagnetic wave.

23. The terahertz device according to any one of clauses 1 to 22, in which the base member includes a conductive member connected to the terahertz element, and the conductive member includes an opening that overlaps at least a portion of the reflection film as viewed in an opposing direction of the base member and the antenna base.

24. The terahertz device according to clause 23, in which
the conductive member includes a first conductor and a second conductor that are separated and opposed to each other, and
the opening includes a gap between the first conductor and the second conductor.

25. The terahertz device according to clause 24, in which
the opening includes a first part opening formed in a part of the first conductor overlapping the reflection film as viewed in the opposing direction, the first part opening being continuous with the gap, and
the opening includes a second part opening formed in a part of the second conductor overlapping the reflection film as viewed in the opposing direction, the second part opening being continuous with the gap.

26. The terahertz device according to clause 25, in which
the first conductor includes a first connector configured to be electrically connected to the terahertz element,
the first connector projects toward the terahertz element from a first wall surface that is a wall surface defining the first part opening,
the second conductor includes a second connector configured to be electrically connected to the terahertz element, and
the second connector projects toward the terahertz element from a second wall surface that is a wall surface defining the second part opening.

27. The terahertz device according to clause 26, further including a first wire connecting the first connector to a first pad formed on the terahertz element, in which as viewed in the opposing direction, a projection dimension of the first connector from the first wall surface is less than a length of the first wire.

28. The terahertz device according to clause 27, further including a second wire connecting the second connector to a second pad formed on the terahertz element, in which as viewed in the opposing direction, a projection dimension of the second connector from the second wall surface is less than a length of the second wire.

29. The terahertz device according to clause 26, further including a first wire connecting the first connector to a first pad formed on the terahertz element, in which as viewed in the opposing direction, a length of the first wire is less than a projection dimension of the first connector from the first wall surface.

30. The terahertz device according to clause 29, further including a second wire connecting the second connector to a second pad formed on the terahertz element, in which as viewed in the opposing direction, a length of the second wire is less than a projection dimension of the second connector from the second wall surface.

31. The terahertz device according to any one of clauses 26 to 30, in which the first connector and the second connector are opposed to each other at opposite sides of the terahertz element.

32. The terahertz device according to any one of clauses 26 to 30, in which the first connector and the second connector are disposed parallel to each other.

33. The terahertz device according to any one of clauses 23 to 32, in which
the conductive member is formed of a lead frame, and
the base member is mounted on the lead frame.

34. The terahertz device according to clause 33, in which the base member is plate-shaped and has a thickness that is less than a thickness of the lead frame.

35. The terahertz device according to clause 1, further including a lead frame as the base member, in which the lead frame includes
a mount base on which the terahertz element is mounted,
a first connector joined to the mount base, the first connector being electrically connected to a first pad formed on the terahertz element by a first wire, and
a second connector insulated from the first connector, the second connector being electrically connected to a second pad formed on the terahertz element by a second wire.

36. The terahertz device according to clause 1, in which
the base member includes
a mount main surface on which the terahertz element is mounted, and
a mount back surface opposite the mount main surface,
the antenna base is disposed at the mount back surface, and
the terahertz element and the reflection film are opposed to each other at opposite sides of the base member.

37. A terahertz device, including:
a terahertz element configured to generate an electromagnetic wave;
a base member including a reflector, the reflector being located opposing the terahertz element to reflect at least part of the electromagnetic wave generated by the terahertz element;
an antenna base located opposing the base member and including an antenna surface; and
a reflection film formed on the antenna surface to reflect at least part of the electromagnetic wave reflected by the reflector in one direction.

38. A terahertz device, including:
a base member;
a terahertz element mounted on the base member and configured to receive an electromagnetic wave;
an antenna base located opposing the base member and including an antenna surface; and
a reflection film formed on the antenna surface to reflect an incident electromagnetic wave toward the terahertz element.

39. The terahertz device according to clause 38, in which
the antenna base includes
a base main surface opposed to the base member,
a base back surface opposite the base main surface, and
a base side surface facing sideward,
the terahertz device further comprises an electrode used for electrical connection with an external device, and
the electrode includes
a side electrode formed on the base side surface, and
a back electrode formed on the base back surface.

40. The terahertz device according to clause 39, in which the electrode includes a lead frame bent along the antenna base.

41. The terahertz device according to clause 40, in which
the electrode includes
a proximal portion that is bent at a corner between the base side surface and the base main surface toward the base side surface,
a bent portion that is bent at a corner between the base side surface and the base back surface, and
a distal portion disposed on the base back surface,
the side electrode is a portion of the electrode from the proximal portion to the bent portion, and the back electrode is a portion of the electrode from the bent portion to the distal portion.

42. The terahertz device according to any one of clauses 38 to 41, in which the terahertz element includes an element main surface including a reception point that receives an electromagnetic wave, and an element back surface opposite the element main surface, and the reflection film is disposed closer to the element main surface than to the element back surface.

43. The terahertz device according to clause 42, in which the terahertz element is configured to receive an electromagnetic wave in a range of an opening angle with the reception point, and the reflection film is formed over an angle that is greater than or equal to the opening angle with the reception point.

44. The terahertz device according to clause 42 or 43, in which the reflection film is parabolic-antenna-shaped.

45. The terahertz device according to clause 44, in which the reflection film is disposed so that a focal point of the reflection film is located on the reception point.

46. The terahertz device according to clause 44, in which a center point of the reflection film coincides with the reception point as viewed in an opposing direction of the base member and the antenna base.

47. The terahertz device according to any one of clauses 44 to 46, in which the reflection film is disposed at a position corresponding to a frequency of an electromagnetic wave received by the terahertz element so that the electromagnetic wave resonates.

48. The terahertz device according to clause 44, in which the terahertz element is disposed at a position so that a center point of the reflection film and the reception point are located at different positions as viewed in an opposing direction of the base member and the antenna base.

49. The terahertz device according to any one of clauses 38 to 48, in which the reflection film is electrically isolated.

50. The terahertz device according to any one of clauses 38 to 49, in which the antenna base is formed of an insulative material.

51. The terahertz device according to any one of clauses 38 to 50, in which the base member is located opposing the reflection film and is formed of a material transmissive to an electromagnetic wave.

52. The terahertz device according to clause 51, in which the base member is formed of a dielectric.

53. The terahertz device according to any one of clauses 38 to 52, in which the base member includes a mount main surface on which the terahertz element is mounted, the antenna base includes a base main surface opposed to the mount main surface, and a recess recessed from the base main surface and including the antenna surface, and the terahertz element and the reflection film are disposed in an accommodation space defined by the mount main surface and the antenna surface.

54. The terahertz device according to clause 53, in which the reflection film is formed on the antenna surface and is not formed on the base main surface.

55. The terahertz device according to clause 53 or 54, in which the antenna base includes a receptacle disposed separately from the recess to accommodate a protection diode, and the protection diode is connected in parallel to the terahertz element.

56. The terahertz device according to any one of clauses 53 to 55, further including:

a conductive member disposed on the mount main surface and connected to the terahertz element; and an adhesive layer disposed between the antenna base and the conductive member to adhere the antenna base to the conductive member, in which the adhesive layer is formed of an insulative material and is disposed between the reflection film and the conductive member.

57. The terahertz device according to clause 56, further including an insulative spacer disposed between the reflection film and the conductive member, in which the spacer is different from the adhesive layer.

58. The terahertz device according to clause 56 or 57, in which the recess includes a large diameter surface having a diameter larger than that of the antenna surface and a stepped surface formed between the antenna surface and the large diameter surface, and the reflection film is formed over the antenna surface and the stepped surface.

59. The terahertz device according to any one of clauses 56 to 58, in which the base member includes a mount back surface opposite the mount main surface, the terahertz device further comprises a reflection reduction film formed on at least a portion of a part of the mount back surface, the part of the mount back surface overlapping the conductive member as viewed in an opposing direction of the base member and the antenna base, and the reflection reduction film reduces reflection of an electromagnetic wave.

60. The terahertz device according to any one of clauses 38 to 59, in which the base member includes a conductive member connected to the terahertz element, and the conductive member includes an opening that overlaps at least a portion of the reflection film as viewed in an opposing direction of the base member and the antenna base.

61. The terahertz device according to clause 60, in which the conductive member includes a first conductor and a second conductor that are separated and opposed to each other, and the opening includes a gap between the first conductor and the second conductor.

62. The terahertz device according to clause 61, in which the opening includes a first part opening formed in a part of the first conductor overlapping the reflection film as viewed in the opposing direction, the first part opening being continuous with the gap, and the opening includes a second part opening formed in a part of the second conductor overlapping the reflection film as viewed in the opposing direction, the second part opening being continuous with the gap.

63. The terahertz device according to clause 62, in which the first conductor includes a first connector configured to be electrically connected to the terahertz element, the first connector projects toward the terahertz element from a first wall surface that is a wall surface defining the first part opening, the second conductor includes a second connector configured to be electrically connected to the terahertz element, and the second connector projects toward the terahertz element from a second wall surface that is a wall surface defining the second part opening.

64. The terahertz device according to clause 63, further including a first wire connecting the first connector to a first pad formed on the terahertz element, in which as viewed in the opposing direction, a projection dimension of the first connector from the first wall surface is less than a length of the first wire.

65. The terahertz device according to clause 64, further including a second wire connecting the second connector to a second pad formed on the terahertz element, in which as viewed in the opposing direction, a projection dimension of the second connector from the second wall surface is less than a length of the second wire.

66. The terahertz device according to clause 63, further including a first wire connecting the first connector to a first pad formed on the terahertz element, in which as viewed in the opposing direction, a length of the first wire is less than a projection dimension of the first connector from the first wall surface.

67. The terahertz device according to clause 66, further including a second wire connecting the second connector to a second pad formed on the terahertz element, in which as viewed in the opposing direction, a length of the second wire is less than a projection dimension of the second connector from the second wall surface.

68. The terahertz device according to any one of clauses 63 to 67, in which the first connector and the second connector are opposed to each other at opposite sides of the terahertz element.

69. The terahertz device according to any one of clauses 63 to 67, in which the first connector and the second connector are disposed parallel to each other.

70. The terahertz device according to any one of clauses 60 to 69, in which the conductive member is formed of a lead frame, and the base member is mounted on the lead frame.

71. The terahertz device according to clause 70, in which the base member is plate-shaped and has a thickness that is less than that of the lead frame.

72. The terahertz device according to clause 38, further including a lead frame as the base member, in which the lead frame includes a mount base on which the terahertz element is mounted, a first connector joined to the mount base, the first connector being electrically connected to a first pad formed on the terahertz element by a first wire, and a second connector insulated from the first connector, the second connector being electrically connected to a second pad formed on the terahertz element by a second wire.

73. The terahertz device according to clause 38, in which the base member includes a mount main surface on which the terahertz element is mounted, and a mount back surface opposite the mount main surface, the antenna base is disposed at the mount back surface, and the terahertz element and the reflection film are opposed to each other at opposite sides of the base member.

74. A terahertz device, including:

a terahertz element configured to receive an electromagnetic wave;

a base member including a reflector, the reflector being located opposing the terahertz element to reflect at least part of an incident electromagnetic wave toward the terahertz element;

an antenna base located opposing the base member and including an antenna surface; and a reflection film formed on the antenna surface to reflect at least part of an incident electromagnetic wave toward the reflector.

75. A terahertz device, including:

a base member;

a terahertz element mounted on the base member and configured to generate an electromagnetic wave;

an antenna base opposed to the base member and including an antenna surface;

a reflection film formed on the antenna surface to reflect at least part of the electromagnetic wave generated by the terahertz element in one direction; and an electrode used for electrical connection with an external device, in which the electrode projects sideward relative to the antenna base as viewed in an opposing direction of the base member and the antenna base.

76. The terahertz device according to clause 75, in which the electrode is located toward the base member from a central portion of the terahertz device in the opposing direction.

77. The terahertz device according to clause 75 or 76, in which the electrode is formed of a lead frame.

78. The terahertz device according to clause 77, in which the electrode includes an inclined portion inclined in a direction away from the base member as the electrode extends away from the antenna base.

79. The terahertz device according to clause 77 or 78, in which the electrode is crank-shaped.

80. The terahertz device according to clause 75 or 76, in which the base member includes a support substrate, the support substrate includes an extension extending sideward beyond the antenna base as viewed in the opposing direction, and the electrode includes a wiring pattern formed on the extension.

81. The terahertz device according to clause 80, in which the base member includes a mount main surface on which the terahertz element is mounted and a mount back surface opposite the mount main surface, the terahertz device further comprises:

a connection pattern that is a wiring pattern formed on the mount main surface at a position separate from the electrode, the connection pattern being connected to the terahertz element;

a back pattern that is a wiring pattern formed on the mount back surface; and a through via extending through the support substrate and connecting the connection pattern and the electrode to the back pattern, and the reflection film includes an end disposed between the connection pattern and the electrode and separated from the connection pattern and the electrode as viewed in the opposing direction.

82. The terahertz device according to any one of clauses 75 to 81, in which the terahertz element includes an element main surface including an oscillation point on which an electromagnetic wave is generated, and an element back surface opposite the element main surface, and the reflection film is disposed closer to the element main surface than to the element back surface.

83. The terahertz device according to clause 82, in which
the terahertz element is configured to radiate an electromagnetic wave from the oscillation point in a range of an opening angle, and
the reflection film is formed over an angle that is greater than or equal to the opening angle of the oscillation point.

84. The terahertz device according to clause 82 or 83, in which the reflection film is parabolic-antenna-shaped.

85. The terahertz device according to clause 84, in which the reflection film is disposed so that a focal point of the reflection film is located on the oscillation point.

86. The terahertz device according to clause 84, in which a center point of the reflection film coincides with the oscillation point as viewed in an opposing direction of the base member and the antenna base.

87. The terahertz device according to any one of clauses 84 to 86, in which the reflection film is disposed at a position corresponding to a frequency of an electromagnetic wave generated by the terahertz element so that the electromagnetic wave resonates.

88. The terahertz device according to clause 84, in which the terahertz element is disposed at a position so that a center point of the reflection film and the oscillation point are located at different positions as viewed in an opposing direction of the base member and the antenna base.

89. The terahertz device according to any one of clauses 75 to 88, in which the reflection film is electrically isolated.

90. The terahertz device according to any one of clauses 75 to 89, in which the antenna base is formed of an insulative material.

91. The terahertz device according to any one of clauses 75 to 90, in which the base member is located opposing the reflection film and is formed of a material transmissive to an electromagnetic wave.

92. The terahertz device according to clause 91, in which the base member is formed of a dielectric.

93. The terahertz device according to any one of clauses 75 to 92, in which
the base member includes a mount main surface on which the terahertz element is mounted,
the antenna base includes
a base main surface faced to the mount main surface, and
a recess recessed from the base main surface and including the antenna surface, and
the terahertz element and the reflection film are disposed in an accommodation space defined by the mount main surface and the antenna surface.

94. The terahertz device according to clause 93, in which the reflection film is formed on the antenna surface and is not formed on the base main surface.

95. The terahertz device according to clause 93 or 94, in which
the antenna base includes a receptacle disposed separately from the recess to accommodate a protection diode, and
the protection diode is connected in parallel to the terahertz element.

96. The terahertz device according to any one of clauses 93 to 95, further including:
a conductive member disposed on the mount main surface and connected to the terahertz element; and
an adhesive layer disposed between the antenna base and the conductive member to adhere the antenna base to the conductive member,
in which the adhesive layer is formed of an insulative material and is disposed between the reflection film and the conductive member.

97. The terahertz device according to clause 96, further including an insulative spacer disposed between the reflection film and the conductive member, in which the spacer is different from the adhesive layer.

98. The terahertz device according to clause 96 or 97, in which
the recess includes a large diameter surface having a diameter larger than that of the antenna surface and a stepped surface formed between the antenna surface and the large diameter surface, and
the reflection film is formed over the antenna surface and the stepped surface.

99. The terahertz device according to any one of clauses 96 to 98, in which
the base member includes a mount back surface opposite the mount main surface,
the terahertz device further comprises a reflection reduction film formed on at least a portion of a part of the mount back surface, the part of the mount back surface overlapping the conductive member as viewed in an opposing direction of the base member and the antenna base, and
the reflection reduction film reduces reflection of an electromagnetic wave.

100. The terahertz device according to any one of clauses 65 to 99, in which
the base member includes a conductive member connected to the terahertz element, and
the conductive member includes an opening that overlaps at least a portion of the reflection film as viewed in an opposing direction of the base member and the antenna base.

101. The terahertz device according to clause 100, in which
the conductive member includes a first conductor and a second conductor that are separated and faced to each other, and
the opening includes a gap between the first conductor and the second conductor.

102. The terahertz device according to clause 101, in which
the opening includes a first part opening formed in a part of the first conductor overlapping the reflection film as viewed in the opposing direction, the first part opening being continuous with the gap, and
the opening includes a second part opening formed in a part of the second conductor overlapping the reflection film as viewed in the opposing direction, the second part opening being continuous with the gap.

103. The terahertz device according to clause 102, in which
the first conductor includes a first connector configured to be electrically connected to the terahertz element,
the first connector projects toward the terahertz element from a first wall surface that is a wall surface defining the first part opening,
the second conductor includes a second connector configured to be electrically connected to the terahertz element, and
the second connector projects toward the terahertz element from a second wall surface that is a wall surface defining the second part opening.

104. The terahertz device according to clause 103, further including a first wire connecting the first connector to a first pad formed on the terahertz element, in which as viewed in the opposing direction, a projection dimension of the first connector from the first wall surface is less than a length of the first wire.

105. The terahertz device according to clause 104, further including a second wire connecting the second connector to a second pad formed on the terahertz element, in which as viewed in the opposing direction, a projection dimension of the second connector from the second wall surface is less than a length of the second wire.

106. The terahertz device according to clause 103, further including a first wire connecting the first connector to a first pad formed on the terahertz element, in which as viewed in the opposing direction, a length of the first wire is less than a projection dimension of the first connector from the first wall surface.

107. The terahertz device according to clause 106, further including a second wire connecting the second connector to a second pad formed on the terahertz element, in which as viewed in the opposing direction, a length of the second wire is less than a projection dimension of the second connector from the second wall surface.

108. The terahertz device according to any one of clauses 103 to 107, in which the first connector and the second connector are faced to each other at opposite sides of the terahertz element.

109. The terahertz device according to any one of clauses 103 to 107, in which the first connector and the second connector are disposed parallel to each other.

110. The terahertz device according to any one of clauses 96 to 109, in which the conductive member is formed of a lead frame, and the base member is mounted on the lead frame.

111. The terahertz device according to clause 110, in which the base member is plate-shaped and has a thickness that is less than that of the lead frame.

112. The terahertz device according to any one of clauses 96 to 109, in which the base member includes a support substrate, and the conductive member includes a wiring pattern formed on the support substrate.

113. The terahertz device according to clause 75, further including a lead frame as the base member, in which the lead frame includes a mount base on which the terahertz element is mounted, a first connector joined to the mount base, the first connector being electrically connected to a first pad formed on the terahertz element by a first wire, and a second connector insulated from the first connector, the second connector being electrically connected to a second pad formed on the terahertz element by a second wire.

114. The terahertz device according to clause 75, in which the base member includes a mount main surface on which the terahertz element is mounted, and a mount back surface opposite the mount main surface, the antenna base is disposed at the mount back surface, and the terahertz element and the reflection film are faced to each other at opposite sides of the base member.

115. The terahertz device according to clause 75, in which the antenna base is convex-lens-shaped and is curved to project in a direction away from the terahertz element, and the antenna surface corresponds to a lens surface of the antenna base.

116. The terahertz device according to clause 115, in which the base member includes a mount main surface on which the terahertz element is mounted, and a mount back surface opposite the mount main surface, the antenna base is disposed at the mount back surface of the base member, and the terahertz element and the reflection film are opposed to each other at opposite sides of the base member and the antenna base.

117. A terahertz device, including:

a base member;

a terahertz element mounted on the base member and configured to receive an electromagnetic wave;

an antenna base located opposing the base member and including an antenna surface;

a reflection film formed on the antenna surface to reflect an incident electromagnetic wave toward the terahertz element; and an electrode used for electrical connection with an external device, in which the electrode projects sideward relative to the antenna base as viewed in an opposing direction of the base member and the antenna base.

118. The terahertz device according to clause 117, in which the electrode is located toward the base member from a central portion of the terahertz device in the opposing direction.

119. The terahertz device according to clause 117 or 118, in which the electrode is formed of a lead frame.

120. The terahertz device according to clause 119, in which the electrode includes an inclined portion inclined in a direction away from the base member as the electrode extends away from the antenna base.

121. The terahertz device according to clause 119 or 120, in which the electrode is crank-shaped.

122. The terahertz device according to clause 117 or 118, in which the base member includes a support substrate, the support substrate includes an extension extending sideward beyond the antenna base as viewed in the opposing direction, and the electrode includes a wiring pattern formed on the extension.

123. The terahertz device according to clause 122, in which the base member includes a mount main surface on which the terahertz element is mounted and a mount back surface opposite the mount main surface, the terahertz device further comprises:

a connection pattern that is a wiring pattern formed on the mount main surface at a position separate from the electrode, the connection pattern being connected to the terahertz element;

a back pattern that is a wiring pattern formed on the mount back surface; and a through via extending through the support substrate and connecting the connection pattern and the electrode to the back pattern, and the reflection film includes an end disposed between the connection pattern and the electrode and separated from the connection pattern and the electrode as viewed in the opposing direction.

124. The terahertz device according to any one of clauses 117 to 123, in which the terahertz element includes an element main surface including a reception point that receives an electromagnetic wave, and an element back surface opposite the element main surface, and the reflection film is disposed closer to the element main surface than to the element back surface.

125. The terahertz device according to clause 124, in which the terahertz element is configured to receive an electromagnetic wave in a range of an opening angle with the reception point, and the reflection film is formed over an angle that is greater than or equal to the opening angle with the reception point.

126. The terahertz device according to clause 124 or 125, in which the reflection film is parabolic-antenna-shaped.

127. The terahertz device according to clause 126, in which the reflection film is disposed so that a focal point of the reflection film is located on the reception point.

128. The terahertz device according to clause 126, in which a center point of the reflection film coincides with the reception point as viewed in an opposing direction of the base member and the antenna base.

129. The terahertz device according to any one of clauses 126 to 128, in which the reflection film is disposed at a position corresponding to a frequency of an electromagnetic wave received by the terahertz element so that the electromagnetic wave resonates.

130. The terahertz device according to clause 126, in which the terahertz element is disposed at a position so that a center point of the reflection film and the reception point are located at different positions as viewed in an opposing direction of the base member and the antenna base.

131. The terahertz device according to any one of clauses 117 to 130, in which the reflection film is electrically isolated.

132. The terahertz device according to any one of clauses 117 to 131, in which the antenna base is formed of an insulative material.

133. The terahertz device according to any one of clauses 117 to 132, in which the base member is located opposing the reflection film and is formed of a material transmissive to an electromagnetic wave.

134. The terahertz device according to clause 133, in which the base member is formed of a dielectric.

135. The terahertz device according to any one of clauses 117 to 134, in which the base member includes a mount main surface on which the terahertz element is mounted, the antenna base includes a base main surface faced to the mount main surface, and a recess recessed from the base main surface and including the antenna surface, and the terahertz element and the reflection film are disposed in an accommodation space defined by the mount main surface and the antenna surface.

136. The terahertz device according to clause 135, in which the reflection film is formed on the antenna surface and is not formed on the base main surface.

137. The terahertz device according to clause 135 or 136, in which the antenna base includes a receptacle disposed separately from the recess to accommodate a protection diode, and the protection diode is connected in parallel to the terahertz element.

138. The terahertz device according to any one of clauses 135 to 137, further including:

a conductive member disposed on the mount main surface and connected to the terahertz element; and an adhesive layer disposed between the antenna base and the conductive member to adhere the antenna base to the conductive member, in which the adhesive layer is formed of an insulative material and is disposed between the reflection film and the conductive member.

139. The terahertz device according to clause 138, further including an insulative spacer disposed between the reflection film and the conductive member, in which the spacer is different from the adhesive layer.

140. The terahertz device according to clause 138 or 139, in which the recess includes a large diameter surface having a diameter larger than that of the antenna surface and a stepped surface formed between the antenna surface and the large diameter surface, and the reflection film is formed over the antenna surface and the stepped surface.

141. The terahertz device according to any one of clauses 138 to 140, in which the base member includes a mount back surface opposite the mount main surface, the terahertz device further comprises a reflection reduction film formed on at least a portion of a part of the mount back surface, the part of the mount back surface overlapping the conductive member as viewed in an opposing direction of the base member and the antenna base, and the reflection reduction film reduces reflection of an electromagnetic wave.

142. The terahertz device according to any one of clauses 117 to 141, in which the base member includes a conductive member connected to the terahertz element, and the conductive member includes an opening that overlaps at least a portion of the reflection film as viewed in an opposing direction of the base member and the antenna base.

143. The terahertz device according to clause 142, in which the conductive member includes a first conductor and a second conductor that are separated and faced to each other, and the opening includes a gap between the first conductor and the second conductor.

144. The terahertz device according to clause 143, in which the opening includes a first part opening formed in a part of the first conductor overlapping the reflection film as viewed in the opposing direction, the first part opening being continuous with the gap, and the opening includes a second part opening formed in a part of the second conductor overlapping the reflection film as viewed in the opposing direction, the second part opening being continuous with the gap.

145. The terahertz device according to clause 144, in which the first conductor includes a first connector configured to be electrically connected to the terahertz element, the first connector projects toward the terahertz element from a first wall surface that is a wall surface defining the first part opening, the second conductor includes a second connector configured to be electrically connected to the terahertz element, and the second connector projects toward the terahertz element from a second wall surface that is a wall surface defining the second part opening.

146. The terahertz device according to clause 145, further including a first wire connecting the first connector to a first pad formed on the terahertz element, in which as viewed in the opposing direction, a projection dimension of the first connector from the first wall surface is less than a length of the first wire.

147. The terahertz device according to clause 146, further including a second wire connecting the second connector to a second pad formed on the terahertz element, in which as viewed in the opposing direction, a projection dimension of the second connector from the second wall surface is less than a length of the second wire.

148. The terahertz device according to clause 145, further including a first wire connecting the first connector to a first pad formed on the terahertz element, in which as viewed in the opposing direction, a length of the first wire is less than a projection dimension of the first connector from the first wall surface.

149. The terahertz device according to clause 148, further including a second wire connecting the second connector to a second pad formed on the terahertz element, in which as viewed in the opposing direction, a length of the second wire is less than a projection dimension of the second connector from the second wall surface.

150. The terahertz device according to any one of clauses 145 to 149, in which the first connector and the second connector are faced to each other at opposite sides of the terahertz element.

151. The terahertz device according to any one of clauses 145 to 149, in which the first connector and the second connector are disposed parallel to each other.

152. The terahertz device according to any one of clauses 138 to 151, in which the conductive member is formed of a lead frame, and the base member is mounted on the lead frame.

153. The terahertz device according to clause 152, in which the base member is plate-shaped and has a thickness that is less than that of the lead frame.

154. The terahertz device according to any one of clauses 138 to 151, in which the base member includes a support substrate, and the conductive member includes a wiring pattern formed on the support substrate.

155. The terahertz device according to clause 117, further including a lead frame as the base member, in which the lead frame includes a mount base on which the terahertz element is mounted, a first connector joined to the mount base, the first connector being electrically connected to a first pad formed on the terahertz element by a first wire, and a second connector insulated from the first connector, the second connector being electrically connected to a second pad formed on the terahertz element by a second wire.

156. The terahertz device according to clause 117, in which the base member includes a mount main surface on which the terahertz element is mounted, and a mount back surface opposite the mount main surface, the antenna base is disposed at the mount back surface, and the terahertz element and the reflection film are faced to each other at opposite sides of the base member.

157. The terahertz device according to clause 117, in which the antenna base is convex-lens-shaped and is curved to project in a direction away from the terahertz element, and the antenna surface corresponds to a lens surface of the antenna base.

158. The terahertz device according to clause 157, in which the base member includes a mount main surface on which the terahertz element is mounted, and a mount back surface opposite the mount main surface, the antenna base is disposed at the mount back surface of the base member, and the terahertz element and the reflection film are opposed to each other at opposite sides of the base member and the antenna base.

159. The antenna base may include a receptacle arranged separately from the recess to accommodate a specific element, the specific element being electrically connected to the terahertz element.

160. The specific element may be an integrated circuit (IC).

161. A terahertz device, including:

a base member;

a terahertz element mounted on the base member and configured to generate an electromagnetic wave;

an antenna base located opposing the base member and including an antenna surface; and a reflection film formed on the antenna surface to reflect at least part of the electromagnetic wave generated by the terahertz element in one direction.

162. A terahertz device, including:

a base member;

a terahertz element mounted on the base member and configured to receive an electromagnetic wave;

an antenna base located opposing the base member and including an antenna surface; and a reflection film formed on the antenna surface to reflect an incident electromagnetic wave toward the terahertz element.

163. A terahertz device, including:

a terahertz element configured to generate an electromagnetic wave;

a base member including a reflector, the reflector being located opposing the terahertz element to reflect at least part of the electromagnetic wave generated by the terahertz element;

an antenna base located opposing the base member and including an antenna surface; and a reflection film formed on the antenna surface to reflect at least part of the electromagnetic wave reflected by the reflector in one direction.

164. A terahertz device, including:

a terahertz element configured to receive an electromagnetic wave;

a base member including a reflector, the reflector being located opposing the terahertz element to reflect at least part of an incident electromagnetic wave toward the terahertz element;

an antenna base located opposing the base member and including an antenna surface; and a reflection film formed on the antenna surface to reflect at least part of an incident electromagnetic wave toward the reflector.

165. The antenna base may include a receptacle arranged separately from the recess to accommodate a specific element, the specific element being electrically connected to the terahertz element.

166. A specific element that is mounted on the mount back surface when the specific element is electrically connected to the terahertz element may be included.

167. The specific element may be an IC.

DESCRIPTION OF THE REFERENCE NUMERALS

10) terahertz device; 11) mount plate (base member); 12) mount main surface; 13) mount back surface; 20) terahertz element; 21) element main surface; 22) element back surface; 33*b*) first pad; 34*b*) second pad; 50) antenna base; 50*a*) base main surface; 50*b*) base back surface; 51*a*) first base side surface; 51*b*) second base side surface; 52) recess; 53) antenna surface; 54, 223, 224) reflection film; 54*a*) end of reflection film; 60) lead frame; 61) first lead part; 63) first part opening; 64) first inner surface; 65, 211) first connector; 71) second lead part; 73) second part opening; 74) second inner surface; 75, 212) second connector; 80) opening; 81) gap; 90) adhesive layer; 94, 101, 304, 305) electrode; 94*a*, 101*a*) proximal portion; 94*b*, 101*b*) bent portion; 94*c*, 101*c*) distal portion; 95, 102) side electrode; 93, 103) back electrode; 110) circuit substrate; 120) reflection reduction film; 131, 132) protection diode; 141, 142) receptacle; 200) spacer; 210) mount base; 221) large diameter surface; 222) stepped surface; 300) reflector; 301) reflection protrusion; A1) accommodation space; P1) oscillation point; P2) center point of reflection film; W1) first wire; W2) second wire; θ) opening angle; 153) mount main surface; 154) mount back surface; 230) antenna base; 231) antenna surface; 233, 283, 290) reflection film; 170) adhesive layer; 91, 171, 192, 242) first electrode (electrode); 92, 172, 202, 252) second electrode (electrode); 91*a*, 92*a*) inclined portion; 116) hole; 180, 220) reflection reduction film; 150) support substrate (base member); 151, 152) extension; 160) wiring pattern; 191, 201, 241, 251) connection pattern; 193, 203) back pattern; 194, 195, 204, 205) through via; 260) spacer; 270) mount base; 281) large diameter surface; 282) stepped surface

The invention claimed is:

1. A terahertz device, comprising:

a base member;

a terahertz element mounted on the base member and configured to generate an electromagnetic wave;

an antenna base located opposing the base member and including an antenna surface; and a reflection film formed on the antenna surface to reflect at least part of the electromagnetic wave generated by the terahertz element in one direction.

2. The terahertz device according to claim 1, wherein the antenna base includes a base main surface faced to the base member, a base back surface opposite the base main surface, and a base side surface facing sideward, the terahertz device further comprises an electrode used for electrical connection with an external device, and the electrode includes a side electrode formed on the base side surface, and a back electrode formed on the base back surface.

3. The terahertz device according to claim 2, wherein the electrode includes a lead frame bent along the antenna base.

4. The terahertz device according to claim 3, wherein the electrode includes a proximal portion that is bent at a corner between the base side surface and the base main surface toward the base side surface, a bent portion that is bent at a corner between the base side surface and the base back surface, and a distal portion disposed on the base back surface, the side electrode is a portion of the electrode from the proximal portion to the bent portion, and the back electrode is a portion of the electrode from the bent portion to the distal portion.

5. The terahertz device according to claim 1, wherein the terahertz element includes an element main surface including an oscillation point on which an electromagnetic wave is generated, and an element back surface opposite the element main surface, and the reflection film is disposed closer to the element main surface than to the element back surface.

6. The terahertz device according to claim 5, wherein the terahertz element is configured to radiate an electromagnetic wave from the oscillation point in a range of an opening angle, and the reflection film is formed over an angle that is greater than or equal to the opening angle of the oscillation point.

7. The terahertz device according to claim 5, wherein the reflection film is parabolic-antenna-shaped.

8. The terahertz device according to claim 7, wherein the reflection film is disposed so that a focal point of the reflection film is located on the oscillation point.

9. The terahertz device according to claim 7, wherein a center point of the reflection film coincides with the oscillation point as viewed in an opposing direction of the base member and the antenna base.

10. The terahertz device according to claim 7, wherein the reflection film is disposed at a position corresponding to a frequency of an electromagnetic wave generated by the terahertz element so that the electromagnetic wave resonates.

11. The terahertz device according to claim 7, wherein the terahertz element is disposed at a position so that a center point of the reflection film and the oscillation point are located at different positions as viewed in an opposing direction of the base member and the antenna base.

12. The terahertz device according to claim 1, wherein the reflection film is electrically isolated.

13. The terahertz device according to claim 1, wherein the antenna base is formed of an insulative material.

14. The terahertz device according to claim 1, wherein the base member is located opposing the reflection film and is formed of a material transmissive to an electromagnetic wave.

15. The terahertz device according to claim 14, wherein the base member is formed of a dielectric.

16. The terahertz device according to claim 1, wherein
- the base member includes a mount main surface on which the terahertz element is mounted,
- the antenna base includes
  - a base main surface faced to the mount main surface, and
  - a recess recessed from the base main surface and including the antenna surface, and
- the terahertz element and the reflection film are disposed in an accommodation space defined by the mount main surface and the antenna surface.

17. The terahertz device according to claim 16, wherein the reflection film is formed on the antenna surface and is not formed on the base main surface.

18. The terahertz device according to claim 16, wherein
- the antenna base includes a receptacle disposed separately from the recess to accommodate a protection diode, and
- the protection diode is connected in parallel to the terahertz element.

19. The terahertz device according to claim 16, further comprising:
- a conductive member disposed on the mount main surface and connected to the terahertz element; and
- an adhesive layer disposed between the antenna base and the conductive member to adhere the antenna base to the conductive member,
- wherein the adhesive layer is formed of an insulative material and is disposed between the reflection film and the conductive member.

20. The terahertz device according to claim 19, further comprising an insulative spacer disposed between the reflection film and the conductive member, wherein the spacer is different from the adhesive layer.

* * * * *